United States Patent
Jeon et al.

(10) Patent No.: US 11,980,062 B2
(45) Date of Patent: May 7, 2024

(54) DISPLAY APPARATUS AND MULTI DISPLAY APPARATUS INCLUDING THE SAME

(71) Applicant: LG Display Co., Ltd., Seoul (KR)

(72) Inventors: YoungHo Jeon, Paju-si (KR); JongHyun Park, Paju-si (KR); DongHee Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 17/138,717

(22) Filed: Dec. 30, 2020

(65) Prior Publication Data

US 2021/0202630 A1  Jul. 1, 2021

(30) Foreign Application Priority Data

Dec. 31, 2019 (KR) .................. 10-2019-0180105

(51) Int. Cl.
*H10K 59/122* (2023.01)
*H01L 25/065* (2023.01)
*H10K 50/844* (2023.01)
*H10K 59/131* (2023.01)

(52) U.S. Cl.
CPC ....... *H10K 59/122* (2023.02); *H01L 25/0655* (2013.01); *H10K 50/844* (2023.02); *H10K 59/131* (2023.02)

(58) Field of Classification Search
CPC .... H10K 59/38; H10K 59/131; H10K 59/122; H10K 59/18; H10K 50/844; H01L 27/3246; H01L 27/3276; H01L 27/3293; H01L 25/0655; H01L 51/5253
See application file for complete search history.

(56) References Cited

U.S. PATENT DOCUMENTS

| | | | |
|---|---|---|---|
| 9,761,838 B2 | 9/2017 | Chung et al. | |
| 10,133,381 B2 | 11/2018 | Huh et al. | |
| 10,338,876 B2 | 7/2019 | Kim et al. | |
| 2017/0148856 A1 | 5/2017 | Choi et al. | |
| 2017/0331058 A1* | 11/2017 | Seo | H10K 59/50 |
| 2018/0188579 A1 | 7/2018 | Jeong et al. | |
| 2019/0245015 A1 | 8/2019 | Lee et al. | |
| 2019/0296099 A1* | 9/2019 | Lee | H10K 59/1315 |
| 2019/0319201 A1* | 10/2019 | Goh | H10K 59/131 |
| 2020/0013843 A1* | 1/2020 | Choi | H10K 59/1213 |

(Continued)

FOREIGN PATENT DOCUMENTS

| | | | |
|---|---|---|---|
| CN | 109802052 A | 5/2019 | |
| CN | 110265583 A | 9/2019 | |

(Continued)

*Primary Examiner* — Vongsavanh Sengdara

(74) *Attorney, Agent, or Firm* — Seed IP Law Group LLP

(57) ABSTRACT

A display apparatus includes a first substrate including a plurality of pixel areas provided in a display portion, a second substrate coupled to the first substrate, and a routing portion disposed on an outer surface of the first substrate and an outer surface of the second substrate. The first substrate includes a dam pattern disposed along an edge of the display portion, a light emitting device layer including a light emitting device disposed on the dam pattern and in the plurality of pixel areas, and a trench pattern portion disposed near the dam pattern. The light emitting device is isolated by the trench pattern portion.

24 Claims, 33 Drawing Sheets

(56) References Cited

U.S. PATENT DOCUMENTS

| | | | |
|---|---|---|---|
| 2020/0044193 A1* | 2/2020 | Kim | H10K 50/844 |
| 2020/0051966 A1* | 2/2020 | Lee | H01L 25/18 |
| 2020/0161582 A1* | 5/2020 | Choi | G06F 3/0412 |
| 2020/0227489 A1* | 7/2020 | Kim | H10K 59/122 |
| 2020/0312933 A1* | 10/2020 | Lee | H10K 71/231 |
| 2021/0126067 A1* | 4/2021 | Xu | H10K 59/131 |
| 2024/0023365 A1 | 1/2024 | Choi et al. | |

FOREIGN PATENT DOCUMENTS

| | | |
|---|---|---|
| KR | 10-2013-0030598 A | 3/2013 |
| KR | 10-2013-0060476 A | 6/2013 |
| KR | 10-1441956 B1 | 9/2014 |
| KR | 10-2016-0093179 A | 8/2016 |
| KR | 10-2017-0031846 A | 3/2017 |
| KR | 10-2017-0032172 A | 3/2017 |
| KR | 10-2017-0054654 A | 5/2017 |
| KR | 10-2017-0059864 A | 5/2017 |
| KR | 10-2017-0113926 A | 10/2017 |
| KR | 10-2018-0002099 A | 1/2018 |
| WO | WO 2019155510 A1 | 8/2019 |
| WO | WO 2019167966 A1 | 9/2019 |

\* cited by examiner

DISPLAY APPARATUS AND MULTI DISPLAY APPARATUS INCLUDING THE SAME

CROSS-REFERENCE TO RELATED APPLICATIONS

This application claims the benefit of the Korean Patent Application No. 10-2019-0180105, filed Dec. 31, 2019, which is hereby incorporated by reference as if fully set forth herein.

BACKGROUND

Technical Field

The present disclosure relates to a display apparatus and a multi display apparatus including the same.

Description of the Related Art

Recently, with the advancement of multimedia, the importance of display apparatuses is increasing. Therefore, display apparatuses such as liquid crystal display (LCD) apparatuses, organic light emitting display apparatuses, and light emitting diode display apparatuses are being commercialized.

Display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMP), navigation devices, ultra-mobile personal computers (PCs), mobile phones, smartphones, smartwatches, tablet personal computers (PCs), watch phones, and mobile communication terminals.

Display apparatuses may include a display panel which includes a plurality of pixels including a thin film transistor (TFT) connected to a data line and a gate line, a data driving circuit for supplying a data voltage to the data line, and a gate driving circuit for supplying a scan signal to the gate line. The display panel may include a display area which includes the plurality of pixels for displaying an image and a bezel area which surrounds the display area.

A display apparatus of the related art may need a bezel (or a mechanism) for covering a bezel area disposed at a border (or an edge portion) of a display panel, and due to this, a width of the bezel may increase.

Recently, multi-display apparatuses have been commercialized where a large screen is implemented by arranging a plurality of display apparatuses as a lattice type. One prior art approach in this general field is described in Korean Patent Registration No. 10-1441956 (Title of the Invention: multi-panel display apparatus, Int. Cl.: G02F 1/1335, G02F 1/13357).

BRIEF SUMMARY

The inventors of the present disclosure have recognized that multi-display apparatuses of the related art each include a boundary portion which creates a discontinuity in the entire image displayed by the multi-display apparatuses. For example, the boundary portion such as a seam may be formed between adjacent display apparatuses due to a bezel area or a bezel of each of a plurality of display apparatuses. The boundary portion causes a sense of discontinuity of an image when one image is being displayed on the entire connected screen of the multi-display apparatus, and due to this, user experience of a viewer is reduced.

Accordingly, the inventors of the present disclosure provide a display apparatus and a multi display apparatus including the same that substantially obviates one or more problems due to limitations and disadvantages of the related art.

One or more embodiments of the present disclosure provides a display apparatus in which a bezel is not provided.

One or more embodiments of the present disclosure provides a multi-display apparatus for displaying an image without a sense of discontinuity. The multi-display apparatus may combine each display apparatus that does not have a bezel or a bezel area. Accordingly, the assembled multi-display apparatus may provide a viewer with an image or a stream of images (e.g., video) that does not have a disconnection between adjacent displays.

Additional advantages and features of the disclosure will be set forth in part in the description which follows and in part will become apparent to those having ordinary skill in the art upon examination of the following or may be learned from practice of the disclosure. The technical benefits of the disclosure may be realized and attained by the structure particularly pointed out in the written description and claims hereof as well as the appended drawings.

To achieve these and other advantages, as embodied and broadly described herein, there is provided a display apparatus including a first substrate including a plurality of pixel areas provided in a display portion, a second substrate coupled to the first substrate, and a routing portion disposed on an outer surface of the first substrate and an outer surface of the second substrate, wherein the first substrate includes a dam pattern disposed along an edge of the display portion, a light emitting device layer including a light emitting device disposed on the dam pattern and the plurality of pixel areas, and a trench pattern portion disposed near the dam pattern, and the light emitting device is isolated by the trench pattern portion.

A multi display apparatus according to some embodiments of the present disclosure includes a plurality of display modules arranged in at least one direction of a first direction and a second direction intersecting with the first direction, wherein each of the plurality of display modules includes a first substrate including a plurality of pixel areas provided in a display portion, a second substrate coupled to the first substrate, and a routing portion disposed on an outer surface of the first substrate and an outer surface of the second substrate, wherein the first substrate includes a dam pattern disposed along an edge of the display portion, a light emitting device layer including a light emitting device disposed on the dam pattern and the plurality of pixel areas, and a trench pattern portion disposed near the dam pattern, and the light emitting device is isolated by the trench pattern portion.

A display apparatus according to some embodiments of the present disclosure includes a display portion defined on an outer surface thereof between a first surface and a second surface thereof and the first surface thereof, a second substrate including an outer surface between a front surface and a rear surface thereof, and a coupling member disposed between the second surface of the first substrate and the front surface of the second substrate, wherein a size of the display portion is the same as a total size of the first surface of the first substrate and an end of the display portion is an outer surface of the first substrate.

A display apparatus according to some embodiments of the present disclosure includes a first substrate, and a display area including a plurality of pixels on the first substrate, wherein a size of the display area is substantially the same as a size of the first substrate.

According to some embodiments of the present disclosure, a display apparatus including no bezel and a multi-display apparatus including the display apparatus may be provided.

According to some embodiments of the present disclosure, the display apparatus may include a barrier pattern portion which is disposed at an edge portion of a display portion to insulate a light emitting device, thereby providing a display apparatus and a multi display apparatus including the display apparatus for preventing the light emitting device from being degraded by the penetration of water in a lateral direction and for enhancing the reliability of the light emitting device.

According to some embodiments of the present disclosure, a multi-display apparatus for displaying an image without a sense of discontinuity may be provided.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1A:
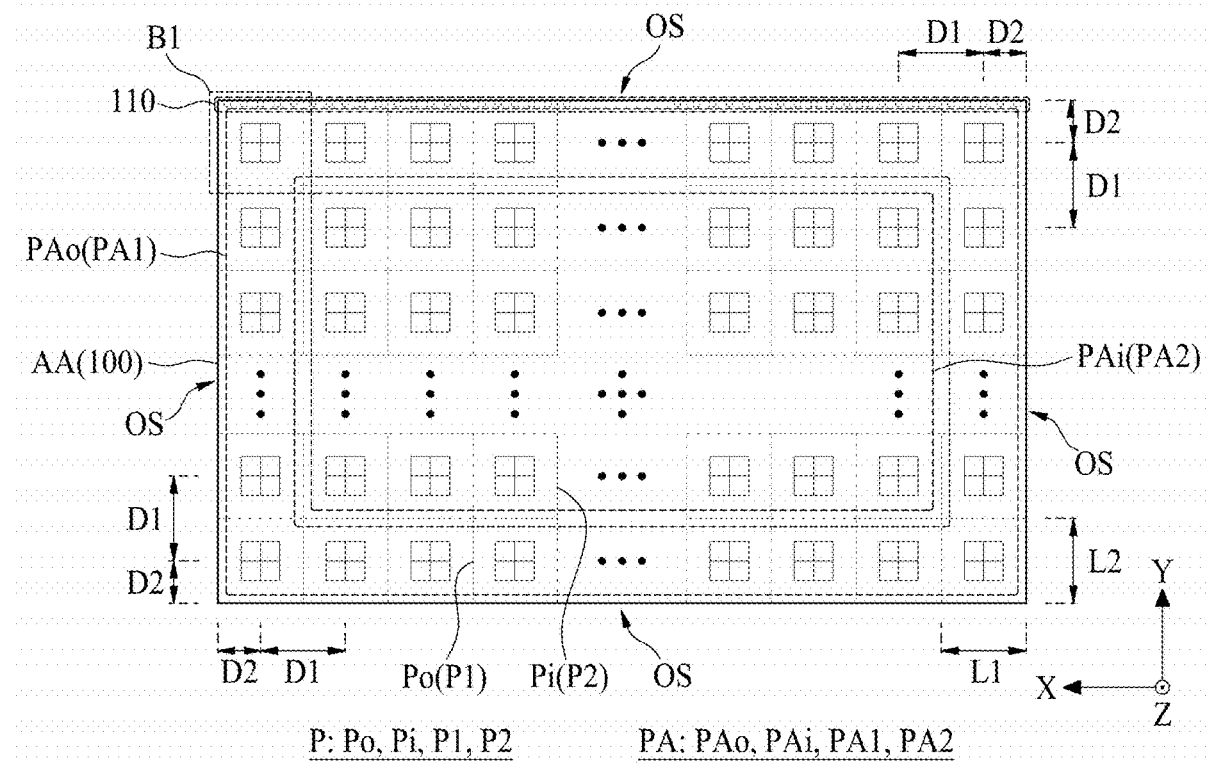
FIGS. 1A and 1B are a diagram illustrating a display apparatus according to the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,', 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam pattern, this may be construed as the encapsulation layer at least partially surrounding the dam pattern. However, in some embodiments, the encapsulation layer may entirely surround the dam pattern. The meaning in which the term "surround" is used herein can further specified based on the associated drawings. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 1B:
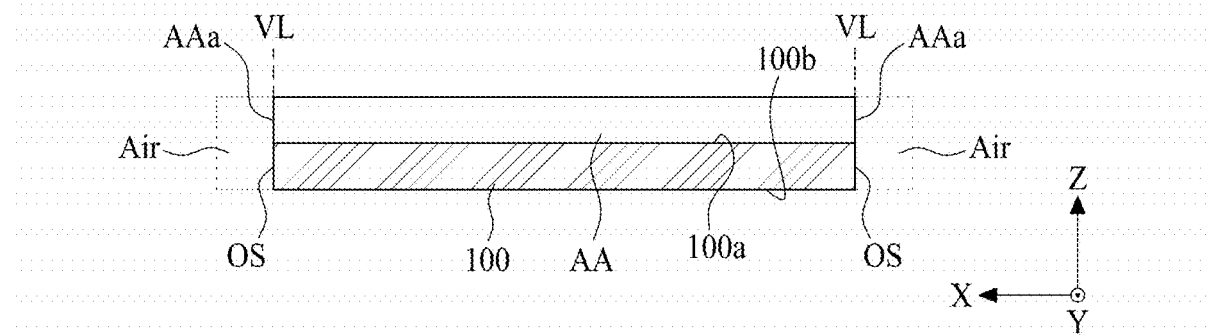

FIG. 1A is a plan view illustrating a display apparatus according to the present disclosure, and FIG. 1B is a lateral view illustrating the display apparatus according to the present disclosure. FIGS. 2A to 2D are enlarged views of a region 'B1' illustrated in FIG. 1A.

Referring to FIGS. 1A and 1B, the display apparatus according to the present disclosure may include a first substrate 100 including a display area AA and a plurality of pixels P which are arranged at a first interval D1 in the display area AA of the first substrate 100.

The first substrate 100 may include a first surface 100a, a second surface 100b, and an outer surface OS. The first surface 100a of the first substrate 100 may be defined as a front surface, a top surface, or an upper surface facing a front surface (or a forward direction) of the display apparatus. The second surface 100b of the first substrate 100 may be defined as a back surface, a rear surface, a bottom surface, or a lower surface facing a back surface (or a rearward direction) of the display apparatus. The outer surface OS of the first substrate 100 may be defined as a side surface, a lateral surface, or a sidewall, which extends along an outer periphery between the first surface 100a and the second surface 100b, faces the lateral surface (or the lateral direction) of the display apparatus, and is exposed to ambient air. In some cases where multiple display apparatuses are connected together, the outer surface OS (or the outermost side surface OS) of a display apparatus positioned in the periphery of the connected multiple display apparatuses may abut ambient air. For example, when the first substrate 100 has a hexahedral structure, the outer surface OS of the first substrate 100 may include side surfaces of the hexahedral structure.

The outer surface OS of the first substrate 100 may be formed in parallel with a thickness direction Z of the display apparatus. For example, the outer surface OS of the first substrate 100 may include a first outer surface which is parallel to a first direction X, a second outer surface which is parallel to the first outer surface, a third outer surface which is parallel to a second direction Y transverse (or crossing) to the first direction X and is connected between one end of the first outer surface and one end of the second outer surface, and a fourth outer surface which is parallel to the third outer surface and is connected between the other end of the first outer surface and the other end of the second outer surface. The first direction X may be a first lengthwise direction (for example, a widthwise direction) of the first substrate 100 or the display apparatus, and the second direction Y may be a second lengthwise direction (for example, a lengthwise direction) of the first substrate 100 or the display apparatus.

The display area AA of the first substrate 100 may be an area which displays an image and may be referred to as a display portion or an active portion. A size of the display area AA may be the same as or substantially the same as the first substrate 100 (or the display apparatus). For example, a size of the display area AA may be the same as a total size of the first surface 100a of the first substrate 100. Therefore, the display area AA may be implemented (or disposed) on the whole front surface of the first substrate 100, and thus, the first substrate 100 may not include an opaque non-display area which is provided along an edge portion of the first surface 100a to surround all of the display area AA. Accordingly, a whole front surface of the display apparatus may implement the display area AA.

An end (or an outermost portion) AAa of the display area AA may overlap or may be substantially aligned with the outer surface OS of the first substrate 100. For example, a lateral surface AAa of the display portion AA may be substantially coplanar with the outer surface OS of the first substrate 100. In other words, the lateral surface of the display portion AA and the outer surface OS of the first substrate 100 may be aligned at substantially the same position. The lateral surface AAa of the display portion AA may not be surrounded by a separate mechanism and may be abutting ambient air. As another example, the lateral surface of the display portion AA may overlap or may be substantially aligned with the outer surface OS of the first substrate 100. That is, all lateral surfaces of the display portion AA may be provided in a structure which directly contacts air without being surrounded by a separate mechanism.

With respect to a thickness direction Z of the first substrate 100, an end AAa of the display area AA and a vertical extension line VL vertically extending from the outer surface OS of the first substrate 100 may overlap each other or may be aligned on substantially the same plane. For example, a first end (or an upper end) of the display area AA may be a first outer surface (or an upper sidewall) of the first substrate 100, a second end (or a lower end) of the display area AA may be a second outer surface (or a lower sidewall) of the first substrate 100, a third end (or a left end) of the display area AA may be a third outer surface (or a left sidewall) of the first substrate 100, and a fourth end (or a right end) of the display area AA may be a fourth outer surface (or a right sidewall) of the first substrate 100. Therefore, the outer surface OS of the first substrate 100 corresponding to the end AAa of the display area AA may be abutting ambient air, and thus, the display apparatus according to the present disclosure may have an air-bezel structure or a non-bezel structure where the end AAa of the display area AA (or the lateral surface of the display portion AA) is surrounded by air instead of an opaque non-display area.

The display area (or the display portion) AA according to an embodiment may include a plurality of pixel areas PA.

The plurality of pixel areas PA according to an embodiment may be arranged (or disposed) at the first interval D1 in the display area AA of the first substrate 100. Two pixel areas PA adjacent to each other in the first direction X and the second direction Y of the first substrate 100 may have the same first interval D1 without an error range of a manufacturing process. The first interval D1 may be a pitch (or a pixel pitch) between two adjacent pixel areas PA. For example, the first interval D1 may be a shortest distance (or a shortest length) between center portions of two adjacent pixel areas PA. Optionally, the pixel pitch may be a size between one end and the other end of a pixel area PA parallel to the first direction X. Also, as another example, the pixel pitch may be referred to as a size between one end and the other end of a pixel area PA parallel to the second direction Y.

Each of the plurality of pixel areas PA may have a first length L1 parallel to the first direction X and a second length L2 parallel to the second direction Y. Each of the first length L1 and the second length L2 may be the same as the first interval D1. For example, the first length L1 may be referred to as a first width, a widthwise length, or a widthwise width. The second length L2 may be referred to as a second width, a lengthwise length, or a lengthwise width. The first length L1 or the second length L2 of the pixel area PA may be referred to as a pixel pitch.

A second interval D2 between each of outermost pixel areas PAo of the plurality of pixel areas PA and the outer surface OS of the first substrate 100 may be half or less of the first interval D1 so that the whole front surface of the first substrate 100 (or the whole front surface of the display apparatus) is referred to as a display area AA. For example, the second interval D2 may be a shortest distance (or a shortest length) between a center portion of the outermost pixel area PAo and the outer surface OS of the first substrate 100.

When the second interval D2 is greater than half of the first interval D1, the first substrate 100 may have a greater size than that of the display area AA by an area between an end of the outermost pixel area PAo (or the end AAa of the display area AA) and the outer surface OS of the first substrate 100, and thus, an area between the end of the outermost pixel area PAo and the outer surface OS of the first substrate 100 may be provided as a non-display area surrounding all of the display area AA. Therefore, in some embodiments, the first substrate 100 may include a bezel area based on a non-display area surrounding all of the display area AA. On the other hand, when the second interval D2 is half or less of the first interval D1, the end of the outermost pixel area PAo (or the end AAa of the display area AA) may overlap the outer surface OS of the first substrate 100 or may be disposed in a space outside the outer surface OS of the first substrate 100, and thus, the display area AA may be implemented (or disposed) on the whole front surface of the first substrate 100.

The display area (or the display portion) AA according to an embodiment may include the outermost pixel area PAo and an internal pixel area (or an inner pixel area) PAi.

The outermost pixel area PAo may be disposed along an edge portion (or a periphery portion) of the first substrate 100 among the plurality of pixel areas PA. For example, the outermost pixel area PAo may be referred to as a first pixel area PA1.

The internal pixel area PAi may be a pixel area other than the outermost pixel area PAo among the plurality of pixel areas PA, or may be surrounded by the outermost pixel area PAo. The internal pixel area PAi may be referred to as a second pixel area PA2.

Each of a plurality of pixels P may be disposed in a corresponding pixel area PA of the plurality of pixel areas PA defined on the first surface 100a of the first substrate 100. For example, the display area AA may be a pixel array which includes the plurality of pixels P arranged on the first substrate 100. The pixels P of the pixel array may be immediately adjacent to one another in the first direction X and the second direction Y. For example, the pixels P of the pixel array may be immediately adjacent to one another in the first direction X and the second direction Y without a separation space (or a spaced apart space). As another example, a plurality of outermost pixels Po of the pixel array may match to overlap one another on the outer surface of the first substrate 100, or may be aligned on the same plane. For example, each pixel P of the pixel array may be arranged on the first substrate 100 to have a pixel pitch D1 in the first direction X and the second direction Y, and an interval D2 between a center portion of each of the outermost pixels Po and the outer surface OS of the first substrate 100 may be half or less of the pixel pitch D1.

The display area (or the display portion) AA according to an embodiment may include an outermost pixel Po and an internal pixel (or an inner pixel) Pi.

The outermost pixel Po may be disposed at the edge portion (or a periphery portion) of the first substrate 100 among the plurality of pixel areas PA. For example, the outermost pixel Po may be referred to as a first pixel P1 disposed in the outermost pixel area PAo.

The internal pixel Pi may be a pixel other than the outermost pixel Po among the plurality of pixels P, or may be disposed to be surrounded by the outermost pixel Po. For example, the internal pixel Pi may be referred to as a second pixel P2. The internal pixel Pi (or the second pixel P2) may be implemented to have a configuration or a structure, which differs from the outermost pixel Po (or the first pixel P1).

The second interval D2 between each of the outermost pixels Po of the plurality of pixels P and the outer surface OS of the first substrate 100 may be half or less of the first interval D1 so that the whole front surface of the first substrate 100 (or the whole front surface of the display apparatus) is referred to as the display area AA. The first interval D1 may be a shortest distance (or a shortest length) between center portions of two adjacent pixels P. The second interval D2 may be a shortest distance (or a shortest length) between a center portion of the outermost pixel Po and the outer surface OS of the first substrate 100.

Figure 2A:
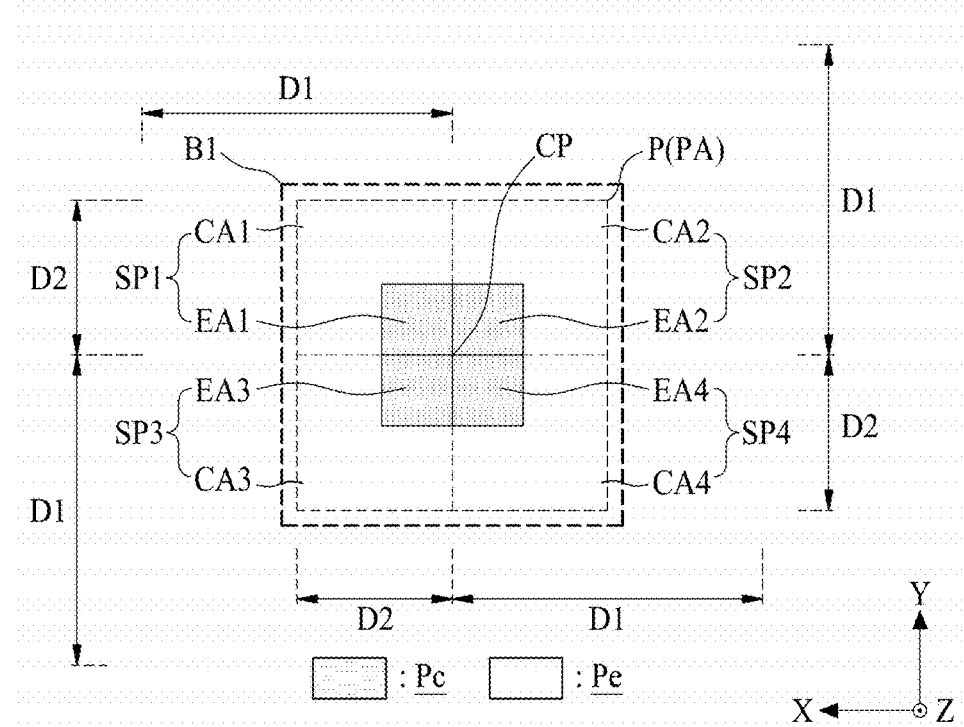
FIGS. 2A to 2D are an enlarged view of a region 'B1' illustrated in FIG. 1.

Each of the plurality of pixels P according to an embodiment, as illustrated in FIG. 2A, may include a center portion Pc including a plurality of emission areas EA and an edge portion (or a periphery portion) Pe surrounding all of the center portion Pc.

A center CP of the center portion Pc may overlap a central portion of the pixel P. The center portion Pc may be referred to as an opening portion or a light emitting portion of the pixel P. In some embodiments, the center CP refers to the central point of the pixel P or the emission area PA.

The center portion Pc according to an embodiment may include first to fourth emission areas EA1 to EA4 which are disposed with respect to the central portion of the pixel P. For example, the first to fourth emission areas EA1 to EA4 may be immediately adjacent to one another in the first direction X and the second direction Y. For example, the first to fourth emission areas EA1 to EA4 may be directly contact to one another in the first direction X and the second direction Y without a separation space (or a spaced apart space).

The first to fourth emission areas EA1 to EA4 may each have a square shape and may be disposed in a 2×2 form or a quad form. According to another embodiment, the first to fourth emission areas EA1 to EA4 may each have a rectangular shape which includes a short side parallel to the first direction X and a long side parallel to the second direction Y, and for example, may be disposed a 1×4 form or a 1×4 stripe form.

The first emission area EA1 may be implemented to emit light of a first color, the second emission area EA2 may be implemented to emit light of a second color, the third emission area EA3 may be implemented to emit light of a third color, and the fourth emission area EA4 may be implemented to emit light of a fourth color. For example, each of the first to fourth colors may be different. For example, the first color may be red, the second color may be blue, the third color may be white, and the fourth color may be green. As another example, some of the first to fourth colors may be the same. For example, the first color may be red, the second color may be first green, the third color may be second green, and the fourth color may be blue.

Figure 2B:
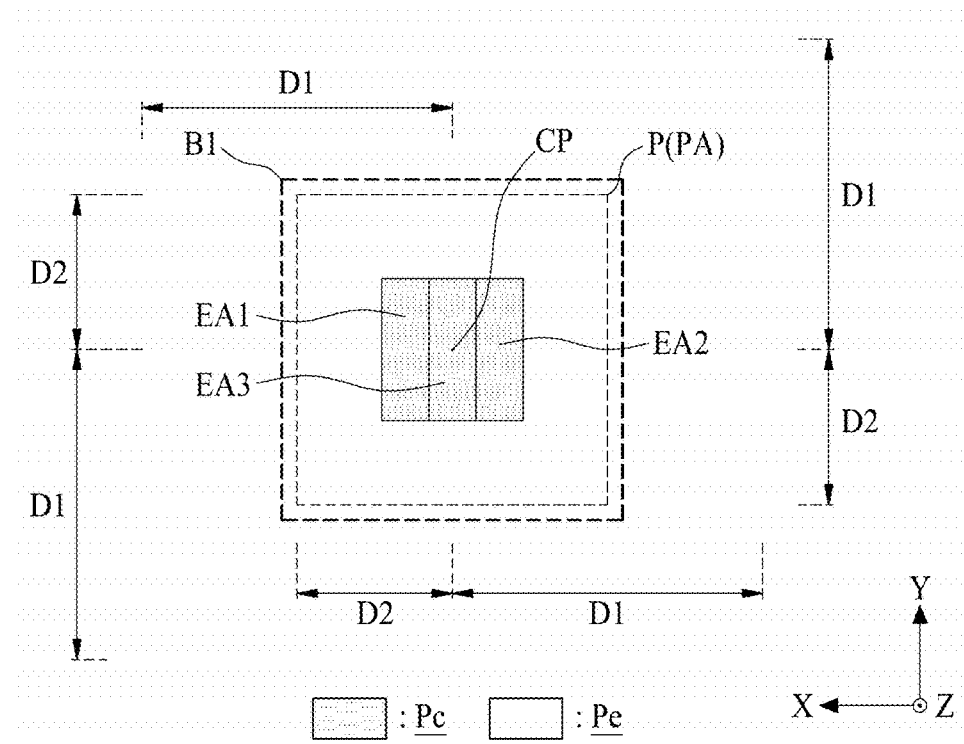

According to another embodiment, as illustrated in FIG. 2B, the center portion Pc may include first to third emission areas EA1 to EA3 which are disposed with respect to the central portion of the pixel P. In this case, the first to third emission areas EA1 to EA3 may each have a rectangular shape which includes a short side parallel to the first direction X and a long side parallel to the second direction Y, and for example, may be disposed a 1×3 form or a 1×3 stripe form. For example, the first color may be red, the second color may be blue, and the third color may be green.

The edge portion Pe may be disposed in the pixel area PA to surround all of the center portion Pc, and thus, may define the center portion Pc of the pixel area PA or the pixel P. The edge portion Pe may have a size which is wider than the center portion Pc. The edge portion Pe may be referred to as a non-opening portion, a non-emission portion, or a pixel separation portion of the pixel P.

Referring again to FIG. 2A, each of a plurality of pixels P according to another embodiment may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA. For example, with respect to the central portion of the pixel P, the first subpixel SP1 may be a left upper area of the pixel area PA, the second subpixel SP2 may be a right upper area of the pixel area PA, the third subpixel SP3 may be a left lower area of the pixel area PA, and the fourth subpixel SP4 may be a right lower area of the pixel area PA.

The first to fourth subpixels SP1 to SP4 may respectively include a plurality of emission areas EA1 to EA4 and a plurality of circuit areas CA1 to CA4.

The emission areas EA1 to EA4 may be disposed at the center portion Pc of the pixel P, or may be disposed close to the central portion of the pixel P.

Each of the circuit areas CA1 to CA4 may be disposed near a corresponding emission area of the emission areas EA1 to EA4. Each of the circuit areas CA1 to CA4 may include a signal line, a power line, and a circuit for allowing a corresponding subpixel to emit light.

The emission areas EA1 to EA4 of the first to fourth subpixels SP1 to SP4 according to an embodiment may have the same size in a corresponding pixel P or pixel area PA.

For example, the emission areas EA1 to EA4 of the first to fourth subpixels SP1 to SP4 may have a uniform quad structure or a non-uniform stripe structure. For example, the emission areas EA1 to EA4 of the first to fourth subpixels SP1 to SP4 may be implemented to have the same size around (or near) the central portion of the pixel P.

Figure 2C:
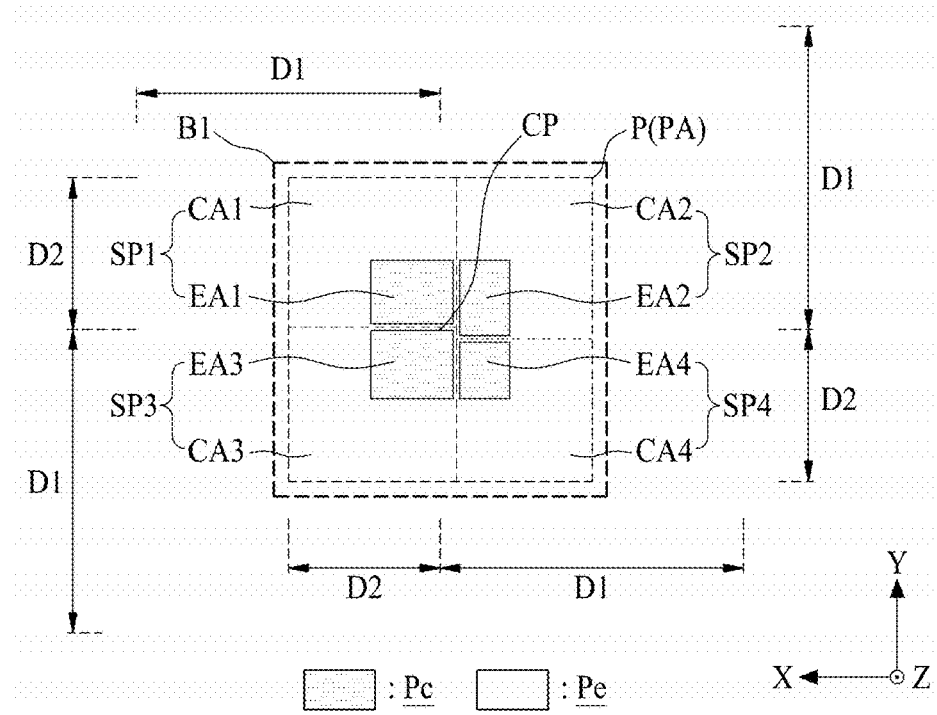

According to another embodiment, as illustrated in FIG. 2C, each of the emission areas EA1 to EA4 of each of the first to fourth subpixels SP1 to SP4 may have different sizes in a corresponding pixel P or pixel area PA. For example, the emission areas EA1 to EA4 of the first to fourth subpixels SP1 to SP4 may have a non-uniform quad structure or a non-uniform stripe structure. For example, the emission areas EA1 to EA4 of the first to fourth subpixels SP1 to SP4 may be implemented to have different sizes around (or near) the central portion of the pixel P.

A size of each of the emission areas EA1 to EA4 of each of the first to fourth subpixels SP1 to SP4 having a non-uniform quad structure (or a non-uniform stripe structure) may be set based on a resolution, emission efficiency, or image quality. For example, when the emission areas EA1 to EA4 have a non-uniform quad structure (or a non-uniform stripe structure), in the emission areas EA1 to EA4 of the first to fourth subpixels SP1 to SP4, the emission area EA4 of a green subpixel SP4 may have a smallest size, and the emission area EA3 of a white subpixel SP3 may have a largest size.

In the first to fourth subpixels SP1 to SP4 according to another embodiment, each of the emission areas EA1 to EA4 may be apart from one another in the first direction X and the second direction Y, but are not limited thereto and may be immediately adjacent to one another.

Figure 2D:
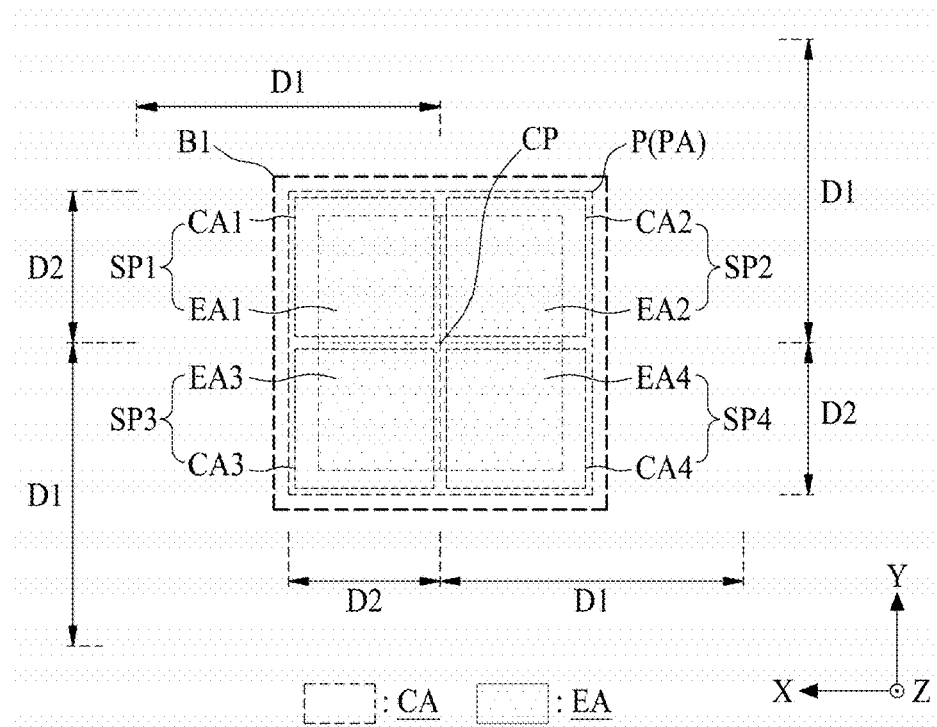

Alternatively, as illustrated in FIG. 2D, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, each of the emission areas EA1 to EA4 of the first to fourth subpixels SP1 to SP4 may be implemented on the first substrate 100 to overlap a corresponding circuit area of the circuit areas CA1 to CA4. In this case, the emission areas EA1 to EA4 may have a size which is equal to or greater than that of the circuit areas CA1 to CA4.

Referring again to FIGS. 1A to 2D, the display apparatus according to the present disclosure may further include a pad part 110 including a plurality of pads which are disposed in the display area AA and are selectively connected to the plurality of pixels P. For example, the pad part 110 may be a first pad part or a front pad part.

The pad part 110 may be included in the outmost pixels Po disposed at a first edge portion of the first surface 100a of the first substrate 100 parallel to the first direction X. That is, the outermost pixels Po disposed at the first edge portion of the first substrate 100 may include at least one of the plurality of pads. Therefore, the plurality of pads may be disposed or included within the display area AA, and thus, a non-display area (or a bezel area) based on the pad part 110 may not be formed or may not be on the first substrate 100. Therefore, the outermost pixel Po (or the first pixel P1) may include the pad part 110, and thus, may be implemented to have a configuration or a structure, which differs from the internal pixel Pi (or the second pixel P2) including no pad part 110.

For example, when the pad part 110 is not provided within the outermost pixels Po and is disposed between the outermost pixels Po and the outer surface OS of the first substrate 100, the first substrate 100 may include a non-display area (or a non-display portion) corresponding to an area where the pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be needed. On the other hand, the pad part 110 according to the present disclosure may be disposed between the emission areas EA1 to EA4 of the outermost pixels Po and the outer surface OS of the first substrate 100 and may be included within the outermost pixels Po, and thus, a non-display area (or a bezel area) based on the pad part 110 may not be formed or may not be between the outermost pixels Po and the outer surface OS of the first substrate 100.

Therefore, the display apparatus according to the present disclosure may have an air-bezel structure where a whole first substrate 100 including the pad part 110 is implemented as the display area AA, and thus, all outer surfaces (or outer surfaces of the display panel) OS of the first substrate 100 aligned with an end of the display area AA are surrounded by air.

Figure 3A:
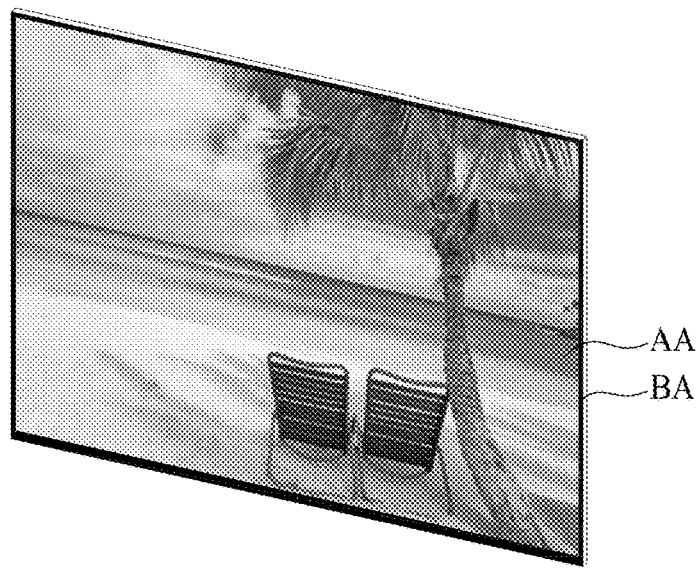
FIGS. 3A and 3B are diagrams illustrating a bezel area of a display apparatus according to a comparative example and an air-bezel of a display apparatus according to the present disclosure.
Figure 3B:
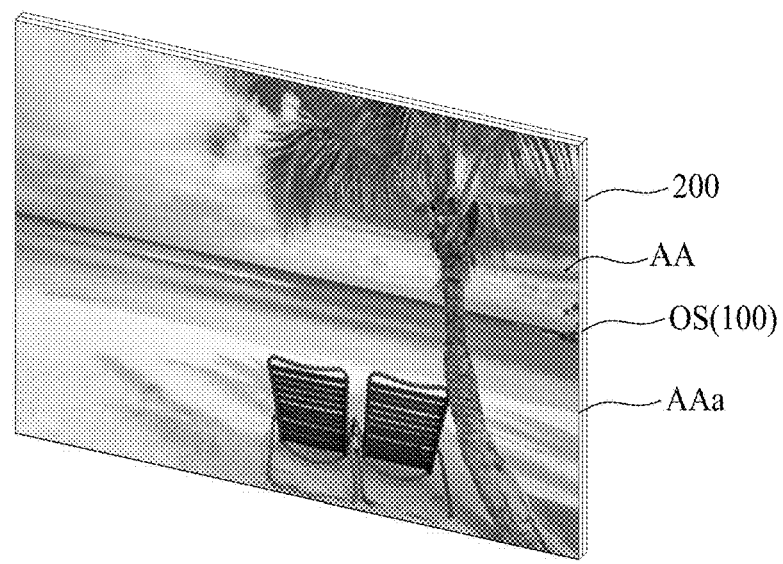

FIGS. 3A and 3B are diagrams illustrating a bezel area of a display apparatus according to a comparative example and an air-bezel of a display apparatus according to the present disclosure.

Referring to FIG. 3A, in the display apparatus according to the comparative example, it may be seen that the display apparatus includes a bezel area (or a non-display area) BA surrounding all of a display area AA displaying an image, and thus, there is a black bezel area BA surrounding the image displayed by the display area AA. In a multi-display apparatus where a plurality of display apparatuses according to the comparative example are arranged as a lattice type, a sense of discontinuity (or discontinuity) of an image occurs in a boundary portion between adjacent display apparatuses due to the bezel area BA of each of the display apparatuses.

As seen in FIG. 3B, in the display apparatus according to the present disclosure, it may be seen that the display apparatus does not include a bezel area (or a non-display area) surrounding all of a display area AA displaying an image and has an air-bezel structure where the display area AA is surrounded by air, and thus, there is no bezel surrounding the image displayed by the display area AA. For example, the outer surface OS of the first substrate 100 may be exposed at the outside of the display apparatus or may be surrounded by air, and the display portion AA implemented to be overlaid on the first substrate 100 may be disposed so that the lateral surface (or the end) AAa of the display portion AA substantially matches the outer surface OS of the first substrate 100. As another example, the lateral surface (or the end) AAa of the display portion AA and the outer surface OS of the first substrate 100 may be substantially disposed and aligned on the same plane in alignment with each other, directly exposed at the outside of the display apparatus, and directly surrounded by air. In a multi-display apparatus where a plurality of display apparatuses according to the present disclosure are arranged as a lattice type, because a bezel area is not provided in each of the display apparatuses, a sense of discontinuity (or discontinuity) of an image does not occur in a boundary portion between adjacent display apparatuses.

Figure 4:
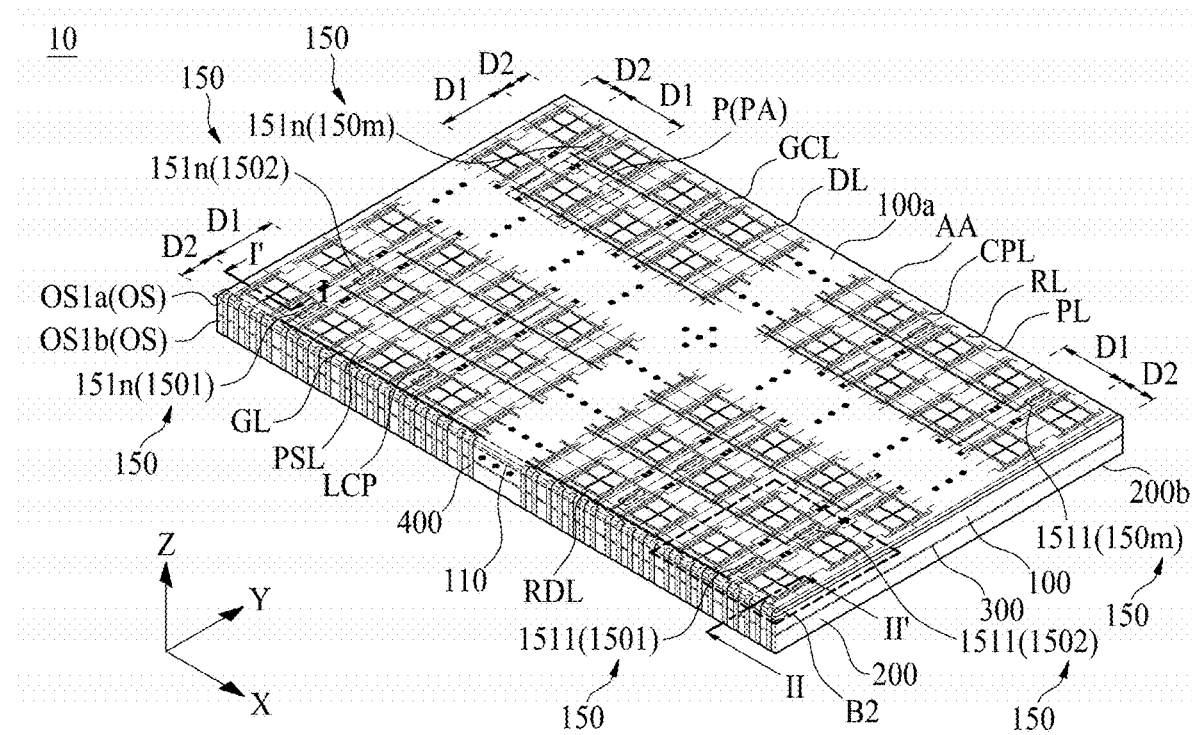
FIG. 4 is a perspective view illustrating a display apparatus according to an embodiment of the present disclosure.
Figure 5:
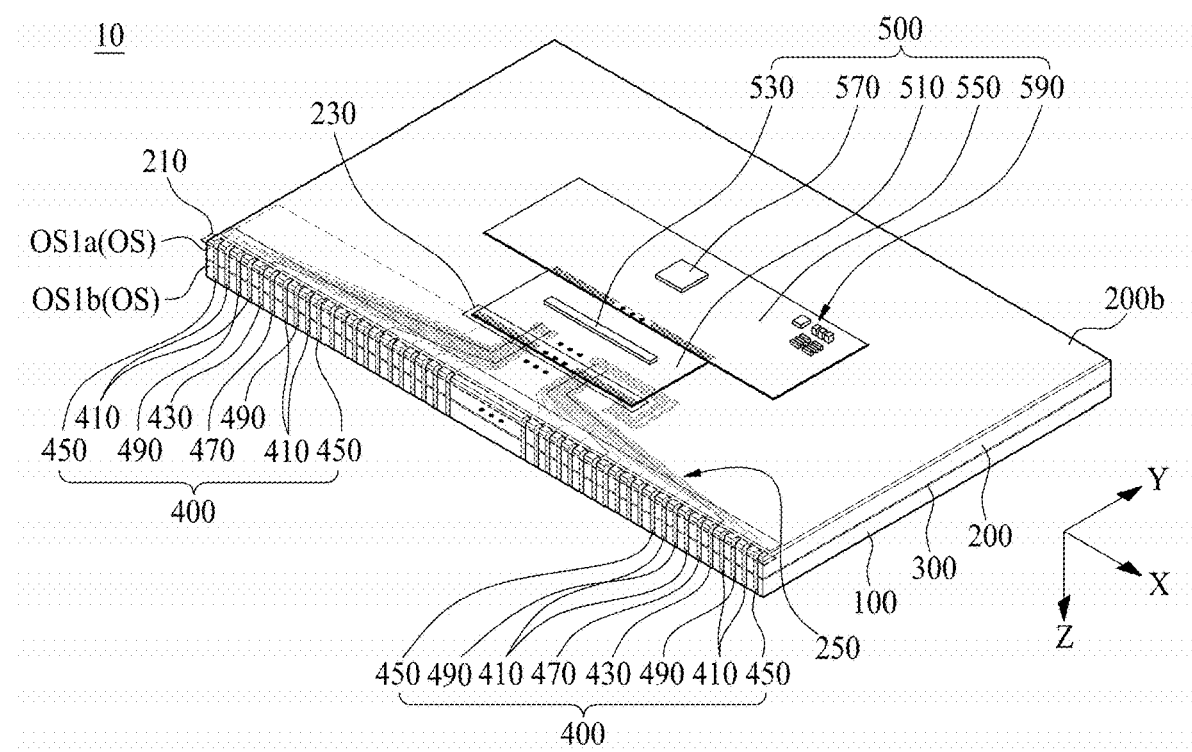
FIG. 5 is a diagram illustrating a rear surface of a display apparatus according to an embodiment of the present disclosure.

FIG. 4 is a perspective view illustrating a display apparatus 10 according to an embodiment of the present disclosure, and FIG. 5 is a diagram illustrating a rear surface of the display apparatus 10 according to an embodiment of the present disclosure.

Referring to FIGS. 4 and 5, the display apparatus 10 according to an embodiment of the present disclosure may include a first substrate 100, a second substrate 200, a coupling member 300, and a routing portion 400 (or may also be referred to as a routing assembly 400).

The first substrate 100 may be referred to as a display substrate, a pixel array substrate, an upper substrate, a front substrate, or a base substrate. The first substrate 100 may include a glass material or a plastic material. The first substrate 100 may be a glass substrate, or may be a thin glass substrate or a plastic substrate, which is bendable or flexible. The first substrate 100 according to an embodiment may be a glass substrate or tempered glass. For example, the tempered glass may include one of sapphire glass and gorilla glass or a stacked glass thereof.

The display apparatus 10 according to an embodiment may include a plurality of pixel driving lines and a plurality of pixels P, which are disposed on the first substrate 100.

The pixel driving lines may be provided on a first surface 100a of the first substrate 100 and may transfer a signal needed for driving (emitting light) of each of the plurality of pixels P. For example, the pixel driving line may include a data line DL, a gate line GL, a pixel driving power line (or a first power line) PL, and a pixel common power line (or a second power line) CPL. Additionally, the pixel driving line may further include a reference power line (or a sensing line) RL, based on driving (or operating) of a pixel circuit disposed in a circuit area of the pixel P.

Each of the pixel driving lines according to an embodiment may be electrically connected to a first pad part 110 disposed at a first edge portion of the first surface 100a of the first substrate 100. The first pad part 110 may be included in a plurality of outermost pixels Po disposed at the first edge portion of the first substrate 100 parallel to a first direction X. Here, the first edge portion of the first surface 100a of the first substrate 100 may include a first outer surface (or one side surface) OS1a of an outer surface OS of the first substrate 100.

The first pad part 110 may include a plurality of first pads which are disposed in parallel with one another in the first direction X on a passivation layer 101d (see FIG. 16) exposed at the first edge portion of the first surface 100a of the first substrate 100.

The plurality of first pads according to an embodiment may be divided (or classified) into a plurality of first data pads, a plurality of first pixel driving power pads, and a plurality of first pixel common power pads. Therefore, the first pad part 110 may include a first data pad part including the plurality of first data pads connected to a plurality of data lines DL, a first pixel driving power pad part including the plurality of first pixel driving power pads connected to the plurality of pixel driving power lines PL, and a first pixel common power pad part including the plurality of first pixel common power pads connected to the plurality of pixel common power lines CPL. Optionally, the first pad part 110 may further include a first reference power pad part including a plurality of first reference power pads connected to a plurality of reference power lines RL.

The plurality of pixels P may be respectively disposed in a plurality of pixel areas PA which are arranged at a first interval (or a first pitch) D1 in the first direction X and a second direction Y. Each of the plurality of pixels P may include a self-light emitting device (or a self-light emitting element), which emits light on the basis of a top emission type based on a signal supplied through corresponding pixel driving line adjacent thereto and irradiates the light onto a portion above the first surface 100a of the first substrate 100, and a pixel circuit which is connected to pixel driving lines adjacent thereto to allow the self-light emitting device to emit light. For example, the pixel circuit may include a driving thin film transistor (TFT) which provides the self-light emitting device with a data current corresponding to a data signal supplied through the data line DL.

A distance between an outermost pixel of the plurality of pixels P and the outer surface OS of the first substrate 100 may be half or less of the first interval D1. A second interval D2 between a center portion of the outermost pixel and the outer surface OS of the first substrate 100 may be half or less of the first interval D1, and thus, a whole front surface of the first substrate 100 (or a whole front surface of the display apparatus) may be implemented as the display area AA. Accordingly, the display apparatus 10 according to the present disclosure may have an air-bezel structure where the display area AA is surrounded by air.

The first substrate 100 may further include a first chamfer which is provided at a corner portion between the first surface 100a and the outer surface OS. The first chamfer may reduce or minimize the damage of the corner portion of the first substrate 100 caused by a physical impact applied from the outside and may prevent a disconnection of the routing portion 400 caused by the corner portion of the first substrate 100. For example, the first chamfer may have a 45-degree angle, but is not limited thereto. The first chamfer may be implemented by a chamfer process using a cutting wheel or a polishing wheel. Accordingly, each of outer surfaces of the first pads of the first pad part 110 disposed to contact the first chamfer may include an inclined surface which is inclined by an angle corresponding to an angle of the first chamfer by removing or polishing a corresponding portion thereof along with the corner portion of the first substrate 100 through the chamfer process. For example, when the first chamfer is formed at an angle of 45 degrees between the outer surface OS and the first surface 100a of the first substrate 100, outer surfaces of the first pads may be formed at an angle of 45 degrees.

The first substrate 100 may further include a gate driving circuit 150 which is disposed in the display area AA.

The gate driving circuit 150 may be disposed in the display area AA to supply a scan signal (or a gate signal) to the pixels P disposed on the first substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line GL.

The gate driving circuit 150 according to an embodiment may be implemented with a shift register including a plurality of stage circuit units 1501 to 150m (where m is an integer of 2 or more). That is, the display apparatus according to the present disclosure may include a shift register which is disposed in the display area AA of the first substrate to supply the scan signal to the pixel P.

Each of the plurality of stage circuit units 1501 to 150m may include a plurality of branch circuits 1511 to 151n (where n is an integer of 2 or more) which are disposed apart from one another in each horizontal line of the first substrate 100 in the first direction X. The plurality of branch circuits 1511 to 151n may include at least one TFT (or a branch TFT) and may be disposed between two adjacent pixels P (or pixel areas PA) within one horizontal line along the first direction X. For example, the branch circuits 1511 to 151n may be disposed one by one between two adjacent pixels P (or pixel areas PA) within one horizontal line along the first direction X. Each of the plurality of stage circuit units 1501 to 150m may generate the scan signal in a predetermined order in response to a gate control signal supplied through the first pad part 110 and may supply the scan signal to the gate line GL. For example, the gate control signal may include a start signal, a plurality of shift clocks, at least one gate driving power, and at least one gate common power.

The first substrate 100 may further include a plurality of gate control line groups GCL which are disposed apart from one another or disposed individually between the plurality of pixels P and are connected to the gate driving circuit 150. Each of the gate control line groups GCL may be selectively connected to the plurality of branch circuits 1511 to 151n respectively disposed in the plurality of stage circuit units 1501 to 150m. For example, the plurality of gate control line groups GCL may be distributedly disposed between the plurality of pixels P.

The gate control line group GCL according to an embodiment may include a start signal line, a plurality of shift clock lines, at least one gate driving power line, and at least one gate common power line. The plurality of shift clock lines according to an embodiment may be divided (or classified) into a plurality of scan clock lines and a plurality of carry clock lines. Here, the plurality of carry clock lines may be omitted.

The first pad part 110 may further include a first gate pad part including a plurality of first gate pads connected to the gate control line group GCL.

A plurality of first gate pads according to an embodiment may be divided (classified) into a first start signal pad connected to the start signal line, a plurality of first shift clock pads respectively connected to the plurality of shift clock lines, at least one first gate driving power pad connected to at least one gate driving power line, and at least one first gate common power pad connected to at least one gate common power line. Therefore, the first gate pad part may include a first start signal pad, a plurality of first shift clock pads, at least one first gate driving power pad, and at least one first gate common power pad. The plurality of first shift clock pads according to an embodiment may include a plurality of first scan clock pads respectively connected to the plurality of scan clock lines and a plurality of first carry clock pads respectively connected to the plurality of carry clock lines. Here, the plurality of first carry clock pads may be omitted.

The second substrate 200 may be referred to as a wiring substrate, a link substrate, a lower substrate, a rear substrate, or link glass. The second substrate 200 may include a glass material or a plastic material. The second substrate 200 may be a glass substrate, or may be a thin glass substrate or a plastic substrate, which is bendable or flexible. The second substrate 200 according to an embodiment may include the same material as that of the first substrate 100. For example, a size of the second substrate 200 may be the same as or substantially the same as that of the first substrate 100.

The second substrate 200 may be coupled (or connected) to a second surface 100b of the first substrate 100 by using the coupling member 300. The second substrate 200 may include a front surface which faces the second surface 100b of the first substrate 100 or is coupled to the coupling member 300, a rear surface (or a back surface) 200b opposite to the front surface, and an outer surface OS between the front surface and the rear surface. The second substrate 200 may transfer a signal to the pixel driving lines and may increase the stiffness of the first substrate 100.

The display apparatus 10 according to an embodiment may further include a second pad part 210 disposed on the second substrate 200.

The second pad part 210 may be disposed at a first edge portion of a rear surface 200b of the second substrate 200 overlapping the first pad part 110 disposed on the first substrate 100. The first edge portion of the rear surface 200b of the second substrate 200 may include a first outer surface (or one surface) OS1b of the outer surface OS of the second substrate 200.

The second pad part 210 may include a plurality of second pads which are arranged at a certain interval in the first direction X to respectively overlap the pads of the first pad part 110.

The plurality of second pads according to an embodiment may be divided (or classified) into a plurality of second data pads, a plurality of second pixel driving power pads, and a plurality of second pixel common power pads. Therefore, the second pad part 210 may include a second data pad part including the plurality of second data pads, a second gate pad part including the plurality of second gate pads, a second pixel driving power pad part including the plurality of second pixel driving power pads, and a second pixel common power pad part including the plurality of second pixel common power pads. Optionally, the second pad part 210 may further include a second reference power pad part including a plurality of second reference power pads.

A plurality of second gate pads according to an embodiment may be divided (classified) into a second start signal pad, a plurality of second shift clock pads, at least one second gate driving power pad, and at least one second gate common power pad. Therefore, the second gate pad part may include a second start signal pad, a plurality of second shift clock pads, at least one second gate driving power pad, and at least one second gate common power pad. The plurality of second shift clock pads according to an embodiment may be divided (classified) into a plurality of second scan clock pads and a plurality of second carry clock pads. Here, the plurality of second carry clock pads may be omitted.

The display apparatus 10 according to an embodiment may further include a third pad part (or an input pad part) 230 and a link line portion 250 which are disposed on the second substrate 200.

The third pad part 230 may be disposed on the rear surface 200b of the second substrate 200. For example, the third pad part 230 may be disposed at a middle portion adjacent to the first edge portion among the rear surface 200b of the second substrate 200. The third pad part 230 according to an embodiment may include a plurality of third pads (or input pads) which are apart from one another by a certain interval.

The link line portion 250 may be disposed between the second pad part 210 and the third pad part 230 on the rear surface 200b of the second substrate 200. For example, the link line portion 250 may include a plurality of link lines which individually (or respectively) connect the second pads of the second pad part 210 to the third pads of the third pad part 230.

The second substrate 200 may further include a second chamfer which is provided at a corner portion between the rear surface 200b and the outer surface OS. The second chamfer may reduce or minimize the damage of the corner portion of the second substrate 200 caused by a physical impact applied from the outside and may prevent a disconnection of the routing portion 400 caused by the corner portion of the second substrate 200. For example, the second chamfer may have a 45-degree angle, but is not limited thereto.

The coupling member 300 may be disposed between the first substrate 100 and the second substrate 200. The first substrate 100 and the second substrate 200 may be opposite-bonded to each other by the coupling member 300. For example, the second surface 100b of the first substrate 100 may be coupled to one surface of the coupling member 300, and the front surface of the second substrate 200 may be coupled to the other surface of coupling member 300. Accordingly, the first substrate 100 and the second substrate 200 opposite-bonded (or coupled) to each other by the coupling member 300 may be referred to as a display panel.

The routing portion 400 may be disposed to surround the outer surface OS of the first substrate 100 and the outer surface OS of the second substrate 200. The routing portion 400 according to an embodiment may include a plurality of routing lines which are disposed on each of the first outer surface (or one surface) OS1a of the outer surface OS of the first substrate 100 and the first outer surface (or one surface) OS1b of the outer surface OS of the second substrate 200. Each of the plurality of routing lines may be formed to surround each of the first outer surface OS1a of the first substrate 100 and the first outer surface OS1b of the second substrate 200. For example, the plurality of routing lines may be respectively (or individually) connected to the pixel driving lines disposed on the first substrate 100 and may be directly connected to the pixel driving lines. As another example, the plurality of routing lines may be respectively (or individually) connected to the pixel driving lines through the pad of the first pad part 110 disposed on the first substrate 100, and in this case, a resistance of each of the pixel driving lines and/or the voltage drop (or IR drop) of a signal applied to the pixel driving lines may be reduced due to an increase in size based on a pad.

The plurality of routing lines according to an embodiment may be divided (classified) into a plurality of data routing lines, a plurality of gate routing lines, a plurality of pixel driving power routing lines, and a plurality of pixel common power routing lines.

According to another embodiment, the routing portion 400 may include a data routing portion, a gate routing portion, a pixel driving power routing portion, and a pixel common power routing portion.

The data routing portion (or a first routing portion) may electrically connect the first data pad part of the first pad part 110 to the second data pad part of the second pad part 210. The data routing portion according to an embodiment may include a plurality of data routing lines 410. The plurality of data routing lines (or a first routing line) 410 may individually (or respectively) connect the plurality of first data pads, disposed in the first pad part 110, to the plurality of second data pads disposed in the second pad part 210.

The gate routing portion (or a second routing portion) may electrically connect the first gate pad part of the first pad part 110 to the second gate pad part of the second pad part 210. The gate routing portion according to an embodiment may include a plurality of gate routing lines 430. The plurality of gate routing lines (or a second routing line) 430 may individually (or respectively) connect the plurality of first gate pads, disposed in the first pad part 110, to the plurality of second gate pads disposed in the second pad part 210.

The plurality of gate routing lines 430 according to an embodiment may be divided (classified) into a start signal routing line, a plurality of shift clock routing lines, at least one gate driving power routing line, and at least one gate common power routing line. Therefore, the gate routing portion may include a start signal routing line, a plurality of shift clock routing lines, at least one gate driving power routing line, and at least one gate common power routing line. The plurality of shift clock routing lines according to an embodiment may be divided (classified) into a plurality of scan clock routing lines and a plurality of carry clock routing lines. Here, the plurality of carry clock routing lines may be omitted.

The start signal routing line may electrically connect a first start signal pad, disposed in the first pad part 110, to a second start signal pad disposed in the second pad part 210.

The plurality of shift clock routing lines may individually (or respectively) connect the plurality of first shift clock pads, disposed in the first pad part 110, to the plurality of second shift clock pads disposed in the second pad part 210.

The plurality of scan clock routing lines among the plurality of shift clock routing lines according to an embodiment may individually (or respectively) connect the plurality of first scan clock pads, disposed in the first pad part 110, to the plurality of second scan clock pads disposed in the second pad part 210.

The plurality of carry clock routing lines among the plurality of shift clock routing lines according to an embodiment may individually (or respectively) connect the plurality of first carry clock pads, disposed in the first pad part 110, to the plurality of second carry clock pads disposed in the second pad part 210.

The at least one gate driving power routing line may electrically connect the at least one first gate driving power pad, disposed in the first pad part 110, to the at least one second gate driving power pad disposed in the second pad part 210.

The at least one gate common power routing line may electrically connect the at least one first gate common power pad, disposed in the first pad part 110, to the at least one second gate common power pad disposed in the second pad part 210.

The pixel driving power routing portion (or a third routing portion) may electrically connect the first pixel driving power pad part of the first pad part 110 to the second pixel driving power pad part of the second pad part 210. The pixel driving power routing portion according to an embodiment may include a plurality of pixel driving power routing lines 450. The plurality of pixel driving power routing lines (or a third routing line) 450 may individually (or respectively) connect the plurality of first pixel driving power pads, disposed in the first pad part 110, to the plurality of second pixel driving power pads disposed in the second pad part 210.

The pixel common power routing portion (or a fourth routing portion) may electrically connect the first pixel common power pad part of the first pad part 110 to the second pixel common power pad part of the second pad part 210. The pixel common power routing portion according to an embodiment may include a plurality of pixel common power routing lines 470. The plurality of pixel common power routing lines (or a fourth routing line) 470 may individually (or respectively) connect the plurality of first pixel common power pads, disposed in the first pad part 110, to the plurality of second pixel common power pads disposed in the second pad part 210.

The routing portion 400 according to an embodiment may further include a reference power routing portion.

The reference power routing portion (or a fifth routing portion) may electrically connect the first reference power pad part of the first pad part 110 to the second reference power pad part of the second pad part 210. The reference power routing portion according to an embodiment may include a plurality of reference power routing lines 490. The plurality of reference power routing lines (or a fifth routing line) 490 may individually (or respectively) connect the plurality of first reference power pads, disposed in the first pad part 110, to the plurality of second reference power pads disposed in the second pad part 210.

The display apparatus 10 according to an embodiment of the present disclosure may further include a driving circuit unit 500.

The driving circuit unit 500 may drive (or emit light) the pixels P disposed on the first substrate 100 on the basis of digital video data and a timing synchronization signal supplied from a display driving system to allow the display area AA to display an image corresponding to image data. The driving circuit unit 500 may be connected to the third pad part 230 disposed on the rear surface 200b of the second substrate 200 and may output, to the third pad part 230, a data signal, a gate control signal, and a driving power for driving (or emitting light) the pixels P disposed on the first substrate 100. For example, the driving circuit unit 500 may have a size which is less than that of the second substrate 200, and thus, may be covered by the second substrate 200 and may not be exposed at the outer surface of the second substrate 200 or the outer surface of the first substrate 100.

The driving circuit unit 500 according to an embodiment may include a flexible circuit film 510, a driving integrated circuit (IC) 530, a printed circuit board (PCB) 550, and a timing controller 570.

The flexible circuit film 510 may be connected to the third pad part 230 disposed on the rear surface 200b of the second substrate 200. The flexible circuit film 510 according to an embodiment may be a tape carrier package (TCP) or a chip on film (COF). For example, one edge portion (or an output bonding portion) of the flexible circuit film 510 may be attached on the third pad part 230 disposed on the second substrate 200 through a film attachment process using an anisotropic conductive film. The other edge portion (or an input bonding portion) of the flexible circuit film 510 may be attached on the PCB 550 through a film attachment process using an anisotropic conductive film.

The driving IC 530 may be mounted on the flexible circuit film 510. The driving IC 530 may receive subpixel data and a data control signal provided from the timing controller 570, and convert the subpixel data into an analog data signal on the basis of the data control signal to supply the analog data signal to a corresponding data line DL. For example, the driving IC 530 may be a data driving IC or a source driving IC.

The driving IC 530 according to an embodiment may generate a plurality of grayscale voltages by using a plurality of reference gamma voltages provided from the PCB 550 and may select a grayscale voltage corresponding to the subpixel data from among the plurality of grayscale voltages to output a data signal. The data signal may be supplied to a corresponding data line DL via an output bonding portion of the flexible circuit film 510, the third pad part 230, the link line portion 250, the second pad part 210, the routing portion 400, and the first pad part 110.

Moreover, the driving IC 530 may generate and output a pixel driving power and a pixel common power needed for driving (or emitting light) of the pixels P by using the plurality of reference gamma voltages. For example, the driving IC 530 may select and output, as the pixel driving power and the pixel common power, a predetermined reference gamma voltage or a predetermined grayscale voltage from among the plurality of reference gamma voltages or a plurality of grayscale voltages.

Additionally, the driving IC 530 may additionally generate and output a reference power on the basis of driving (or operating) of a pixel circuit disposed in the circuit area of the pixel P. For example, the driving IC 530 may select and output, as a reference voltage, a predetermined reference gamma voltage or a predetermined grayscale voltage from among the plurality of reference gamma voltages or the plurality of grayscale voltages.

The pixel driving power, the pixel common power, and the reference power may have different voltage levels. The pixel driving power, the pixel common power, and the reference power may be respectively supplied to a corresponding pixel driving power line PL, a corresponding pixel common power line CPL, and a corresponding reference power line RL via an output bonding portion of the flexible circuit film 510, the third pad part 230, the link line portion 250, the second pad part 210, the routing portion 400, and the first pad part 110.

The driving IC 530 may sense a characteristic value of a driving TFT disposed in the pixel P through the plurality of reference power lines RL disposed on the first substrate 100, generate sensing raw data corresponding to a sensing value, and provide the sensing raw data to the timing controller 570.

The PCB 550 may be connected to the other edge portion of the flexible circuit film 510. The PCB 550 may transfer a signal and power between elements of the driving circuit unit 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data on the basis of the timing synchronization signal to generate pixel data matching a pixel arrangement structure disposed in the display area AA and may provide the generated pixel data to the driving IC 530.

According to an embodiment, when the pixel P includes a white subpixel SP, the timing controller 570 may extract white pixel data on the basis of the digital video data (e.g., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to the driving IC 530. For example, the timing controller 570 may convert red, green, and blue input data into four-color (for example, red, green, blue, and white) data on the basis of a data conversion method disclosed in Korean Patent Publication No. 10-2013-0060476 or 10-2013-0030598.

The timing controller 570 may generate each of the data control signal and the gate control signal on the basis of the timing synchronization signal, control a driving timing of the driving IC 530 on the basis of the data control signal, and control a driving timing of the gate driving circuit 150 on the basis of the gate control signal. For example, the timing synchronization signal may include a vertical synchronization signal, a horizontal synchronization signal, a data enable signal, and a main clock (or a dot clock).

The data control signal according to an embodiment may include a source start pulse, a source shift clock, and a source output signal. The data control signal may be supplied to the driving IC 530 via the input bonding portion of the flexible circuit film 510 and the flexible circuit film 510.

The gate control signal according to an embodiment may include a start signal (or a gate start pulse), a plurality of shift clocks, a forward driving signal, and a reverse driving signal. In this case, the plurality of shift clocks may include a plurality of scan clocks where phases thereof are sequentially shifted and a plurality of carry clocks where phases thereof are sequentially shifted. Additionally, the gate control signal according to an embodiment may further include an external sensing line selection signal, an external sensing reset signal, and an external sensing control signal for sensing a characteristic value of the driving TFT disposed in the pixel P. The gate control signal may be supplied to the gate driving circuit 150 via the input bonding portion of the flexible circuit film 510, the flexible circuit film 510, the output bonding portion of the flexible circuit film 510, the third pad part 230, the link line portion 250, the second pad part 210, the routing portion 400, and the first pad part 110.

The timing controller 570 may drive each of the driving IC 530 and the gate driving circuit 150 on the basis of an external sensing mode during a predetermined external sensing period, generate compensation data for compensating for a characteristic variation of the driving TFT of each pixel P on the basis of the sensing raw data provided from the driving IC 530, and modulate pixel data on the basis of the generated compensation data. For example, the timing controller 570 may drive each of the driving IC 530 and the gate driving circuit 150 on the basis of the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each pixel P, provided from the driving IC 530, in a storage circuit on the basis of the external sensing mode. Also, in a display mode, the timing controller 570 may correct pixel data which is to be supplied to each pixel, based on the sensing raw data stored in the storage circuit and may provide corrected pixel data to the driving IC 530. Here, sensing raw data of each pixel may include sequential variation information about each of a driving TFT and a self-light emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel SP, thereby minimizing or preventing the degradation in image quality caused by a characteristic value deviation of driving TFTs of a plurality of subpixels SP. The external sensing mode of a display apparatus may be technology known to those skilled in the art, and thus, its detailed description is omitted. For example, the display apparatus according to the present disclosure may sense a characteristic value of the driving TFT disposed in each subpixel P on the basis of a sensing mode disclosed in Korean Patent Publication No. 10-2016-0093179, 10-2017-0054654, or 10-2018-0002099.

The driving circuit unit 500 according to an embodiment may further include a power circuit unit 590.

The power circuit unit 590 may be mounted on the PCB 550 and may generate various source voltages needed for displaying an image on the pixels P by using an input power supplied from the outside to provide the generated source voltage to a corresponding circuit. For example, the power circuit unit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. The gate driving power and the gate common power may have different voltage levels.

Each of the plurality of reference gamma voltages may be supplied to the driving IC 530 via the input bonding portion of the flexible circuit film 510 and the flexible circuit film 510. Each of the at least one gate driving power and the at least one gate common power may be supplied to the gate driving circuit 150 via the input bonding portion of the flexible circuit film 510, the flexible circuit film 510, the output bonding portion of the flexible circuit film 510, the third pad part 230, the link line portion 250, the second pad part 210, the routing portion 400, and the first pad part 110.

Figure 6:
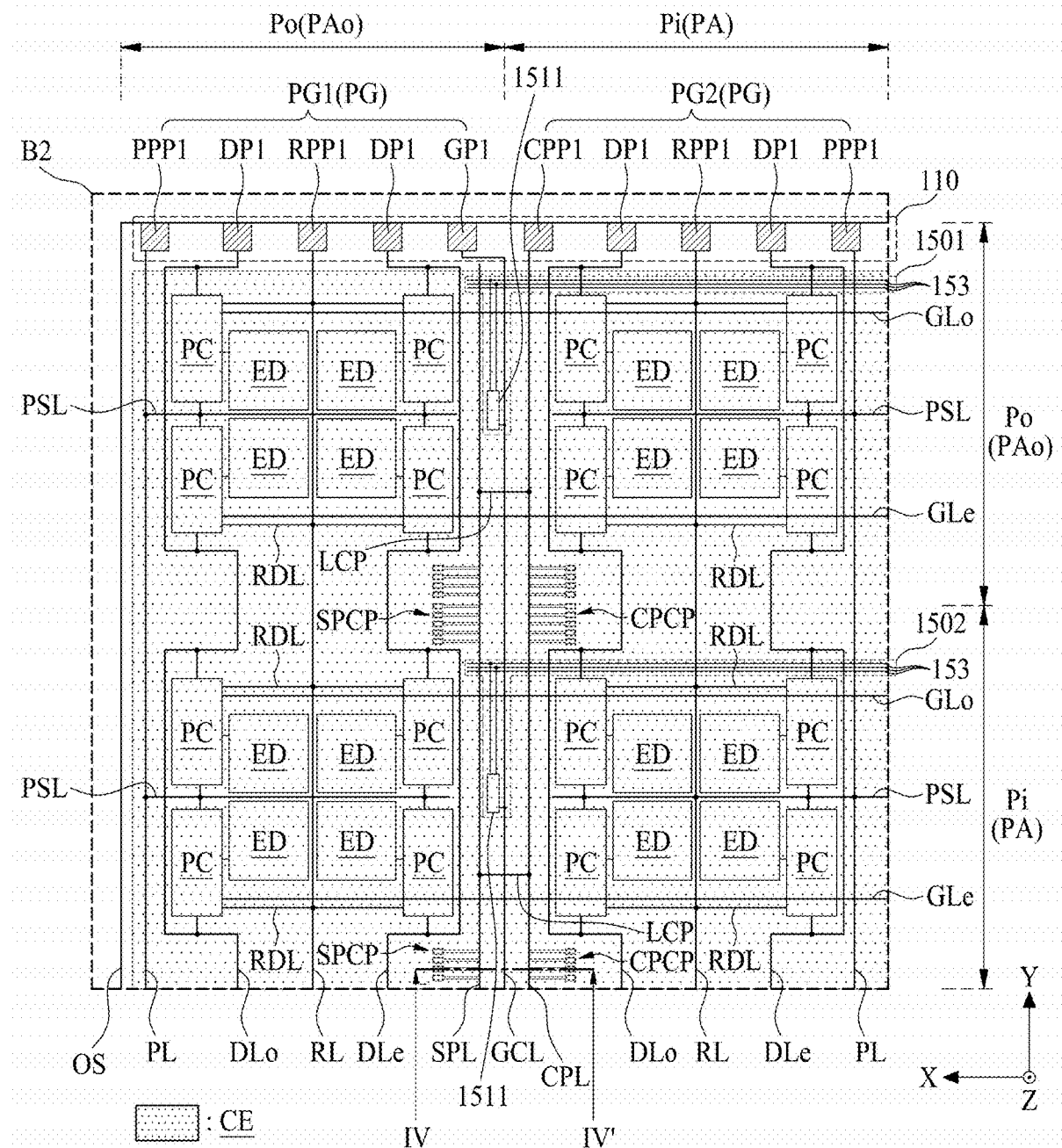
FIG. 6 is an enlarged view of a region 'B2' illustrated in FIG. 4.

FIG. 6 is an enlarged view of a region 'B2' illustrated in FIG. 4 and is diagram for describing pixels disposed on a first substrate.

Referring to FIGS. 4 to 6, a first substrate 100 according to the present disclosure may include a plurality of data lines DLo and DLe, a plurality of gate lines GLo and GLe, a plurality of pixel driving power lines PL, a plurality of pixel common power lines CPL, a plurality of pixels P, a common electrode CE, a plurality of common power contact portions CPCP, a gate control line group GCL, a gate driving circuit 150, and a first pad part 110.

The plurality of data lines DLo and DLe may extend long in a second direction Y and may be disposed apart from one another by a predetermined interval in a display area AA of the first substrate 100 in a first direction X. For example, in the plurality of data lines DLo and DLe, an odd-numbered data line DLo may be disposed at a first edge portion of each of a plurality of pixel areas PA arranged on the first substrate 100 in the second direction Y, and an even-numbered data line DLe may be disposed at a second edge portion of each of the plurality of pixel areas PA arranged on the first substrate 100 in the second direction Y. Here, with respect to the first direction X, the first edge portion of each of the plurality of pixel areas PA may be a left edge portion of a corresponding pixel area PA, and the second edge portion of each of the plurality of pixel areas PA may be a right edge portion of a corresponding pixel area PA.

The plurality of gate lines GLo and GLe may extend long in the first direction X and may be disposed apart from one another by a predetermined interval in the display area AA of the first substrate 100 in the second direction Y. For example, in the plurality of gate lines GLo and GLe, an odd-numbered gate line GLo may be disposed at a third edge portion of each of the plurality of pixel areas PA arranged on the first substrate 100 in the first direction X, and an even-numbered gate line GLe may be disposed at a fourth edge portion of each of the plurality of pixel areas PA arranged on the first substrate 100 in the first direction X. Here, with respect to the second direction Y, the third edge portion of each of the plurality of pixel areas PA may be an upper edge portion of a corresponding pixel area PA, and the fourth edge portion of each of the plurality of pixel areas PA may be a lower edge portion of a corresponding pixel area PA.

The plurality of pixel driving power lines PL may extend long in the second direction Y and may be disposed apart from one another by a predetermined interval in the display area AA of the first substrate 100 in the first direction X. For example, in the plurality of pixel driving power lines PL, an odd-numbered pixel driving power line PL may be disposed at a first edge portion of an odd-numbered pixel area PA with respect to the first direction X, and an even-numbered pixel driving power line PL may be disposed at a second edge portion of an even-numbered pixel area PA with respect to the first direction X.

Two adjacent pixel driving power lines PL of the plurality of pixel driving power lines PL may be connected to a plurality of power sharing lines PSL disposed in each of pixel areas PA arranged in the second direction Y. For example, the plurality of pixel driving power lines PL may be electrically connected to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the display apparatus 10 according to the present disclosure may prevent or reduce or minimize the degradation in image quality caused by a deviation of the pixel driving power supplied to each of the pixels P.

Each of the plurality of power sharing lines PSL may branch from an adjacent pixel driving power line PL in parallel with the first direction X and may be disposed in a middle region of each pixel area PA.

The plurality of pixel common power lines CPL may extend long in the second direction Y and may be disposed apart from one another by a predetermined interval in the display area AA of the first substrate 100 in the first direction X. For example, each of the plurality of pixel common power lines CPL may be disposed at a first edge portion of an even-numbered pixel area PA with respect to the first direction X.

A plurality of pixels P may be respectively disposed in the plurality of pixel areas PA which is defined to have an equal size in the display area AA of the first substrate 100.

Each of the plurality of pixels P may include at least three subpixels. For example, as illustrated in FIG. 2, each of the plurality of pixels P may include first to fourth subpixels SP1 to SP4.

Referring to FIGS. 2 and 6, each of the first to fourth subpixels SP1 to SP4 may include a pixel circuit PC and a light emitting device ED.

The pixel circuit PC according to an embodiment may be disposed in a circuit area CA of the pixel area PA and may be connected to gate lines GLo and GLe adjacent thereto, data lines DLo and DLe adjacent thereto, and the pixel driving power line PL. For example, a pixel circuit PC disposed in a first subpixel SP1 may be connected to an odd-numbered data line DLo and an odd-numbered gate line GLo, a pixel circuit PC disposed in a second subpixel SP2 may be connected to an even-numbered data line DLe and an odd-numbered gate line GLo, a pixel circuit PC disposed in a third subpixel SP3 may be connected to an odd-numbered data line DLo and an even-numbered gate line GLe, and a pixel circuit PC disposed in a fourth subpixel SP4 may be connected to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device ED on the basis of a sampled data signal. For example, the pixel circuit PC may sample a data signal by using at least two TFTs and at least one capacitor and may control a current flowing in the light emitting device ED on the basis of a sampled data signal.

The pixel circuit PC of each of the first to fourth subpixels SP1 to SP4 may be implemented as a pixel driving chip through a semiconductor manufacturing process, disposed in a circuit area CA of a corresponding pixel area PA, and connected to gate lines GLo and GLe adjacent thereto, data lines DLo and DLe adjacent thereto, and the pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from corresponding data lines DLo and DLe in response to a scan signal supplied from corresponding gate lines GLo and GLe and may control a current flowing from the pixel driving power line PL to the light emitting device ED on the basis of a sampled data signal.

The light emitting device ED may be disposed in an emission area EA of the pixel area PA, electrically connected to the pixel circuit PC, and electrically connected to the common electrode CE. The light emitting device ED may emit light with a current flowing from the pixel circuit PC to the common electrode CE. For example, the light emitting device ED may emit light on the basis of a top emission type and may irradiate the light onto a portion above a first surface of a first substrate 100, but is not limited thereto.

The light emitting device ED according to an embodiment may include a self-light emitting device. For example, the light emitting device ED may include an organic light emitting device or an inorganic light emitting device. The inorganic light emitting device may include a semiconductor light emitting diode, a micro light emitting diode, or a quantum dot light emitting diode. For example, when the light emitting device ED is the inorganic light emitting device, the light emitting device ED may have a scale of 1 μm to 100 μm, but is not limited thereto.

The light emitting device ED according to an embodiment may emit one light of red light, green light, blue light, and white light. For example, the light emitting device ED of each of the first to fourth subpixels SP1 to SP4 may be implemented to emit white light, but is not limited thereto.

Referring again to FIGS. 4 to 6, the common electrode CE may be disposed in a display area AA of the first substrate 100 and may be electrically connected to the light emitting device ED of each of the plurality of pixels P. For example, the common electrode CE may be disposed in a region, other than a first pad part 110 disposed in the first substrate 100, of the display area AA of the first substrate 100.

The common electrode CE according to an embodiment may include a transparent conductive material which transmits light emitted from the light emitting device ED of each of the plurality of pixels P. For example, the transparent conductive material may be indium tin oxide (ITO) or indium zinc oxide (IZO), but is not limited thereto.

Each of the plurality of common power contact portions CPCP may be disposed between two adjacent pixels P of the plurality of pixels P respectively overlapping the plurality of pixel common power lines CPL and may electrically connect the common electrode CE to a corresponding pixel common power line CPL of the plurality of pixel common power lines CPL. With respect to the second direction Y, each of the plurality of common power contact portions CPCP according to an embodiment may be electrically connected to a corresponding pixel common power line CPL of the plurality of pixel common power lines CPL at a portion between the plurality of pixels P or at a boundary portion between the plurality of pixels P and may be electrically connected to a portion of the common electrode CE, and thus, may electrically connect the common electrode CE to a corresponding pixel common power line CPL of the plurality of pixel common power lines CPL.

Each of the plurality of common power contact portions CPCP may be disposed between two adjacent pixels P of the plurality of pixels P to electrically connect the common electrode CE to a corresponding pixel common power line CPL of the plurality of pixel common power lines CPL, and thus, may prevent or reduce or minimize the voltage drop (IR drop) of the pixel common power caused by a surface resistance of the common electrode CE. Accordingly, the display apparatus 10 according to the present disclosure may prevent or reduce or minimize the degradation in image quality caused by a deviation of the pixel driving power supplied to each of the pixels P arranged in the display area AA.

The gate control line group GCL may include a gate driving circuit 150 and a plurality of gate control lines in the display area AA of the first substrate 100.

The gate control line group GCL according to an embodiment may include a start signal line, a plurality of shift clock lines, at least one gate driving power line, and at least one gate common power line. The lines of the gate control line group GCL may extend long in the second direction Y and may be disposed apart from one another by a predetermined interval in the display area AA of the first substrate 100 in the first direction X. For example, each of the lines of the gate control line group GCL may be disposed between one or more pixels P in the first direction X.

The gate driving circuit 150 may be disposed in the display area AA of the first substrate 100. Therefore, because the gate driving circuit 150 is disposed in the display area AA of the first substrate 100, a second interval D2 between a center portion of an outermost pixel area PAo and each of outer surfaces OS of the first substrate 100 may be half or less of a first interval (or a pixel pitch) D1 between adjacent pixel areas PA. For example, when the gate driving circuit 150 is not disposed in the display area AA of the first substrate 100 and is between the outermost pixel area PAo and the outer surface OS of the first substrate 100, the second interval D2 may not be half or less of the first interval D1 due to a size (or a width) occupied by the gate driving circuit 150. Accordingly, in an embodiment of the present disclosure, because the gate driving circuit 150 is disposed within the display area AA of the first substrate 100, the second interval D2 may be implemented to be half or less of the first interval D1.

Figure 7:
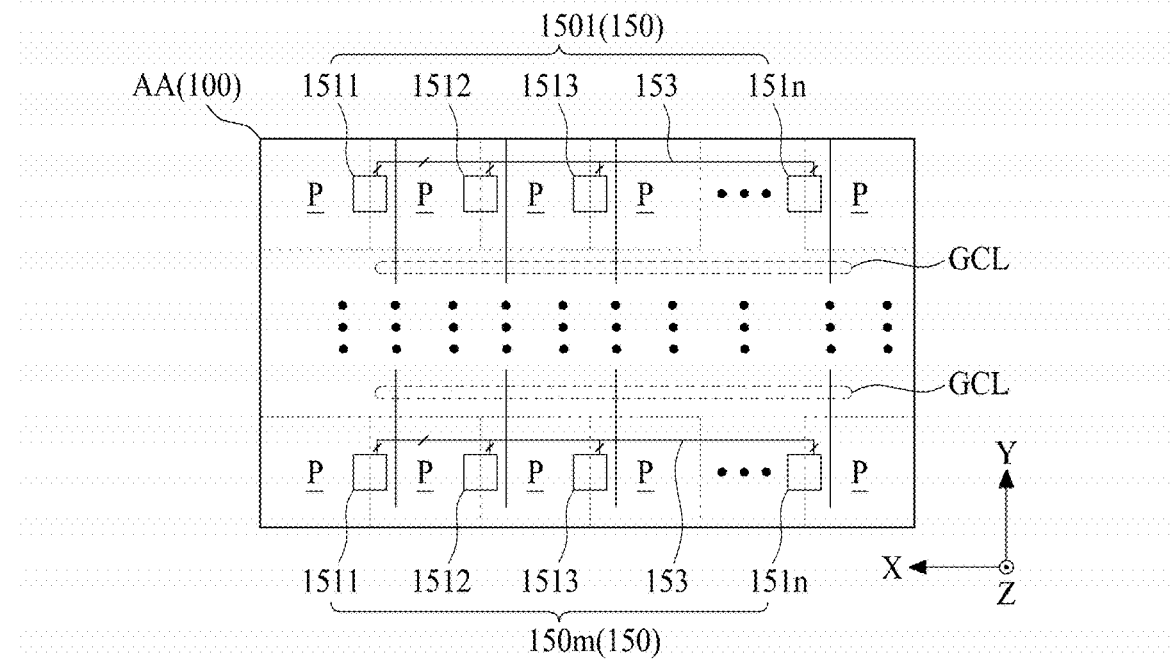
FIG. 7 is a diagram illustrating a gate driving circuit disposed in a display area illustrated in FIG. 4.

Referring to FIGS. 6 and 7, a gate driving circuit 150 according to an embodiment may be implemented with a shift register including a plurality of stage circuit units 1501 to 150m.

Each of the plurality of stage circuit units 1501 to 150m may be disposed apart from one another in each horizontal line of a first surface 100a of the first substrate 100 in the first direction X and may be dependently connected to one another in the second direction Y. Each of the plurality of stage circuit units 1501 to 150m may generate a scan signal in a predetermined order in response to a gate control signal supplied through the first pad part 110 and the gate control line group GCL and may supply the scan signal to a corresponding gate line GL.

Each of the plurality of stage circuit units 1501 to 150m according to an embodiment may include a plurality of branch circuits 1511 to 151n and a branch network 153.

The plurality of branch circuits 1511 to 151n may be selectively connected to the lines of the gate control line group GCL through the branch network 153 and may be electrically connected to one another through the branch network 153. Each of the plurality of branch circuits 1511 to 151n may generate the scan signal on the basis of a gate control signal, supplied through a corresponding line of the gate control line group GCL and the branch network 153, and a signal transferred between branch networks 153 and may supply the scan signal to a corresponding gate line GL.

Each of the plurality of branch circuits 1511 to 151n may include at least one of a plurality of TFTs configuring one of the stage circuit units 1501 to 150m. Each of the plurality of branch circuits 1511 to 151n may be disposed in a circuit area between two adjacent pixels P or in a circuit area between two pixels P, in each horizontal line of the first substrate 100, but is not limited thereto and may be disposed in a circuit area between one or more pixels P on the basis of the number of TFTs configuring each of the stage circuit units 1501 to 150m and the number of pixels P disposed one horizontal line.

The branch network 153 may be disposed in each horizontal line of the first substrate 100 and may electrically connect the plurality of branch circuits 1511 to 151n. The branch network 153 according to an embodiment may include a plurality of control nodes and a network line.

The plurality of control nodes may be disposed in each horizontal line of the first substrate 100 and may be selectively connected to the plurality of branch circuits 1511 to 151n in one horizontal line. For example, the plurality of control nodes may be disposed in an upper edge region (or a lower edge region) among pixel areas arranged in each horizontal line of the first substrate 100.

The network line may be selectively connected to the lines of the gate control line group GCL disposed in the first substrate 100 and may be selectively connected to the plurality of branch circuits 1511 to 151n. For example, the network line may transfer the gate control signal, supplied through the lines of the gate control line group GCL, to corresponding branch circuits 1511 to 151n and may transfer a signal between the plurality of branch circuits 1511 to 151n.

Referring again to FIGS. 4 to 6, the first pad part 110 may be disposed at a first edge portion among the first surface of the first substrate 100 parallel to the first direction X. The first pad part 110 may be disposed at a third edge portion of each of outermost pixel areas PAo disposed at the first edge portion of the first substrate 100. With respect to the second direction Y, an end of the first pad part 110 may overlap or may be aligned with an end of each of the outermost pixel areas PAo. Therefore, the first pad part 110 may be included (or disposed) in each of the outermost pixel areas PAo disposed at the first edge portion of the first substrate 100, and thus, a non-display area (or a bezel area) based on the first pad part 110 may not be formed or may not be on the first substrate 100.

The first pad part 110 may include a plurality of first pads which are disposed in parallel with one another in the first direction X on the first edge portion of the first substrate 100. The plurality of first pads may be divided (or classified) into a plurality of first data pads DP1, a plurality of first gate pads GP1, a plurality of first pixel driving power pads PPP1, and a plurality of first pixel common power pads CPP1.

The first pad part 110 according to an embodiment may include a first data pad part, a first gate pad part, a first pixel driving power pad part, and a first pixel common power pad part.

The first data pad part may include a plurality of first data pads DP1. Each of the plurality of first data pads DP1 may be individually (or respectively) connected to one end of each of a plurality of data lines DLo and DLe disposed on the first substrate 100.

The first data pad part may be connected to a data routing portion disposed in a routing portion 400. Each of the plurality of first data pads DP1 disposed in the first data pad part may be individually (or respectively) connected to one end of each of a plurality of data routing lines 410 disposed in the routing portion 400. Therefore, each of the plurality of data lines DLo and DLe disposed on the first substrate 100 may be electrically connected to a corresponding data routing line 410 of the plurality of data routing lines 410 through a corresponding first data pad DP1 of the plurality of first data pads DP1.

The first gate pad part may include a plurality of first gate pads GP1. Each of the plurality of first gate pads GP1 may be individually (or respectively) connected to one end of a corresponding gate control line among the gate control lines included in the gate control line group GCL disposed on the first substrate 100.

The first gate pad part may be connected to a gate routing portion disposed in the routing portion 400. Each of the plurality of first gate pads GP1 disposed in the first gate pad part may be individually (or respectively) connected to one end of each of a plurality of gate routing lines 430 among a plurality of routing lines disposed in the routing portion 400. Therefore, each line included in the gate control line group GCL disposed on the first substrate 100 may be electrically connected to a corresponding gate routing line 430 of the plurality of gate routing lines 430 through a corresponding first gate pad GP1 among a plurality of first gate pads GP1.

The plurality of first gate pads GP1 according to an embodiment may be divided (or classified) into a first start signal pad, a plurality of first shift clock pads, at least one first gate driving power pad, and at least one first gate common power pad.

The first start signal pad may be electrically connected to a start signal routing line disposed in a gate routing portion of the routing portion 400. Therefore, the start signal line disposed on the first substrate 100 may be electrically connected to the start signal routing line through the first start signal pad.

Each of the plurality of first shift clock pads may be electrically connected to a corresponding shift clock routing line of the plurality of shift clock routing lines disposed in the gate routing portion of the routing portion 400. Therefore, each of the plurality of shift clock lines disposed on the first substrate 100 may be electrically connected to a corresponding shift clock pad of the plurality of shift clock pads through a corresponding first shift clock pad of a plurality of first shift clock pads.

The at least one first gate driving power pad may be electrically connected to the at least one gate driving power routing line disposed in the gate routing portion of the routing portion 400. Therefore, the at least one first gate driving power line disposed on the first substrate 100 may be electrically connected to the at least one gate driving power routing line through the at least one first gate driving power pad.

The at least one first gate common power pad may be electrically connected to the at least one gate common power routing line disposed in the gate routing portion of the routing portion 400. Therefore, the at least one first gate common power line disposed on the first substrate 100 may be electrically connected to the at least one gate common power routing line through the at least one first gate common power pad.

The first pixel driving power pad part may include a plurality of first pixel driving power pads PPP1. Each of the plurality of first pixel driving power pads PPP1 may be individually (or respectively) connected to one end of a corresponding pixel driving power line PL among the plurality of pixel driving power lines PL disposed on the first substrate 100.

The first pixel driving power pad part may be connected to the pixel driving power routing portion disposed in the routing portion 400. Each of the plurality of first pixel driving power pads PPP1 disposed in the first pixel driving power pad part may be individually (or respectively) connected to one end of a corresponding pixel driving power routing line 450 among the plurality of pixel driving power routing lines 450 disposed in the routing portion 400. Therefore, each of the plurality of pixel driving power lines PL disposed on the first substrate 100 may be individually (or respectively) connected to one end of a corresponding pixel driving power routing line 450 of the plurality of pixel driving power routing lines 450 through a corresponding first pixel driving power pad PPP1 of the plurality of first pixel driving power pads PPP1.

The first pixel common power pad part may include a plurality of first pixel common power pads CPP1. Each of the plurality of first pixel common power pads CPP1 may be individually (or respectively) connected to one end of a corresponding pixel common power line CPL of the plurality of pixel common power lines CPL disposed on the first substrate 100.

The first pixel common power pad part may be connected to the pixel common power routing portion disposed in the routing portion 400. Each of the plurality of first pixel common power pads CPP1 disposed in the first pixel common power pad part may be individually (or respectively) connected to one end of a corresponding pixel common power routing line 470 of the plurality of pixel common power routing lines 470 disposed in the routing portion 400. Therefore, each of the plurality of pixel common power lines CPL disposed on the first substrate 100 may be individually (or respectively) connected to one end of a corresponding pixel common power routing line 470 of the plurality of pixel common power routing lines 470 through a corresponding first pixel common power pad CPP1 of the plurality of first pixel common power pads CPP1.

The first pad part 110 according to an embodiment may include a plurality of pad groups PG which are arranged in the order of a first pixel driving power pad PPP1, two first data pads DP1, a first gate pad GP1, a first pixel common power pad CPP1, two first data pads DP1, and a first pixel driving power pad PPP1 along the first direction X. Each of the plurality of pad groups PG may be connected to two adjacent pixels P disposed along the first direction X. For example, the plurality of pad groups PG may include a first pad group PG1, including one first pixel driving power pad PPP1, two first data pads DP1, and one first gate pad GP1 continuously disposed in an odd-numbered pixel area PA along the first direction X, and a second pad group PG2 including one first pixel common power pad CPP1, two first data pads DP1, and one first pixel driving power pad PPP1 continuously disposed in an even-numbered pixel area PA along the first direction X.

The first substrate 100 according to the present disclosure may further include a plurality of secondary power lines SPL and a plurality of secondary power contact portions SPCP.

Each of the plurality of secondary power lines SPL may extend long in the second direction Y and may be disposed adjacent to a corresponding pixel common power line CPL of the plurality of pixel common power lines CPL. Each of the plurality of secondary power lines SPL may be electrically connected to an adjacent pixel common power line CPL without being electrically connected to the first pixel common power pad CPP1 and may be supplied with a pixel common power through the adjacent pixel common power line CPL. Accordingly in some embodiments, the first substrate 100 according to the present disclosure may further include a plurality of line connection patterns LCP which electrically connect a pixel common power line CPL and a secondary power line SPL adjacent to each other.

Each of the plurality of line connection patterns LCP may be disposed on the first substrate 100 so that the line connection pattern LCP and a pixel common power line CPL and a secondary power line SPL adjacent to each other overlap with each other and may electrically connect a pixel common power line CPL and a secondary power line SPL adjacent to each other by using a line jumping structure. For example, one side of each of the plurality of line connection patterns LCP may be electrically connected to a portion of the secondary power line SPL through a first line contact hole formed in an insulation layer on the secondary power line SPL, and the other side of each of the plurality of line connection patterns LCP may be electrically connected to a portion of the pixel common power line CPL through a second line contact hole formed in an insulation layer on the pixel common power line CPL.

Each of the plurality of secondary power contact portions SPCP may be disposed between the plurality of pixels P respectively overlapping the plurality of secondary power lines SPL and may electrically connect the common electrode CE to each of the plurality of secondary power lines SPL. With respect to the second direction Y, each of the plurality of secondary power contact portions SPCP according to an embodiment may be electrically connected to a corresponding secondary power line SPL of the plurality of secondary power lines SPL at a portion between the plurality of pixels P or a boundary portion between the plurality of pixels P and may be electrically connected to a portion of the common electrode CE, and thus, may electrically connect the common electrode CE to each of the plurality of secondary power lines SPL. Therefore, the common electrode CE may be additionally connected to each of the plurality of secondary power lines SPL through each of the plurality of secondary power contact portions SPCP. Accordingly, the display apparatus 10 according to the present disclosure may prevent or reduce or minimize the degradation in image quality caused by a deviation of the pixel common power supplied to each of the pixels P arranged in the display area AA. Also, in the display apparatus 10 according to the present disclosure, although a first pixel common power pad CPP1 connected to each of the plurality of secondary power lines SPL is not additionally disposed (or formed), the pixel common power may be supplied to the common electrode CE in each of the plurality of pixel areas PA.

The display apparatus 10 according to the present disclosure may further include a plurality of reference power lines RL.

The plurality of reference power lines RL may extend long in the second direction Y and may be disposed apart from one another by a predetermined interval in the display area AA of the first substrate 100 in the first direction X. Each of the plurality of reference power lines RL may be disposed in a center region of each of the pixel areas PA arranged in the second direction Y. For example, each of the plurality of reference power lines RL may be disposed between an odd-numbered data line DLo and an even-numbered data line DLe in each pixel area PA.

Each of the plurality of reference power lines RL may be shared by two adjacent subpixels ((SP1, SP2) (SP3, SP4)) in the first direction X in each pixel area PA. Accordingly, in some embodiments, each of the plurality of reference power lines RL may include a reference branch line RDL.

The reference branch line RDL may branch (or protrude) to the two adjacent subpixels ((SP1, SP2) (SP3, SP4)) in the first direction X in each pixel area PA and may be electrically connected to the two adjacent subpixels ((SP1, SP2) (SP3, SP4)).

The first pad part 110 according to the present disclosure may further include a first reference power pad part.

The first reference power pad part may include a plurality of first reference power pads RPP1. Each of the plurality of first reference power pads RPP1 may be individually (or respectively) connected to one end of a corresponding reference power line RL of the plurality of reference power lines RL. For example, each of the plurality of first reference power pads RPP1 may be disposed between two first data pads DP1 disposed in each of a plurality of outermost pixel areas PAo, but is not limited thereto.

The first reference power pad part may be connected to the reference power routing portion disposed in the routing portion 400. Each of the plurality of first reference power pads RPP1 disposed in the first reference power pad part may be individually (or respectively) connected to one end of a corresponding reference power routing line 490 of the plurality of reference power routing lines 490 disposed in the routing portion 400. Therefore, each of the plurality of reference power lines RL disposed on the first substrate 100 may be electrically connected to a corresponding reference power routing line 490 of the plurality of reference power routing lines 490 through a corresponding first reference power pad RPP1 of the plurality of first reference power pads RPP1.

Optionally, the plurality of reference power lines RL, the reference branch line RDL, the plurality of first reference power pads RPP1, and the plurality of reference power routing lines 490 may each be omitted based on a circuit configuration of the pixel circuit PC.

Figure 8:
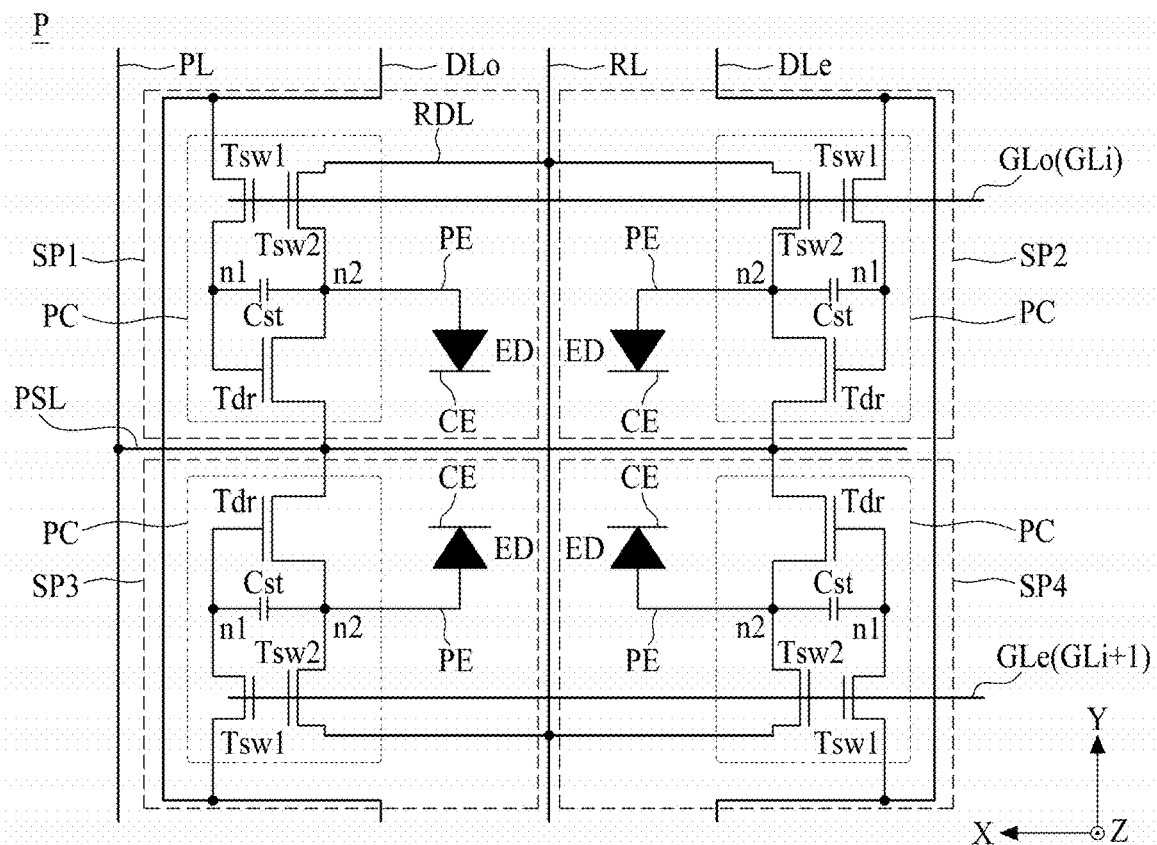
FIG. 8 is a circuit diagram illustrating one pixel illustrated in FIGS. 4 and 6.

FIG. 8 is a circuit diagram illustrating one pixel illustrated in FIGS. 4 and 6 and is a diagram for describing a pixel circuit of a subpixel. In describing FIG. 8, elements which are the same or correspond to the elements of FIGS. 4 to 7 are referred to by like reference numerals, and their repetitive descriptions are omitted or will be briefly described below.

Referring to FIG. 8, a pixel P according to the present disclosure may include first to fourth subpixels SP1 to SP4 each including a pixel circuit PC, a pixel electrode PE, and a light emitting device ED.

The pixel circuit PC disposed in each of the first to fourth subpixels SP1 to SP4 of the pixel P may be disposed in a circuit area and may be connected to adjacent gate lines GLo and GLe, adjacent data lines DLo and DLe, a reference power line RL, and a pixel driving power line PL. The pixel circuit PC may provide the light emitting device ED with a data current corresponding to a difference voltage between a data signal supplied through the adjacent data lines DLo and DLe and a reference voltage supplied through the reference power line RL in response to a scan signal supplied through the adjacent gate lines GLo and GLe, thereby allowing the light emitting device ED to emit light.

The pixel circuit PC according to an embodiment may include a first switching TFT Tsw1, a second switching TFT Tsw2, a storage capacitor Cst, and a driving TFT Tdr. In the following description, a thin film transistor may be referred to as a TFT.

At least one of the first switching TFT Tsw1, the second switching TFT Tsw2, and the driving TFT Tdr may be an N-type or P-type TFT. At least one of the first switching TFT Tsw1, the second switching TFT Tsw2, and the driving TFT Tdr may be an amorphous silicon (a-Si) TFT, a poly-Si TFT, an oxide TFT, or an organic TFT. For example, in the pixel circuit PC, some of the first switching TFT Tsw1, the second switching TFT Tsw2, and the driving TFT Tdr may be a TFT including a semiconductor layer (or an active layer) including low-temperature polysilicon (LTPS) having an excellent response characteristic, and the other of the first switching TFT Tsw1, the second switching TFT Tsw2, and the driving TFT Tdr may be a TFT including a semiconductor layer (or an active layer) including oxide which is good in off current characteristic. The first switching TFT Tsw1, the second switching TFT Tsw2, and the driving TFT Tdr may have different sizes (or channel sizes). For example, the driving TFT Tdr may have a size which is greater than that of each of the first switching TFT Tsw1 and the second switching TFT Tsw2, and the second switching TFT Tsw2 may have a size which is greater than that of the first switching TFT Tsw1.

The first switching TFT Tsw1 may include a gate electrode connected to the adjacent gate lines GLo and GLe, a first source/drain electrode connected to the adjacent data lines DLo and DLe, and a second source/drain electrode connected to a first node (or a gate electrode of the driving TFT Tdr) n1. The first switching TFT Tsw1 may be turned on by a scan signal supplied through corresponding gate lines GLo and GLe and may transfer a data signal, supplied through corresponding data lines DLo and DLe, to the first node n1 (e.g., the gate electrode n1 of the driving TFT Tdr).

According to an embodiment, the gate electrode of the first switching TFT Tsw1 disposed in the pixel circuit PC of each of the first subpixel SP1 and the second subpixel SP2 may be connected to an odd-numbered gate line GLo, and the gate electrode of the first switching TFT Tsw1 disposed in the pixel circuit PC of each of the third subpixel SP3 and the fourth subpixel SP4 may be connected to an even-numbered gate line GLe. The first source/drain electrode of the first switching TFT Tsw1 disposed in the pixel circuit PC of each of the first subpixel SP1 and the third subpixel SP3 may be connected to an odd-numbered data line DLo, and the first source/drain electrode of the first switching TFT Tsw1 disposed in the pixel circuit PC of each of the second subpixel SP2 and the fourth subpixel SP4 may be connected to an even-numbered data line DLe.

The second switching TFT Tsw2 may include a gate electrode connected to the adjacent gate lines GLo and GLe, a first source/drain electrode connected to an adjacent reference power line RL, and a second source/drain electrode connected to a second node (or a source electrode of the driving TFT Tdr) n2. The second switching TFT Tsw2 may be turned on by a scan signal supplied through corresponding gate lines GLo and GLe and may transfer a reference voltage, supplied through a corresponding reference branch line RDL and reference power line RL, to the source electrode n2 of the driving TFT Tdr.

According to an embodiment, the gate electrode of the second switching TFT Tsw2 disposed in the pixel circuit PC of each of the first subpixel SP1 and the second subpixel SP2 may be connected to an odd-numbered gate line GLo, and the gate electrode of the second switching TFT Tsw2 disposed in the pixel circuit PC of each of the third subpixel SP3 and the fourth subpixel SP4 may be connected to an even-numbered gate line GLe. The first source/drain electrode of the second switching TFT Tsw2 disposed in the pixel circuit PC of each of the first to fourth subpixels SP1 and SP4 may be connected to an adjacent reference power line RL in common through a corresponding reference branch line RDL.

The scan signal supplied to the gate electrode of the first switching TFT Tsw1 and the scan signal supplied to the gate electrode of the second switching TFT Tsw2 may be the same signal. For example, the gate electrode of the first switching TFT Tsw1 and the gate electrode of the second switching TFT Tsw2 may be connected to the same gate lines GLo and GLe. Therefore, the first switching TFT Tsw1 and the second switching TFT Tsw2 disposed in the pixel circuit PC of each of the first subpixel SP1 and the second subpixel SP2 may be simultaneously turned on or off by a scan signal supplied through the odd-numbered gate line GLo. Likewise, the first switching TFT Tsw1 and the second switching TFT Tsw2 disposed in the pixel circuit PC of each of the third subpixel SP3 and the fourth subpixel SP4 may be simultaneously turned on or off by a scan signal supplied through the even-numbered gate line GLe.

Optionally, the scan signal supplied to the gate electrode of the first switching TFT Tsw1 and the scan signal supplied to the gate electrode of the second switching TFT Tsw2 may be different signals. For example, the gate electrode of the first switching TFT Tsw1 and the gate electrode of the second switching TFT Tsw2 may be connected to different gate lines GLo and GLe.

Each of the odd-numbered gate line GLo and the even-numbered gate line GLe according to an embodiment may include first and second gate lines.

The first gate line of the odd-numbered gate line GLo may be connected to the gate electrode of the first switching TFT Tsw1 disposed in the pixel circuit PC of each of the first subpixel SP1 and the second subpixel SP2, and the second gate line of the odd-numbered gate line GLo may be connected to the gate electrode of the second switching TFT Tsw2 disposed in the pixel circuit PC of each of the first subpixel SP1 and the second subpixel SP2.

The first gate line of the even-numbered gate line GLe may be connected to the gate electrode of the first switching TFT Tsw1 disposed in the pixel circuit PC of each of the third subpixel SP3 and the fourth subpixel SP4, and the second gate line of the even-numbered gate line GLe may be connected to the gate electrode of the second switching TFT Tsw2 disposed in the pixel circuit PC of each of the third subpixel SP3 and the fourth subpixel SP4.

Therefore, the first switching TFT Tsw1 and the second switching TFT Tsw2 disposed in the pixel circuit PC of each of the first subpixel SP1 and the second subpixel SP2 may be simultaneously turned on or off by the same scan signal supplied through the first and second gate lines of the odd-numbered gate line GLo, or may be individually turned on or off by different scan signals supplied through the first and second gate lines of the odd-numbered gate line GLo. Likewise, the first switching TFT Tsw1 and the second switching TFT Tsw2 disposed in the pixel circuit PC of each of the third subpixel SP3 and the fourth subpixel SP4 may be simultaneously turned on or off by the same scan signal supplied through the first and second gate lines of the even-numbered gate line GLe, or may be individually turned on or off by different scan signals supplied through the first and second gate lines of the even-numbered gate line GLe. For example, in each of the first to fourth subpixels SP1 to SP4, the first switching TFT Tsw1 may be turned on based on a first scan signal supplied through a first gate line, and the second switching TFT Tsw2 may be turned on based on a second scan signal supplied through a second gate line.

The second switching TFT Tsw2 disposed in the pixel circuit PC of each of the first to fourth subpixels SP1 to SP4 may transfer a reference voltage to the source electrode n2 of the driving TFT Tdr through the reference power line RL during a data charging period (or section) of the pixel P based on an external sensing mode and may transfer a current, flowing in the source electrode n2 of the driving TFT Tdr, to the reference power line RL during a sensing period (or section) of the pixel P, and in this case, the driving circuit unit may sense the current supplied to the reference power line RL to generate compensation data for compensating for a characteristic variation of the driving TFT Tdr and may modulate pixel data on the basis of the generated compensation data. For example, the characteristic variation of the driving TFT Tdr may include a shift of a threshold voltage and/or mobility.

The storage capacitor Cst may be provided in an overlap region between the gate electrode n1 and the source electrode n2 of the driving TFT Tdr. The storage capacitor Cst may include a first capacitor electrode connected to the gate electrode of the driving TFT Tdr, a second capacitor electrode connected to the source electrode of the driving TFT Tdr, and a dielectric layer formed in an overlap region between the first capacitor electrode and the second capacitor electrode. The storage capacitor Cst may be charged with a difference voltage between the gate electrode n1 and the source electrode n2 of the driving TFT Tdr, and then, may turn on or off the driving TFT Tdr on the basis of a charged voltage.

The driving TFT Tdr may include a gate electrode (or a gate node) n1 which is connected to the second source/drain electrode of the first switching TFT Tsw1 and the first capacitor electrode of the storage capacitor Cst, a source electrode (or a source node) which is connected to the second source/drain electrode of the second switching TFT Tsw2, the second capacitor electrode of the storage capacitor Cst, and a pixel electrode PE in common, and a drain electrode (or a drain node) connected to an adjacent pixel driving power line PL.

The drain electrode of the driving TFT Tdr disposed in the pixel circuit PC of each of the first to fourth subpixels SP1 to SP4 may be connected to an adjacent pixel driving power line PL through a power sharing line PSL. The power sharing line PSL may branch from the adjacent pixel driving power line PL adjacent thereto in parallel with the first direction X and may be disposed in a center region of the pixel P. The driving TFT Tdr may be turned on based on a voltage of the storage capacitor Cst and may control the amount of current flowing from the pixel driving power line PL to the light emitting device ED.

The driving TFTs Tdr respectively disposed in the pixel circuits PC of the first to fourth subpixels SP1 to SP4 may have different sizes (or channel sizes) on the basis of the emission efficiency of a corresponding light emitting device ED. For example, the driving TFT Tdr of the first subpixel (or a red subpixel) SP1 may have a size which is greater than that of the driving TFT Tdr of each of the second to fourth subpixels SP2 to SP4, the driving TFT Tdr of the fourth subpixel (or a green subpixel) SP4 may have a size which is greater than that of the driving TFT Tdr of each of the second and third subpixels SP2 and SP3, and the driving TFT Tdr of the second subpixel (or a blue subpixel) SP2 may have a size which is greater than that of the driving TFT Tdr of the third subpixel (or a white subpixel) SP3.

Optionally, in each of the first to fourth subpixels SP1 to SP4, the pixel circuit PC including the first switching TFT Tsw1, the second switching TFT Tsw2, the storage capacitor Cst, and the driving TFT Tdr may be implemented as a pixel driving chip, disposed in a circuit area CA of a corresponding pixel area PA, and connected to gate lines GLo and GLe adjacent thereto, data lines DLo and DLe adjacent thereto, and the pixel driving power line PL. Such a pixel driving chip may sample a data signal supplied from corresponding data lines DLo and DLe in response to a scan signal supplied from corresponding gate lines GLo and GLe and may supply a data current, corresponding to a sampled data signal, to the pixel electrode PE.

The pixel electrode PE may be disposed in an emission area of each of the first to fourth subpixels SP1 to SP4 and may be connected to the drain electrode of a driving TFT Tdr disposed in a corresponding pixel circuit PC.

Based on a resolution of the display apparatus 10, the pixel electrode PE may be disposed in a corresponding subpixel area not to overlap the pixel circuit PC or to overlap a portion or all of the pixel circuit PC. For example, as illustrated in one of FIGS. 2A to 2C, the pixel electrode PE may be disposed in a subpixel area to overlap a portion or all of a circuit area CA.

The pixel electrode PE according to an embodiment may be disposed in the subpixel area not to overlap the pixel circuit PC. For example, the pixel electrode PE may be disposed close to a central portion of the pixel P in the subpixel area.

According to another embodiment, the pixel electrode PE may be disposed in the subpixel area to overlap a portion of the pixel circuit PC. For example, the pixel electrode PE may be disposed close to the central portion of the pixel P in the subpixel area to overlap a portion of the pixel circuit PC.

According to another embodiment, the pixel electrode PE may be disposed in the subpixel area to overlap all of the pixel circuit PC. For example, the pixel electrode PE may be disposed in all of the subpixel area to overlap all of the pixel circuit PC.

The light emitting device ED may be disposed on the pixel electrode PE and may be electrically connected to the pixel electrode PE. Also, the light emitting device ED may be electrically connected to the common electrode. That is, the light emitting device ED may be disposed between the pixel electrode PE and the common electrode. The light emitting device ED may emit light with a data current supplied from a corresponding pixel circuit PC. The light emitting device ED may emit light with a data current supplied from a corresponding pixel circuit PC and may irradiate the light onto a portion above a first surface of the first substrate 100. The light emitting device ED according to an embodiment may include a self-light emitting device described above.

Optionally, in the pixel circuit PC according to an embodiment, the second switching TFT Tsw2 may be omitted based on a driving (or operating) manner of the pixel P, and in this case, the reference power line RL disposed on the first substrate 100 may also be omitted.

Figure 9:
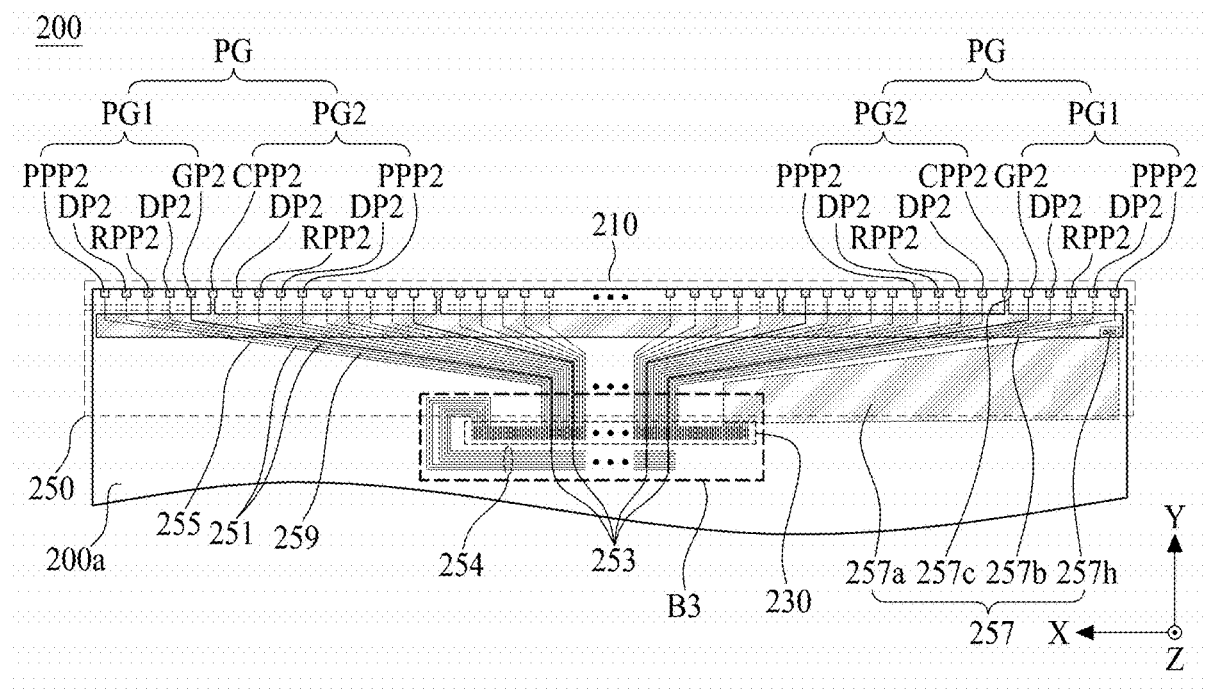
FIG. 9 is a diagram illustrating a second substrate illustrated in FIG. 5.
Figure 10:
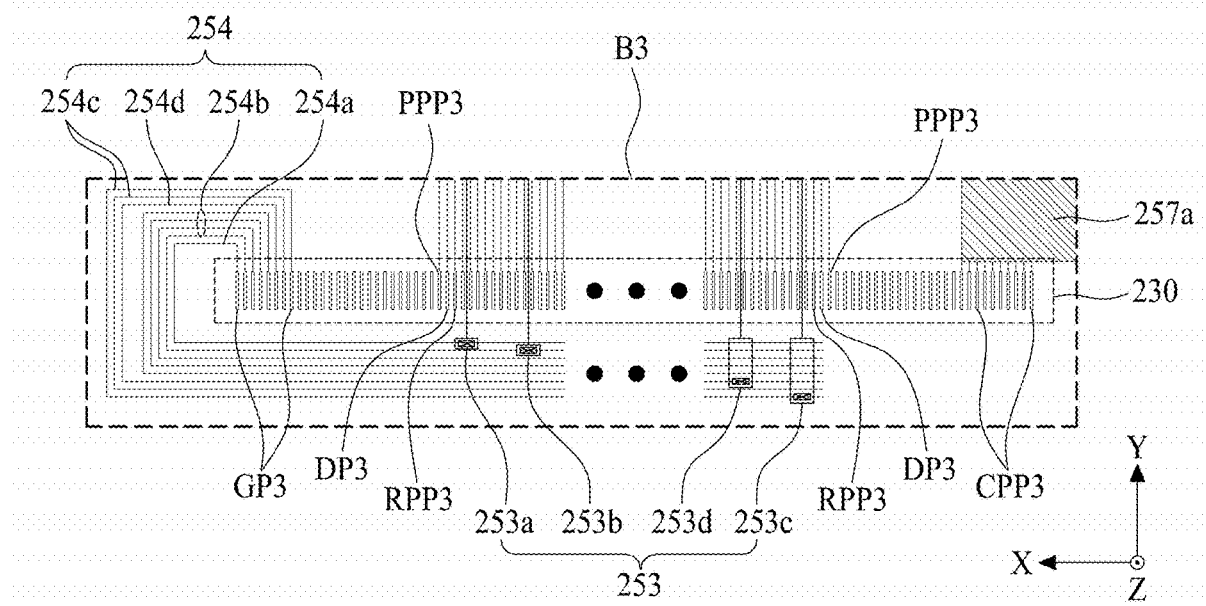
FIG. 10 is an enlarged view of a region 'B3' illustrated in FIG. 9.

FIG. 9 is a diagram illustrating a second substrate illustrated in FIG. 5, and FIG. 10 is an enlarged view of a region 'B3' illustrated in FIG. 9. In describing FIGS. 9 and 10, repetitive descriptions of elements which are the same or correspond to the elements of FIGS. 4 to 8 are omitted or will be briefly given below.

Referring to FIGS. 5, 6, 9, and 10, a second substrate 200 according to the present disclosure may include a second pad part 210.

The second pad part 210 may be disposed at a first edge portion of among second surface 200b of the second substrate 200 parallel to the first direction X to overlap the first pad part 110 disposed on the first substrate 100. The second pad part 210 may include a plurality of second pads which are disposed in parallel with one another at the first edge portion of the second substrate 200 in the first direction X. The plurality of second pads may be divided (or classified) into a plurality of second data pads DP2, a plurality of second gate pads GP2, a plurality of second pixel driving power pads PPP2, and a plurality of second pixel common power pads CPP2.

The second pad part 210 according to an embodiment may include a second data pad part, a second gate pad part, a second pixel driving power pad part, and a second pixel common power pad part.

The second data pad part may be electrically connected to the first data pad part of the first pad part 110 through the routing portion 400.

The second data pad part according to an embodiment may include a plurality of second data pads DP2. Each of the plurality of second data pads DP2 may be disposed to individually (or respectively) overlap a corresponding first data pad DP1 of the plurality of first data pads DP1 disposed in the first pad part 110 of the first substrate 100. Each of the plurality of second data pads DP2 according to an embodiment may be individually (or respectively) connected to a corresponding first data pad DP1 of the plurality of first data pads DP1 through a corresponding data routing line 410 of the plurality of data routing lines 410 among the plurality of routing lines disposed in the routing portion 400. Accordingly, each of the plurality of second data pads DP2 may be electrically connected to corresponding data lines DLo and DLe through a corresponding data routing line 410 and a corresponding first data pad DP1.

The second gate pad part may be electrically connected to the first gate pad part of the first pad part 110 through the routing portion 400.

The second gate pad part according to an embodiment may include a plurality of second gate pads GP2. Each of the plurality of second gate pads GP2 may be disposed to individually (or respectively) overlap a corresponding first gate pad GP1 of the plurality of first gate pads GP1 disposed in the first pad part 110 of the first substrate 100. Each of the plurality of second gate pads GP2 according to an embodiment may be individually (or respectively) connected to the other end of a corresponding gate routing line 430 of the plurality of gate routing lines 430 among the plurality of routing lines disposed in the routing portion 400. Accordingly, each of the plurality of second gate pads GP2 may be electrically connected to a corresponding gate control line included in a gate control line group GCL through a corresponding gate routing line 430 and a corresponding first gate pad GP1.

The plurality of second gate pads GP2 according to an embodiment may be divided (or classified) into a second start signal pad, a plurality of second shift clock pads, at least one second gate driving power pad, and at least one second gate common power pad.

The second start signal pad may be electrically connected to a start signal routing line disposed in a gate routing portion of the routing portion 400. Therefore, the second start signal pad may be electrically connected to a corresponding start signal line included in the gate control line group GCL through a corresponding first start signal pad and a corresponding start signal routing line among the plurality of gate routing lines 430.

Each of the plurality of second shift clock pads may be electrically connected to a corresponding shift clock routing line of the plurality of shift clock routing lines disposed in the gate routing portion of the routing portion 400. Therefore, each of the plurality of second shift clock pads may be electrically connected to a corresponding shift clock line of the plurality of shift clock lines included in the gate control line group GCL through a corresponding first shift clock pad and a corresponding shift clock routing line among the plurality of gate routing lines 430.

The at least one second gate driving power pad may be electrically connected to the at least one gate driving power routing line disposed in the gate routing portion of the routing portion 400. Therefore, the at least one second gate driving power pad may be electrically connected to the gate driving power line included in the gate control line group GCL through a corresponding first gate driving power pad and a corresponding gate driving power routing line among the plurality of gate routing lines 430.

The at least one second gate common power pad may be electrically connected to the at least one gate common power routing line disposed in the gate routing portion of the routing portion 400. Therefore, the at least one second gate common power pad may be electrically connected to the gate common power line included in the gate control line group GCL through a corresponding first gate common power pad and a corresponding gate common power routing line among the plurality of gate routing lines 430.

The second pixel driving power pad part may be electrically connected to the first pixel driving power pad part of the first pad part 110 through the routing portion 400.

The second pixel driving power pad part according to an embodiment may include a plurality of second pixel driving power pads PPP2. Each of the plurality of second pixel driving power pads PPP2 may be disposed to individually (or respectively) overlap a corresponding first pixel driving power pad PPP1 of the plurality of first pixel driving power pads PPP1 disposed in the first pad part 110 of the first substrate 100. Each of the plurality of second pixel driving power pads PPP2 according to an embodiment may be individually (or respectively) connected to a corresponding first pixel driving power pad PPP1 of the plurality of first pixel driving power pads PPP1 through a corresponding pixel driving power routing line 450 of the plurality of pixel driving power routing lines 450 among the plurality of routing lines disposed in the routing portion 400. Accordingly, each of the plurality of second pixel driving power pads PPP2 may be electrically connected to a corresponding pixel driving power line PL through a corresponding pixel driving power routing line 450 and a corresponding first pixel driving power pad PPP1.

The second pixel common power pad part may be electrically connected to the first pixel common power pad part of the first pad part 110 through the routing portion 400.

The second pixel common power pad part according to an embodiment may include a plurality of second pixel common power pads CPP2. Each of the plurality of second pixel common power pads CPP2 may be disposed to individually (or respectively) overlap a corresponding first pixel common power pad CPP1 of the plurality of first pixel common power pads CPP1 disposed in the first pad part 110 of the first substrate 100. Each of the plurality of second pixel common power pads CPP2 according to an embodiment may be individually (or respectively) connected to a corresponding first pixel common power pad CPP1 of the plurality of first pixel common power pads CPP1 through a corresponding pixel common power routing line 470 of the plurality of pixel common power routing lines 470 among the plurality of routing lines disposed in the routing portion 400. Accordingly, each of the plurality of second pixel common power pads CPP2 may be electrically connected to a corresponding pixel common power line CPL through a corresponding pixel common power routing line 470 and a corresponding first pixel common power pad CPP1.

The second pad part 210 according to an embodiment may include a plurality of pad groups PG which are arranged in the order of a second pixel driving power pad PPP2, two second data pads DP2, a second gate pad GP2, a second pixel common power pad CPP2, two second data pads DP2, and a second pixel driving power pad PPP2 along the first direction X so as to be equal to (or match) the arrangement order of the pads disposed among the first pad part 110. For example, the plurality of pad groups PG may include a first pad group PG1, including one second pixel driving power pad PPP2, two second data pads DP2, and one second gate pad GP2 continuously disposed along the first direction X, and a second pad group PG2 including one second pixel common power pad CPP2, two second data pads DP2, and one second pixel driving power pad PPP2 continuously disposed along the first direction X.

The second pad part 210 according to the present disclosure may further include a second reference power pad part.

The second reference power pad part may be electrically connected to the first reference power pad part of the first pad part 110 through the routing portion 400.

The second reference power pad part according to an embodiment may include a plurality of second reference power pads RPP2. Each of the plurality of second reference power pads RPP2 may be disposed to individually (or respectively) overlap a corresponding first reference power pad RPP1 of the plurality of first reference power pads RPP1 disposed in the first pad part 110 of the first substrate 100. Accordingly, each of the plurality of second reference power pads RPP2 may be electrically connected to a corresponding reference power line RL through a corresponding reference power routing line 490 and a corresponding first reference power pad RPP1.

The second substrate 200 according to the present disclosure may further include a third pad part 230 and a link line portion 250.

The third pad part 230 may be disposed on the rear surface 200b of the second substrate 200. For example, the third pad part 230 may be disposed at a center portion adjacent to the first edge portion of the rear surface 200b of the second substrate 200.

The third pad part 230 according to an embodiment may include a plurality of third pads (or input pads) which are apart from one another by a certain interval along the first direction X. The plurality of third pads may be divided (or classified) into a plurality of third data pads DP3, a third pixel driving power pad PPP3, a plurality of third gate pads GP3, and a plurality of third pixel common power pads CPP3.

The third pad part 230 according to an embodiment may include a third data pad part, a third pixel driving power pad part, a third gate pad part, and a third pixel common power pad part.

The third pad part 230 may include a first region (or a center region) including the third data pad part and the third pixel driving power pad part, a second region (or one region) including the third gate pad part, and a third region (or the other region) including the third pixel common power pad part.

The third data pad part may be electrically connected to the second data pad part of the second pad part 210 through the link line portion 250.

The third data pad part according to an embodiment may include a plurality of third data pads DP3. The plurality of third data pads DP3 may be disposed apart from one another by a certain interval in the first direction X in parallel in a first region of the third pad part 230.

Each of the plurality of third data pads DP3 according to an embodiment may be individually (or respectively) connected to a corresponding second data pad DP2 among the plurality of second data pads DP2 disposed in the second pad part 210 through the link line portion 250. Each of the plurality of third data pads DP3 may be supplied with a data signal from the driving IC 530 of the driving circuit unit 500. The data signal according to an embodiment may be supplied to each of the plurality of second data pads DP2 disposed in the second pad part 210 through a corresponding third data pad DP3 of plurality of third data pads DP3 and the link line portion 250.

The third pixel driving power pad part may be electrically connected to the second pixel driving power pad part of the second pad part 210 through the link line portion 250.

The third pixel driving power pad part according to an embodiment may include a plurality of third pixel driving power pads PPP3. The plurality of third pixel driving power pads PPP3 may be disposed apart from one another by a certain interval along the first direction X in parallel in a first region of the third pad part 230.

Each of the plurality of third pixel driving power pads PPP3 according to an embodiment may be individually (or respectively) connected to a corresponding second pixel driving power pad PPP2 among the plurality of second pixel driving power pads PPP2 disposed in the second pad part 210 through the link line portion 250. For example, each of the plurality of third pixel driving power pads PPP3 may be supplied with a pixel driving power from the driving IC 530 of the driving circuit unit 500. The pixel driving power according to an embodiment may be supplied to each of the plurality of second pixel driving power pads PPP2 disposed in the second pad part 210 through a corresponding third pixel driving power pad PPP3 of the plurality of third pixel driving power pads PPP3 and the link line portion 250.

The plurality of third data pads DP3 and the plurality of third pixel driving power pads PPP3 may be disposed in parallel in the first region of the third pad part 230 in the same order as the arrangement order of the plurality of second data pads DP2 and the plurality of second pixel driving power pads PPP2 disposed in the second pad part 210.

The third gate pad part may be electrically connected to the second gate pad part of the second pad part 210 through the link line portion 250.

The third gate pad part according to an embodiment may include a plurality of third gate pads GP3. The plurality of third gate pads GP3 may be disposed apart from one another by a certain interval along the first direction X in parallel in a second region of the third pad part 230.

Each of the plurality of third gate pads GP3 according to an embodiment may be individually (or respectively) connected to a corresponding second gate pad GP2 among the plurality of second gate pads GP2 disposed in the second pad part 210 through the link line portion 250. For example, each of the plurality of third gate pads GP3 may be supplied with a gate control signal from the timing controller 570 of the driving circuit unit 500. The gate control signal according to an embodiment may be supplied to each of the plurality of second gate pads GP2 disposed in the second pad part 210 through a corresponding third gate pad GP3 of plurality of third gate pads GP3 and the link line portion 250.

The plurality of third gate pads GP3 according to an embodiment may be divided (or classified) into a third start signal pad, a plurality of third shift clock pads, at least one third gate driving power pad, and at least one third gate common power pad.

The third start signal pad may be electrically connected to the second start signal pad disposed in the second pad part 210 through the link line portion 250. For example, the third start signal pad may be supplied with a start signal (or a pulse) from the timing controller 570 of the driving circuit unit 500. The start signal according to an embodiment may be supplied to the second start signal pad disposed in the second pad part 210 through a corresponding third start signal pad among the plurality of third start signal pads and the link line portion 250.

Each of the plurality of third shift clock pads may be electrically connected to a corresponding second shift clock pad among the plurality of second shift clock pads disposed in the second pad part 210 through the link line portion 250. For example, each of the plurality of third shift clock pads may be individually supplied with one of a plurality of gate shift clocks from the timing controller 570 of the driving circuit unit 500. Each of the plurality of gate shift clocks according to an embodiment may be supplied to the second shift clock pad disposed in the second pad part 210 through a corresponding third shift clock pad among the plurality of third shift clock pads and the link line portion 250.

The at least one third gate driving power pad may be electrically connected to the at least one second gate driving power pad disposed in the second pad part 210 through the link line portion 250. For example, the at least one third gate driving power pad may be supplied with a gate driving power from the power circuit unit 590 of the driving circuit unit 500. The gate driving power according to an embodiment may be supplied to the second gate driving power pad disposed in the second pad part 210 through a corresponding third gate driving power pad among the plurality of third gate driving power pads and the link line portion 250.

The at least one third gate common power pad may be electrically connected to the at least one second gate common power pad disposed in the second pad part 210 through the link line portion 250. For example, the at least one third gate common power pad may be supplied with a gate common power from the power circuit unit 590 of the driving circuit unit 500. The gate common power according to an embodiment may be supplied to the second gate common power pad disposed in the second pad part 210 through a corresponding third gate common power pad among the plurality of third gate common power pads and the link line portion 250.

The third pixel common power pad part may include at least one third pixel common power pad CPP3. The at least one third pixel common power pad CPP3 may be disposed in a third region of the third pad part 230.

The at least one third pixel common power pad CPP3 may be individually (or respectively) connected to a corresponding second pixel common power pad CPP2 disposed in the second pad part 210 through the link line portion 250. For example, the at least one third pixel common power pad CPP3 may be supplied with a pixel common power from the power circuit unit 590 of the driving circuit unit 500. The pixel common power according to an embodiment may be supplied to each of the plurality of second pixel common power pads CPP2 disposed in the second pad part 210 through a corresponding third pixel common power pad CPP3 among the plurality of third pixel common power pads CPP3 and the link line portion 250.

The third pad part 230 may further include a first dummy area which is disposed between the first region and the second region and includes a plurality of dummy pads and a second dummy area which is disposed between the first region and the third region and includes a plurality of dummy pads.

The third pad part 230 according to an embodiment may further include a third reference power pad part.

The third reference power pad part may be electrically connected to the second reference power pad part of the second pad part 210 through the link line portion 250.

The third reference power pad part according to an embodiment may include a plurality of third reference power pads RPP3. The plurality of third reference power pads RPP3 may be disposed apart from one another by a certain interval along the first direction X in parallel in the first region of the third pad part 230.

Each of the plurality of third reference power pads RPP3 according to an embodiment may be individually (or respectively) connected to a corresponding second reference power pad RPP2 among the plurality of second reference power pads RPP2 disposed in the second pad part 210 through the link line portion 250. For example, each of the plurality of third reference power pads RPP3 may be supplied with a reference power from the driving IC 530 of the driving circuit unit 500. The reference power according to an embodiment may be supplied to each of the plurality of second reference power pads RPP2 disposed in the second pad part 210 through a corresponding third reference power pad RPP3 among the plurality of third reference power pads RPP3 and the link line portion 250.

Each of the plurality of third pixel driving power pads PPP3, the plurality of third data pads DP3, and the plurality of third reference power pads RPP3 in the first region of the third pad part 230 may be disposed in parallel in the same order as the arrangement order of the plurality of second pixel driving power pads PPP2, the plurality of second data pads DP2, and the plurality of second reference power pads RPP2 disposed in the second pad part 210.

The link line portion 250 may be disposed between the second pad part 210 and the third pad part 230. The link line portion 250 may include a plurality of link lines which individually (or respectively) connect the second pads of the second pad part 210 to the third pads of the third pad part 230.

The plurality of link lines according to an embodiment may be divided (or classified) into a plurality of data link lines 251, a plurality of gate link lines 253, a plurality of pixel driving power link lines 255, and a pixel common power link line 257. Therefore, the link line portion 250 may include a plurality of data link lines 251, a plurality of gate link lines 253, a plurality of pixel driving power link lines 255, and a pixel common power link line 257.

According to another embodiment, the link line portion 250 may include a data link portion, a gate link portion, a pixel driving power link portion, and a pixel common power link portion.

The data link portion (or a first link portion) may electrically connect the second data pad part of the second pad part 210 to the third data pad part of the third pad part 230.

The data link portion according to an embodiment may include a plurality of data link lines 251. Each of the plurality of data link lines (or first link lines) 251 may individually (or respectively) connect a corresponding second data pad of the plurality of second data pads DP2, disposed in the second pad part 210, to a corresponding third data pad of the plurality of third data pads DP3 disposed in the third pad part 230. Accordingly, a data signal supplied to each of the plurality of third data pads DP3 may be supplied to a corresponding second data pad DP2 through a corresponding data link line 251 and may be supplied to corresponding data lines DLo and DLe through a corresponding data routing line 410 and a corresponding first data pad DP1.

The gate link portion (or a second link portion) may electrically connect the second gate pad part of the second pad part 210 to the third gate pad part of the third pad part 230.

The gate link portion according to an embodiment may include a plurality of gate link lines 253. Each of the plurality of gate link lines (or second link lines) 253 may individually (or respectively) connect a corresponding second gate pad of the plurality of second gate pads GP2, disposed in the second pad part 210, to a corresponding third gate pad of the plurality of third gate pads GP3 disposed in the third pad part 230. Accordingly, a gate control signal supplied to each of the plurality of third gate pads GP3 may be supplied to a corresponding second gate pad GP2 through a corresponding gate link line 253 and may be supplied to a corresponding gate link line included in the gate control line group GCL through a corresponding gate routing line 430 and a corresponding first gate pad GP1.

The plurality of gate link lines 253 according to an embodiment may be divided (classified) into a start signal link line 253a, a plurality of shift clock link lines 253b, at least one gate driving power link line 253c, and at least one gate common power link line 253d. Accordingly, the gate link portion may include the start signal link line 253a, the plurality of shift clock link lines 253b, the at least one gate driving power link line 253c, and the at least one gate common power link line 253d.

The start signal link line 253a may electrically connect the second start signal pad, disposed in the second pad part 210, to the third start signal pad disposed in the third pad part 230. Accordingly, a start signal supplied to the third start signal pad may be supplied to the second start signal pad through the start signal link line and may be supplied to a corresponding start signal line included in the gate control line group GCL through the start signal routing line and the first start signal pad.

Each of the plurality of shift clock link lines 253b may electrically connect a corresponding second shift clock pad of the plurality of second shift clock pads, disposed in the second pad part 210, to a corresponding third shift clock pad of the plurality of third shift clock pads disposed in the third pad part 230. Accordingly, a gate shift clock supplied to each of the plurality of third shift clock pads may be supplied to a corresponding second shift clock pad through a corresponding shift clock link line 253b and may be supplied to a corresponding shift clock line included in the gate control line group GCL through the shift clock routing line and the first shift clock pad.

The at least one gate driving power link line 253c may electrically connect the at least one second gate driving power pad, disposed in the second pad part 210, to the at least one third gate driving power pad disposed in the third pad part 230. Accordingly, a gate driving power supplied to the third gate driving power pad may be supplied to the second gate driving power pad through the gate driving power link line 253c and may be supplied to the gate driving power line included in the gate control line group GCL through the gate driving power routing line and the first gate driving power pad.

The at least one gate common power link line 253d may electrically connect the at least one second gate common power pad, disposed in the second pad part 210, to the at least one third gate common power pad disposed in the third pad part 230. Accordingly, a gate common power supplied to the third gate common power pad may be supplied to the second gate common power pad through the gate common power link line 253d and may be supplied to the gate common power line included in the gate control line group GCL through the gate common power routing line and the first gate common power pad.

The pixel driving power link portion (or a third link portion) may electrically connect the second pixel driving power pad part of the second pad part 210 to the third pixel driving power pad part of the third pad part 230.

The pixel driving power link portion according to an embodiment may include a plurality of pixel driving power link lines 255. Each of the plurality of pixel driving power link lines (or third link lines) 255 may individually (or respectively) connect the plurality of second pixel driving power pads PPP2, disposed in the second pad part 210, to the plurality of third pixel driving power pads PPP3 disposed in the third pad part 230. Accordingly, a pixel driving power supplied to each of the plurality of third pixel driving power pads PPP3 may be supplied to a corresponding second pixel driving power pad PPP2 through a corresponding pixel driving power link line 255 and may be supplied to a corresponding pixel driving power line PL through the pixel driving power routing line 450 and the first pixel driving power pad PPP1.

The plurality of data link lines 251, the plurality of gate link lines 253, and the plurality of pixel driving power link lines 255 may each include a first line portion connected to the second pad part 210, a second line portion connected to the third pad part 230, and a third line portion connected between the first line portion and the second line portion. Each of the first line portion and the second line portion may have a rectilinear shape, and the third line portion may have a non-rectilinear shape. For example, the third line portion may have a diagonal shape corresponding to a shortest path between the first line portion and the second line portion.

The pixel common power link portion (or a fourth link portion) may electrically connect the second pixel common power pad part of the second pad part 210 to the third pixel common power pad part of the third pad part 230.

The pixel common power link portion according to an embodiment may include a pixel common power link line 257. Each of the plurality of pixel common power link lines (or fourth link lines) 257 may connect the plurality of second pixel common power pads CPP2, disposed in the second pad part 210, to the plurality of third pixel common power pads CPP3 disposed in the third pad part 230 in common. Accordingly, a pixel common power supplied to each of the at least one third pixel common power pads CPP3 may be supplied to the plurality of second pixel common power pads CPP2 through the pixel common power link line 257, supplied to each of the plurality of pixel common power lines CPL through a corresponding pixel common power routing line of the plurality of pixel common power routing lines 470 and a corresponding first pixel common power pad of the plurality of first pixel common power pads CPP1, and supplied to the common electrode CE through each of the plurality of common power contact portions CPCP.

The pixel common power link line 257 according to an embodiment may include a first common link line 257a, a second common link line 257b, and a plurality of third common link lines 257c.

The first common link line 257a may be commonly connected to the at least one third pixel common power pad CPP3 disposed in the third pad part 230. For example, the first common link line 257a may be disposed at one corner portion of the rear surface 200b of the second substrate 200.

The first common link line 257a may be disposed or formed on the rear surface 200b of the second substrate 200 between the second pad part 210 and the third pad part 230 to have a relatively wide size (or area) so that the voltage drop of the pixel common power applied thereto is reduced or minimized. A size of the first common link line 257a according to an embodiment may progressively increase in a direction from one side thereof to the other side thereof. For example, a size of the first common link line 257a according to an embodiment may progressively increase in a direction from the third pad part 230 to the outer surface OS of the second substrate 200.

In the first common link line 257a according to an embodiment, one side thereof adjacent to the third pad part 230 may be commonly connected to the at least one third pixel common power pad CPP3 disposed in the third pad part 230, and the other side thereof adjacent to the second pad part 210 may overlap the second common link line 257b. For example, the first common link line 257a may be disposed on the rear surface 200b of the second substrate 200 along with the data link line 251 or the gate link line 253.

The second common link line 257b may be disposed at the first edge portion of the rear surface 200b of the second substrate 200 to overlap the first edge portion of the first substrate 100 and to be adjacent to the second pad part 210. The second common link line 257b according to an embodiment may be disposed in parallel with the first direction X to face all pads disposed in the second pad part 210. For example, the second common link line 257b may have a bar shape having a relatively wide size (or area), for reducing or minimizing the voltage drop of the pixel common voltage applied to the pixel common power link line 257.

The second common link line 257b may overlap each of the plurality of pixel driving power link lines 255, the plurality of data link lines 251, and the plurality of gate link lines 253. For example, the data link line 251 may be disposed on the gate link line 253, and the second common link line 257b may be disposed on the pixel driving power link line 255. Also, the pixel driving power link line 255 may be disposed on the gate link line 253 along with the data link line 251.

One side of the second common link line 257b may be electrically connected to the other side of the first common link line 257a through a link contact hole 257h.

Each of the plurality of third common link lines 257c may be connected to the second common link line 257b in common and may be connected to a corresponding second pad among the plurality of second pads. Each of the plurality of third common link lines 257c according to an embodiment may extend (or protrude) in a direction from the other side of the second common link line 257b to the plurality of second pixel common power pads CPP2 disposed in the second pad part 210 and may be electrically connected to a corresponding second pixel common power pad of the plurality of second pixel common power pads CPP2. For example, each of the plurality of third common link lines 257c may be formed along with the second common link line 257b. Also, the plurality of third common link lines 257c and the second common link line 257b may be formed along with the pads of the second pad part 210.

The link line portion 250 according to an embodiment may further include a reference power link portion.

The reference power link portion (or a fifth link portion) may electrically connect the second reference power pad part of the second pad part 210 to the third reference power pad part of the third pad part 230.

The reference power link portion according to an embodiment may include a plurality of reference power link lines 259. Each of the plurality of reference power link lines (or fifth link lines) 259 may individually (or respectively) connect a corresponding second reference power pad of the plurality of second reference power pads RPP2, disposed in the second pad part 210, to a corresponding third reference power pad of the plurality of third reference power pads RPP3 disposed in the third pad part 230. Therefore, a reference voltage supplied to each of the plurality of third reference power pads RPP3 may be supplied to a corresponding second reference power pad RPP2 through a corresponding reference power link line 259 and may be supplied to a corresponding reference power line RL through the reference power routing line 490 and the first reference power pad RPP1.

The plurality of reference power link lines 259 may each include a first line portion connected to a corresponding second reference power pad RPP2, a second line portion connected to the third reference power pad RPP3, and a third line portion connected between the first line portion and the second line portion. Each of the first line portion and the second line portion may have a rectilinear shape, and the third line portion may have a non-rectilinear shape. For example, the third line portion may have a diagonal shape corresponding to a shortest path between the first line portion and the second line portion.

The link line portion 250 according to an embodiment may further include a gate control signal transfer portion 254.

The gate control signal transfer portion (or a sixth link portion) 254 may bypass the third pad part 230 and may electrically connect the third gate pad part to the gate link portion.

The gate control signal transfer portion 254 according to an embodiment may include a plurality of gate control signal transfer lines.

Each of the plurality of gate control signal transfer lines (or sixth link lines) may selectively connect a corresponding third gate pad of the plurality of third gate pads GP3, disposed in the third pad part 230, to a corresponding gate link line of the plurality of gate link lines. For example, the plurality of gate control signal transfer lines and the plurality of gate link lines 253 may be disposed on different layers on the rear surface 200b of the second substrate 200, and a corresponding side of each of the plurality of gate link lines 253 may be electrically connected to a corresponding gate control signal transfer line through a link contact hole. Optionally, the other side of each of the plurality of gate link lines 253 may pass through a region between two adjacent third pads and may be selectively connected to a plurality of gate control signal transfer lines not to overlap the third pad disposed in the third pad part 230.

The plurality of gate control signal transfer lines according to an embodiment may be divided (classified) into a start signal transfer line 254a, a plurality of shift clock transfer lines 254b, at least one gate driving power transfer line 254c, and at least one gate common power transfer line 254d. Therefore, the gate control signal transfer portion 254 may include the start signal transfer line 254a, the plurality of shift clock transfer lines 254b, the at least one gate driving power transfer line 254c, and the at least one gate common power transfer line 254d.

The start signal transfer line 254a may electrically connect the third start signal pad to the start signal link line 253a. The start signal transfer line 254a according to an embodiment may include one line portion thereof electrically connected to the third start signal pad, the other line portion thereof electrically connected to the start signal link line 253a, and a middle line portion electrically connected between the one line portion thereof and the other line portion thereof to bypass the third pad part 230.

The one line portion of the start signal transfer line 254a may be disposed in parallel with the second direction Y and may be electrically connected to the third start signal pad.

The other line portion of the start signal transfer line 254a may be disposed to be adjacent to the third pad part 230 in parallel with the first direction X and may be electrically connected to the start signal link line 253a. For example, the other line portion of the start signal transfer line 254a may be electrically connected to the start signal link line 253a through a link contact hole. Therefore, a start signal supplied to the third start signal pad may be supplied to the start signal line included in the gate control line group GCL through the start signal transfer line 254a, the start signal link line 253a, the second start signal pad, the start signal routing line, and the first start signal pad.

The middle line portion of the start signal transfer line 254a may include a first middle line which extends from the one line portion in parallel with the first direction X and a second middle line which extends from the first middle line so as to be apart from one end (or a left end) of the third pad part 230 and is electrically connected to the other line portion. For example, the middle line portion may have a "⌠"-shape which bypasses the third pad part 230.

The start signal link line 253a according to an embodiment may pass through the third pad part 230 and may be electrically connected to the other line portion of the start signal transfer line 254a. For example, the start signal link line 253a may be disposed to pass through a region between two adjacent third pads so as not to overlap the third pad disposed in the third pad part 230. In this case, a start signal supplied to the start signal link line 253a may not vary (or change) based on a signal supplied to the third pad and may be maintained at an original voltage level.

Each of the plurality of shift clock transfer lines 254b may selectively connect a corresponding third shift clock pad of the plurality of shift clock pads to a corresponding shift clock link line of the plurality of shift clock link lines 253b. For example, when the gate control signal transfer portion 254 includes first to fourth shift clock transfer lines 254b and the line link portion 250 includes a plurality of first to fourth shift clock link lines 253b, each of the plurality of first shift clock link lines 253b may be connected to the first shift clock transfer line 254b in common, each of the plurality of second shift clock link lines 253b may be connected to the second shift clock transfer line 254b in common, each of the plurality of third shift clock link lines 253b may be connected to the third shift clock transfer line 254b in common, and each of the plurality of fourth shift clock link lines 253b may be connected to the fourth shift clock transfer line 254b in common.

Each of the plurality of shift clock transfer lines 254b may have a shape which surrounds the start signal transfer line 254a and may be disposed in parallel with the start signal transfer line 254a to bypass the third pad part 230. Each of the plurality of shift clock transfer lines 254b according to an embodiment may include one line portion thereof electrically connected to a corresponding third shift clock pad, the other line portion thereof electrically connected to a corresponding shift clock link line 253b, and a middle line portion electrically connected between one line portion thereof and the other line portion thereof to bypass the third pad part 230. For example, the other line portion of each of the plurality of shift clock transfer lines 254b may be electrically connected to a corresponding shift clock link line 253b through a link contact hole. Therefore, a gate shift clock supplied to each of the plurality of third shift clock pads may be supplied to the shift clock line included in the gate control line group GCL through a corresponding shift clock transfer line 254b, a corresponding shift clock link line 253b, a corresponding second shift clock pad, a corresponding gate shift clock routing line, and a corresponding first shift clock pad.

Each of the plurality of shift clock link lines 253b according to an embodiment may pass through the third pad part 230 and may be electrically connected to the other line portion of a corresponding shift clock transfer line 254b. For example, each of the plurality of shift clock link lines 253b may be disposed to pass through a region between two adjacent third pads so as not to overlap the third pad disposed in the third pad part 230. In this case, a gate shift clock supplied to each of the plurality of shift clock link lines 253b may not vary (or change) based on a signal supplied to the third pad and may be maintained at an original voltage level.

The at least one gate driving power transfer line 254c may electrically connect at least one gate driving power pad to at least one gate driving power link line 253c.

The at least one gate driving power transfer line 254c may have a shape which surrounds an outermost shift clock transfer line 254b and may be disposed in parallel with the shift clock transfer line 254b to bypass the third pad part 230. The at least one gate driving power transfer line 254c according to an embodiment may include one line portion thereof electrically connected to the third gate driving power pad, the other line portion thereof electrically connected to the gate driving power link line 253c, and a middle line portion electrically connected between one line portion thereof and the other line portion thereof to bypass the third pad part 230. For example, the other line portion of the at least one gate driving power transfer line 254c may be electrically connected to the gate driving power link line 253c through a link contact hole. Therefore, a gate driving power supplied to the at least one gate driving power pad may be supplied to the gate driving power line included in the gate control line group GCL through the gate driving power transfer line 254c, the gate driving power link line 253c, the second gate driving power pad, the gate driving power routing line, and the first gate driving power pad.

The at least one gate driving power link line 253c according to an embodiment may pass through the third pad part 230 and may be electrically connected to the other line portion of the gate driving power transfer line 254c. For example, the at least one gate driving power link line 253c may be disposed to pass through a region between two adjacent third pads so as not to overlap the third pad disposed in the third pad part 230. In this case, a gate driving power supplied to the gate driving power link line 253c may not vary (or change) based on a signal supplied to the third pad and may be maintained at an original voltage level.

The at least one gate common power transfer line 254d may electrically connect the at least one gate common power pad to the at least one gate common power link line 253d.

The at least one gate common power transfer line 254d may have a shape which surrounds the gate driving power transfer line 254c and may be disposed in parallel with the gate driving power transfer line 254c to bypass the third pad part 230. The at least one gate common power transfer line 254d according to an embodiment may include one line portion thereof electrically connected to the third gate common power pad, the other line portion thereof electrically connected to the gate common power link line 253d, and a middle line portion electrically connected between one line portion thereof and the other line portion thereof to bypass the third pad part 230. For example, the other line portion of the at least one gate common power transfer line 254d may be electrically connected to the gate common power link line 253d through a link contact hole. Therefore, a gate common power supplied to the at least one gate common power pad may be supplied to the gate common power line included in the gate control line group GCL through the gate common power transfer line 254d, the gate common power link line 253d, the second gate common power pad, the gate common power routing line, and the first gate common power pad.

The at least one gate common power link line 253d according to an embodiment may pass through the third pad part 230 and may be electrically connected to the other line portion of the gate common power transfer line 254d. For example, the at least one gate common power link line 253d may be disposed to pass through a region between two adjacent third pads so as not to overlap the third pad disposed in the third pad part 230. In this case, a gate common power supplied to the gate common power link line 253d may not vary (or change) based on a signal supplied to the third pad and may be maintained at an original voltage level.

Figure 11:
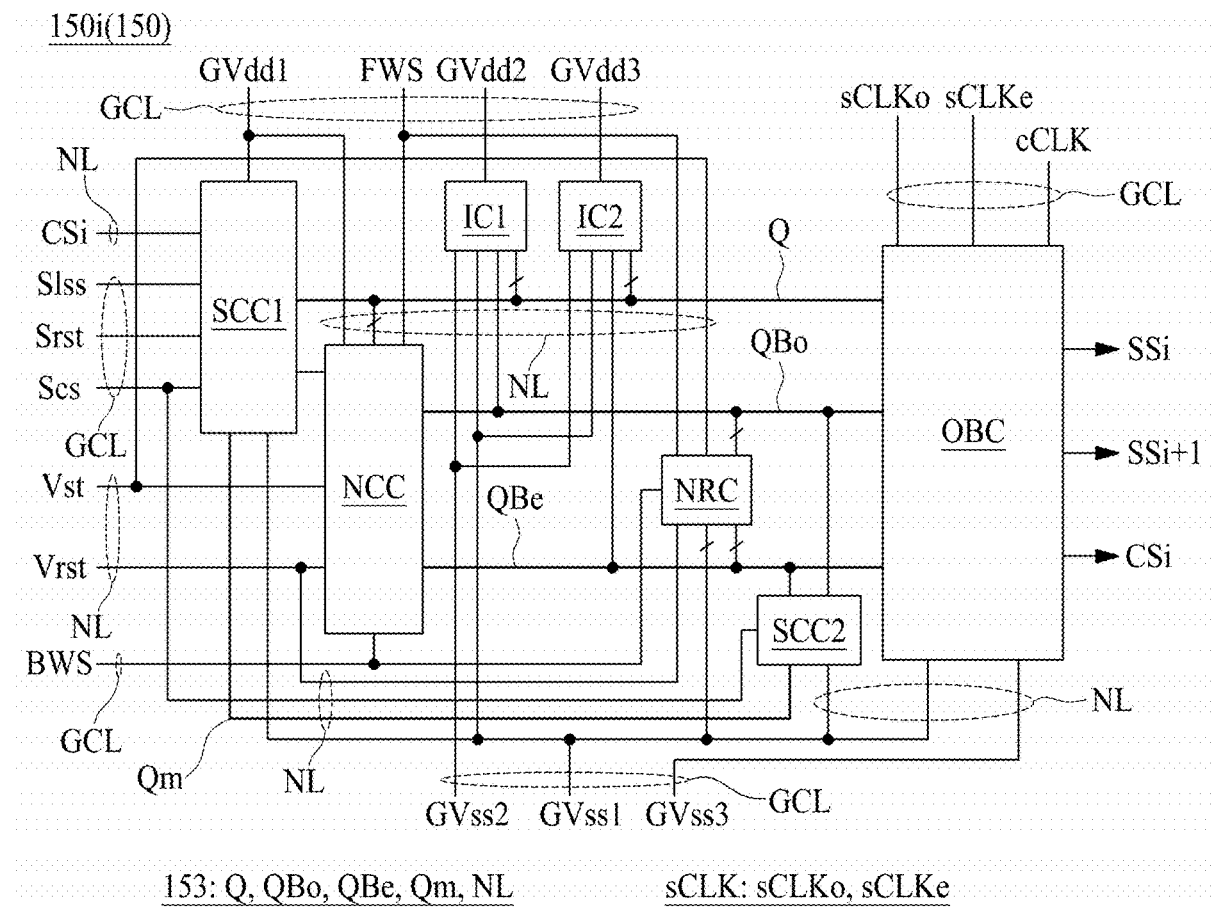
FIG. 11 is a circuit diagram illustrating an $i^{th}$ stage circuit unit illustrated in FIG. 7.

FIG. 11 is a circuit diagram illustrating an $i^{th}$ stage circuit unit illustrated in FIG. 7.

Referring to FIGS. 6 to 8 and 11, an $i^{th}$ stage circuit unit 150i according to the present disclosure may output two scan signals SSi and SSi+1 and a carry signal CSi in response to a gate control signal supplied from a gate control line group GCL disposed on the first substrate 100.

The gate control signal according to an embodiment may include a start signal Vst, a plurality of shift clocks including a plurality of scan clocks sCLK and a plurality of carry clocks cCLK, first to third gate driving powers GVdd1, GVdd2, and GVdd3, and first and second gate common powers GVss1 and GVss2. In this case, the gate control line group GCL may include a start signal line, a plurality of scan clock lines, a plurality of carry clock lines, first to third gate driving power lines, and first and second gate common power lines.

The gate control signal according to an embodiment may include first to $j^{th}$ carry clocks and first to $j^{th}$ scan clocks. For example, j may be 4, but is not limited thereto and may be an even number of 6, 8, or 10 or more.

When the gate control signal includes the first to fourth carry clocks, the first carry clock may be applied to a $4k-3^{th}$ (where k is a natural number) stage circuit unit, the second carry clock may be applied to a $4k-2^{th}$ stage circuit unit, the third carry clock may be applied to a $4k-1^{th}$ stage circuit unit, and the fourth carry clock may be applied to a $4k^{th}$ stage circuit unit. When the gate control signal includes the first to fourth scan clocks, the first and second scan clocks may be applied to an odd-numbered stage circuit unit, and the third and fourth scan clocks may be applied to an even-numbered stage circuit unit.

Moreover, the gate control signal according to an embodiment may further include a forward driving signal FWS and a backward driving signal BWS. In this case, the gate control line group GCL may further include a forward driving signal line and a backward driving signal line.

The gate control signal according to an embodiment may further include an external sensing line selection signal Slss, an external sensing reset signal Srst, and an external sensing control signal Scs for an external sensing mode. In this case, the gate control line group GCL may further include an external sensing selection signal line, an external sensing reset signal line, and an external sensing control signal line.

The $i^{th}$ stage circuit unit 150i according to the present disclosure may include a branch network 153, a node control circuit NCC, a first inverter circuit IC1, a second inverter circuit IC2, a node reset circuit NRC, and an output buffer circuit OBC.

The branch network 153 may be implemented to form a circuit connection between the node control circuit NCC, the first inverter circuit IC1, the second inverter circuit IC2, the node reset circuit NRC, and the output buffer circuit OBC and to be selectively connected to the lines of the gate control line group GCL.

The branch network 153 may be selectively connected to the lines of the gate control line group GCL. The branch network 153 according to an embodiment may include first to third control nodes Q, QBo, and QBe and a network line NL.

Each of the first to third control nodes Q, QBo, and QBe may be disposed in an upper edge region (or a lower edge region) of each of pixel areas arranged in an $i^{th}$ horizontal line of the first substrate 100. Each of the first to third control nodes Q, QBo, and QBe may be disposed in parallel with a first direction X or a gate line. For example, each of the first to third control nodes Q, QBo, and QBe may be disposed adjacent to the gate line.

The network line NL may be selectively connected to the lines of the gate control line group GCL and may be selectively connected to the first to third control nodes Q, QBo, and QBe. Also, the network line NL may be selectively connected between circuits configuring the stage circuit unit 150i.

The node control circuit NCC may be implemented to control a voltage of each of the first to third control nodes Q, QBo, and QBe.

The node control circuit NCC according to an embodiment may be connected to each of the first to third control nodes Q, QBo, and QBe through the network line NL and may be implemented to control the voltage of each of the first to third control nodes Q, QBo, and QBe in response to the start signal Vst, the reset signal Vrst, and the first gate driving power GVdd1 supplied through the network line NL. For example, the start signal Vst may be an $i-2^{th}$ carry signal CSi−2 output from the $i-2^{th}$ stage circuit unit 150$i$−2. The reset signal Vrst may be an $i+2^{th}$ carry signal CSi+2 output from an $i+2^{th}$ stage circuit unit 150$i$+2.

According to another embodiment, the node control circuit NCC may be connected to each of the first to third control nodes Q, QBo, and QBe through the network line NL and may control the voltage of each of the first to third control nodes Q, QBo, and QBe in response to the start signal Vst, the reset signal Vrst, the forward driving signal FWS, the backward driving signal BWS, and the first gate driving power GVdd1 supplied through the network line NL. For example, when the forward driving signal FWS has a high voltage level (or a high potential voltage level), the backward driving signal BWS may have a low voltage level (or a low potential voltage level), and when the forward driving signal FWS has a low voltage level (or a low potential voltage level), the backward driving signal BWS may have a high voltage level (or a high potential voltage level). For example, when the forward driving signal FWS has a high voltage level, the gate driving circuit 150 may supply a scan signal up to a last gate line from a first gate line on the basis of forward scan driving, and when the backward driving signal BWS has a high voltage level, the gate driving circuit 150 may supply the scan signal up to the first gate line from the last gate line on the basis of backward scan driving. Herein, a high voltage level may be referred to as a first voltage level, a high potential voltage level, a gate turn-on voltage level, or a transistor on voltage level, and a low voltage level may be referred to as a second voltage level, a low potential voltage level, a gate turn-off voltage level, or a transistor off voltage level.

The first inverter circuit IC1 may control or discharge the voltage of the second control node QBo on the basis of the voltage of the first control node Q. The first inverter circuit IC1 according to an embodiment may be connected to the second gate driving power GVdd2, the first control node Q, the second control node QBo, the first gate common power GVss1, and the second gate driving power GVdd2 through the network line NL. In response to the second gate common power GVss2 and the voltage of the first control node Q, the first inverter circuit IC1 may supply the first gate common power GVss1 to the second control node QBo to discharge the voltage of the second control node QBo.

The second inverter circuit IC2 may control or discharge the voltage of the third control node QBe on the basis of the voltage of the first control node Q. The second inverter circuit IC2 according to an embodiment may be connected to the third gate driving power GVdd3, the first control node Q, the third control node QBe, the first gate common power GVss1, and the second gate common power GVss2 through the network line NL. In response to the third gate driving power GVdd3 and the voltage of the first control node Q, the second inverter circuit IC2 may supply the first gate common power GVss1 to the third control node QBe to discharge the voltage of the third control node QBe.

The second gate driving power GVdd2 and the third gate driving power GVdd3 may have voltage levels which are inverted (or opposite to each other) therebetween. For example, when the second gate driving power GVdd2 has a high voltage level, the third gate driving power GVdd3 may have a low voltage level, and when the second gate driving power GVdd2 has a low voltage level, the third gate driving power GVdd3 may have a high voltage level.

The second gate common power GVss2 and the first gate common power GVss1 may have the same voltage level or different voltage levels.

The node reset circuit NRC may maintain a voltage level of each of the second control node QBo and the third control node QBe while the voltage of the first control node Q has a high voltage level.

The node reset circuit NRC according to an embodiment may simultaneously reset the voltage of the second control node QBo and the voltage of the third control node QBe in response to the start signal Vst and the reset signal Vrst supplied through the network line NL. For example, the node reset circuit NRC may supply the first gate common power GVss1 to the second control node QBo and the third control node QBe in response to the start signal Vst and the reset signal Vrst, and thus, may maintain the second control node QBo and the third control node QBe at a voltage level of the first gate common power GVss1.

According to another embodiment, the node reset circuit NRC may simultaneously reset the voltage of the second control node QBo and the voltage of the third control node QBe in response to the start signal Vst, the reset signal Vrst, the forward driving signal FWS, and the backward driving signal BWS supplied through the network line NL. For example, the node reset circuit NRC may supply the first gate common power GVss1 to the second control node QBo and the third control node QBe in response to the start signal Vst, the reset signal Vrst, the forward driving signal FWS, and the backward driving signal BWS, and thus, may maintain each of the second control node QBo and the third control node QBe at a voltage level of the first gate common power GVss1.

The output buffer circuit OBC may be implemented to sequentially output two scan signals having a gate-on voltage level or to sequentially output two scan signals having a gate-off voltage level in response to the voltage of each of the first to third control nodes Q, QBo, and QBe on the basis of the carry clock cCLK, the scan clock sCLK, the first gate common power GVss1, and the third gate common power GVss3 supplied through the network line NL.

When the voltage of the first control node Q has a high voltage level and the voltage of each of the second and third control nodes QBo and QBe has a low voltage level, the output buffer circuit OBC according to an embodiment may output each of an $i^{th}$ carry signal CSi corresponding to the carry clock cCLK, an $i^{th}$ scan signal SSi corresponding to an odd-numbered scan clock sCLKo, and an $i+1^{th}$ scan signal SSi+1 corresponding to an even-numbered scan clock sCLKe. For example, the $i^{th}$ carry signal CSi may be supplied as the start signal Vst to the $i+2^{th}$ stage circuit unit, the $i^{th}$ scan signal SSi may be supplied to an odd-numbered gate line GLo (or an $i^{th}$ gate line GLi), and the $i+1^{th}$ scan signal SSi+1 may be supplied to an even-numbered gate line GLe (or an $i+1^{th}$ gate line GLi+1).

When the voltage of each of the first and third control nodes Q and QBe has a low voltage level and the voltage of the second control node QBo has a high voltage level, the output buffer circuit OBC according to an embodiment may output each of the $i^{th}$ scan signal SSi and the $i+1^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

When the voltage of each of the first and second control nodes Q and QBo has a low voltage level and the voltage of the third control node QBe has a high voltage level, the output buffer circuit OBC according to an embodiment may output each of the $i^{th}$ scan signal SSi and the i+1$^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

The output buffer circuit OBC according to an embodiment may be disposed in a center region of the $i^{th}$ horizontal line parallel to the first direction X. For example, when the output buffer circuit OBC is disposed adjacent to one end (or the other end) of a horizontal line, a voltage level of the scan signal may decrease in a direction from one end of a gate line to the other end thereof due to a line resistance of a horizontal line, and thus, in order to prevent such a problem, the output buffer circuit OBC should be disposed in the center region of the $i^{th}$ horizontal line parallel to the first direction X, but is not limited thereto and may be disposed at one side or the other side of the $i^{th}$ horizontal line when a total length of the gate line is relatively short.

The first to third gate common powers GVss1, GVss2, and GVss3 may have the same voltage level or different voltage levels.

The $i^{th}$ stage circuit unit 150*i* according to the present disclosure may further include a fourth control node Qm, a first sensing control circuit SCC1, and a second sensing control circuit SCC2.

The fourth control node Qm may be implemented to be electrically connected between the first sensing control circuit SCC1 and the second sensing control circuit SCC2. The fourth control node Qm may be included in the branch network 153 and may be electrically connected between the first sensing control circuit SCC1 and the second sensing control circuit SCC2 through the network line NL.

The first sensing control circuit SCC1 may be implemented to control a voltage of each of the first control node Q and the fourth control node Qm in response to the $i^{th}$ carry signal CSi, the external sensing line selection signal Slss, the external sensing control signal Scs, the external sensing reset signal Srst, and the first gate driving power GVdd1 supplied through the branch network 153. For example, the first sensing control circuit SCC1 may charge the first gate driving power GVdd1 into the fourth control node Qm in response to the $i^{th}$ carry signal CSi having a high voltage level and the external sensing line selection signal Slss having a high voltage level, and then, may control the voltage of the first control node Q in response to a voltage charged into the fourth control node Qm, the external sensing control signal Scs having a high voltage level supplied during a fore period of a vertical blank period, and the first gate driving power GVdd1. Therefore, the output buffer circuit OBC may output each of the $i^{th}$ carry signal CSi corresponding to the carry clock cCLK, the $i^{th}$ scan signal SSi corresponding to the odd-numbered scan clock sCLKo, and the i+1$^{th}$ scan signal SSi+1 corresponding to the even-numbered scan clock sCLKe during the vertical blank period on the basis of the voltage of the first control node Q.

Moreover, the first sensing control circuit SCC1 may discharge the voltage of the first control node Q in response to the external sensing reset signal Srst supplied through the branch network 153. For example, the first sensing control circuit SCC1 may supply the first gate common power GVss1 to the first control node Q to reset or initialize the voltage of the first control node Q in response to the external sensing reset signal Srst having a high voltage level supplied during a latter period of the vertical blank period.

The second sensing control circuit SCC2 may be implemented to discharge the voltage of each of the second control node QBo and the third control node QBe in response to the voltage of the fourth control node Qm and the external sensing control signal Scs supplied through the branch network 153. For example, the second sensing control circuit SCC2 may supply the first gate common voltage GVss1 to each of the second control node QBo and the third control node QBe to simultaneously discharge the second control node QBo and the third control node QBe, in response to the voltage of the fourth control node Qm having a high voltage level and the external sensing control signal Scs having a high voltage level.

Figure 12:
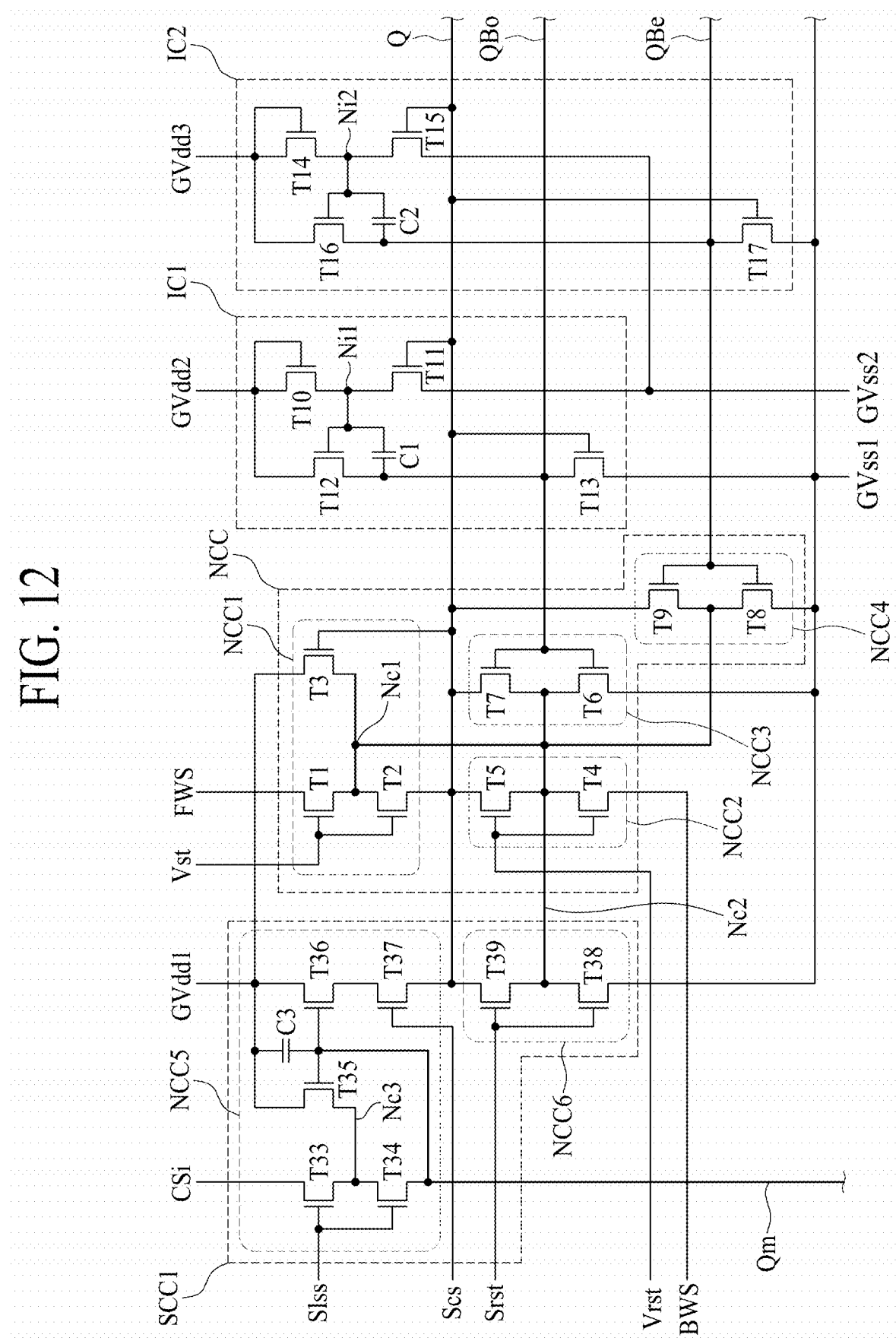
FIG. 12 is a circuit diagram illustrating a node control circuit, a first inverter circuit, a second inverter circuit, and a first sensing control circuit each illustrated in FIG. 11.

FIG. 12 is a circuit diagram illustrating the node control circuit, the first inverter circuit, the second inverter circuit, and the first sensing control circuit each illustrated in FIG. 11.

Referring to FIGS. 11 and 12, a node control circuit NCC according to an embodiment may include first to fourth node control circuits NCC1 to NCC4.

In forward scan driving, the first node control circuit NCC1 may charge a high voltage level of a forward driving signal FWS into a first control node Q in response to a start signal Vst having a high voltage level and the forward driving signal FWS having a high voltage level. Also, in backward scan driving, the first node control circuit NCC1 may electrically connect a forward driving signal line having a low voltage level to the first control node Q to discharge a voltage, charged into the first control node Q, to a low voltage level in response to the start signal Vst having a high voltage level and the forward driving signal FWS having a low voltage level.

The first node control circuit NCC1 may include first to third TFTs T1 to T3.

The first TFT T1 may output the forward driving signal FWS to a first connection node Nc1 in response to the start signal Vst. For example, the first TFT T1 may be turned on based on the start signal Vst having a high voltage level and may output the forward driving signal FWS, supplied through the forward driving signal line, to the first connection node Nc1.

The second TFT T2 may electrically connect the first connection node Nc1 to a first control node Q in response to the start signal Vst. For example, the second TFT T2 may be turned on based on the start signal Vst having a high voltage level and may output the forward driving signal FWS, supplied through the first TFT T1 and the first connection node Nc1, to the first control node Q.

The third TFT T3 may supply a first gate driving power GVdd1, supplied through a first gate driving power line, to the first connection node Nc1 in response to a voltage of the first control node Q. For example, the third TFT T3 may be turned on based on the voltage of the first control node Q having a high voltage level and may transfer the first gate driving power GVdd1 to the first connection node Nc1 between the first TFT T1 and the second TFT T2, thereby preventing the voltage leakage of the first control node Q. For example, the third TFT T3 may increase a voltage difference between a gate voltage of the second TFT T2 and the voltage of the first connection node Nc1 to turn off the second TFT T2 which has been turned off based on the start signal Vst having a low voltage level, and thus, may prevent the voltage drop of the first control node Q through the turned-off second TFT T2, thereby stably maintaining the voltage of the first control node Q.

In backward scan driving, the second node control circuit NCC2 may charge a high voltage level of a backward driving signal BWS into the first control node Q in response to a reset signal Vrst having a high voltage level and the backward driving signal BWS having a high voltage level. Also, in forward scan driving, the second node control circuit NCC2 may electrically connect a backward driving signal line having a low voltage level to the first control node Q to discharge a voltage, charged into the first control node Q, to a low voltage level in response to the reset signal Vrst having a high voltage level and the backward driving signal BWS having a low voltage level.

The second node control circuit NCC2 according to an embodiment may include a fourth TFT T4 and a fifth TFT T5.

The fourth TFT T4 may output the backward driving signal BWS in response to the reset signal Vrst. For example, the fourth TFT T4 may be turned on based on the reset signal Vrst having a high voltage level and may output the backward driving signal BWS, supplied through a backward driving signal line, to a second connection node Nc2.

The fifth TFT T5 may electrically connect the second connection node Nc2 to the first control node Q in response to the reset signal Vrst. For example, the fifth TFT T5 may be turned on based on the reset signal Vrst having a high voltage level and may output the backward driving signal BWS, supplied through the fourth TFT T4 and the second connection node Nc2, to the first control node Q.

The second connection node Nc2 between the fourth TFT T4 and the fifth TFT T5 may be electrically connected to the first connection node Nc1. Therefore, the second connection node Nc2 may be supplied with the first gate driving power GVdd1, supplied through the first gate driving power line, through the third TFT T3 of the first node control circuit NCC1. Therefore, the third TFT T3 of the first node control circuit NCC1 may increase a voltage difference between a gate voltage of the fifth TFT T5 of the second node control circuit NCC2 and the voltage of the second connection node Nc2 to completely turn off the fifth TFT T5 which has been turned off based on the reset signal Vrst having a low voltage level, and thus, may prevent the voltage drop (or the current leakage) of the first control node Q through the turned-off fifth TFT T5, thereby stably maintaining the voltage of the first control node Q.

The third node control circuit NCC3 may discharge the voltage of the first control node Q in response to a voltage of a second control node QBo. For example, the third node control circuit NCC3 may form a current path between the first control node Q and a first gate common power line on the basis of a high voltage level of the second control node QBo to discharge the voltage of the first control node Q to the first gate common power line.

The third node control circuit NCC3 according to an embodiment may include a sixth TFT T6 and a seventh TFT T7.

The sixth TFT T6 may supply the second connection node Nc2 with the first gate common power GVss1 supplied through the first gate common power line in response to the voltage of the second control node QBo. For example, the sixth TFT T6 may be turned on based on a high voltage level of the second control node QBo and may electrically connect the second connection node Nc2 to the first gate common power line.

The seventh TFT T7 may electrically connect the second connection node Nc2 to the first control node Q in response to the voltage of the second control node QBo. For example, the seventh TFT T7 may be turned on based on a high voltage level of the second control node QBo and may electrically connect the second connection node Nc2 to the first control node Q.

The seventh TFT T7 may be turned off based on a low voltage level of the second control node QBo, and a voltage difference between a gate voltage of the turned-off seventh TFT T7 and a voltage of the second connection node Nc2 may increase based on the first gate driving power GVdd1 supplied to the second connection node Nc2 through the third TFT T3 of the first node control circuit NCC1, whereby the seventh TFT T7 turned off based on the low voltage level of the second control node QBo may be completely turned off based on the first gate driving power GVdd1 supplied to the second connection node Nc2. Accordingly, the voltage drop (or current leakage) of the first control node Q through the third node control circuit NCC3 may be prevented because the seventh TFT T7 is completely turned off, thereby stably maintaining the voltage of the first control node Q.

The fourth node control circuit NCC4 may discharge the voltage of the first control node Q in response to a voltage of a third control node QBe. For example, the fourth node control circuit NCC4 may form a current path between the first control node Q and the first gate common power line on the basis of a high voltage level of the third control node QBe to discharge the voltage of the first control node Q to the first gate common power line.

The fourth node control circuit NCC4 according to an embodiment may include an eighth TFT T8 and a ninth TFT T9.

The eighth TFT T8 may supply the second connection node Nc2 with the first gate common power GVss1 supplied through the first gate common power line in response to the voltage of the third control node QBe. For example, the eighth TFT T8 may be turned on based on a high voltage level of the third control node QBe and may electrically connect the second connection node Nc2 to the first gate common power line.

The ninth TFT T9 may electrically connect the second connection node Nc2 to the first control node Q in response to the voltage of the third control node QBe. For example, the ninth TFT T9 may be turned on based on a high voltage level of the third control node QBe and may electrically connect the second connection node Nc2 to the first control node Q.

The ninth TFT T9 may be turned off based on a low voltage level of the third control node QBe, and a voltage difference between a gate voltage of the turned-off ninth TFT T9 and a voltage of the second connection node Nc2 may increase based on the first gate driving power GVdd1 supplied to the second connection node Nc2 through the third TFT T3 of the first node control circuit NCC1, whereby the ninth TFT T9 turned off based on the low voltage level of the third control node QBe may be completely turned off based on the first gate driving power GVdd1 supplied to the second connection node Nc2. Accordingly, the voltage drop (or current leakage) of the first control node Q through the fourth node control circuit NCC4 may be prevented because the ninth TFT T9 is completely turned off, thereby stably maintaining the voltage of the first control node Q.

The first inverter circuit IC1 may discharge the voltage of the second control node QBo in response to the voltage of the first control node Q and a second gate driving power GVdd2. For example, the first inverter circuit IC1 may form a current path between the second control node QBo and the first gate common power line on the basis of a high voltage level of the first control node Q to discharge the voltage of the second control node QBo to the first gate common power line.

The first inverter circuit IC1 according to an embodiment may include tenth to thirteenth TFTs T10 to T13 and a first capacitor C1.

The tenth TFT T10 may be turned on or off based on the second gate driving power GVdd2 and may output the second gate driving power GVdd2, which has a high voltage level when turned on, to a first internal node Ni1. The tenth TFT T10 according to an embodiment may be diode-connected between the second gate driving power GVdd2 and the first internal node Ni1.

The eleventh TFT T11 may be turned on or off based on the voltage of the first control node Q, and when turned on, may discharge a voltage of the first internal node Ni1 to a second gate common power line.

The twelfth TFT T12 may be turned on or off based on the voltage of the first internal node Ni1, and when turned on, may supply the second gate driving power GVdd2 to the second control node QBo.

The thirteenth TFT T13 may be turned on or off based on the voltage of the first control node Q, and when turned on, may supply the voltage of the second control node QBo to the first gate common power line.

The first capacitor C1 may be formed between the first internal node Ni1 and a node (or the second control node QBo) between the twelfth TFT T12 and the thirteenth TFT T13. For example, the first capacitor C1 may allow bootstrapping to occur in the first internal node Ni1 on the basis of a voltage variation of the second gate driving power GVdd2. Therefore, when a voltage level of the second gate driving power GVdd2 varies, the voltage of the first internal node Ni1 may further vary by a voltage variation of the second gate driving power GVdd2 due to bootstrapping caused by coupling of the first capacitor C1 and the second gate driving power GVdd2, thereby more enhancing an output characteristic of the twelfth TFT T12.

The second inverter circuit IC2 may discharge the voltage of the third control node QBe in response to the voltage of the first control node Q and a third gate driving power GVdd3. For example, the second inverter circuit IC2 may form a current path between the third control node QBe and the first gate common power line on the basis of a high voltage level of the first control node Q to discharge the voltage of the third control node QBe to the first gate common power line.

The second inverter circuit IC2 according to an embodiment may include fourteenth to seventeenth TFTs T14 to T17 and a second capacitor C2.

The fourteenth TFT T14 may be turned on or off based on the third gate driving power GVdd3 and may output the third gate driving power GVdd3, which has a high voltage level when turned on, to a second internal node Ni2. The fourteenth TFT T14 according to an embodiment may be diode-connected between the third gate driving power GVdd3 and the second internal node Ni2.

The fifteenth TFT T15 may be turned on or off based on the voltage of the first control node Q, and when turned on, may discharge a voltage of the second internal node Ni2 to the second gate common power line.

The sixteenth TFT T16 may be turned on or off based on the voltage of the second internal node Ni2, and when turned on, may supply the third gate driving power GVdd3 to the third control node QBe.

The seventeenth TFT T17 may be turned on or off based on the voltage of the first control node Q, and when turned on, may supply the voltage of the third control node QBe to the first gate common power line.

The second capacitor C2 may be formed between the second internal node Ni2 and a node (or the third control node QBe) between the sixteenth TFT T16 and the seventeenth TFT T17. For example, the second capacitor C2 may allow bootstrapping to occur in the second internal node Ni2 on the basis of a voltage variation of the third gate driving power GVdd3. Therefore, when a voltage level of the third gate driving power GVdd3 varies, the voltage of the second internal node Ni2 may further vary by a voltage variation of the third gate driving power GVdd3 due to bootstrapping caused by coupling of the second capacitor C2 and the third gate driving power GVdd3, thereby more enhancing an output characteristic of the sixteenth TFT T16.

The first sensing control circuit SCC1 may be implemented to control a voltage of each of the first control node Q and the fourth control node Qm in response to an $i^{th}$ carry signal CSi, an external sensing line selection signal Slss, an external sensing control signal Scs, an external sensing reset signal Srst, and the first gate driving power GVdd1.

The first sensing control circuit SCC1 according to an embodiment may include a fifth node control circuit NCC5 and a sixth node control circuit NCC6.

The fifth node control circuit NCC5 may control the voltage of each of the first control node Q and the fourth control node Qm in response to the $i^{th}$ carry signal CSi, the external sensing line selection signal Slss, the external sensing control signal Scs, and the first gate driving power GVdd1.

The fifth node control circuit NCC5 according to an embodiment may include thirty-third to thirty-seventh TFT T33 to T37 and a third capacitor C3.

The thirty-third TFT T33 may output the $i^{th}$ carry signal CSi to a third connection node Nc3 in response to the external sensing line selection signal Slss supplied along with the start signal Vst. For example, the thirty-third TFT T33 may be turned on based on the external sensing line selection signal Slss having a high voltage level and may output the $i^{th}$ carry signal CSi to the third connection node Nc3.

The thirty-fourth TFT T34 may electrically connect the third connection node Nc3 to the fourth control node Qm in response to the external sensing line selection signal Slss. For example, the thirty-fourth TFT T34 may be turned on based on the external sensing line selection signal Slss having a high voltage level and may supply the $i^{th}$ carry signal CSi, supplied through the thirty-third TFT T33 and the third connection node Nc3, to the fourth control node Qm. The third connection node Nc3 may be a connection line between the thirty-third TFT T33 and the thirty-fourth TFT T34.

The thirty-fifth TFT T35 may supply the first gate driving power GVdd1 to the third connection node Nc3 in response to the voltage of the fourth control node Qm. For example, the thirty-fifth TFT T35 may be turned on based on the voltage of the fourth control node Qm having a high voltage level and may supply the first gate driving power GVdd1 to the third connection node Nc3, thereby preventing the voltage leakage of the fourth control node Qm. For example, the thirty-fifth TFT T35 may increase a voltage difference between a gate voltage of the thirty-fourth TFT T34 and a voltage of the third connection node Nc3, and thus, may completely turn off the thirty-fourth TFT T34 which has been turned off based on the external sensing line selection signal Slss having a low voltage level, thereby preventing the voltage drop (or current leakage) of the fourth control node Qm through the turned-off thirty-fourth TFT T34 to stably maintain the voltage of the fourth control node Qm.

The thirty-sixth TFT T36 may output the first gate driving power GVdd1 to the thirty-seventh TFT T37 in response to the voltage of the fourth control node Qm. For example, the thirty-sixth TFT T36 may be turned on based on the voltage of the fourth control node Qm having a high voltage level and may supply the first gate driving power GVdd1 to the thirty-seventh TFT T37.

The thirty-seventh TFT T37 may electrically connect the thirty-sixth TFT T36 to the first control node Q in response to the external sensing control signal Scs. For example, the thirty-seventh TFT T37 may be turned on based on the external sensing control signal Scs having a high voltage level and may supply the first gate driving power GVdd1, supplied through the thirty-sixth TFT T36, to the first control node Q to charge a voltage level of the first gate driving power GVdd1 into the first control node Q.

The third capacitor C3 may be formed between the fourth control node Qm and the first gate driving power line and may store a difference voltage between the fourth control node Qm and the first gate driving power line. For example, a first electrode of the third capacitor C3 may be electrically connected to the fourth control node Qm which is connected to a gate electrode of the thirty-fifth TFT T35 and a gate electrode of the thirty-sixth TFT T36 in common, and a second electrode of the third capacitor C3 may be electrically connected to the first gate driving power line. The third capacitor C3 may store the $i^{th}$ carry signal CSi according to the turn-on of the thirty-third, thirty-fourth, and thirty-fifth TFTs T33 to T35, and when the thirty-third, thirty-fourth, and thirty-fifth TFTs T33 to T35 are turned off, the third capacitor C3 may maintain the voltage of the fourth control node Qm at a high voltage level by using the stored voltage. For example, the third capacitor C3 may maintain the voltage of the fourth control node Qm at a high voltage level by using the stored voltage during one horizontal period.

The sixth node control circuit NCC6 may discharge the voltage of the first control node Q in response to the external sensing reset signal Srst. For example, the sixth node control circuit NCC6 may supply the first gate common power GVss1 to the first control node Q in response to the external sensing reset signal Srst having a high voltage level, thereby resetting or initializing the voltage of the first control node Q.

The sixth node control circuit NCC6 according to an embodiment may include a thirty-eighth TFT T38 and a thirty-ninth TFT T39.

The thirty-eighth TFT T38 may supply the first gate common power GVss1, supplied through the first gate common power line, to the second connection node Nc2 in response to the external sensing reset signal Srst. For example, the thirty-eighth TFT T38 may be turned on based on the external sensing reset signal Srst having a high voltage level and may output the first gate common power GVss1 to the second connection node Nc2.

The thirty-ninth TFT T39 may electrically connect the second connection node Nc2 to the first control node Q in response to the external sensing reset signal Srst. For example, the thirty-ninth TFT T39 may be turned on based on the external sensing reset signal Srst having a high voltage level and may supply the first gate common power GVss1, supplied through the thirty-eighth TFT T38 and the second connection node Nc2, to the first control node Q.

The second connection node Nc2 between the thirty-eighth TFT T38 and the thirty-ninth TFT T39 may be electrically connected to the first connection node Nc1. Therefore, the second connection node Nc2 may be supplied with the first gate driving power GVdd1 through the third TFT T3 of the first node control circuit NCC1. Therefore, the third TFT T3 of the first node control circuit NCC1 may increase a voltage difference between a gate voltage of the thirty-ninth TFT T39 of the sixth node control circuit NCC6 and the voltage of the second connection node Nc2 to completely turn off the thirty-ninth TFT T39 which has been turned off based on the external sensing reset signal Srst having a low voltage level, and thus, may prevent the voltage drop (or the current leakage) of the first control node Q through the turned-off thirty-ninth TFT T39, thereby stably maintaining the voltage of the first control node Q.

Optionally, the first sensing control circuit SCC1 may be omitted. That is, the first sensing control circuit SCC1 may be a circuit which is used for sensing a characteristic value of a driving TFT disposed in a subpixel of a pixel on the basis of an external sensing mode of the pixel, and when the pixel is not driven in the external sensing mode, the first sensing control circuit SCC1 may be an undesired element and thus may be omitted.

Figure 13:
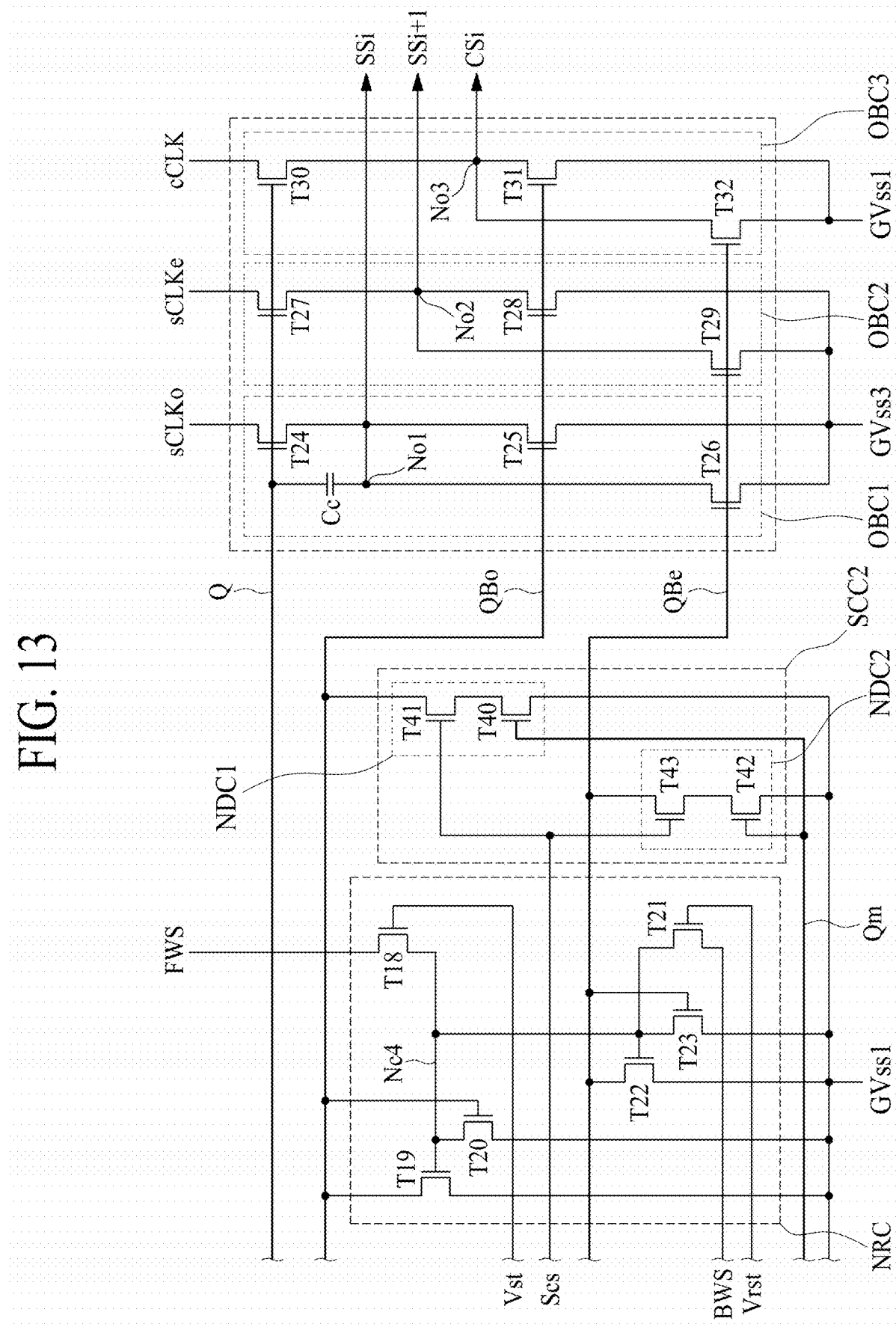
FIG. 13 is a circuit diagram illustrating a node reset circuit, an output buffer circuit, and a second sensing control circuit each illustrated in FIG. 11.

FIG. 13 is a circuit diagram illustrating the node reset circuit, the output buffer circuit, and the second sensing control circuit each illustrated in FIG. 11.

Referring to FIGS. 11 and 13, a node reset circuit NRC according to an embodiment may maintain a voltage level of each of a second control node QBo and a third control node QBe while a voltage of a first control node Q has a high voltage level.

The node reset circuit NRC according to an embodiment may include eighteenth to twenty-third TFTs T18 to T23.

The eighteenth TFT T18 may electrically connect a fourth connection node Nc4 to a forward driving signal line in response to a start signal Vst and a forward driving signal FWS. For example, the eighteenth TFT T18 may be turned on based on the start signal Vst having a high voltage level and may supply the forward driving signal FWS to the fourth connection node Nc4.

The nineteenth TFT T19 may electrically connect a second control node QBo to a first gate common power line in response to a voltage of a fourth connection node Nc4. For example, the nineteenth TFT T19 may be turned on based on a voltage of the fourth connection node Nc4 and may form a current path between the second control node QBo and a first gate common power line to discharge a voltage of the second control node QBo to the first gate common power line, thereby resetting the voltage of the second control node QBo to a voltage level of a first gate common power GVss1.

The twentieth TFT T20 may electrically connect the fourth connection node Nc4 to the first gate common power line in response to the voltage of the second control node QBo. For example, the twentieth TFT T20 may be turned on based on a high voltage level of the second control node QBo and may form a current path between the fourth connection node Nc4 and the first gate common power line to discharge a voltage of the fourth connection node Nc4 to the first gate common power line, thereby resetting the voltage of the fourth connection node Nc4 to the voltage level of the first gate common power GVss1. Accordingly, when the voltage of the second control node QBo has a high voltage level, the twentieth TFT T20 may reset the voltage of the fourth connection node Nc4 to the voltage level of the first gate common power GVss1 to turn off the nineteenth TFT T19, and thus, may prevent the voltage of the second control node QBo from being discharged to the first gate common power line through the nineteenth TFT T19.

The twenty-first TFT T21 may electrically connect the fourth connection node Nc4 to a backward driving signal line in response to a reset signal Vrst and a backward driving signal BWS. For example, the twenty-first TFT T21 may be turned on based on the reset signal Vrst having a high voltage level and may supply the backward driving signal BWS having a high voltage level to the fourth connection node Nc4.

The twenty-second TFT T22 may electrically connect the third control node QBe to the first gate common power line in response to the voltage of the fourth connection node Nc4. For example, the twenty-second TFT T22 may be turned on based on the voltage of the fourth connection node Nc4 and may form a current path between the third control node QBe and the first gate common power line to discharge a voltage of the third control node QBe to the first gate common power line, thereby resetting the voltage of the third control node QBe to the voltage level of the first gate common power GVss1.

The twenty-third TFT T23 may electrically connect the fourth connection node Nc4 to the first gate common power line in response to the voltage of the third control node QBe. For example, the twenty-third TFT T23 may be turned on based on a high voltage level of the third control node QBe and may form a current path between the fourth connection node Nc4 and the first gate common power line to discharge the voltage of the fourth connection node Nc4 to the first gate common power line, thereby resetting the voltage of the fourth connection node Nc4 to the voltage level of the first gate common power GVss1. Accordingly, when the voltage of the third control node QBe has a high voltage level, the twenty-third TFT T23 may reset the voltage of the fourth connection node Nc4 to the voltage level of the first gate common power GVss1 to turn off the twenty-second TFT T22, and thus, may prevent the voltage of the third control node QBe from being discharged to the first gate common power line through the twenty-second TFT T22.

The nineteenth TFT T19 and the twenty-second TFT T22 may be simultaneously turned on or off based on the voltage of the fourth connection node Nc4.

For example, in forward scan driving of the gate driving circuit 150, the nineteenth TFT T19 and the twenty-second TFT T22 may be simultaneously turned on based on a high voltage level of the forward driving signal FWS supplied to the fourth connection node Nc4 through the eighteenth TFT T18 turned on based on the start signal Vst having a high voltage level and may be simultaneously turned off based on the first gate common power GVss1 supplied to the fourth connection node Nc4 through the twentieth TFT T20 turned on based on a high voltage level of the second control node QBo or may be simultaneously turned off based on the first gate common power GVss1 supplied to the fourth connection node Nc4 through the twenty-third TFT T23 turned on based on a high voltage level of the third control node QBe.

As another example, in backward scan driving of the gate driving circuit 150, the nineteenth TFT T19 and the twenty-second TFT T22 may be simultaneously turned on based on a high voltage level of the backward driving signal BWS supplied to the fourth connection node Nc4 through the twenty-first TFT T21 turned on based on the reset signal Vrst having a high voltage level and may be simultaneously turned off based on the first gate common power GVss1 supplied to the fourth connection node Nc4 through the twenty-third TFT T23 turned on based on a high voltage level of the third control node QBe or may be simultaneously turned off based on the first gate common power GVss1 supplied to the fourth connection node Nc4 through the twentieth TFT T20 turned on based on a high voltage level of the second control node QBo.

The output buffer circuit OBC may receive a carry clock cCLK, an odd-numbered scan clock sCLKo, an even-numbered scan clock sCLKe, a first gate common power GVss1, the second gate common power GVss2, and a third gate common power GVss3 and may output an $i^{th}$ scan signal SSi, an $i+1^{th}$ scan signal SSi+1, and an $i^{th}$ carry signal CSi based on the carry clock cCLK, the scan clock sCLK, and the third gate common power GVss3 in response to the voltage of each of the first to third control nodes Q, QBo, and QBe. For example, when the voltage of the first control node Q has a high voltage level, the output buffer circuit OBC may output the $i^{th}$ carry signal CSi corresponding to the carry clock cCLK, the $i^{th}$ scan signal SSi corresponding to the odd-numbered scan clock sCLKo, and the $i+1^{th}$ scan signal SSi+1 corresponding to the even-numbered scan clock sCLKe.

The output buffer circuit OBC according to an embodiment may include first to third output buffer circuits OBC1 to OBC3.

The first output buffer circuit OBC1 may output the $i^{th}$ scan signal SSi having a voltage level of the odd-numbered scan clock sCLKo or a voltage level of the third gate common power GVss3 on the basis of the voltage of each of the first to third control nodes Q, QBo, and QBe.

The first output buffer circuit OBC1 according to an embodiment may include twenty-fourth to twenty-sixth TFTs T24 to T26 and a coupling capacitor Cc.

The twenty-fourth TFT T24 (or a first pull-up TFT) may transfer the odd-numbered scan clock sCLKo to the $i^{th}$ gate line GLi through a first output node No1 on the basis of the voltage of the first control node Q. For example, the twenty-fourth TFT T24 may include a gate electrode connected to the first control node Q, a first source/drain electrode connected to the first output node No1, and a second source/drain electrode connected to an odd-numbered scan clock line.

The twenty-fifth TFT T25 (or an odd first pull-down TFT) may transfer the third gate common power GVss3 to the $i^{th}$ gate line GLi through the first output node No1 on the basis of the voltage of the second control node QBo. For example, the twenty-fifth TFT T25 may include a gate electrode connected to the second control node QBo, a first source/drain electrode connected to the first output node No1, and a second source/drain electrode connected to a third gate common power line.

The twenty-sixth TFT T26 (or an even first pull-down TFT) may transfer the third gate common power GVss3 to the $i^{th}$ gate line GLi through the first output node No1 on the basis of the voltage of the third control node QBe. For example, the twenty-sixth TFT T26 may include a gate electrode connected to the third control node QBe, a first source/drain electrode connected to the first output node No1, and a second source/drain electrode connected to a third gate common power line.

The coupling capacitor Cc may be formed between the first control node Q and the first output node No1. For example, the coupling capacitor Cc may be a parasitic capacitor between a gate electrode of the twenty-fourth TFT T24 and the first output node No1. The coupling capacitor Cc may allow bootstrapping to occur in the first control node Q on the basis of a phase shift (or variation) of the odd-numbered scan clock sCLKo. Accordingly, when the odd-numbered scan clock sCLKo is shifted from a low voltage level to a high voltage level, the voltage of the first control node Q may be boosted to a higher voltage by a high voltage level of the odd-numbered scan clock sCLKo on the basis of bootstrapping caused by coupling between the coupling capacitor Cc and the odd-numbered scan clock sCLKo having a high voltage level. For example, as the odd-numbered scan clock sCLKo having a high voltage level is supplied to the second source/drain electrode of the twenty-fourth TFT T24, the voltage of the first control node Q pre-charged with a voltage level of the forward driving signal FWS by the first node control circuit NCC1 may be boosted to a higher voltage, and thus, the twenty-fourth TFT T24 may be completely turned on and the odd-numbered scan clock sCLKo having a high voltage level may be supplied to, as the $i^{th}$ scan signal SSi, the $i^{th}$ gate line GLi through the first output node No1 and the turned-on twenty-fourth TFT T24 without voltage loss.

The second output buffer circuit OBC2 may output the i+1$^{th}$ scan signal SSi+1 having a voltage level of the even-numbered scan clock sCLKe or a voltage level of the third gate common power GVss3 on the basis of the voltage of each of the first to third control nodes Q, QBo, and QBe.

The second output buffer circuit OBC2 according to an embodiment may include twenty-seventh to twenty-ninth TFTs T27 to T29.

The twenty-seventh TFT T27 (or a second pull-up TFT) may transfer the even-numbered scan clock sCLKe to the i+1$^{th}$ gate line GLi+1 through a second output node No2 on the basis of the voltage of the first control node Q. For example, the twenty-seventh TFT T27 may include a gate electrode connected to the first control node Q, a first source/drain electrode connected to the second output node No2, and a second source/drain electrode connected to an even-numbered scan clock line. The twenty-seventh TFT T27 may be turned on based on the bootstrapped voltage of the first control node Q, and thus, may transfer the even-numbered scan clock sCLKe having a high voltage level, supplied through an even-numbered scan clock line, to the i+1$^{th}$ gate line GLi+1 as the i+1$^{th}$ scan signal SSi+1 through the second output node No2 without voltage loss.

The twenty-eighth TFT T28 (or an odd second pull-down TFT) may transfer the third gate common power GVss3 to the i+1$^{th}$ gate line GLi+1 through the second output node No2 on the basis of the voltage of the second control node QBo. For example, the twenty-eighth TFT T28 may include a gate electrode connected to the second control node QBo, a first source/drain electrode connected to the second output node No2, and a second source/drain electrode connected to the third gate common power line.

The twenty-ninth TFT T29 (or an even second pull-down TFT) may transfer the third gate common power GVss3 to the i+1$^{th}$ gate line GLi+1 through the second output node No2 on the basis of the voltage of the third control node QBe. For example, the twenty-ninth TFT T29 may include a gate electrode connected to the third control node QBe, a first source/drain electrode connected to the second output node No2, and a second source/drain electrode connected to the third gate common power line.

The third output buffer circuit OBC3 may output the $i^{th}$ carry signal CSi having a voltage level of the carry clock cCLK or a voltage level of the first gate common power GVss1 on the basis of the voltage of each of the first to third control nodes Q, QBo, and QBe.

The third output buffer circuit OBC3 according to an embodiment may include thirtieth to thirty-second TFTs T30 to T32.

The thirtieth TFT T30 (or a third pull-up TFT) may output, as the $i^{th}$ carry signal CSi, the carry clock cCLK through a third output node No3 on the basis of the voltage of the first control node Q. For example, the thirtieth TFT T30 may include a gate electrode connected to the first control node Q, a first source/drain electrode connected to the third output node No3, and a second source/drain electrode connected to a carry clock line. The thirtieth TFT T30 may be turned on based on the bootstrapped voltage of the first control node Q and may output, as the $i^{th}$ carry signal CSi, the carry clock cCLK having a high voltage level, supplied through the carry clock line, through the third output node No3 without voltage loss.

The thirty-first TFT T31 (or an odd third pull-down TFT) may output, as the $i^{th}$ carry signal CSi, the first gate common power GVss1 through the third output node No3 on the basis of the voltage of the second control node QBo. For example, the thirty-first TFT T31 may include a gate electrode connected to the second control node QBo, a first source/drain electrode connected to the third output node No3, and a second source/drain electrode connected to the first gate common power line.

The thirty-second TFT T32 (or an even third pull-down TFT) may output, as the $i^{th}$ carry signal CSi, the first gate common power GVss1 through the third output node No3 on the basis of the voltage of the third control node QBe. For example, the thirty-second TFT T32 may include a gate electrode connected to the third control node QBe, a first source/drain electrode connected to the third output node No3, and a second source/drain electrode connected to the first gate common power line.

Alternatively, the coupling capacitor Cc may be formed between the first control node Q and the third output node No3. Furthermore, the coupling capacitor Cc may be formed in at least one of a region between the first control node Q and the first output node No1, a region between the first control node Q and the second output node No2, and a region between the first control node Q and the third output node No3.

The second sensing control circuit SCC2 may be implemented to discharge the voltage of each of the second control node QBo and the third control node QBe in response to the voltage of the fourth control node Qm and the external sensing control signal Scs.

The second sensing control circuit SCC2 according to an embodiment may include a first node discharging circuit NDC1 and a second node discharging circuit NDC2.

The first node discharging circuit NDC1 may discharge the voltage of the second control node QBo in response to the voltage of the fourth control node Qm and the external sensing control signal Scs. For example, the first node discharging circuit NDC1 may supply the first gate common power GVss1 to the second control node QBo in response to the voltage of the fourth control node Qm having a high voltage level and the external sensing control signal Scs having a high voltage level, and thus, may discharge the voltage of the second control node QBo to the first gate common power line or may reset the voltage of the second control node QBo to the first gate common power GVss1.

The first node discharging circuit NDC1 according to an embodiment may include a fortieth TFT T40 and a forty-first TFT T41.

The fortieth TFT T40 may transfer the first gate common power GVss1 to the forty-first TFT T41 in response to the voltage of the fourth control node Qm. For example, the fortieth TFT T40 may be turned on based on a high voltage level of the fourth control node Qm and may form a current path between the forty-first TFT T41 and the first gate common power GVss1.

The forty-first TFT T41 may electrically connect the second control node QBo to the fortieth TFT T40 in response to the external sensing control signal Scs. For example, the forty-first TFT T41 may be turned on based on the external sensing control signal Scs having a high voltage level and may form a current path between the second control node QBo and the fortieth TFT T40. The forty-first TFT T41 may be turned on based on the external sensing control signal Scs having a high voltage level in a state where the fortieth TFT T40 is turned on based on a high voltage level of the fourth control node Qm, and thus, the voltage of the second control node QBo may be discharged to the first gate common power line or may be reset to the first gate common power GVss1 through each of the forty-first TFT T41 and the fortieth TFT T40.

The second node discharging circuit NDC2 may discharge the voltage of the third control node QBe in response to the voltage of the fourth control node Qm and the external sensing control signal Scs. For example, the second node discharging circuit NDC2 may supply the first gate common power GVss1 to the third control node QBe in response to the voltage of the fourth control node Qm having a high voltage level and the external sensing control signal Scs having a high voltage level, and thus, may discharge the voltage of the third control node QBe to the first gate common power line or may reset the voltage of the third control node QBe to the first gate common power GVss1

The second node discharging circuit NDC2 according to an embodiment may include a forty-second TFT T42 and a forty-third TFT T43.

The forty-second TFT T42 may transfer the first gate common power GVss1 to the forty-third TFT T43 in response to the voltage of the fourth control node Qm. For example, the forty-second TFT T42 may be turned on based on a high voltage level of the fourth control node Qm and may form a current path between the forty-third TFT T43 and the first gate common power GVss1.

The forty-third TFT T43 may electrically connect the third control node QBe to the forty-second TFT T42 in response to the external sensing control signal Scs. For example, the forty-third TFT T43 may be turned on based on the external sensing control signal Scs having a high voltage level and may form a current path between the third control node QBe and the forty-second TFT T42. The forty-third TFT T43 may be turned on based on the external sensing control signal Scs having a high voltage level in a state where the forty-second TFT T42 is turned on based on a high voltage level of the fourth control node Qm, and thus, the voltage of the third control node QBe may be discharged to the first gate common power line or may be reset to the first gate common power GVss1 through each of the forty-third TFT T43 and the forty-second TFT T42.

Alternatively, the second sensing control circuit SCC2 may be omitted along with the first sensing control circuit SCC1. That is, each of the first sensing control circuit SCC1 and the second sensing control circuit SCC2 may be a circuit which is used for sensing a characteristic value of a driving TFT disposed in a subpixel of a pixel on the basis of an external sensing mode of the pixel, and when the pixel is not driven in the external sensing mode, each of the first sensing control circuit SCC1 and the second sensing control circuit SCC2 may be an undesired element and thus may be omitted.

The first to forty-third TFTs T1 to T43 illustrated in FIGS. 12 and 13 may be separately disposed (or distributedly disposed) in one horizontal line of the display area AA and may be connected to one another through the branch network 153, and thus, may configure the plurality of branch circuits 1511 to 151n disposed apart from one another between the plurality of pixels P in a lengthwise direction of the plurality of gate lines and connected to the gate control line group GCL illustrated in FIG. 7. For example, each of the stage circuit units 1501 to 150m may include first to $n^{th}$ (where n is 43) branch circuits 1511 to 151n where one of the first to forty-third TFTs T1 to T43 is disposed or provided, but is not limited thereto and each of the plurality of branch circuits 1511 to 151n may be implemented with at least one of the first to forty-third TFTs T1 to T43 on the basis of the number of pixels disposed in one horizontal line.

Additionally, in the stage circuit unit 150i illustrated in FIGS. 11 to 13, when the first switching TFT Tsw1 and the second switching TFT Tsw2 disposed in the pixel circuit PC of each of the plurality of subpixels SP1 to SP4 illustrated in FIG. 8 are turned on based on different first and second scan signals, the $i^{th}$ scan signal SSi may be used as a first scan signal supplied through a first gate line of the odd-numbered gate line GLo and the i+$1^{th}$ scan signal SSi+1 may be used as the first scan signal supplied through a first gate line of the even-numbered gate line GLe. Therefore, the output buffer circuit OBC of the stage circuit unit 150i illustrated in FIGS. 11 to 13 may further include a fourth output buffer circuit and a fifth output buffer circuit.

The fourth output buffer circuit may be implemented to output a second scan signal to a second gate line of the odd-numbered gate line GLo, and the fifth output buffer circuit may be implemented to output the second scan signal to a second gate line of the even-numbered gate line GLe.

The fourth output buffer circuit according to an embodiment may output an $i^{th}$ second scan signal having a voltage level of a second scan odd-numbered scan clock or a voltage level of the third gate common power GVss3 on the basis of the voltage of each of the first to third control nodes Q, QBo, and QBe. Except for that the fourth output buffer circuit outputs the $i^{th}$ second scan signal on the basis of the second scan odd-numbered scan clock, the fourth output buffer circuit may include three TFTs which are substantially the same as those of the first output buffer circuit OBC1 illustrated in FIG. 13, and thus, its detailed description is omitted.

The fifth output buffer circuit according to an embodiment may output an i+$1^{th}$ second scan signal having a voltage level of a second scan even-numbered scan clock or a voltage level of the third gate common power GVss3 on the basis of the voltage of each of the first to third control nodes Q, QBo, and QBe. Except for that the fifth output buffer circuit outputs the i+$1^{th}$ second scan signal on the basis of the second scan even-numbered scan clock, the fifth output buffer circuit may include three TFTs which are substantially the same as those of the second output buffer circuit OBC2 illustrated in FIG. 13, and thus, its detailed description is omitted.

In the stage circuit unit 150i illustrated in FIGS. 11 and 13, the odd-numbered scan clock sCLKo may be referred to as a first scanning odd-numbered scan clock, and the even-numbered scan clock sCLKe may be referred to as a first scanning even-numbered scan clock. For example, a first scanning scan clock and a second scanning scan clock may have the same phase or different phases. Also, the first scanning scan clock and the second scanning scan clock may have the same clock width or different clock widths.

Figure 14:
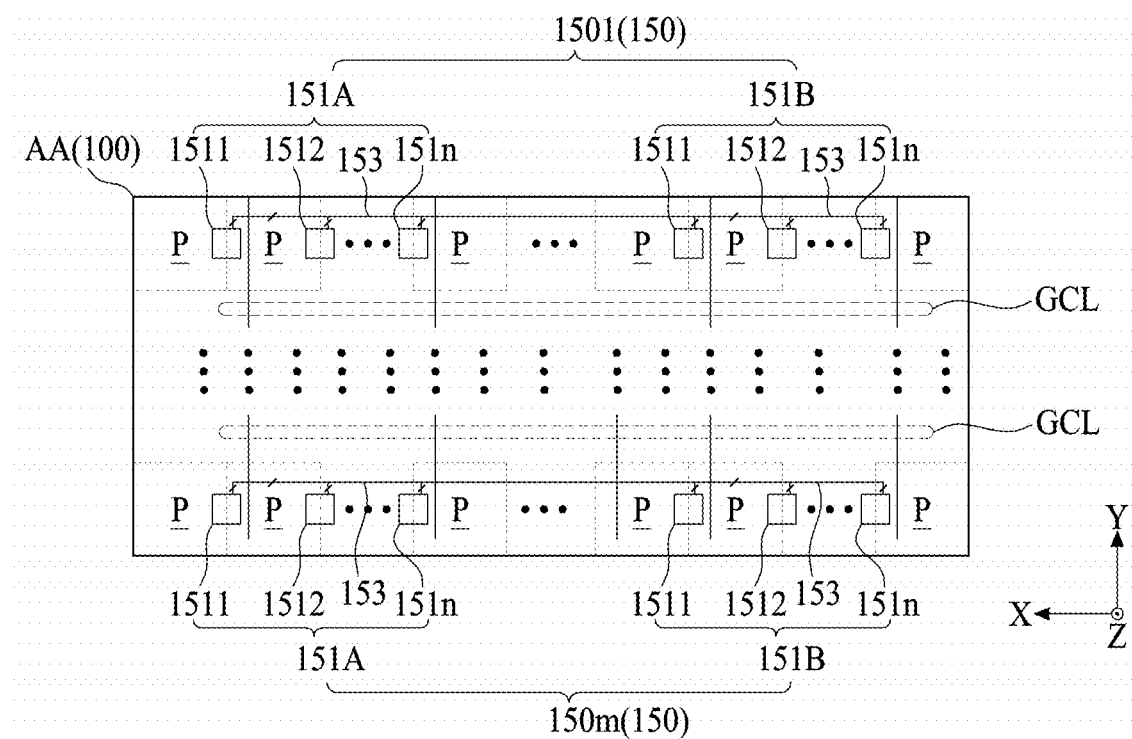
FIG. 14 is a diagram for describing a gate driving circuit according to another embodiment of the present disclosure illustrated in FIG. 4.

FIG. 14 is a diagram for describing a gate driving circuit according to another embodiment of the present disclosure illustrated in FIG. 4 and illustrates an embodiment where a configuration of each stage circuit unit in the gate driving circuit illustrated in FIGS. 6 and 7 are modified. In describing FIG. 14, elements which are the same or correspond to the elements of FIGS. 6 and 7 are referred to by like reference numerals, and their repetitive descriptions are omitted or will be briefly described below.

Referring to FIG. 14, a gate driving circuit 150 according to another embodiment may include a plurality of stage circuit units 1501 to 150m which are disposed in each horizontal line of a first substrate 100 in a first direction X and are dependently connected to one another in a second direction Y.

Each of the plurality of stage circuit units 1501 to 150m according to an embodiment may include a first stage circuit part 151A and a second stage circuit part 151B.

The first stage circuit part 151A may be disposed in one region of each horizontal line on a first surface 100a of a first substrate 100 in a first direction X. The first stage circuit part 151A may generate a scan signal and may supply the scan signal to a corresponding gate line GL, in response to a gate control signal supplied through each line of a gate control line group GCL.

The first stage circuit part 151A according to an embodiment may include the branch network 153, the node control circuit NCC, the first inverter circuit IC1, the second inverter circuit IC2, the node reset circuit NRC, and the output buffer circuit OBC illustrated in FIGS. 11 to 13. The first stage circuit part 151A including such elements may include the same elements as those of the i$^{th}$ stage circuit unit 150i illustrated in FIGS. 11 to 13, and thus, their repetitive descriptions are omitted.

The branch network 153 of the first stage circuit part 151A may include a plurality of first to third control nodes and a network line, and the plurality of first to third control nodes may be shared by a second stage circuit part 151B. That is, each of the first to third control nodes may be commonly connected to the first stage circuit part 151A and the second stage circuit part 151B.

The first stage circuit part 151A according to an embodiment may include the node control circuit NCC, the first inverter circuit IC1, the second inverter circuit IC2, the node reset circuit NRC, and a plurality of branch circuits 1511 to 151n including at least one of TFTs T1 to T43 configuring the output buffer circuit OBC. Each of the plurality of branch circuits 1511 to 151n may be dependently connected to one another through the branch network 153.

The second stage circuit part 151B may be disposed in the other region of each horizontal line on the first surface 100a of the substrate 100. The second stage circuit part 151B may generate a scan signal and may supply the scan signal to a corresponding gate line GL, in response to a gate control signal supplied through each line of a gate control line group GCL. For example, the second stage circuit part 151B may be electrically connected to the same gate line as the first stage circuit part 151A and may supply the same gate line with the same scan signal as the first stage circuit part 151A. In this case, the gate driving circuit 150 may realize a double feeding manner for simultaneously supplying a scan signal in one region and the other region of one gate line through the first stage circuit part 151A and the second stage circuit part 151B, and thus, the delay of the scan signal caused by a line resistance of each gate line may be prevented or minimized.

Optionally, the second stage circuit part 151B may be implemented as a redundancy circuit for replacing the first stage circuit part 151A when a driving error or a defect occurs in the first stage circuit part 151A.

The second stage circuit part 151B according to an embodiment may include the node control circuit NCC, the first inverter circuit IC1, the second inverter circuit IC2, the node reset circuit NRC, and the output buffer circuit OBC illustrated in FIGS. 11 to 13. The second stage circuit part 151B including such elements may include the same elements as those of the i$^{th}$ stage circuit unit 150i illustrated in FIGS. 11 to 13, and thus, their repetitive descriptions are omitted.

The second stage circuit part 151B according to an embodiment may include the node control circuit NCC, the first inverter circuit IC1, the second inverter circuit IC2, the node reset circuit NRC, and a plurality of branch circuits 1511 to 151n including at least one of TFTs T1 to T43 configuring the output buffer circuit OBC. Each of the plurality of branch circuits 1511 to 151n may be dependently connected to one another through the branch network 153.

Figure 15:
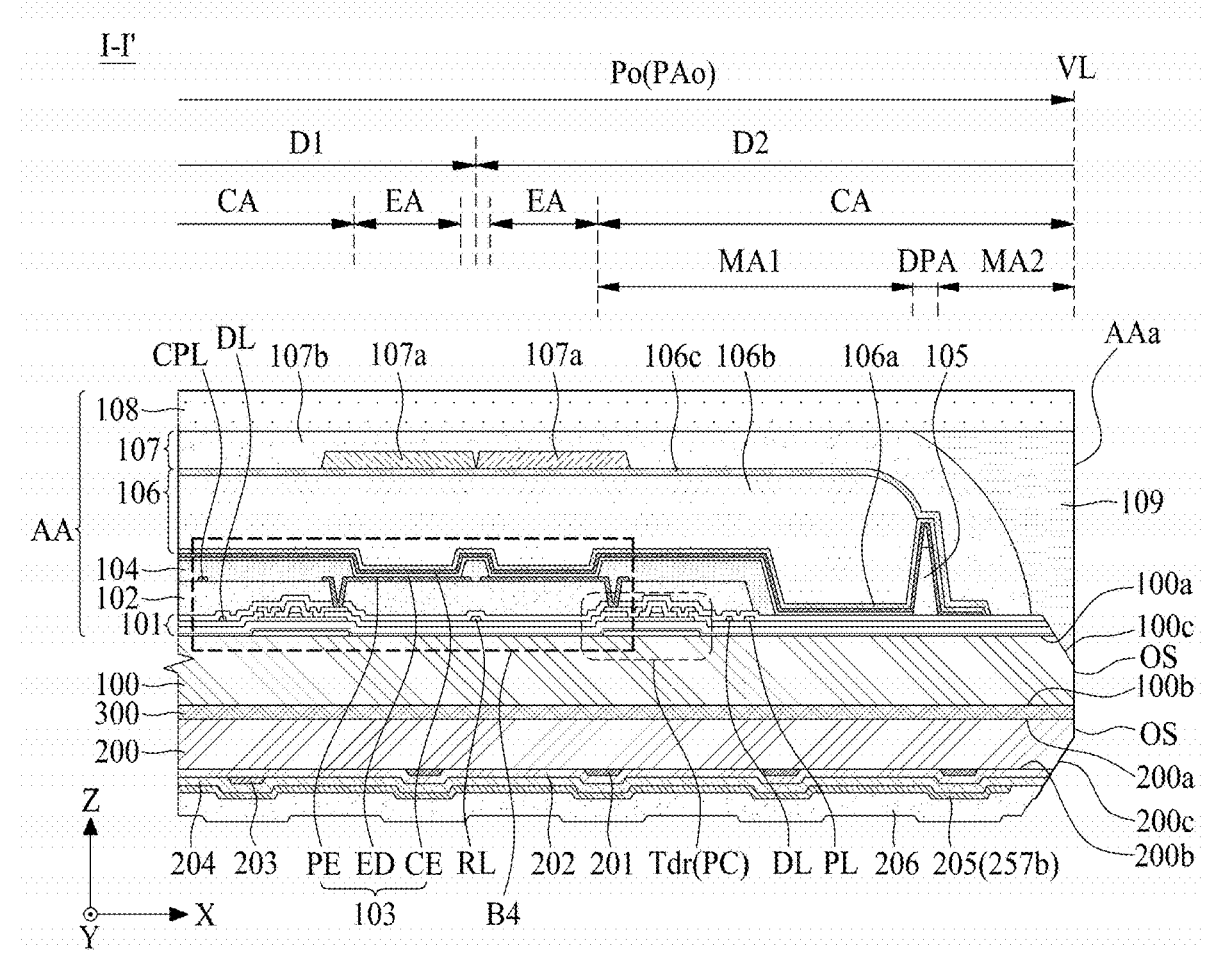
FIG. 15 is a cross-sectional view taken along line I-I' illustrated in FIG. 4.
Figure 16:
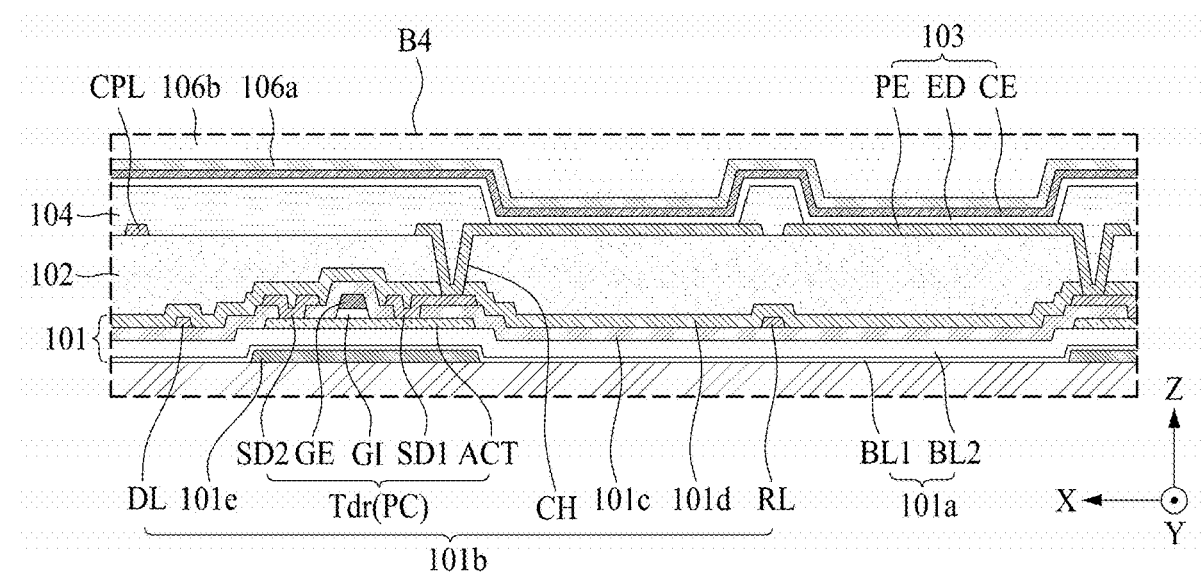
FIG. 16 is an enlarged view of a region 'B4' illustrated in FIG. 15.

FIG. 15 is a cross-sectional view taken along line I-I' illustrated in FIG. 4, and FIG. 16 is an enlarged view of a region B4' illustrated in FIG. 15. FIGS. 15 and 16 are diagrams for describing a cross-sectional structure of each of first and second substrates of a display apparatus according to the present disclosure. In describing FIGS. 15 and 16, elements which are the same or correspond to the elements of FIG. 4 are referred to by like reference numerals, and their repetitive descriptions are omitted or will be briefly described below.

Referring to FIGS. 4, 6, 8, 15, and 16, a display apparatus 10 according to the present disclosure may include a first substrate 100 and a second substrate 200, which are coupled (or bonded) to each other by using a coupling member 300.

The first substrate 100 according to an embodiment may include a circuit layer 101, a planarization layer 102, a light emitting device layer 103, a bank 104, a dam pattern 105, and an encapsulation layer 106.

The circuit layer 101 may be disposed on a first surface 100a of the first substrate 100. The circuit layer 101 may be referred to as a pixel array layer or a TFT array layer.

The circuit layer 101 according to an embodiment may include a buffer layer 101a and a circuit array layer 101b.

The buffer layer 101a may prevent materials, such as hydrogen included in the first substrate 100, from being diffused to the circuit array layer 101b in a high temperature process of a process of manufacturing a TFT. Also, the buffer layer 101a may prevent external water or moisture from penetrating into the light emitting device layer 103. The buffer layer 101a according to an embodiment may include silicon oxide (SiOx), silicon nitride (SiNx), silicon oxynitride (SiON), or a multilayer thereof, but is not limited thereto. For example, the buffer layer 101a may include a first buffer layer BL1 which includes SiNx and is disposed on the first substrate 100 and a second buffer layer BL2 which includes SiOx and is disposed on the first buffer layer BL1.

The circuit array layer 101b may include a plurality of pixel driving lines GL, DL, PL, RL, CPL, PSL, RDL, and LCP disposed on the buffer layer 101a and a pixel circuit PC which includes a driving TFT Tdr disposed in each of a plurality of pixel areas PA on the buffer layer 101a.

The driving TFT Tdr disposed in each pixel area PA may include an active layer ACT, a gate insulation layer GI, a gate electrode GE, an interlayer insulation layer 101c, a first source/drain electrode SD1, a second source/drain electrode SD2, and a passivation layer 101d.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display area AA or electrically connects lines disposed on different layers.

The gate insulation layer GI may be disposed in the channel area of the active layer ACT. The gate insulation layer GI may insulate the active layer ACT from the gate electrode GE. For example, the gate insulation layer GI may include SiOx, SiNx, SiON, or a multilayer thereof, but is not limited thereto.

The gate electrode GE may be disposed on the gate insulation layer GI. The gate electrode GE may overlap the channel area of the active layer ACT with the gate insulation layer GI therebetween.

The gate electrode GE may have a single-layer structure or a multi-layer structure including at least one of molybdenum (Mo), titanium (Ti), a Mo—Ti alloy (MoTi), and copper (Cu). The gate electrode GE according to an embodiment may include a first gate metal layer disposed on the gate insulation layer GI and a second gate metal layer disposed on the first gate metal layer. For example, the first gate metal layer may include Ti or MoTi. The second gate metal layer may include Cu. In this case, the gate electrode GE may have a two-layer structure of Cu/MoTi or Cu/Ti.

Each of gate lines GL, power sharing lines PSL, line connection patterns LCP, and a reference branch line RDL among the pixel driving lines GL, DL, PL, RL, CPL, PSL, RDL, and LCP may include the same material as that of the gate electrode GE, but is not limited thereto.

The interlayer insulation layer 101c may be disposed on the first substrate 100 to cover the gate electrode GE and the active layer ACT. The interlayer insulation layer 101c may electrically insulate (or isolate) the gate electrode GE from the source/drain electrodes SD1 and SD2. For example, the interlayer insulation layer 101c may include SiOx, SiNx, SiON, or a multilayer thereof, but is not limited thereto.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The source/drain electrodes SD1 and SD2 according to an embodiment may have a single-layer structure or a multi-layer structure including the same material as that of the gate electrode GE.

Each of data lines DL, pixel driving power lines PL, and reference power lines RL among the pixel driving lines GL, DL, PL, RL, CPL, PSL, RDL, and LCP may include the same material as that of the source/drain electrode SD1 and SD2, but is not limited thereto. Also, each line of a gate control line group GCL may include the same material as that of the source/drain electrode SD1 and SD2, but is not limited thereto.

A passivation layer 101d may be disposed on a first surface 100a of the first substrate 100 to cover the pixel circuit PC including the driving TFT Tdr. The passivation layer 101d according to an embodiment may include SiOx, SiNx, SiON, or a multilayer thereof, but is not limited thereto.

Each of first and second switching TFTs Tsw1 and Tsw2 configuring the pixel circuit PC may be formed along with the driving TFT Tdr, and thus, their detailed descriptions are omitted.

The circuit layer 101 according to an embodiment may further include a light blocking layer 101e which is disposed under the active layer ACT of each of the TFTs Tdr, Tsw1, and Tsw2 configuring the pixel circuit PC.

The light blocking layer (or a light blocking pattern) 101e may be disposed in an island shape between the first substrate 100 and the active layer ACT. The light blocking layer 101e may be covered by the buffer layer 101a. The light blocking layer 101e may block light which is incident on the active layer ACT through the first substrate 100, thereby preventing or minimizing a threshold voltage variation of each TFT caused by external light. Optionally, the light blocking layer 101e may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

Moreover, the light blocking layer 101e may be used as at least one of the power sharing lines PSL, the line connection patterns LCP, and the reference branch line RDL among the pixel driving lines GL, DL, PL, RL, CPL, PSL, RDL, and LCP.

The gate driving circuit 150 illustrated in FIGS. 4 and 6 may be formed along with the driving TFT Tdr of the pixel circuit PC. For example, a plurality of TFTs configuring each of the stage circuit units 1501 to 150m of the gate driving circuit 150 may be formed along with the driving TFT Tdr, and thus, the plurality of branch circuits 1511 to 151n disposed in each horizontal line on the first substrate 100 may be implemented. The first to fourth control nodes Q, QBo, QBe, and Qm configuring the branch network 153 of each of the stage circuit units 1501 to 150m may be formed along with the gate line GL. Also, a network line NL configuring the branch network 153 of each of the stage circuit units 1501 to 150m may be formed along with at least one of the light blocking layer 101e, the gate line GL, and the data line DL on the basis of a position of a connection portion of each of the branch circuits 1511 to 151n to be connected, but is not limited thereto.

The planarization layer 102 may be disposed on the first surface 100a of the first substrate 100 and may provide a flat surface on the circuit layer 101. The planarization layer 102 may cover the circuit layer 101 including the driving TFT Tdr disposed in each of the plurality of pixel areas PA. The planarization layer 102 according to an embodiment may include acryl resin, epoxy resin, phenolic resin, polyamides resin, or polyimides resin, but is not limited thereto.

The planarization layer 102 according to an embodiment may be formed to cover the circuit layer 101 except an edge portion of the first surface 100a of the first substrate 100. Therefore, the passivation layer 101d of the circuit layer 101 disposed at the edge portion of the first surface 100a of the first substrate 100 may be exposed without being covered by the planarization layer 102.

The light emitting device layer 103 may be disposed on the planarization layer 102 and may emit light toward the first surface 100a of the first substrate 100 on the basis of a top emission type.

The light emitting device layer 103 according to an embodiment may include a pixel electrode PE, a light emitting device ED, and a common electrode CE.

The pixel electrode PE may be referred to as an anode electrode, a reflective electrode, a lower electrode, or a first electrode of the light emitting device ED.

The pixel electrode PE may be disposed on the planarization layer 102 overlapping an emission area EA of each of the plurality of pixel areas PA. The pixel electrode PE may be patterned and disposed in an island shape in each pixel area PA and may be electrically connected to the first source/drain electrode SD1 of the driving TFT Tdr of a corresponding pixel circuit PC. One side of the pixel electrode PE may extend from the emission area EA of the pixel area PA to the first source/drain electrode SD1 of the driving TFT Tdr disposed in a circuit area CA and may be electrically connected to the first source/drain electrode SD1 of the driving TFT Tdr through a contact hole CH provided in the planarization layer 102.

The pixel electrode PE according to an embodiment may include a metal material which is low in work function and is good in reflective efficiency.

For example, the pixel electrode PE may have a three-layer structure including first to third pixel electrode layer. The first pixel electrode layer may act as an adhesive layer corresponding to the planarization layer 102 and may act as a secondary electrode of the light emitting device ED, and moreover, may include indium tin oxide (ITO) or indium zinc oxide (IZO). The second pixel electrode layer may act as a reflector and may perform a function of decreasing a resistance of the pixel electrode PE, and moreover, may include one material of aluminum (Al), silver (Ag), Mo, Ti, and MoTi. The third pixel electrode layer may act as an electrode of the light emitting device ED and may include ITO or IZO. For example, the pixel electrode PE according to an embodiment may be formed in a three-layer structure of IZO/MoTi/ITO or ITO/MoTi/ITO.

As another example, the pixel electrode PE may have a four-layer structure including first to fourth pixel electrode layer. The first pixel electrode layer may act as the adhesive layer corresponding to the planarization layer 102 and may act as the secondary electrode of the light emitting device ED, and moreover, may include one material of ITO, Mo, and MoTi. The second pixel electrode layer may perform a function of decreasing a resistance of the pixel electrode PE and may include Cu. The third pixel electrode layer may act as a reflector and may include one material of Al, Ag, Mo, Ti, and MoTi. The fourth pixel electrode layer may act as an electrode of the light emitting device ED and may include ITO or IZO. For example, the pixel electrode PE according to another embodiment may be formed in a four-layer structure of ITO/Cu/MoTi/ITO.

Optionally, the line connection patterns LCP among the pixel driving lines GL, DL, PL, RL, CPL, PSL, RDL, and LCP may be formed of the same material along with the pixel electrode PE, but are not limited thereto. Also, first pads of a first pad part 110 disposed on the first substrate 100 may be formed of the same material along with the pixel electrode PE, but are not limited thereto.

The light emitting device ED may be formed on the pixel electrode PE and may directly contact the pixel electrode PE. The light emitting device ED may be a common layer which is formed in common in each of a plurality of subpixels SP so as not to be distinguished by subpixel SP units. The light emitting device ED may react on a current flowing between the pixel electrode PE and the common electrode CE to emit white light. The light emitting device ED according to an embodiment may include an organic light emitting device or an inorganic light emitting device, or may include a stacked or combination structure of an organic light emitting device (or an inorganic light emitting device) and a quantum dot light emitting device.

An organic light emitting device according to an embodiment may include two or more light emitting material layers (or a light emitting portion) for emitting white light. For example, the organic light emitting device may include a first light emitting material layer and a second light emitting material layer, for emitting white light on the basis of a combination of first light and second light. Here, the first light emitting material layer may include at least one of a blue light emitting material, a green light emitting material, a red light emitting material, a yellow light emitting material, and a yellow-green light emitting material. The second light emitting material layer may include at least one of a blue light emitting material, a green light emitting material, a red light emitting material, a yellow light emitting material, and a yellow-green light emitting material, for emitting second light which is combined with first light to generate white light.

The organic light emitting device according to an embodiment may further include one or more function layers for enhancing emission efficiency and/or lifetime. For example, the function layer may be disposed upper and/or under a light emitting material layer.

An inorganic light emitting device according to an embodiment may include a semiconductor light emitting diode, a micro light emitting diode, or a quantum dot light emitting diode. For example, when the light emitting device ED is the inorganic light emitting device, the light emitting device ED may have a scale of 1 μm or 100 μm, but is not limited thereto.

The common electrode CE may be referred to as a cathode electrode, a transparent electrode, an upper electrode, or a second electrode of the light emitting device ED. The common electrode CE may be formed on the light emitting device ED and may directly contact the light emitting device ED or may electrically and directly contact the light emitting device ED. The common electrode CE may include a transparent conductive material which transmits light emitted from the light emitting device ED.

The common electrode CE according to an embodiment may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO$_2$:Sb.

Additionally, by adjusting a refractive index of light emitted from the light emitting device ED, a capping layer for enhancing the emission efficiency of light may be further disposed on the common electrode CE.

The bank 104 may be disposed on the planarization layer 102 to cover an edge portion of the pixel electrode PE. The bank 104 may define an emission area EA (or an opening portion) of each of the plurality of subpixels SP and may electrically isolate pixel electrodes PE disposed in adjacent subpixels SP. The bank 104 may be formed to cover a contact hole CH disposed in each of the plurality of pixel areas PA. The bank 104 may be covered by the light emitting device ED.

For example, the bank 104 may include a transparent material (for example, acryl resin, epoxy resin, phenolic resin, polyamide resin, or polyimide resin), and in this case, the bank 104 may be a transparent bank.

As another example, the bank 104 may include a light-absorbing material or an opaque material including a black pigment such as carbon black, and for example, may include polyimides resin, acryl resin, or benzocyclobutene (BCB), and in this case, the bank 104 may be a black bank which prevents or minimizes color mixture between adjacent subpixels SP.

The dam pattern 105 may be disposed on the circuit layer 101 at an edge portion of the first substrate 100 to have a closed loop shape or a closed loop line shape. For example, the dam pattern 105 may be disposed on a passivation layer 101d of the circuit layer 101. The dam pattern 105 may prevent the spread or overflow of the encapsulation layer 106. The dam pattern 105 may be included within outermost pixels Po (or outermost pixel areas PAo) disposed at an edge portion of the first substrate 100 among a plurality of pixels P (or a plurality of pixel area PA). In this case, a portion of the dam pattern 105 may be disposed (or implemented) between the first pad part 110 disposed in the first substrate 100 and an emission area EA of each of the outermost pixels Po (or the outermost pixel area PAo).

The dam pattern 105 according to an embodiment may include the same material along with the planarization layer 102. The dam pattern 105 may have the same height (or thickness) as that of the planarization layer 102, or may have a height which is higher than the planarization layer 102. For example, a height (or thickness) of the dam pattern 105 may be twice a height (or thickness) of the planarization layer 102.

According to another embodiment, the dam pattern 105 may include a lower dam pattern, which is formed of the same material along with the planarization layer 102, and an upper dam pattern which is stacked on the lower dam pattern and includes the same material as that of the bank 104. The lower dam pattern may have the same height (or thickness) as that of the planarization layer 102, or may have a height which is higher than the planarization layer 102. For example, a height (or thickness) of the lower dam pattern may be twice a height (or thickness) of the planarization layer 102.

In some embodiments, the light emitting device ED including an organic light emitting device may be implemented in only an internal region (or an inner region) surrounded by the dam pattern 105. That is, the light emitting device ED including an organic light emitting device may be disposed at a portion other than a portion between an outer surface OS of the first substrate 100 and the dam pattern 105 in the first surface 100a of the first substrate 100, and may not be disposed between the outer surface OS of the first substrate 100 and the dam pattern 105 and on a top surface of the dam pattern 105. Also, the common electrode CE of the light emitting device layer 103 may be implemented to cover the light emitting device ED and the dam pattern 105.

The first substrate 100 according to an embodiment may further include a first margin area MA1, a second margin area MA2, and a dam pattern area DPA.

The first margin area MA1 may be disposed between an emission area EA of the outermost pixel Po and the dam pattern 105. The first margin area MA1 may have a first width between an end of the emission area EA (or the bank 104) of the outermost pixel Po and the dam pattern 105 on the basis of a shadow area (or a tail portion of the light emitting device) of the light emitting device ED inevitably occurring in a process of forming the light emitting device ED. Accordingly, the dam pattern 105 may be implemented to be apart from the end of the emission area EA by the first width of the first margin area MA1 with respect to the first direction X.

The second margin area MA2 may be disposed between the outer surface OS of the first substrate 100 and the dam pattern 105. The second margin area MA2 may have a second width between the outer surface OS of the first substrate 100 and the dam pattern 105 on the basis of the reliability margin of the light emitting device ED against water. Accordingly, the dam pattern 105 may be implemented to be apart from the outer surface OS of the first substrate 100 by the second width of the second margin area MA2 with respect to the first direction X.

The second margin area MA2 according to an embodiment may include a pad margin area overlapping the first pad part 110 disposed at a first edge portion of the first surface 100a of the first substrate 100.

The dam pattern area DPA may be disposed between the first margin area MA1 and the second margin area MA2. The dam pattern area DPA may have a third width corresponding to a width of a lowermost bottom surface (or a bottom surface) of the dam pattern 105.

A width of each of the first margin area MA1, the second margin area MA2, and the dam pattern area DPA may be implemented so that a second interval D2 between a center portion of the outermost pixel and the outer surface OS of the first substrate 100 is half or less of a first interval (or a pixel pitch) D1 between two adjacent pixel areas PA, with respect to the first direction X.

For example, when half of the first interval (or the pixel pitch) D1 between the two adjacent pixel areas PA is 700 μm within a process error range, a total width of the first margin area MA1, the second margin area MA2, and the dam pattern area DPA may be implemented to be about 670 μm, based on a shadow margin based on the shadow area of the light emitting device ED and an encapsulation margin based on securing the reliability of the light emitting device ED against water. In this case, the second interval D2 between an outermost outer surface VL of the first substrate 100 and a center portion of the outermost pixel including the first pad part 110 may be implemented to be 700 μm within a process error range. Here, the outermost outer surface VL of the first substrate 100 may be an outermost outer sidewall or an outer sidewall of the display apparatus (or a display panel).

The first margin area MA1 and the second margin area MA2 may have the same width or different widths. The dam pattern area DPA may have a width which is relatively narrower than each of the first margin area MA1 and the second margin area MA2. For example, with respect to the first direction X, the first margin area MA1 may be implemented to have a width of 300 μm or less, the second margin area MA2 may be implemented to have a width of 300 µm or less, and the dam pattern area DPA may be implemented to have a width of 70 µm. Also, a pad margin area (or a lateral routing area) included in the second margin area MA2 may be implemented to have a width of 100 µm or less with respect to the first direction X.

The encapsulation layer 106 may be disposed on a portion other than an outermost edge portion of the first surface 100a of the first substrate 100 to cover the light emitting device layer 103. For example, the encapsulation layer 106 may be implemented to surround all of a front surface and lateral surfaces of the light emitting device layer 103.

The encapsulation layer 106 according to an embodiment may include first to third encapsulation layer 106a to 106c.

The first encapsulation layer 106a may be implemented to prevent oxygen or water from penetrating into the light emitting device layer 103. The first encapsulation layer 106a may be disposed on the common electrode CE to surround the light emitting device layer 103. Therefore, all of the front surface of lateral surfaces of the light emitting device layer 103 may be surrounded by the first encapsulation layer 106a. For example, an end of the first encapsulation layer 106a may be disposed in the second margin area MA2 adjacent to the dam pattern 105. The first encapsulation layer 106a may directly contact a top surface of the passivation layer 101d at an outer periphery of the dam pattern 105 and may cover a boundary portion (or an interface) between the common electrode CE and the passivation layer 101d, the dam pattern 105 may directly contact a top surface of the passivation layer 101d, thereby preventing or minimizing lateral water penetration.

The first encapsulation layer 106a according to an embodiment may include an inorganic material. For example, the first encapsulation layer 106a may be referred to as a first inorganic encapsulation layer. For example, the first encapsulation layer 106a may include a single-layer structure including one of silicon oxide (SiOx), silicon nitride (SiNx), silicon oxynitride (SiONx), titanium oxide (TiOx), and aluminum oxide (AlOx) or a stacked structure thereof.

The second encapsulation layer 106b may be implemented on the first encapsulation layer 106a to have a thickness which is relatively thicker than that of the first encapsulation layer 106a. The second encapsulation layer 106b may have a thickness for sufficiently covering particles (or an undesired material or an undesired structure) which may be or not on the first encapsulation layer 106a. The second encapsulation layer 106b may spread to an edge portion of the first surface 100a of the first substrate 100 due to a relatively thick thickness, but the spread of the second encapsulation layer 106b may be blocked by the dam pattern 105. For example, an end of the second encapsulation layer 106b may directly contact the first encapsulation layer 106a on the dam pattern 105. Accordingly, in some embodiments, the second encapsulation layer 106b may be disposed on only the first encapsulation layer 106a in an internal region (or an inner region) surrounded by the dam pattern 105. The second encapsulation layer 106b may be referred to as a particle cover layer.

The second encapsulation layer 106b according to an embodiment may include an organic material such as SiOCz acryl or epoxy-based resin.

The third encapsulation layer 106c may be implemented to primarily prevent oxygen or water from penetrating into the light emitting device layer 103. The third encapsulation layer 106c may be implemented to surround all of the second encapsulation layer 106b and the first encapsulation layer 106a uncovered by the second encapsulation layer 106b. For example, an end of the third encapsulation layer 106c may be disposed between the end of the first encapsulation layer 106a and the outer surface OS of the first substrate 100 and may directly contact the passivation layer 101d. The third encapsulation layer 106c may directly contact a top surface of the passivation layer 101d and may cover a boundary portion (or an interface) between the first encapsulation layer 106a and the passivation layer 101d, thereby additionally preventing or minimizing lateral water penetration.

The third encapsulation layer 106c according to an embodiment may include an inorganic material. For example, the third encapsulation layer 106c may be referred to as a second inorganic encapsulation layer. For example, the third encapsulation layer 106c may include a single-layer structure including one of SiOx, SiNx, SiONx, TiOx, and AlOx or a stacked structure thereof.

The first substrate 100 according to an embodiment may further include a wavelength conversion layer 107.

The wavelength conversion layer 107 may convert a wavelength of light incident from the emission area EA of each of the plurality of pixel areas PA. For example, the wavelength conversion layer 107 may convert white light, which is incident from the emission area EA, into colored light corresponding to a corresponding pixel P.

The wavelength conversion layer 107 according to an embodiment may include a plurality of wavelength conversion patterns 107a and a protection layer 107b.

The plurality of wavelength conversion patterns 107a may be disposed on the encapsulation layer 106 disposed in the emission area EA of each of the plurality of pixel areas PA. The plurality of wavelength conversion patterns 107a may be divided (or classified) into a red light filter which converts white light into red light, a green light filter which converts white light into green light, and a blue light filter which converts white light into blue light. For example, the plurality of wavelength conversion patterns 107a may be divided (or classified) into the red light filter (or a first light filter) disposed in the first subpixel SP1, the green light filter (or a second light filter) disposed in the second subpixel SP2, and the blue light filter (or a third light filter) disposed in the fourth subpixel SP4.

Each of the plurality of wavelength conversion patterns 107a according to an embodiment may be implemented to have a size which is wider than the emission area EA of each of the plurality of pixel areas PA. That is, in order to prevent color mixture between adjacent subpixels SP, each of the plurality of wavelength conversion patterns 107a may have the same size as that of the pixel electrode PE or may have a size which is wider than the pixel electrode PE, and thus, may overlap a portion of the bank 104 covering an edge portion of the pixel electrode PE. For example, each of the plurality of wavelength conversion patterns 107a may be disposed to overlap all of the emission area EA of each of the plurality of pixel areas PA and to overlap a portion of the circuit area CA adjacent to the emission area EA. In this case, in order to prevent external light, which is incident through a region, which does not overlap the wavelength conversion pattern 107a, of each of the plurality of pixel areas PA, from being reflected by the pixel driving lines or to reduce or minimize the reflection of the external light, the bank 104 may include a light-absorbing material or a black pigment.

According to another embodiment, each of the plurality of wavelength conversion patterns 107a may be implemented to have the same size as that of each of the plurality of pixel areas PA. That is, each of the plurality of wavelength conversion patterns 107a may be disposed to overlap all of each of the plurality of pixel areas PA, for preventing or minimizing the reflection of external light by the pixel driving lines. For example, each of the plurality of wavelength conversion patterns 107a may be disposed to cover all of the emission area EA and the circuit area CA of each of the plurality of pixel areas PA. In this case, the bank 104 may be a black bank or a transparent bank.

Additionally, each of the plurality of wavelength conversion patterns 107a may include a quantum dot which re-emits light on the basis of white light or blue light incident from the light emitting device layer 103 to additionally irradiate colored light corresponding to a corresponding pixel. Here, the quantum dot may be selected from among CdS, CdSe, CdZnSeS, CdTe, ZnS, ZnSe, GaAs, GaP, GaAs—P, Ga—Sb, InAs, InP, InSb, AlAs, AlP, and AlSb. For example, the red light filter disposed in the first subpixel SP1 may include a red quantum dot such as CdSe or InP emitting red light, the green light filter disposed in the second subpixel SP2 may include a green quantum dot such as CdZnSeS emitting green light, and the blue light filter disposed in the fourth subpixel SP4 may include a blue quantum dot such as ZnSe emitting blue light. As described above, when each of the plurality of wavelength conversion patterns 107a includes the quantum dot, the color reproduction of a light emitting display apparatus may increase.

According to another embodiment, the plurality of wavelength conversion patterns 107a may be implemented to overlap one another in the circuit area CA of each of the plurality of pixel areas PA. In this case, the circuit area CA of each of the plurality of pixel areas PA may be covered by at least two wavelength conversion patterns 107a overlapping each other. For example, the circuit area CA of each of the plurality of pixel areas PA may be covered by a two-layer stacked portion including the red light filter and the green light filter. As another example, the circuit area CA of each of the plurality of pixel areas PA may be covered by a three-layer stacked portion including the red light filter, the green light filter, and the blue light filter. The two-layer stacked portion including two light filters or the three-layer stacked portion including three light filters may perform a function of a black matrix which prevents color mixture between adjacent subpixels SP or prevents or minimizes the reflection of external light.

The protection layer 107b may be implemented to cover the wavelength conversion patterns 107a and to provide a flat surface on the wavelength conversion patterns 107a. The protection layer 107b may be disposed to cover the wavelength conversion patterns 107a and the encapsulation layer 106 where the wavelength conversion patterns 107a are not disposed. The protection layer 107b according to an embodiment may include an organic material. For example, the protection layer 107b may include acryl resin, epoxy resin, phenolic resin, polyamides resin, or polyimides resin, but is not limited thereto. Optionally, the protection layer 107b may further include a getter material for adsorbing water and/or oxygen.

Alternatively, the wavelength conversion layer 107 may be changed to a wavelength conversion sheet having a sheet form and may be disposed on the encapsulation layer 106. In this case, the wavelength conversion sheet (or a quantum dot sheet) may include the wavelength conversion patterns 107a disposed between a pair of films. For example, when the wavelength conversion layer 107 includes a quantum dot which re-emits colored light set in a subpixel, the light emitting device layer 103 of a subpixel may be implemented to emit white light or blue light.

The first substrate 100 according to an embodiment may further include a functional film 108.

The functional film 108 may be disposed on the wavelength conversion layer 107. For example, the functional film 108 may be coupled to the wavelength conversion layer 107 by a transparent adhesive member. The transparent adhesive member may include a pressure sensitive adhesive (PSA), an optical clear adhesive (OCA), or an optical clear resin (OCR).

The functional film 108 according to an embodiment may include an anti-reflection layer (or an anti-reflection film) for preventing reflection of external light to enhance outdoor visibility and a contrast ratio with respect to an image displayed by the display apparatus 10. For example, the anti-reflection layer may include a circular polarization layer (or a circular polarization film) which prevents external light, reflected by TFTs and/or the pixel driving lines disposed on the first substrate 100, from traveling to the outside.

The functional film 108 according to an embodiment may further include a barrier layer (or a barrier film) for primarily preventing the penetration of water or oxygen, and the barrier layer may include a material (for example, a polymer material) which is low in water transmission rate.

The functional film 108 according to an embodiment may further include a light path control layer (or a light path control film) for controlling a path of light output from each pixel P to the outside. The light path control layer may include a stacked structure where a high refraction layer and a low refraction layer are alternately stacked and may change a path of light incident from each pixel P to reduce or minimize a color shift based on a viewing angle.

The first substrate 100 according to an embodiment may further include a side sealing member 109.

The side sealing member (or an edge sealing member) 109 may be formed between the first substrate 100 and the functional film 108 and may cover all of side (or lateral) surfaces of each of the circuit layer 101, the planarization layer 102, and the wavelength conversion layer 107. That is, the side sealing member 109 may cover all of side surfaces of each of the circuit layer 101, the planarization layer 102, and the wavelength conversion layer 107 which are exposed at the outside of the display apparatus 10, between the functional film 108 and the first substrate 100. Also, the side sealing member 109 may cover a first chamfer 100c which is formed (or disposed) at a corner portion between the first surface 100a and the outer surface OS of the first substrate 100 through a chamber process. For example, each of the outermost outer surface of the first substrate 100, an outer surface of the side sealing member 109, and an outer surface of the functional film 108 may be disposed (or aligned) on the same vertical line VL.

The side sealing member 109 according to an embodiment may include a silicon-based or ultraviolet (UV)-curable sealant (or resin), but considering a tack process time, the side sealing member 109 may include the UV-curable sealant. Also, the side sealing member 109 may have a color (for example, blue, red, bluish green, or black), but is not limited thereto and may include a colored resin or a light blocking resin for preventing lateral light leakage. The side sealing member 109 may prevent lateral light leakage by using light, traveling from an inner portion of the wavelength conversion layer 107 to an outer surface thereof, of light emitted from the light emitting device ED of each subpixel SP. Particularly, the side sealing member 109 overlapping the first pad part of the first substrate 100 may prevent or minimize the reflection of external light caused by the pad disposed in the first pad part.

Optionally, the side sealing member 109 may further include a getter material for adsorbing water and/or oxygen.

The first substrate 100 according to an embodiment may further include a front coating layer.

The front coating layer may be provided between the wavelength conversion layer 107 and the functional film 108 to cover a top surface of the wavelength conversion layer 107 and to cover all of the lateral surfaces of each of the circuit layer 101, the planarization layer 102, and the wavelength conversion layer 107. That is, the front coating layer may be implemented to cover all of the lateral surfaces of each of the circuit layer 101, the planarization layer 102, and the wavelength conversion layer 107 which are exposed at the outside of the display apparatus 10, between the functional film 108 and the first substrate 100, and moreover, may be implemented to cover a portion of each of a top surface and a lateral surface of a routing portion 400 connected to the first pad part of the first substrate 100. The front coating layer according to an embodiment may be implemented through an atomic layer deposition process. For example, the front coating layer may be implemented to have a thickness of several μm.

In some embodiments, the side sealing member 109 may be implemented to cover the front coating layer at the edge portion of the first surface 100a of the first substrate 100, or may be omitted.

The second substrate 200 according to an embodiment may include a metal pattern layer connected to the routing portion 400 and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented on a rear surface 200b of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of a link line portion 250 illustrated in FIG. 9. For example, the first metal pattern may be used as each of a plurality of data link lines 251, a plurality of pixel driving power link lines 255, a plurality of gate control signal transfer lines, and a first common link line 257a of a pixel common power link line 257, but is not limited thereto.

The first insulation layer 202 may be implemented on the rear surface 200b of the second substrate 200 to cover the first metal layer 201. The first insulation layer 202 according to an embodiment may include an inorganic material. For example, the first insulation layer 202 may include one material of SiOx, SiNx, and SiONx, but is not limited thereto.

The second metal layer 203 may be implemented on the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines 253 of a plurality of link lines of the link line portion 250 illustrated in FIG. 10, but is not limited thereto. For example, the second metal layer 203 may be used as a jumping line (or a bridge line) for electrically connecting the link lines which are formed of different metal materials on different layers in the link line portion 250.

Optionally, a link line (for example, a plurality of first link lines) disposed on the second metal layer 203 may be modified to be disposed on the first metal layer 201, and a link line (for example, a plurality of second link lines) disposed on the first metal layer 201 may be modified to be disposed on the second metal layer 203.

The second insulation layer 204 may be implemented on the rear surface 200b of the second substrate 200 to cover the second metal layer 203. The second insulation layer 204 according to an embodiment may include an inorganic material. For example, the second insulation layer 204 may include one material of SiOx, SiNx, and SiONx.

The third metal layer 205 may be implemented on the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure of ITO/Mo/ITO, ITO/MoTi/ITO, IZO/Mo/ITO, or IZO/MoTi/ITO. The third metal pattern may be used as each of second pads of the second pad part 210, third pads of the third pad part 230, and a second common link line 257b and a plurality of third common link lines 257c of the pixel common power link line 257 illustrated in FIG. 9.

The third insulation layer 206 may be implemented on the rear surface 200b of the second substrate 200 to cover the third metal layer 205. The third insulation layer 206 according to an embodiment may include an organic material. For example, the third insulation layer 206 may include an insulating material such as photo acryl. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

The third insulation layer 206 may further include a pad exposure hole which exposes a portion of each of the second pads of the second pad part 210 and the third pads of the third pad part 230, which include the third metal layer 205.

The coupling member 300 may be disposed between the first substrate 100 and the second substrate 200. Therefore, the first substrate 100 and the second substrate 200 may be opposite-bonded to each other by a coupling member 300. The coupling member 300 according to an embodiment may be a transparent adhesive member or a double-sided tape including an OCA or an OCR. According to another embodiment, the coupling member 300 may include a glass fiber.

The coupling member 300 according to an embodiment may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Optionally, the coupling member 300 may further include a heat transfer element. In this case, the coupling member 300 may transfer heat, occurring in the first substrate 100, to the second substrate 200 through the heat transfer element to prevent or minimize an increase in temperature of the first substrate 100. The second substrate 200 may act as a temperature lowering member which prevents or minimizes an increase in temperature of the first substrate 100. For example, the heat transfer element may include a plurality of heat transfer particles or a heat transfer layer including a metal material. When the heat transfer element includes a heat transfer layer including a metal material, the heat transfer layer may be electrically grounded or floated, and thus, may act as a noise blocking layer which prevents frequency noise or static electricity, occurring in a driving circuit disposed on the rear surface 200b of the second substrate 200, from flowing into the pixels, the pixel driving lines, and the gate driving circuit 150, which are disposed on the first substrate 100.

Figure 17:
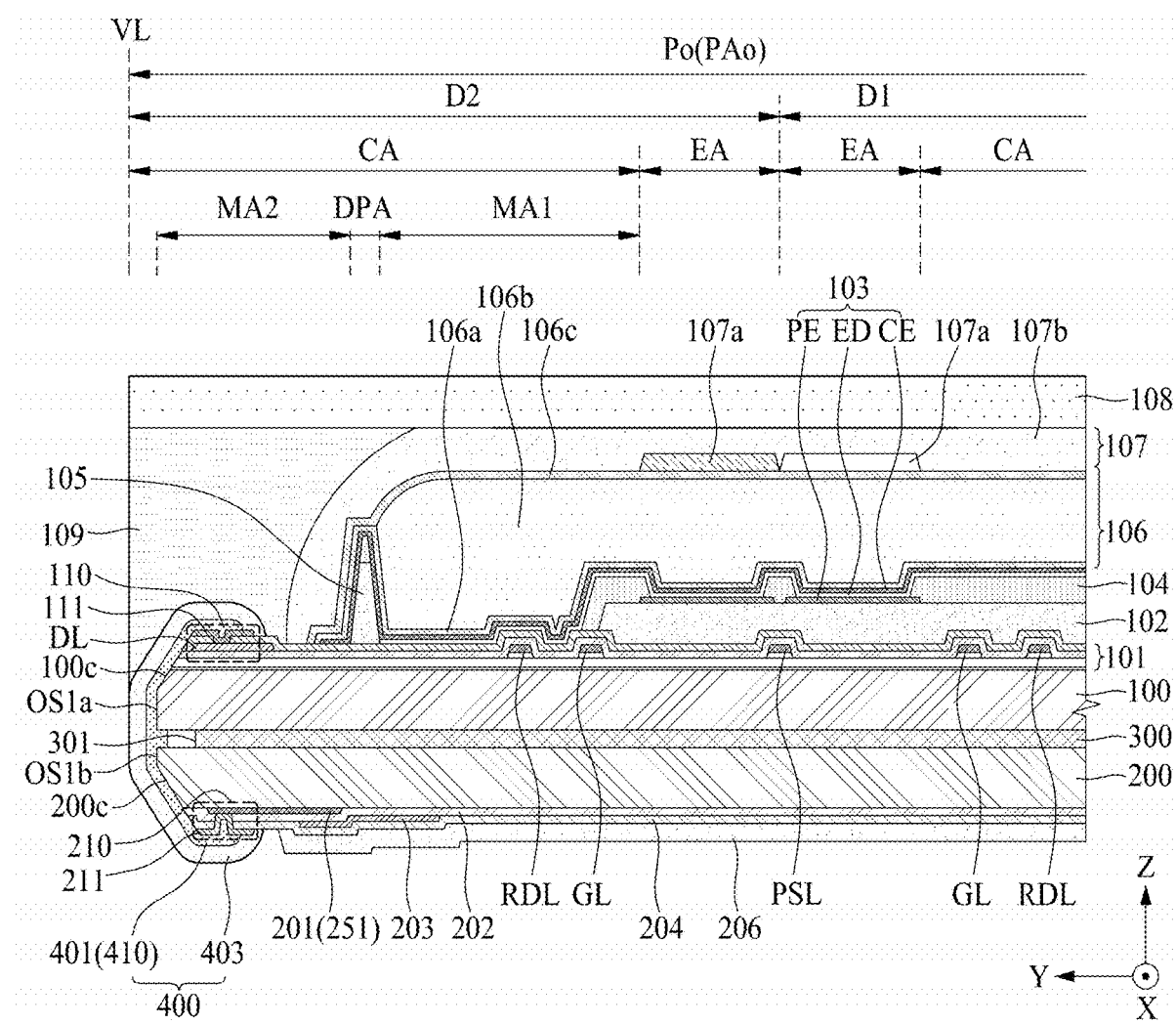
FIG. 17 is a cross-sectional view taken along line II-II' illustrated in FIG. 4.

FIG. 17 is a cross-sectional view taken along line II-II' illustrated in FIG. 4 and is a diagram for describing a cross-sectional structure of a first pad part, a second pad part, and a routing portion of a display apparatus according to the present disclosure. In describing FIG. 17, elements which are the same or correspond to the elements of FIG. 4 are referred to by like reference numerals, and their repetitive descriptions are omitted or will be briefly described below.

Referring to FIGS. 4, 5, and 15 to 17, in a display apparatus 10 according to the present disclosure, a first pad part 110 may include a plurality of first pads 111 disposed at a first edge portion of a first surface 100a of a first substrate 100. The plurality of first pads 111 may be divided (or classified) into a plurality of first data pads, a plurality of first pixel driving power pads, and a plurality of first pixel common power pads. Also, the plurality of first pads 111 may be further divided (or classified) into a plurality of first reference power pads.

Each of the plurality of first pads 111 may be electrically connected to a corresponding line of a plurality of pixel driving lines through a first pad contact hole disposed in a planarization layer 102. For example, the first data pad may be electrically connected to one end of a data line DL through the first pad contact hole disposed in the planarization layer 102.

In the display apparatus 10 according to the present disclosure, a second pad part 210 may include a plurality of second pads 211 disposed at a first edge portion, overlapping the first pad part 110, of a rear surface 200b of a second substrate 200. The plurality of second pads 211 may be divided (or classified) into a plurality of second data pads, a plurality of second pixel driving power pads, and a plurality of second pixel common power pads. Also, the plurality of second pads 211 may be further divided (or classified) into a plurality of second reference power pads.

Each of the plurality of second pads 211 may be electrically connected to a link line of a link line portion 250, including a first metal layer 201 or a second metal layer 203 disposed on the rear surface 200b of the second substrate 200, through a second pad contact hole disposed in each of first and second insulation layers 202 and 204. For example, the second data pad may be electrically connected to one end of a data link line 251 through the second pad contact hole disposed in each of the first and second insulation layers 202 and 204.

The routing portion 400 may be disposed to surround an outer surface OS of the first substrate 100 and an outer surface OS of the second substrate 200. For example, the routing portion 400 may be disposed on each of a first outer surface (or one surface) OS1a of the outer surface OS of the first substrate 100 and a first outer surface (or one surface) OS1b of the outer surface OS of the second substrate 200.

The routing portion 400 according to an embodiment may include a plurality of routing lines 401 which are disposed on each of the first outer surface (or one surface) OS1a of the outer surface OS of the first substrate 100 and the first outer surface (or one surface) OS1b of the outer surface OS of the second substrate 200. The plurality of routing lines 401 may be divided (classified) into a plurality of data routing lines, a plurality of gate routing lines, a plurality of pixel driving power routing lines, and a plurality of pixel common power routing lines. Also, the plurality of routing lines 401 may be further divided (or classified) into a plurality of reference power routing lines.

Each of the plurality of routing lines 401 may be formed to surround each of the first outer surface OS1a of the first substrate 100 and the first outer surface OS1b of the second substrate 200. For example, each of the plurality of routing lines 401 may be formed through a printing process using a conductive paste. For example, each of the plurality of routing lines 401 may be formed through a printing process using an Ag paste, but is not limited thereto.

In each of the plurality of routing lines 401, one end portion thereof may surround a first chamfer 100c and the first pad 111 of the first pad part 110 disposed at a first edge portion of the first substrate 100, the other end portion thereof may surround a second chamfer 200c and the second pad 211 of the second pad part 210 disposed at a first edge portion of the second substrate 200, and a center portion thereof between the one end portion and the other end portion may surround each of the first outer surface OS1a of the first substrate 100 and the first outer surface OS1b of the second substrate 200. For example, in a data routing line 410, one end portion thereof may be implemented to surround the first chamfer 100c and a first data pad of the first pad part 110 disposed at the first edge portion of the first substrate 100, the other end portion thereof may be implemented to surround the second chamfer 200c and a second data pad of the second pad part 210 disposed at a first edge portion of the second substrate 200, and a center portion thereof between the one end portion and the other end portion may be implemented to surround each of the first outer surface OS1a of the first substrate 100 and the first outer surface OS1b of the second substrate 200.

Optionally, when the coupling member 300 includes the heat transfer element, an end 301 of the coupling member 300 closest to the first outer surface OS1a of the first substrate 100 may be apart from the first outer surface OS1a of the first substrate 100 and/or the first outer surface OS1b of the second substrate 200 so as not to be electrically connected to each of the plurality of routing lines 401, and thus, may not be electrically connected to or may be electrically isolated from each of the plurality of routing lines 401. In this case, a portion of each of the plurality of routing lines 401 may penetrate to a region between the first substrate 100 and the second substrate 200, and thus, a separation distance between the coupling member 300 including the heat transfer element and the first outer surface OS1a of the first substrate 100 may be set based on a penetration length (or distance) of a center portion of the routing line 401 penetrating to the region between the first substrate 100 and the second substrate 200.

The routing portion 400 according to an embodiment of the present disclosure may further include an edge coating layer 403.

The edge coating layer 403 may be implemented to cover the plurality of routing lines 401. The edge coating layer 403 according to an embodiment may be implemented to cover all of the first edge portion and the first outer surface OS1a of the first substrate 100 and the first edge portion and the first outer surface OS1b of the second substrate 200, in addition to the plurality of routing lines 401. The edge coating layer 403 may prevent the corrosion of each of the plurality of routing lines 401 including a metal material or electrical short circuit between the plurality of routing lines 401. Also, the edge coating layer 403 may prevent or minimize the reflection of external light caused by the plurality of routing lines 401 and the first pads 111 of the first pad part 110. The edge coating layer 403 according to an embodiment may include a light blocking material including black ink.

A top surface of the edge coating layer 403 covering the first chamfer 100c of the first substrate 100 may be covered by the side sealing member 109.

An outer surface of the edge coating layer 403 may be an outermost outer surface of the first substrate 100, and thus, each of the outermost outer surface of the first substrate 100, an outer surface of the side sealing member 109, and an outer surface of the functional film 108 may be disposed on the same vertical line VL.

Figure 18:
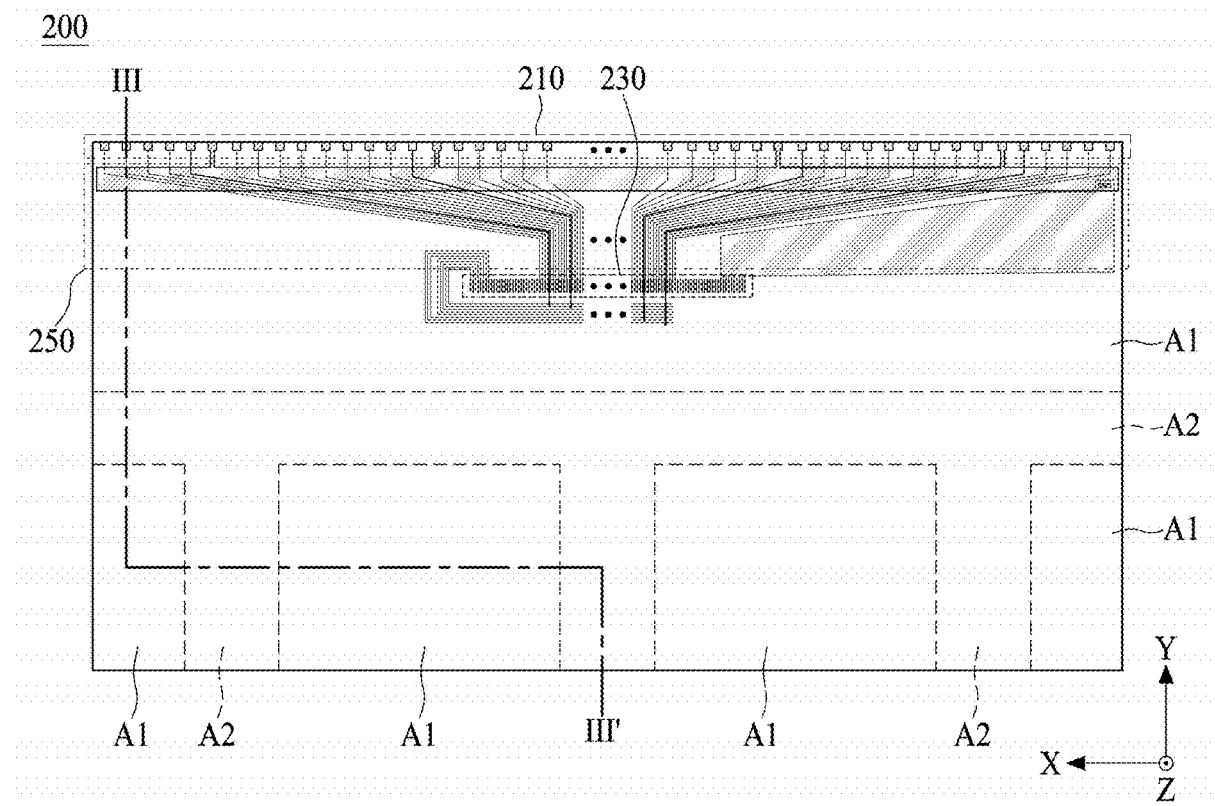
FIG. 18 is a diagram illustrating a second substrate illustrated in FIG. 5.
Figure 19:
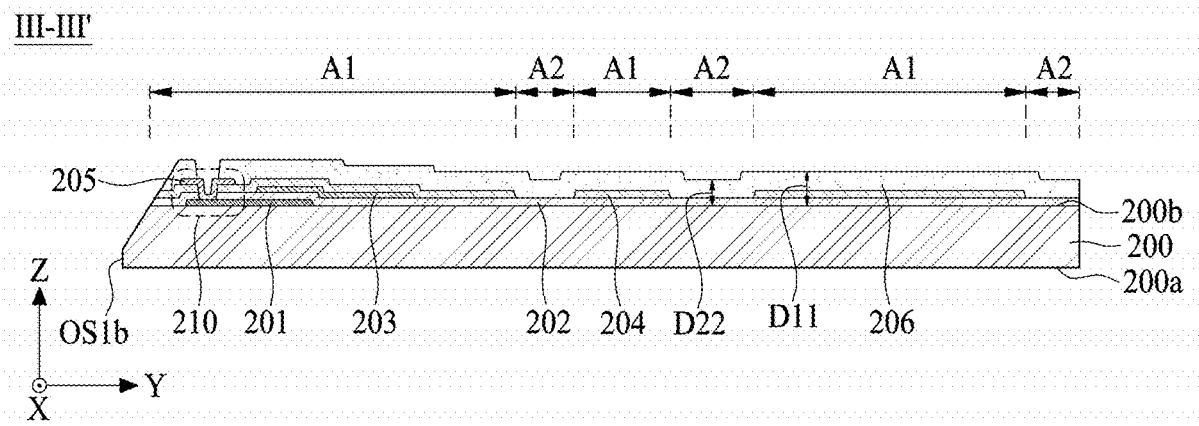
FIG. 19 is a cross-sectional view taken along line III-III' illustrated in FIG. 18.

FIG. 18 is a diagram illustrating a second substrate illustrated in FIG. 5, and FIG. 19 is a cross-sectional view taken along line illustrated in FIG. 18. FIGS. 18 and 19 illustrate an embodiment which is implemented to modify the second insulation layer illustrated in FIGS. 15 to 17. In describing FIGS. 18 and 19, elements which are the same or correspond to the elements of FIGS. 15 to 17 are referred to by like reference numerals, and their repetitive descriptions are omitted or will be briefly described below.

Referring to FIGS. 18 and 19, a second substrate 200 according to another embodiment of the present disclosure may include a first area A1 and a second area A2.

The first area A1 and the second area A2 may be disposed or implemented in a rear insulation layer (or a pattern insulation layer) disposed on a rear surface of the second substrate 200. That is, in order to prevent or minimize a bending phenomenon which occurs in an outer portion of the second substrate 200, the rear insulation layer may include the first area A1 and the second area A2, in which the insulation layer has different thicknesses. For example, the layer in the second area A2 may have a thickness D22 which is thinner than a thickness D11 of the first area A1. The rear insulation layer according to an embodiment may include an isolation pattern area, and in this case, in the pattern insulation layer, a non-isolation pattern area may have a first thickness D11 and the layer in the isolation pattern area may have a second thickness D22 which is thinner than the first thickness D11. For example, the isolation pattern area may include only one of the first insulation layer 202 and the second insulation layer 204, and thus, may have the thickness D22 which is thinner than the thickness D11 of the non-isolation pattern area including a stacked structure of all of the first insulation layer 202 and the second insulation layer 204.

The first area (or a metal pattern layer) A1 may be disposed in a region including the second pad part 210, the third pad part 230, and the link line portion 250, among the rear surface 200b of the second substrate 200. The first area A1 according to an embodiment may include a first insulation layer 202 disposed on the rear surface 200b of the second substrate 200 and a second insulation layer 204 disposed on the first insulation layer 202. The first area A1 may be covered by the third insulation layer 206 including an organic layer. The first area A1 may include a multi-layer inorganic film structure on the basis of a stacked structure of the first insulation layer 202 and the second insulation layer 204 including an inorganic material.

The second area A2 may be disposed in a region except the first area A1 among the rear surface 200b of the second substrate 200. For example, the second area A2 may be disposed in a partial region of a region between the third pad part 230 and a second outer surface (or the other surface or a second long side), which is parallel to a first outer surface (or one surface or a first long side), of the second substrate 200, and in this case, the first area A1 may be disposed in the other region of the region between the second outer surface of the second substrate 200 and the third pad part 230.

The second area A2 according to an embodiment may include a single inorganic layer by the first insulation layer 202 disposed on the rear surface 200b of the second substrate 200. For example, the second insulation layer 204 may be formed to cover all of the first insulation layer 202 disposed on the rear surface 200b of the second substrate 200, and the second insulation layer 204 disposed in the second area A2 may be removed by a patterning process, whereby the second insulation layer 204 may not be disposed in the second area A2. Therefore, the second area A2 may be surrounded by the first area A1. The first insulation layer 202 disposed in the second area A2 may directly contact the third insulation layer 206 including an organic layer, or may be covered by the third insulation layer 206.

Because the second area A2 includes a single inorganic layer structure by the first insulation layer 202 including an inorganic material, the layer in the second area A2 may have the thickness D22 which is relatively thinner than the thickness D11 of the first area A1 including a multi-layer inorganic layer structure on the basis of the first insulation layer 202 and the second insulation layer 204. Accordingly, the second area A2 may prevent or minimize the bending of an outer portion of the second substrate 200 in a process of bonding (or laminating) the first substrate to the second substrate by using a coupling member.

Because a metal pattern is not disposed in a region other than a region between the outer surface OS1b of the second substrate 200 and the third pad part 230, and the second substrate 200 includes a multi-layer inorganic layer structure by the first insulation layer 202 and the second insulation layer 204, the bending of the second substrate 200 may occur due to a stress difference between the second substrate 200 and an inorganic layer. For example, a bending phenomenon may occur in an outer portion of the second substrate 200 due to a compressive stress caused by a stacked inorganic layer disposed on the rear surface 200b of the second substrate 200, and the bending of the second substrate 200 may cause a bonding defect caused by misalignment between the first substrate and the second substrate in the process of bonding (or laminating) the first substrate to the second substrate by using the coupling member.

On the other hand, the second substrate 200 according to the present disclosure may include the second area A2 having a single inorganic layer by the first insulation layer 202, and thus, may separate (or isolate) a portion of the second insulation layer 204 to decrease a stress of the second substrate 200 caused by an inorganic layer, thereby diffusing a compressive stress applied to the second substrate 200 to prevent or minimize the bending of the outer portion of the second substrate 200.

The second area A2 according to an embodiment may include a first pattern area parallel to a first direction X and a plurality of second pattern areas which protrude from one side of the first pattern area in parallel with a second direction Y.

According to another embodiment, the second area A2 may be disposed or implemented to have a ladder shape, a mesh shape, or an island shape.

Optionally, the second area A2 may include a single inorganic layer by the second insulation layer 204 directly contacting the rear surface 200b of the second substrate 200. For example, the first insulation layer 202 may be formed to cover all of the rear surface 200b of the second substrate 200, and the first insulation layer 202 disposed in the second area A2 may be removed by a patterning process, whereby the first insulation layer 202 may not be disposed in the second area A2. Also, the second insulation layer 204 may be formed on the first insulation layer 202 in the first area A1 and may be formed on the rear surface 200b of the second substrate 200 overlapping the second area A2, and thus, may directly contact the rear surface 200b of the second substrate 200 in the second area A2. Accordingly, the second area A2 may include a single inorganic layer based on the second insulation layer 204, thereby diffusing a compressive stress applied to the second substrate 200 to prevent or minimize the bending of the outer portion of the second substrate 200.

The second area A2 may be referred to as a stepped area, a single-layer inorganic layer area, a stress decrease area, a bending limitation area, or an isolation pattern area.

According to another embodiment, the second substrate 200 may include the first area A1 having a multi-layer inorganic layer structure and the second area A2 having a single-layer inorganic layer structure, and thus, the bending of the outer portion of the second substrate 200 may be prevented or minimized. Therefore, in a display apparatus including the second substrate 200 according to another embodiment of the present disclosure, the bending of the outer portion of the second substrate 200 may be prevented or minimized in the process of bonding (or laminating) the first substrate to the second substrate by using the coupling member, thereby minimizing or preventing a bonding defect caused by misalignment between the first substrate and the second substrate.

Figure 20:
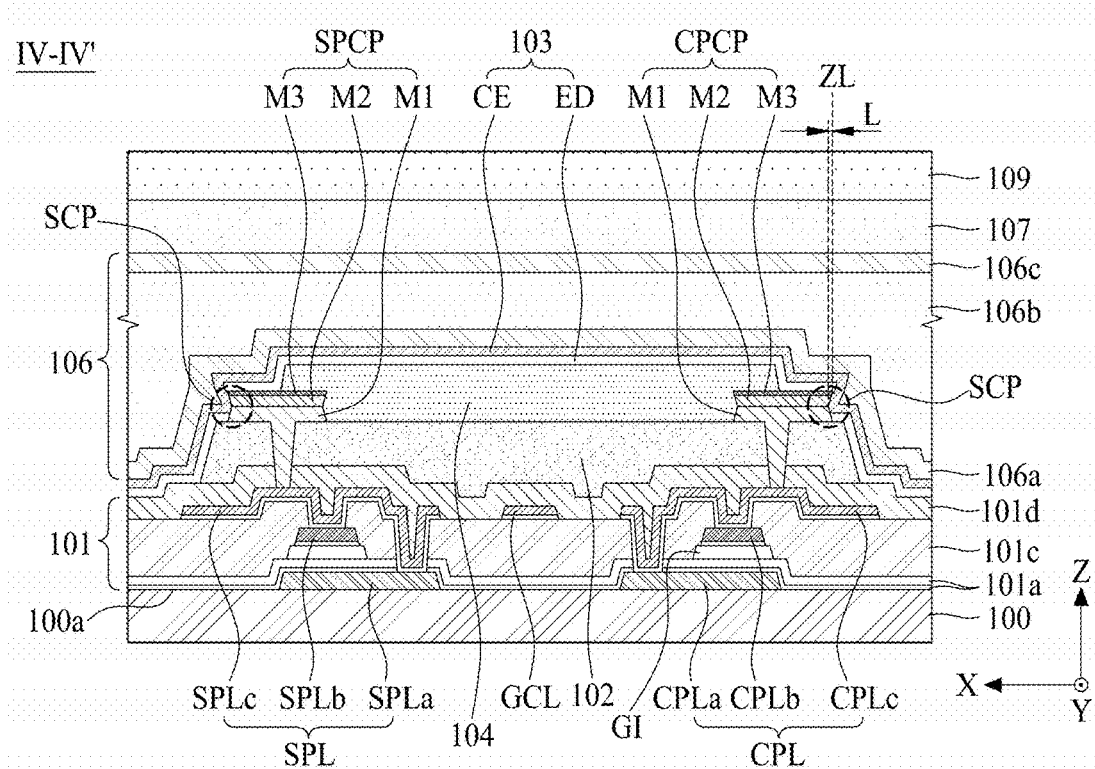
FIG. 20 is a cross-sectional view taken along line IV-IV' illustrated in FIG. 6.

FIG. 20 is a cross-sectional view taken along line IV-IV' illustrated in FIG. 6 and is a diagram for describing a common power contact portion and a secondary power contact portion illustrated in FIG. 6. In describing FIG. 20, elements which are the same or correspond to the elements of FIG. 6 are referred to by like reference numerals, and their repetitive descriptions are omitted or will be briefly described below.

Referring to FIGS. 6, 15, 16, and 20, a common power contact portion CPCP according to an embodiment of the present disclosure may be disposed between a plurality of pixels P respectively overlapping a plurality of pixel common power lines CPL and may electrically connect a common electrode CE to each of the plurality of pixel common power lines CPL.

Each of the plurality of pixel common power lines CPL may include a first pixel common power line CPLa, a second pixel common power line CPLb, and a contact line CPLc.

The first pixel common power line CPLa may extend long in a second direction Y and may be disposed in a display area AA of the first substrate 100 to have a predetermined interval in a first direction X. The first pixel common power line CPLa according to an embodiment may be formed of the same material on a first surface 100a of the first substrate 100 along with a light blocking layer 101e.

The second pixel common power line CPLb may be formed on a gate insulation layer GI overlapping the first pixel common power line CPLa. The second pixel common power line CPLb according to an embodiment may be formed of the same material along with a gate line GL.

The contact line CPLc may be formed on an interlayer insulation layer 101c overlapping the first pixel common power line CPLa and the second pixel common power line CPLb. The contact line CPLc may be electrically connected to the second pixel common power line CPLb through a contact hole disposed in the interlayer insulation layer 101c and may be electrically connected to the first pixel common power line CPLa through a contact hole disposed in the interlayer insulation layer 101c and a buffer layer 101a. The contact line CPLc may be formed of the same material along with a data line DL.

Each of the plurality of pixel common power lines CPL may include the first pixel common power line CPLa and the second pixel common power line CPLb which are electrically connected to each other through the contact line CPLc, thereby decreasing a total line resistance.

The common power contact portion (or a common power contact pad) CPCP may be electrically connected to a corresponding pixel common power line CPL, between the plurality of pixels P and may be electrically connected to the common electrode CE on the basis of a side contact manner.

The common power contact portion CPCP according to an embodiment may include first to third contact metal layers M1 to M3. For example, the common power contact portion CPCP may be formed along with a pixel electrode PE having a three-layer structure.

The first contact metal layer M1 may be disposed on a planarization layer 102 overlapping the pixel common power line CPL and may be electrically connected to the pixel common power line CPL through a contact hole. The first contact metal layer M1 may reinforce an adhesive force between the common power contact portion CPCP and the planarization layer 102. The first contact metal layer M1 may be formed to be relatively thicker than the third contact metal layer M3, for decreasing a total resistance of the common power contact portion CPCP. The first contact metal layer M1 according to an embodiment may include IZO or ITO. For example, the first contact metal layer M1 may include the same material as that of a lowermost layer of the pixel electrode PE having a three-layer structure. The first contact metal layer M1 may act as a sacrificial layer for more increasing an etching speed of a lower portion of a lateral surface of the second contact metal layer M2 adjacent to the planarization layer 102 than an etching speed of an upper portion of the lateral surface of the second contact metal layer M2 adjacent to the third contact metal layer M3 in an electrode patterning process performed on the common power contact portion CPCP.

The second contact metal layer M2 may be disposed on the first contact metal layer M1 and may be electrically connected to the common electrode CE on the basis of a side contact manner. The second contact metal layer M2 may include a light-reflecting metal material having a resistance which is relatively lower than that of the third contact metal layer M3. The second contact metal layer M2 may be formed to be relatively thicker than the third contact metal layer M3, for decreasing a total resistance of the common power contact portion CPCP. The second contact metal layer M2 may include a metal material having an etching speed which is lower than that of the first contact metal layer M1. The second contact metal layer M2 according to an embodiment may include one material of Al, Ag, Mo, Ti, and MoTi. For example, the second contact metal layer M2 may include the same material as that of a middle layer of the pixel electrode PE having a three-layer structure.

The third contact metal layer M3 may be disposed on the second contact metal layer M2 and may prevent the corrosion of the first contact metal layer M1 and the second contact metal layer M2. The third contact metal layer M3 may include a material (or substance) which is stronger in corrosion resistance than each of the first contact metal layer M1 and the second contact metal layer M2. An oxidation rate of the third contact metal layer M3 may be lower than that of the first contact metal layer M1. The third contact metal layer M3 according to an embodiment may include IZO or ITO. For example, the third contact metal layer M3 may include the same material as that of an uppermost layer of the pixel electrode PE having a three-layer structure.

The common power contact portion CPCP may be formed on the planarization layer 102 to have the same three-layer structure as that of the pixel electrode PE, and then, may be patterned through batch etching based on an electrode patterning process (or an etching process).

In the electrode patterning process according to an embodiment, an etching speed of the first contact metal layer M1 may be higher than that of the second contact metal layer M2.

For example, in the electrode patterning process, the common power contact portion CPCP may be sequentially etched up to the first contact metal layer M1 from the third contact metal layer M3. In this case, because an etching speed of the first contact metal layer M1 is higher than that of the second contact metal layer M2, the first contact metal layer M1 may be faster etched than the second contact metal layer M2 from a time at which a top surface thereof is exposed to an etching source, and thus, as a lateral surface of the first contact metal layer M1 is etched prior to a lateral surface of the second contact metal layer M2, a lower portion of the lateral surface of the second contact metal layer M2 may be faster etched than an upper portion of the lateral surface thereof. Therefore, the lateral surface of the first contact metal layer M1 may have an inclined shape or a tapered shape, and the lateral surface of the second contact metal layer M2 may have an inclined shape or a reverse tapered shape. Accordingly, the common power contact portion CPCP may include a side contact portion SCP which is concavely formed on the lateral surface of each of the first contact metal layer M1 and the second contact metal layer M2.

A tapered shape of the first contact metal layer M1 according to an embodiment may be defined as a shape where an included angle (or an internal angle) between a top surface and the lateral surface thereof is greater than an included angle (or an internal angle) between a bottom surface and the lateral surface thereof. A reverse tapered shape of the second contact metal layer M2 according to an embodiment may be defined as a shape where an included angle (or an internal angle) between a top surface and the lateral surface thereof is less than an included angle (or an internal angle) between a bottom surface and the lateral surface thereof. For example, the included angle between the top surface and the lateral surface of the first contact metal layer M1 may be an obtuse angle, and the included angle between the bottom surface and the lateral surface of the first contact metal layer M1 may be an acute angle. The included angle between the top surface and the lateral surface of the second contact metal layer M2 may be an acute angle, and the included angle between the bottom surface and the lateral surface of the second contact metal layer M2 may be an obtuse angle.

The side contact portion SCP according to an embodiment may be inward apart from, by a certain distance, a vertical line extending in a thickness direction Z of the first substrate 100 from an outermost lateral surface of the third contact metal layer M3, and thus, may not protrude to the outside of a lateral surface of the third contact metal layer M3 with respect to the first direction X and may be covered by the third contact metal layer M3. For example, the side contact portion SCP may have an eaves structure, or may have a "("-shaped cross-sectional structure or a "⟨"-shaped cross-sectional structure.

The side contact portion SCP of the common power contact portion CPCP may be formed to be concave or may have an eaves structure, and thus, may be electrically connected to the common electrode CE without electrically contacting the light emitting device ED provided on the common power contact portion CPCP. For example, in a case where the light emitting device ED is formed through a deposition process, a depositing material of the light emitting device ED may have linearity, and thus, may be formed at a portion of each of a top surface and the lateral surface of the third contact metal layer M3 and at a portion of a lower portion of the lateral surface of the first contact metal layer M1, but may not be formed at the side contact portion SCP covered by the third contact metal layer M3. Accordingly, the side contact portion SCP of the common power contact portion CPCP may not be covered by the light emitting device ED and may be exposed at the outside of a lateral surface. Also, the side contact portion SCP may isolate (or cut or divide) the light emitting device ED.

The common electrode CE may be formed on a top surface of the light emitting device ED and may be formed at the side contact portion SCP by penetrating into a concave lateral surface of the common power contact portion CPCP, and thus, may be electrically connected to the light emitting device ED and may be electrically connected to the side contact portion SCP of the common power contact portion CPCP. For example, the common electrode CE may be formed through a deposition process such as a sputtering process for implementing step coverage which is relatively excellent, and in this case, a sputtering electrode material may be deposited on the light emitting device ED and may be deposited on all of the lateral surface of the common power contact portion CPCP including the side contact portion SCP by penetrating into a concave lateral surface of each of the first and second contact metal layers M1 and M2. Accordingly, the common electrode CE may be electrically connected to the pixel common power line CPL through the side contact portion SCP of the common power contact portion CPCP even without a process of forming a separate contact hole or a separate contact structure.

The display apparatus according to an embodiment of the present disclosure may further include a secondary power contact portion SPCP.

The secondary power contact portion SPCP according to an embodiment of the present disclosure may be disposed between a plurality of pixels P respectively overlapping a plurality of secondary power lines SPL and may electrically connect the common electrode CE to each of the plurality of secondary power lines SPL.

Each of the plurality of secondary power lines SPL may include a first secondary power line SPLa, a second secondary power line SPLb, and a secondary contact line SPLc.

The first secondary power line SPLa may extend long in the second direction Y and may be disposed in the display area AA of the first substrate 100 in parallel with the first pixel common power line CPLa. The first secondary power line SPLa according to an embodiment may be formed of the same material on the first surface 100a of the first substrate 100 along with the first pixel common power line CPLa and may be electrically connected to the first pixel common power line CPLa through a plurality of line connection patterns LCP.

The second secondary power line SPLb may be formed on the gate insulation layer GI overlapping the first secondary power line SPLa. The second secondary power line SPLb according to an embodiment may be formed of the same material along with the second pixel common power line CPLb.

The secondary contact line SPLc may be formed on the interlayer insulation layer 101c overlapping the first secondary power line SPLa and the second secondary power line SPLb. The secondary contact line SPLc may be electrically connected to the second secondary power line SPLb through a contact hole disposed in the interlayer insulation layer 101c and may be electrically connected to the first secondary power line SPLa through a contact hole disposed in the interlayer insulation layer 101c and the buffer layer 101a. The secondary contact line SPLc according to an embodiment may be formed of the same material along with the contact line CPLc.

Because each of the plurality of secondary power lines SPL includes the first secondary power line SPLa and the second secondary power line SPLb electrically connected to each other through the secondary contact line SPLc, a total line resistance may be reduced.

The secondary power contact portion (or a secondary power contact pad) SPCP may be electrically connected to a corresponding secondary power line SPL, between the plurality of pixels P and may be electrically connected to the common electrode CE on the basis of the side contact manner.

The secondary power contact portion SPCP according to an embodiment may include the first to third contact metal layers M1 to M3. For example, the secondary power contact portion SPCP may be formed along with the common power contact portion CPCP. Except for that the first contact metal layer M1 is electrically connected to the secondary power line SPL, the secondary power contact portion SPCP may be formed along with the common power contact portion CPCP including the first to third contact metal layers M1 to M3 described above and may be electrically connected to the common electrode CE on the basis of the side contact manner, and thus, a repetitive description thereon is omitted.

Figure 21:
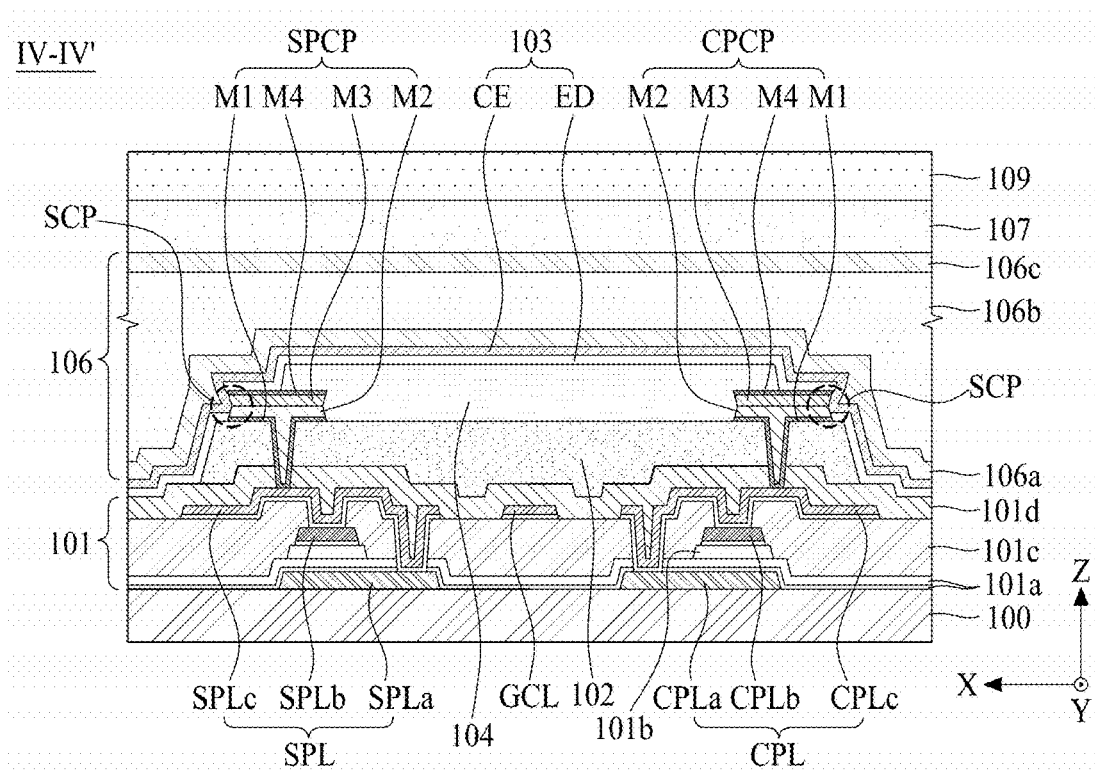
FIG. 21 is another cross-sectional view taken along line IV-IV' illustrated in FIG. 6.

FIG. 21 is another cross-sectional view taken along line IV-IV' illustrated in FIG. 6 and illustrates an embodiment which is implemented to modify the common power contact portion and the secondary power contact portion illustrated in FIG. 20. In describing FIG. 21, elements which are the same or correspond to the elements of FIG. 20 are referred to by like reference numerals, and their repetitive descriptions are omitted or will be briefly described below.

Referring to FIGS. 6, 15, 16, and 21, a common power contact portion CPCP according to an embodiment may include first to fourth contact metal layers M1 to M4. For example, the common power contact portion CPCP may be formed along with a pixel electrode PE having a four-layer structure.

The first contact metal layer M1 may be disposed on a planarization layer 102 overlapping the pixel common power line CPL and may be electrically connected to the pixel common power line CPL through a contact hole. The first contact metal layer M1 may reinforce an adhesive force between the common power contact portion CPCP and the planarization layer 102. An oxidation rate of the first contact metal layer M1 may be lower than that of each of the second and third contact metal layers M2 and M3. The first contact metal layer M1 according to an embodiment may include ITO or MoTi. For example, the first contact metal layer M1 may include the same material as that of a first layer (or a lowermost layer) of the pixel electrode PE having the four-layer structure.

The second contact metal layer M2 may be disposed on the first contact metal layer M1 and may be electrically connected to a common electrode CE on the basis of the side contact manner. The second contact metal layer M2 may include a metal material having a resistance which is relatively lower than that of the third contact metal layer M3. The second contact metal layer M2 may be formed to be relatively thicker than each of the first contact metal layer M1 and the fourth contact metal layer M4, for decreasing a total resistance of the common power contact portion CPCP. The second contact metal layer M2 may include a metal material having an etching speed which is higher than that of the third contact metal layer M3. The second contact metal layer M2 according to an embodiment may include copper (Cu). For example, the second contact metal layer M2 may include the same material as that of a second layer of the pixel electrode PE having the four-layer structure. The second contact metal layer M2 may act as a sacrificial layer for more increasing an etching speed of a lower surface of the third contact metal layer M3 adjacent to the planarization layer 102 than an etching speed of an upper surface of the third contact metal layer M3 adjacent to the fourth contact metal layer M4 in an electrode patterning process performed on the common power contact portion CPCP.

The third contact metal layer M3 may be disposed on the second contact metal layer M2 and may be electrically connected to the common electrode CE on the basis of the side contact manner. The third contact metal layer M3 may act as a reflective electrode including a light-reflecting metal material. The third contact metal layer M3 may include a metal material having a resistance which is relatively lower than that of each of the first contact metal layer M1 and the fourth contact metal layer M4. The third contact metal layer M3 may include a metal material having an etching speed which is higher than that of the fourth contact metal layer M4 and is lower than that of the second contact metal layer M2. The third contact metal layer M3 may be formed to be relatively thicker than each of the first contact metal layer M1 and the fourth contact metal layer M4, for decreasing a total resistance of the common power contact portion CPCP. The third contact metal layer M3 according to an embodiment may include one material of Al, Ag, Mo, Ti, and MoTi. For example, the third contact metal layer M3 may include the same material as that of a third layer of the pixel electrode PE having the four-layer structure.

The fourth contact metal layer M4 may be disposed on the third contact metal layer M3 and may prevent the corrosion of the first to third contact metal layer M1 to M3. The fourth contact metal layer M4 may include a material (or substance) which is stronger in corrosion resistance than each of the second contact metal layer M2 and the third contact metal layer M3. An oxidation rate of the fourth contact metal layer M4 may be lower than that of each of the second contact metal layer M2 and the third contact metal layer M3. The fourth contact metal layer M4 according to an embodiment may include IZO or ITO. For example, the fourth contact metal layer M4 may include the same material as that of a fourth layer of the pixel electrode PE having the four-layer structure.

The common power contact portion CPCP may be formed on the planarization layer 102 to have the same four-layer structure as that of the pixel electrode PE, and then, may be patterned through batch etching based on an electrode patterning process (or an etching process).

In the electrode patterning process according to an embodiment, an etching speed of the third contact metal layer M3 may be higher than that of the fourth contact metal layer M4, and an etching speed of the second contact metal layer M2 may be higher than that of the third contact metal layer M3.

For example, in the electrode patterning process, the common power contact portion CPCP may be sequentially etched up to the first contact metal layer M1 from the fourth contact metal layer M4.

Because an etching speed of the third contact metal layer M3 is higher than that of the fourth contact metal layer M4, the third contact metal layer M3 may be faster etched than the fourth contact metal layer M4 from a time at which a top surface thereof is exposed to an etching source, and thus, as a lateral surface of the third contact metal layer M3 is etched prior to a lateral surface of the fourth contact metal layer M4, a lateral surface of the third contact metal layer M3 may be faster etched than a lateral surface of the fourth contact metal layer M4.

Because an etching speed of the second contact metal layer M2 is higher than that of the third contact metal layer M3, the second contact metal layer M2 may be faster etched than the third contact metal layer M3 from a time at which a top surface thereof is exposed to an etching source, and thus, as an upper portion of a lateral surface of the second contact metal layer M2 is etched prior to the lateral surface of the third contact metal layer M3, a lower portion of the lateral surface of the third contact metal layer M3 may be faster etched than an upper portion of the lateral surface thereof and an upper portion of the lateral surface of the second contact metal layer M2 may be faster etched than a lower portion of the lateral surface thereof. Therefore, the lateral surface of the second contact metal layer M2 may have an inclined shape or a tapered shape, and the lateral surface of the third contact metal layer M3 may have an inclined shape or a reverse tapered shape. Accordingly, the common power contact portion CPCP may include a side contact portion SCP which is concavely formed on the lateral surface of each of the second contact metal layer M2 and the third contact metal layer M3.

A tapered shape of the second contact metal layer M2 according to an embodiment may be defined as a shape where an included angle (or an internal angle) between a top surface and the lateral surface thereof is greater than an included angle (or an internal angle) between a bottom surface and the lateral surface thereof. A reverse tapered shape of the third contact metal layer M3 according to an embodiment may be defined as a shape where an included angle (or an internal angle) between a top surface and the lateral surface thereof is less than an included angle (or an internal angle) between a bottom surface and the lateral surface thereof. For example, the included angle between the top surface and the lateral surface of the second contact metal layer M2 may be an obtuse angle, and the included angle between the bottom surface and the lateral surface of the second contact metal layer M2 may be an acute angle. The included angle between the top surface and the lateral surface of the third contact metal layer M3 may be an acute angle, and the included angle between the bottom surface and the lateral surface of the third contact metal layer M3 may be an obtuse angle.

The side contact portion SCP according to an embodiment may be inward apart from, by a certain distance, a vertical line extending in a thickness direction Z of the first substrate 100 from an outermost lateral surface of the fourth contact metal layer M4, and thus, may not protrude to the outside of a lateral surface of the fourth contact metal layer M4 with respect to a first direction X and may be covered by the fourth contact metal layer M4. For example, the side contact portion SCP may have an eaves structure, or may have a "("-shaped cross-sectional structure or a "("-shaped cross-sectional structure.

The side contact portion SCP of the common power contact portion CPCP may be formed to be concave or may have an eaves structure, and thus, may be electrically connected to the common electrode CE without electrically contacting a light emitting device ED provided on the common power contact portion CPCP. For example, in a case where the light emitting device ED is formed through a deposition process, a depositing material of the light emitting device ED may have linearity, and thus, may be formed at a portion of each of a top surface and the lateral surface of the fourth contact metal layer M4, a portion of the lateral surface of the first contact metal layer M1, and a portion of a lower portion of the lateral surface of the second contact metal layer M2, but may not be formed at the side contact portion SCP covered by the fourth contact metal layer M4. Accordingly, the side contact portion SCP of the common power contact portion CPCP may not be covered by the light emitting device ED and may be exposed at the outside of a lateral surface. Also, the side contact portion SCP may isolate the light emitting device ED.

The common electrode CE may be formed on a top surface of the light emitting device ED and may be formed at the side contact portion SCP by penetrating into a concave lateral surface of the common power contact portion CPCP, and thus, may be electrically connected to the light emitting device ED and may be electrically connected to the side contact portion SCP of the common power contact portion CPCP. For example, the common electrode CE may be formed through a deposition process such as a sputtering process for implementing step coverage which is relatively excellent, and in this case, a sputtering electrode material may be deposited on the light emitting device ED and may be deposited on all of the lateral surface of the common power contact portion CPCP including the side contact portion SCP by penetrating into a concave lateral surface of each of the second and third contact metal layers M2 and M3. Accordingly, the common electrode CE may be electrically connected to the pixel common power line CPL through the side contact portion SCP of the common power contact portion CPCP even without a process of forming a separate contact hole or a separate contact structure.

The secondary power contact portion SPCP according to an embodiment may include the first to fourth contact metal layers M1 to M4. For example, the secondary power contact portion SPCP may be formed along with the common power contact portion CPCP. Except for that the first contact metal layer M1 is electrically connected to a secondary power line SPL, the secondary power contact portion SPCP may be formed along with the common power contact portion CPCP including the first to fourth contact metal layers M1 to M4 described above and may be electrically connected to the common electrode CE on the basis of the side contact manner, and thus, a repetitive description thereon is omitted.

Figure 22:
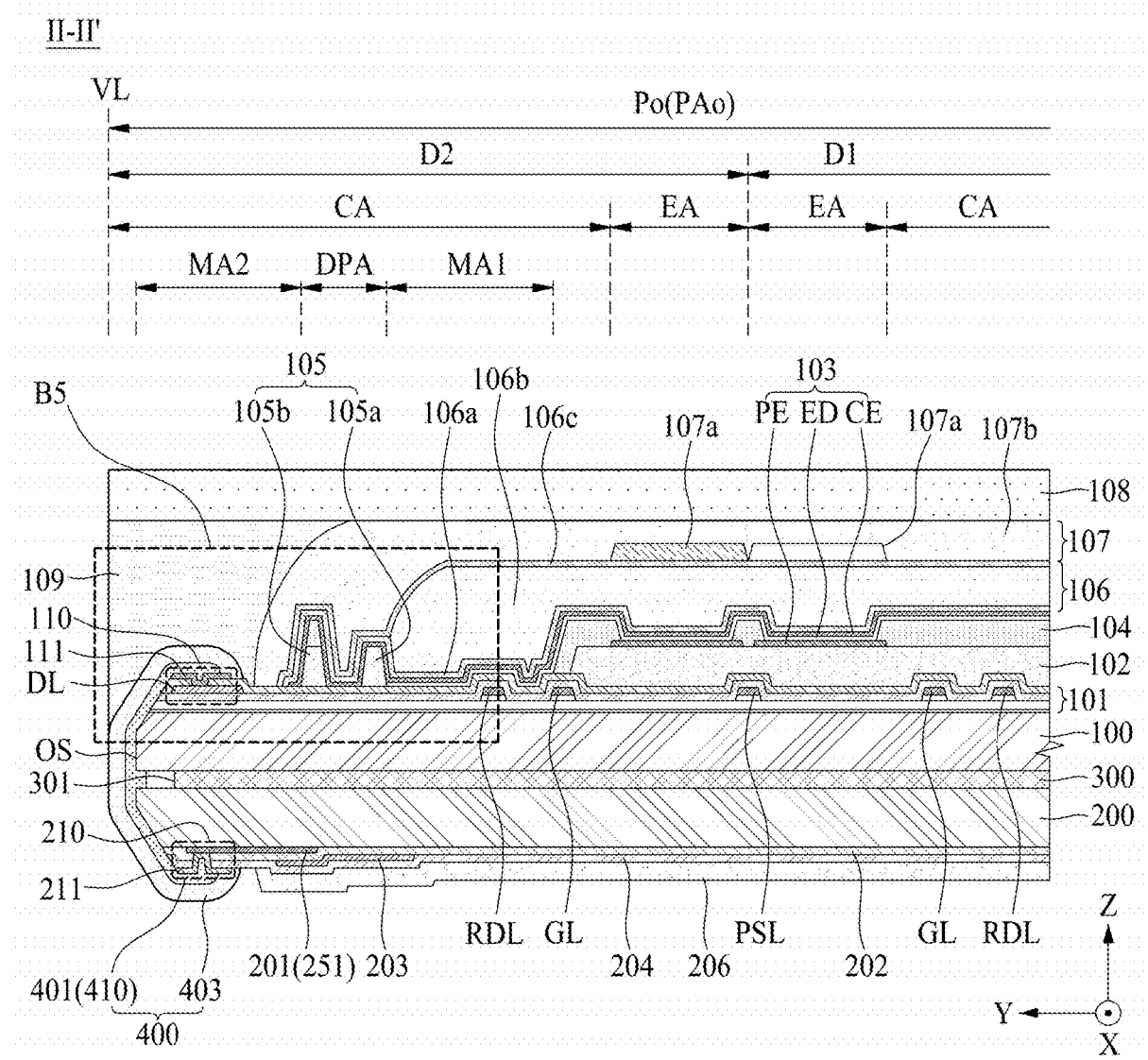
FIG. 22 is another cross-sectional view taken along line II-II' illustrated in FIG. 4.
Figure 23:
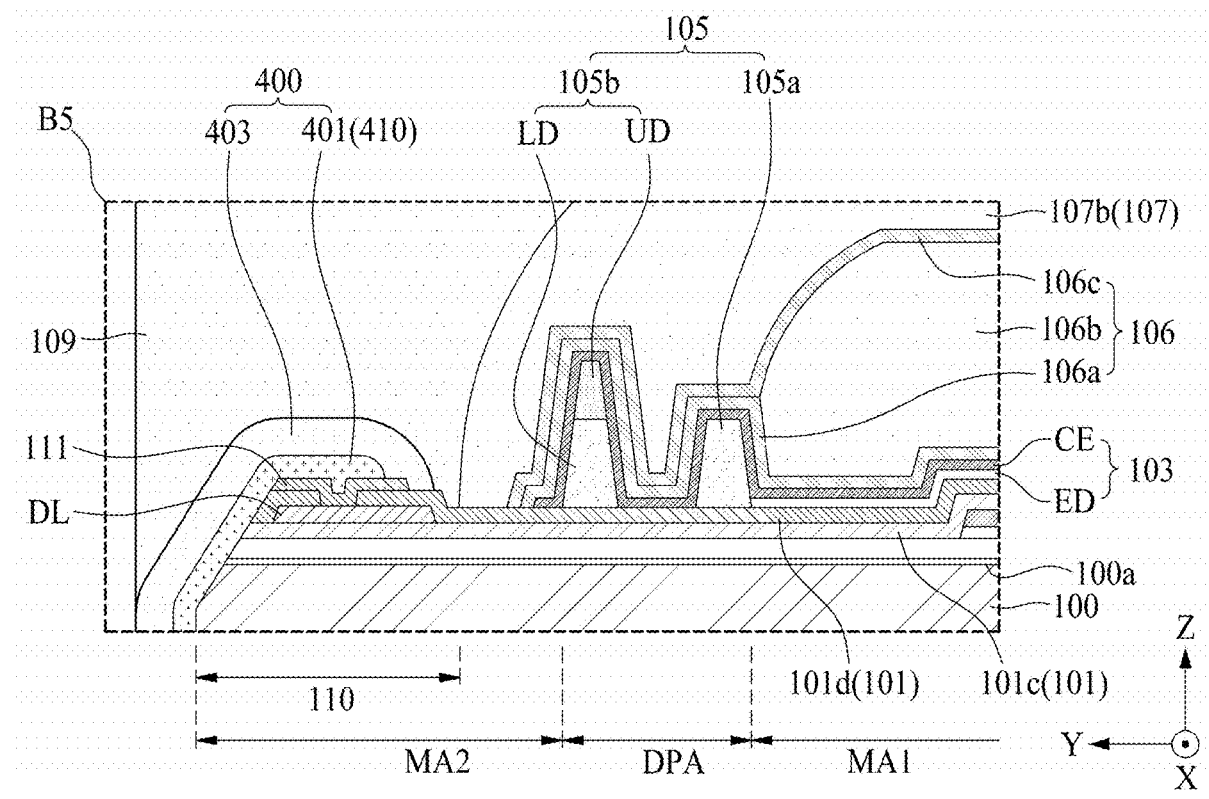
FIG. 23 is an enlarged view of a region 'B5' illustrated in FIG. 22.

FIG. 22 is another cross-sectional view taken along line II-II' illustrated in FIG. 4, and FIG. 23 is an enlarged view of a region 'B5' illustrated in FIG. 22. FIGS. 22 and 23 illustrate an embodiment which is implemented to modifying a dam pattern in the display apparatus illustrated in FIGS. 1 to 21. In describing FIGS. 22 and 23, elements which are the same or correspond to the elements of FIG. 4 are referred to by like reference numerals, and their repetitive descriptions are omitted or will be briefly described below.

Referring to FIGS. 4, 22, and 23, in a display apparatus 10 according to the present disclosure, a dam pattern 105 may include a first dam pattern 105a and a second dam pattern 105b.

The first dam pattern 105a may be disposed on a circuit layer 101 at an edge portion of a first substrate 100 to have a closed loop shape or a closed loop line shape. For example, the first dam pattern 105a may be configured on a passivation layer 101d of the circuit layer 101 so as to be adjacent to an emission area EA of an outermost pixel Po. The first dam pattern 105a may prevent the spread or overflow of an encapsulation layer 106. The first dam pattern 105a may be referred to as an inner dam pattern, an internal dam, a blocking wall, or a partition wall.

The first dam pattern 105a according to an embodiment may be disposed to be most adjacent to a shadow area (or a tail portion of the light emitting device) of the light emitting device ED in a first margin area MA1 defined on the first substrate 100. Therefore, an end (or a tail portion) of the light emitting device ED disposed in the first margin area MA1 may contact an inner surface of the first dam pattern 105a, or may be apart from the inner surface of the first dam pattern 105a in a direction toward the emission area EA.

A dam pattern area DPA overlapping the first dam pattern 105a may be enlarged toward the first margin area MA1, and a water penetration path may increase due to the first dam pattern 105a, whereby the first margin area MA1 based on the shadow area of the light emitting device ED may be reduced. Therefore, a second interval D2 between a center portion of an outermost pixel Po and an outer surface OS of the first substrate 100 may be reduced as the first margin area MA1 decreases. Accordingly, in the display apparatus 10 according to the present disclosure, the second interval D2 between the center portion of the outermost pixel Po and the outer surface OS of the first substrate 100 may be less than the second interval D2 of the display apparatus including the dam pattern 105 illustrated in FIGS. 15 to 17.

The first dam pattern 105a according to an embodiment may be formed of the same material along with the planarization layer 102. For example, a height (or a thickness) of the first dam pattern 105a may be the same as that of the planarization layer 102.

The second dam pattern 105b may be disposed on the circuit layer 101 at the edge portion of the first substrate 100 to have a closed loop shape or a closed loop line shape. For example, the second dam pattern 105b may be implemented on the passivation layer 101d of the circuit layer 101 to surround the first dam pattern 105a. For example, a height (or a thickness) of the second dam pattern 105b may be greater than that of the first dam pattern 105a. The second dam pattern 105b may increase a lateral water penetration path, thereby enhancing the reliability of the light emitting device ED against water penetration. The second dam pattern 105b may be referred to as an outer dam pattern or an external dam.

The second dam pattern 105b according to an embodiment may include a lower dam pattern LD and an upper dam pattern UD.

The lower dam pattern LD may be implemented on the passivation layer 101d adjacent to an outer surface of the first dam pattern 105a to have a closed loop shape (or a closed loop line shape) surrounding the first dam pattern 105a. The lower dam pattern LD according to an embodiment may be formed of the same material along with the planarization layer 102. For example, a height (or a thickness) of the lower dam pattern LD may be the same as that of the planarization layer 102.

The upper dam pattern UD may be implemented on the lower dam pattern LD to have a closed loop shape (or a closed loop line shape) surrounding the first dam pattern 105a. The upper dam pattern UD according to an embodiment may be formed of the same material along with a bank 104. For example, a height (or a thickness) of the upper dam pattern UD may be the same as that of the bank 104.

In some embodiments, the light emitting device ED of a light emitting device layer 103 may be implemented in only an internal region (or an inner region) surrounded by the first dam pattern 105a. That is, the light emitting device ED including an organic light emitting layer may be disposed at a portion other than a portion between the first dam pattern 105a and the outer surface OS of the first substrate 100 in a first surface 100a of the first substrate 100 and may not be disposed between the first dam pattern 105a and the outer surface OS of the first substrate 100 and on a top surface of the first dam pattern 105a.

The common electrode CE of the light emitting device 103 may be implemented to cover the light emitting device ED and the dam pattern 105. An end of the common electrode CE may directly contact the passivation layer 101d adjacent to an outer surface of the second dam pattern 105b. Also, the common electrode CE may directly contact the passivation layer 101d, between the first dam pattern 105a and the second dam pattern 105b. Therefore, the common electrode CE may directly contact the passivation layer 101d at an outer portion of the second dam pattern 105b and between the first dam pattern 105a and the second dam pattern 105b, thereby increasing an effect of preventing lateral water penetration.

A first encapsulation layer 106a of an encapsulation layer 106 may be implemented to cover the common electrode CE. For example, the first encapsulation layer 106a may be implemented in a conformal shape based on a surface shape of the common electrode CE, and thus, may surround the common electrode CE. An end of the first encapsulation layer 106a may directly contact the passivation layer 101d and may surround an end of the common electrode CE. The first encapsulation layer 106a may directly contact a top surface of the passivation layer 101d at an outer periphery of the dam pattern 105 and may cover a boundary portion (or an interface) between the common electrode CE and the passivation layer 101d, thereby preventing or minimizing lateral water penetration.

A second encapsulation layer 106b of the encapsulation layer 106 may be implemented to cover the first encapsulation layer 106a covering an inner surface of the first dam pattern 105a. The second encapsulation layer 106b may have a relatively thick thickness, and thus, may spread to an edge portion of the first surface 100a of the first substrate 100, but the spread of the second encapsulation layer 106b may be blocked by the first dam pattern 105a. For example, an end of the second encapsulation layer 106b may directly contact the first encapsulation layer 106a on the first dam pattern 105a. Accordingly, in some embodiments, the second encapsulation layer 106b may be disposed on only the first encapsulation layer 106a in an internal region (or an inner region) surrounded by the first dam pattern 105a.

A third encapsulation layer 106c of the encapsulation layer 106 may be implemented to cover all of the first encapsulation layer 106a which is disposed to cover the dam pattern 105 and the second encapsulation layer 106b. An end of the third encapsulation layer 106c may directly contact the passivation layer 101d and may surround an end of the first encapsulation layer 106a. The third encapsulation layer 106c may directly contact the top surface of the passivation layer 101d at the outer periphery of the dam pattern 105 and may cover a boundary portion (or an interface) between the first encapsulation layer 106a and the passivation layer 101d, thereby additionally preventing or minimizing lateral water penetration.

Figure 24:
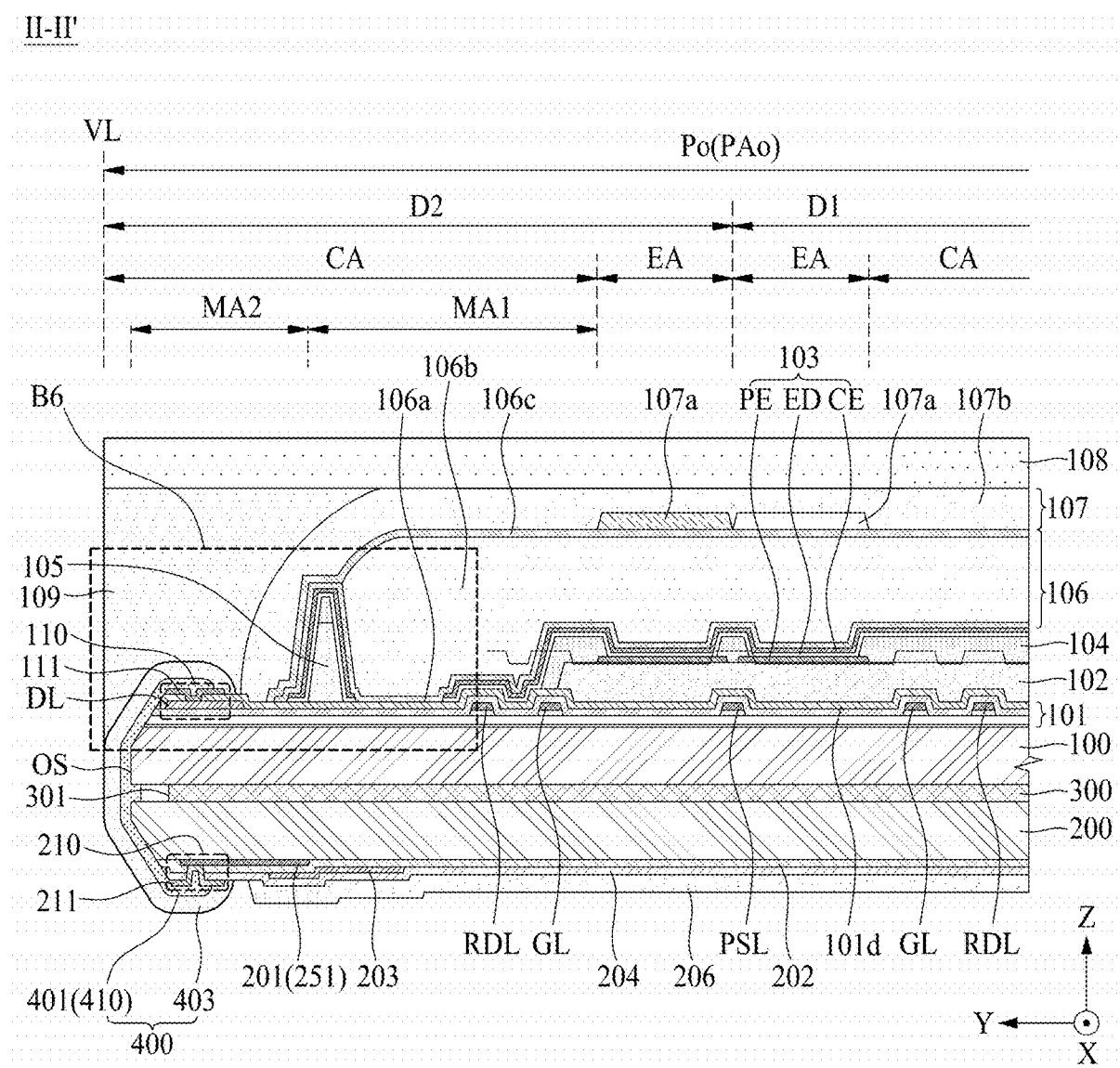
FIG. 24 is another cross-sectional view taken along line II-II' illustrated in FIG. 4.
Figure 25:
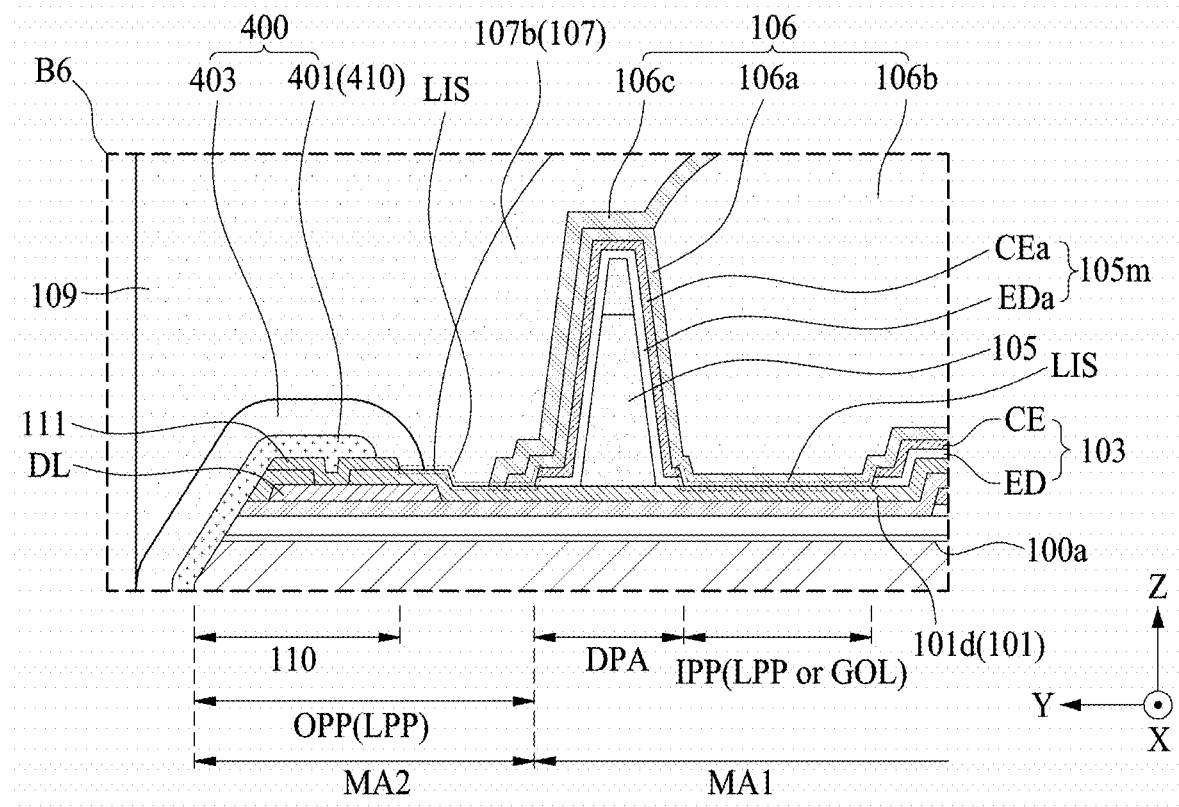
FIG. 25 is an enlarged view of a region 'B6' illustrated in FIG. 24.

FIG. 24 is another cross-sectional view taken along line II-II' illustrated in FIG. 4, and FIG. 25 is an enlarged view of a region 'B6' illustrated in FIG. 24. FIGS. 24 and 25 illustrate an embodiment where a laser patterning portion is further provided near a dam pattern in the display apparatus illustrated in FIGS. 1 to 21. In describing FIGS. 24 and 25, elements which are the same or correspond to the elements of FIG. 4 are referred to by like reference numerals, and their repetitive descriptions are omitted or will be briefly described below.

Referring to FIGS. 4, 24, and 25, a display apparatus 10 according to the present disclosure may include a laser patterning portion LPP disposed near a dam pattern 105 of a first substrate 100.

The laser patterning portion LPP may be implemented to prevent the penetration of water or other foreign, extraneous materials in a lateral direction of the first substrate 100 to prevent the degradation in a light emitting device ED caused by lateral penetration of materials including water as well as others. The laser patterning portion LPP may isolate (or disconnect) the light emitting device ED of a light emitting device layer 103 at a periphery of the dam pattern 105. Accordingly, the laser patterning portion LPP may be defined as a non-disposition area or an isolation area where the light emitting device ED and a common electrode CE are not disposed. Also, the laser patterning portion LPP may be formed by simultaneously removing the light emitting device ED and the common electrode CE disposed near the dam pattern 105, and thus, may be defined as at least one groove line GOL. The at least one groove line may be formed to be concave by patterning the light emitting device ED and the common electrode CE.

The light emitting device ED of the light emitting device layer 103 may be disposed at a bank 104 and a pixel electrode PE exposed at an emission area EA of each of a plurality of subpixels SP, and moreover, may be disposed on a passivation layer 101d exposed at an edge portion of a first surface 100a of the first substrate 100. Therefore, a lateral surface of the light emitting device ED may be exposed at the outside, and due to this, the light emitting device ED may be degraded or may be reduced in reliability due to the penetration of water through the lateral surface of the first substrate 100. In order to solve such a problem, the laser patterning portion LPP may isolate (or disconnect) the light emitting device ED of the light emitting device layer 103 disposed near the dam pattern 105, thereby preventing lateral water penetration.

The laser patterning portion LPP or a groove line GOL may be implemented to isolate the light emitting device ED from the common electrode CE at a periphery of the dam pattern 105 and to expose a top surface of the passivation layer 101d. The laser patterning portion LPP or a groove line GOL may be at least partially covered by the encapsulation layer 106. In some embodiments, the encapsulation layer 106 may directly contact an uppermost surface of a circuit layer 101 at the laser patterning portion LPP, and thus, may at least partially surround a lateral surface LIS (may also be referred to as an isolation surface or a laser isolation surface) of each of the light emitting device ED and the common electrode CE isolated by a laser patterning process. In some embodiments, the laser patterning process may physically isolate as well as electrically isolate the light emitting device ED and the common electrode CE formed adjacent to the dam pattern 105. For example, the encapsulation layer 106 may at least partially or completely cover all of the isolation surface LIS of each of the light emitting device ED and the common electrode CE, a boundary portion (or an interface) between the light emitting device ED and the common electrode CE, and a boundary portion (or an interface) between the passivation layer 101d and the light emitting device ED at the laser patterning portion LPP, thereby fundamentally (or completely) preventing lateral water penetration.

The laser patterning portion LPP according to an embodiment may include an inner patterning portion IPP which is disposed inward from the dam pattern 105.

The inner patterning portion (or a first laser patterning portion) IPP may be disposed adjacent to the inner portion of the dam pattern 105 and may be surrounded by the dam pattern 105. That is, the inner patterning portion IPP may be disposed between the dam pattern 105 and an emission area EA of an outermost pixel area PAo to have a closed loop shape (or a closed loop line shape) surrounded by the dam pattern 105. For example, the inner patterning portion IPP may be disposed in a closed loop shape (or a closed loop line shape) along an edge portion of the first substrate 100, and thus, may be surrounded by the dam pattern 105 having a closed loop shape. The inner patterning portion IPP may isolate (or disconnect) each of the common electrode CE and the light emitting device ED of the light emitting device layer 103 provided at the passivation layer 101d, thereby preventing lateral water penetration.

The inner patterning portion IPP according to an embodiment may be an area which is formed by simultaneously removing the common electrode CE and the light emitting device ED of the light emitting device layer 103 disposed at a periphery inward from the dam pattern 105 through a laser patterning process. For example, in the laser patterning process, a portion of each of the light emitting device ED and the common electrode CE which are disposed in the first margin area MA1 on the first substrate 100 so as to be adjacent to an inner portion of the dam pattern 105 may be simultaneously removed. Accordingly, the inner patterning portion IPP may be defined as a non-disposition area or an isolation area where the light emitting device ED and a common electrode CE are not disposed. Also, the inner patterning portion IPP may be formed by simultaneously removing the light emitting device ED and the common electrode CE disposed at a periphery inward from the dam pattern 105, and thus, may be defined as at least one first groove line (or an inner groove line).

The inner patterning portion IPP may be covered by the encapsulation layer 106. For example, the encapsulation layer 106 may be disposed on the inner patterning portion IPP, and thus, may surround a lateral surface (or an isolation surface or a laser isolation surface) of each of the common electrode CE and the light emitting device ED isolated by the laser patterning process. Accordingly, the encapsulation layer 106 may completely cover all of the lateral surface of each of the light emitting device ED and the common electrode CE, a boundary portion (or an interface) between the light emitting device ED and the common electrode CE, and a boundary portion (or an interface) between the passivation layer 101d and the light emitting device ED at the inner patterning portion IPP, thereby fundamentally (or completely) preventing lateral water penetration.

The inner patterning portion IPP according to an embodiment may be covered by a first encapsulation layer 106a of the encapsulation layer 106. The first encapsulation layer 106a may directly contact an uppermost surface of a circuit layer 101 through the inner patterning portion IPP. For example, the first encapsulation layer 106a may directly contact a top surface of the passivation layer 101d through the inner patterning portion IPP, and thus, may surround a lateral surface (or an isolation surface or a laser isolation surface) of each of the common electrode CE and the light emitting device ED exposed at the inner patterning portion IPP. Accordingly, the first encapsulation layer 106a may completely cover all of the isolation surface of each of the light emitting device ED and the common electrode CE, a boundary portion (or an interface) between the light emitting device ED and the common electrode CE, and a boundary portion (or an interface) between the passivation layer 101d and the light emitting device ED at the inner patterning portion IPP, thereby fundamentally (or completely) preventing lateral water penetration.

In the inner patterning portion IPP, a portion of a first margin area MA1 based on a shadow area of the light emitting device ED may be replaced by an encapsulation margin area which is based on securing the reliability of the light emitting device ED, and thus, an encapsulation margin based on securing the reliability of the light emitting device ED may increase, thereby increasing the reliability of the light emitting device ED. Also, the inner patterning portion IPP may be formed by simultaneously removing the common electrode CE and the light emitting device ED disposed in the first margin area MA1 adjacent to the dam pattern 105, and thus, may be apart from the emission area EA of the outermost pixel Po by the first margin area MA1 based on the shadow area of the light emitting device ED, whereby a dam pattern area DPA overlapping the dam pattern 105 may be implemented to be included in the first margin area MA1. In this case, a second interval D2 between an outer surface OS of the first substrate 100 and a center portion of the outermost pixel implemented to be half or less of a first interval (or a first pitch) D1 between two adjacent pixel areas PA may be more reduced.

The laser patterning portion LPP according to an embodiment may further include an outer patterning portion OPP disposed outward from the dam pattern 105.

The outer patterning portion (or a second laser patterning portion) OPP may be disposed in an outer region of the dam pattern 105 and may surround the dam pattern 105. That is, the outer patterning portion OPP may be disposed between the outer surface OS of the first substrate 100 and the dam pattern 105 to have a closed loop shape (or a closed loop line shape) surrounding the dam pattern 105. For example, the outer patterning portion OPP may be disposed in a closed loop shape (or a closed loop line shape) along an edge portion of the first substrate 100 and may surround the dam pattern 105 having a closed loop shape (or a closed loop line shape).

The outer patterning portion OPP according to an embodiment may be an area which is formed by simultaneously forming the common electrode CE and the light emitting device ED of the light emitting device layer 103 disposed at a periphery outward from the dam pattern 105 through a laser patterning process. Therefore, the outer patterning portion OPP may be defined as a non-disposition area or an edge removal area where the light emitting device ED and a common electrode CE are not disposed. Also, the outer patterning portion OPP may be formed by simultaneously removing the light emitting device ED and the common electrode CE disposed at a periphery outward from the dam pattern 105, and thus, may be defined as at least one second groove line (or an outer groove line).

The outer patterning portion OPP may be covered by the encapsulation layer 106. For example, the encapsulation layer 106 may be disposed on the outer patterning portion OPP, and thus, may surround a lateral surface (or an isolation surface or a laser isolation surface) of each of the common electrode CE and the light emitting device ED isolated by the laser patterning process. Accordingly, the encapsulation layer 106 may completely cover all of the isolation surface of each of the light emitting device ED and the common electrode CE, a boundary portion (or an interface) between the light emitting device ED and the common electrode CE, and a boundary portion (or an interface) between the passivation layer 101d and the light emitting device ED at the outer patterning portion OPP, thereby fundamentally (or completely) preventing lateral water penetration.

The outer patterning portion OPP according to an embodiment may be covered by the first encapsulation layer 106a of the encapsulation layer 106. The first encapsulation layer 106a may directly contact an uppermost surface of the circuit layer 101 through the outer patterning portion OPP. For example, the first encapsulation layer 106a may directly contact a top surface of a passivation layer 101d through the outer patterning portion OPP, and thus, may cover a lateral surface of each of the common electrode CE and the light emitting device ED exposed at the outer patterning portion OPP and a boundary portion (or an interface) between the passivation layer 101d and the light emitting device ED. The outer patterning portion OPP may more increase the reliability of the light emitting device ED, or may decrease a second margin area MA2 which is based on securing the reliability of the light emitting device ED. In this case, a second interval D2 between the outer surface OS of the first substrate 100 and a center portion of an outermost pixel implemented to be half or less of a first interval (or a first pitch) D1 between two adjacent pixel areas PA may be more reduced.

Because the display apparatus 10 according to some embodiments includes the laser patterning portion LPP, a total width of the first margin area MA1 and the second margin area MA2 disposed at an edge portion of the first surface 100a of the first substrate 100 may decrease to 700

μm or less, and in this case, the display apparatus 10 may realize a resolution which is higher than that of a display apparatus including no laser patterning portion LPP.

For example, when half of a first interval (or a pixel pitch) D1 between two adjacent pixel areas PA is 350 μm within a process error range, a total width (or a shortest distance between an outer surface of the first substrate and an end of an emission area EA of the outermost pixel) of the first margin area MA1, the second margin area MA2, and a dam pattern area DPA may be implemented to be 320 μm or less, based on a shadow margin based on a shadow area of the light emitting device ED and an encapsulation margin based on securing the reliability of the light emitting device ED against water. In this case, a second interval D2 between an outermost outer surface VL of the first substrate 100 and a center portion of an outermost pixel including a first pad part 110 may be implemented to be 350 μm within the process error range. Here, the outermost outer surface VL of the first substrate 100 may be an outermost outer surface of an edge coating layer 403 covering a routing portion 400.

The first margin area MA1 and the second margin area MA2 may have the same width or different widths. For example, with respect to a first direction X, the first margin area MA1 may be implemented to have a width of 200 μm or less, and the second margin area MA2 may be implemented to have a width of 120 μm or less. Also, a pad margin area (or a lateral routing area) included in the second margin area MA2 may be implemented to have a width of 100 μm or less with respect to the first direction X.

An encapsulation layer 106 disposed at an edge portion of the first surface 100a of the first substrate 100 may be removed by a pad open process of opening (or exposing) first pads 111 of the first pad part 110. In this case, because a common electrode CE is not disposed on the first surface 100a of the first substrate 100 overlapping the first pad part 110 by using the outer patterning portion OPP, the first pad part 110 may be exposed by only a dry etching process without a wet etching process, and thus, a process of manufacturing the first substrate 100 may be simplified.

The display apparatus 10 according to the present embodiment may further include a dummy dam pattern 105m covering the dam pattern 105.

The dummy dam pattern 105 may be implemented to surround the dam pattern 105 between the inner patterning portion IPP and the outer patterning portion OPP.

The dummy dam pattern 105m according to an embodiment may include a first island pattern EDa surrounding the dam pattern 105 and a second island pattern CEa surrounding the first island pattern EDa.

The first island pattern EDa may be disposed in the dam pattern area DPA on the passivation layer 101d overlapping the dam pattern 105 and may surround lateral surfaces and a top surface of the dam pattern 105. The first island pattern EDa according to an embodiment may be formed of the same material along with the light emitting device ED. For example, the first island pattern EDa may be formed on the passivation layer 101d in the dam pattern area DPA to surround the lateral surfaces and the top surface of the dam pattern 105, and then, may be a light emitting device material layer (or a light emitting device pattern) which is isolated from the light emitting device ED in an island shape by using the inner patterning portion IPP and the outer patterning portion OPP. In other words, the first island pattern EDa may be a light emitting device material layer having an island shape, which remains to surround the dam pattern 105 without being removed by a laser patterning process of forming the inner patterning portion IPP and the outer patterning portion OPP. The first island pattern EDa may enlarge a height of the dam pattern 105, and thus, may reinforce a function of the dam pattern 105 which blocks the spread or overflow of the encapsulation layer 106.

The second island pattern CEa may surround the first island pattern EDa. The second island pattern CEa according to an embodiment may be formed of the same material along with the common electrode CE. For example, the second island pattern CEa may be a common electrode material layer (or a common electrode pattern) which is formed to have the same shape as that of a light emitting device ED including the first island pattern EDa, and then, is isolated from the common electrode CE in an island shape by using the inner patterning portion IPP and the outer patterning portion OPP. In other words, the second island pattern CEa may be a common electrode material layer having an island shape, which remains to surround the dam pattern 105 without being removed by the laser patterning process of forming the inner patterning portion IPP and the outer patterning portion OPP. The second island pattern CEa may enlarge a height of the dam pattern 105, and thus, may reinforce a function of the dam pattern 105 which blocks the spread or overflow of the encapsulation layer 106.

The first island pattern EDa and the second island pattern CEa may be simultaneously formed to have the same shape through the laser patterning process of forming the inner patterning portion IPP and the outer patterning portion OPP.

Additionally, the second island pattern CEa may be implemented to be electrically connected to at least one of a plurality of first pixel common power pads disposed in the first pad part 110. For example, the second island pattern CEa may protrude to at least one of the plurality of first pixel common power pads from one side parallel to the first pad part 110 or may include at least one protrusion pattern, and may be electrically connected to at least one of the plurality of first pixel common power pads through the at least one protrusion pattern. Optionally, the second island pattern CEa may be implemented to be electrically connected to a ground source of a driving circuit unit through a ground strap and a dummy pad disposed in the first pad part 110. The second island pattern CEa may include the same metal material as that of the common electrode CE, and thus, may act as an antistatic circuit which blocks static electricity flowing from the outside into a pixel P or may act as an electrostatic discharge (ESD) path which discharges static electricity to the driving circuit unit.

In the display apparatus according to the present embodiment, the dam pattern 105 may include a first dam pattern 105a and a second dam pattern 105b illustrated in FIGS. 22 and 23. In this case, a laser patterning portion (or a groove line) LPP may be disposed near the first dam pattern 105a and the second dam pattern 105b. For example, the laser patterning portion LPP may be disposed inward from the first dam pattern 105a and outward from the second dam pattern 105b. For example, the laser patterning portion LPP may include the inner patterning portion IPP disposed inward from the first dam pattern 105a and the outer patterning portion OPP disposed outward from the second dam pattern 105b.

Figure 26:
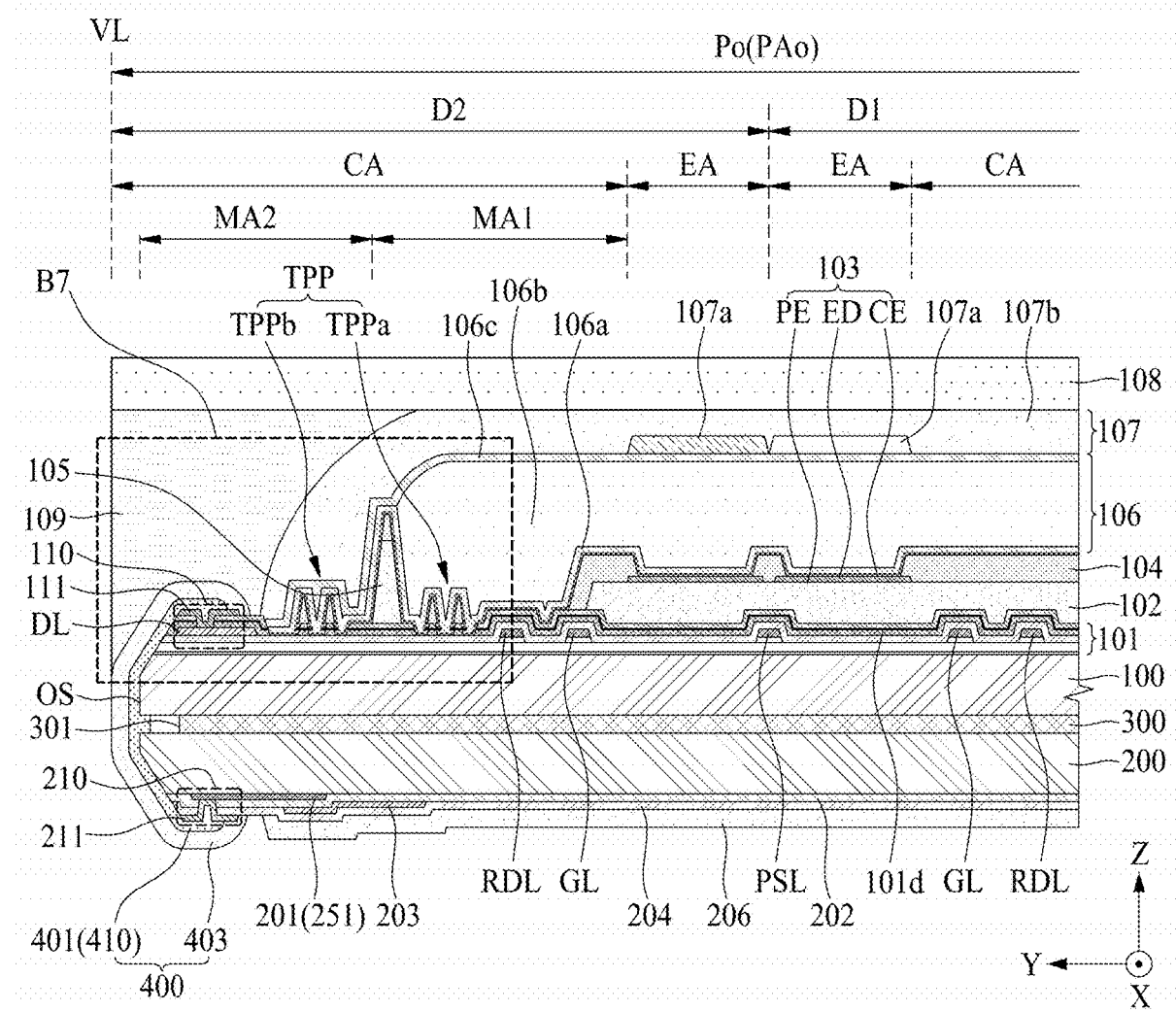
FIG. 26 is another cross-sectional view taken along line II-II' illustrated in FIG. 4.
Figure 27:
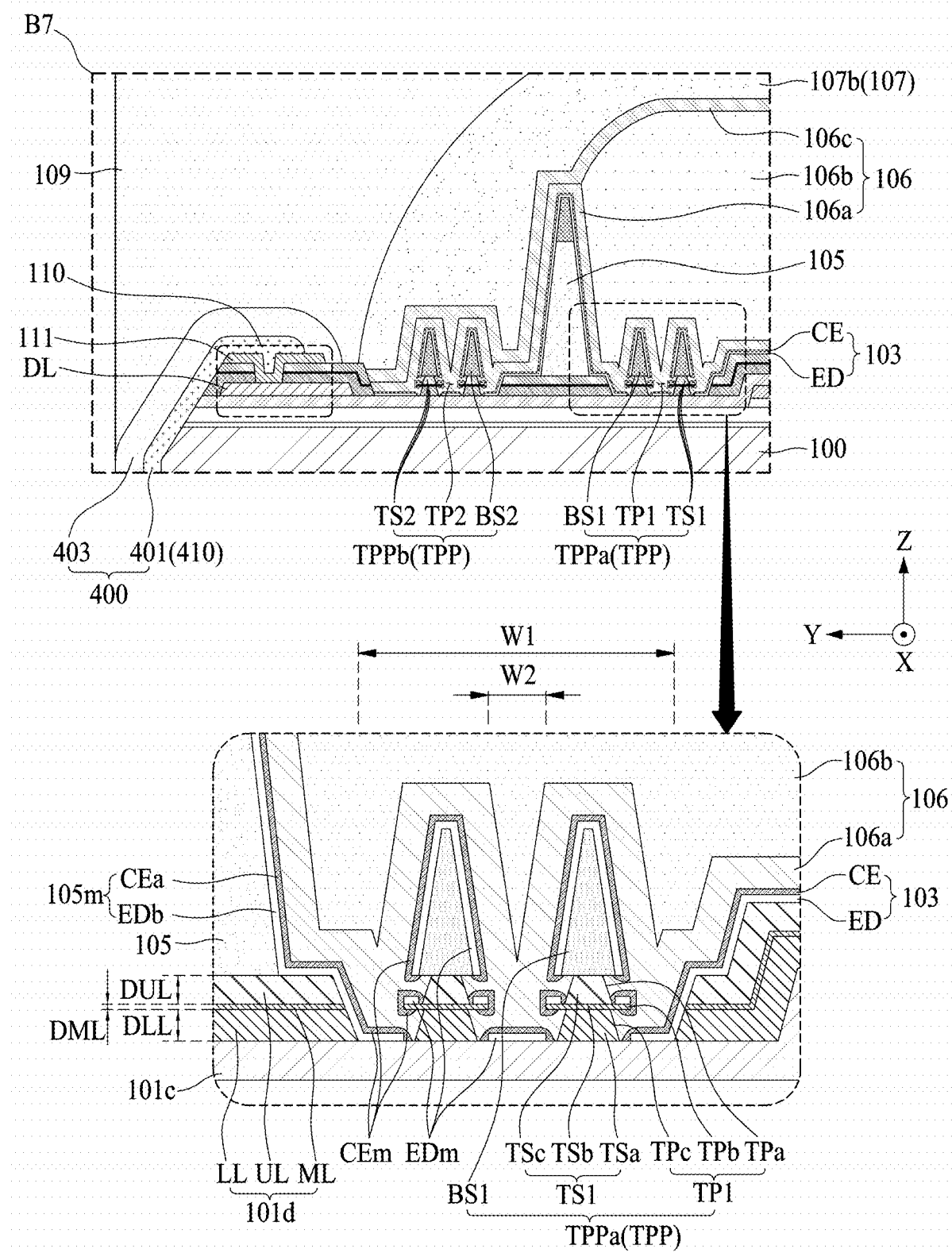
FIG. 27 is an enlarged view of a region 'B7' illustrated in FIG. 26.

FIG. 26 is another cross-sectional view taken along line II-II' illustrated in FIG. 4, and FIG. 27 is an enlarged view of a region 'B7' illustrated in FIG. 26. FIGS. 26 and 27 illustrate an embodiment where a trench pattern portion is further provided near a dam pattern in the display apparatus illustrated in FIGS. 1 to 21. In describing FIGS. 26 and 27, elements which are the same or correspond to the elements of FIGS. 1 to 21 are referred to by like reference numerals, and their repetitive descriptions are omitted or will be briefly described below.

Referring to FIGS. 4, 26, and 27, a display apparatus 10 according to the present disclosure may include a trench pattern portion TPP disposed near a dam pattern 105 of a first substrate 100.

The trench pattern portion TPP may be implemented to prevent the penetration of water in a lateral direction of the first substrate 100 to prevent the degradation in a light emitting device ED caused by lateral water penetration. For example, the trench pattern portion TPP may isolate (or disconnect) the light emitting device ED of a light emitting device layer 103 at a periphery of the dam pattern 105. Accordingly, the trench pattern portion TPP may be defined as an isolation area or a disconnection line of the light emitting device ED.

The light emitting device ED of the light emitting device layer 103 may be disposed at a bank 104 and a pixel electrode PE exposed at an emission area EA of each of a plurality of subpixels SP, and moreover, may be disposed on a passivation layer 101d exposed at an edge portion of a first surface 100a of the first substrate 100. Therefore, the light emitting device ED may be degraded or may be reduced in reliability due to the penetration of water through the lateral surface of the first substrate 100. In order to solve such a problem, the trench pattern portion TPP may be implemented to isolate (or disconnect) the light emitting device ED of the light emitting device layer 103 disposed near the dam pattern 105, thereby preventing or minimizing a reduction in reliability of the light emitting device ED caused by lateral water penetration.

The trench pattern portion (or an isolation pattern portion) TPP may be implemented near the dam pattern 105 to include an isolation structure (or a disconnection structure or a cutting structure) for isolating (or disconnecting) the light emitting device ED disposed near the dam pattern 105 or for isolating (or disconnecting) all of the light emitting device ED and the common electrode CE. The isolation structure may include at least one of an eaves structure (or a cliff structure), a tip structure (or a protrusion tip structure), and an undercut structure. Therefore, the common electrode CE and the light emitting device ED disposed near the dam pattern 105 may be isolated (or disconnected) by an isolation structure of the trench pattern portion TPP in the middle of performing a deposition process, without a separate process. The trench pattern portion TPP may be covered by an encapsulation layer 106. The encapsulation layer 106 may directly contact an uppermost surface of a circuit layer 101 in the trench pattern portion TPP, and thus, may surround a lateral surface (or an isolation surface) of each of the isolated light emitting device ED and common electrode CE. For example, the first encapsulation layer 106a of the encapsulation layer 106 may be filled into an isolation space formed by the isolation structure of the trench pattern portion TPP and may seal or completely surround the trench pattern portion TPP, and thus, may completely surround or cover the lateral surface (or the isolation surface) of each of the isolated light emitting device ED and common electrode CE, thereby fundamentally (or completely) preventing lateral water penetration.

The trench pattern portion TPP may be implemented at a passivation layer 101d disposed near the dam pattern 105. For example, the trench pattern portion TPP may include an isolation structure which is implemented by patterning the passivation layer 101d disposed near the dam pattern 105.

The passivation layer 101d according to the present embodiment may include a three-layer structure for implementing the trench pattern portion TPP.

The passivation layer 101d according to an embodiment may include a lower layer LL, a middle layer ML, and an upper layer UL.

The lower layer (or a lower passivation layer) LL may be disposed on the first surface 100a of the first substrate 100 to cover a pixel circuit including a driving TFT. The lower layer LL according to an embodiment may have a first thickness DLL.

The middle layer (or a middle passivation layer) ML may be disposed on the lower layer LL. The middle layer ML according to an embodiment may have a second thickness DML which differs from the first thickness DLL. For example, the middle layer ML may have the second thickness DML which is relatively thinner than the first thickness DLL of the lower layer LL.

The upper layer (or an upper passivation layer) UL may be disposed on the middle layer ML. The upper layer UL according to an embodiment may have a third thickness DUL which differs from the second thickness DML. For example, the upper layer UL may have the third thickness DUL which is relatively thicker than the second thickness DML of the middle layer ML and is the same as or different from the first thickness DLL of the lower layer LL.

Each of the lower layer LL, the middle layer ML, and the upper layer UL may include SiOx, SiNx, SiON, or a multilayer thereof, but is not limited thereto.

For example, the lower layer LL, the middle layer ML, and the upper layer UL may be implemented to have different dangling bonds, so that the trench pattern portion TPP is implemented. The lower layer LL, the middle layer ML, and the upper layer UL may have different dangling bonds of silicon (Si). For example, a dangling bond of the middle layer ML may be less than a dangling bond of each of the lower layer LL and the upper layer UL, and a dangling bond of the lower layer LL may be less than that of the upper layer UL.

As another example, the lower layer LL, the middle layer ML, and the upper layer UL may be implemented to have different densities, so that the trench pattern portion TPP is implemented. The lower layer LL, the middle layer ML, and the upper layer UL may have different densities of Si. For example, a Si density of the middle layer ML may be higher than a Si density of each of the lower layer LL and the upper layer UL, and a Si density of the upper layer UL may be lower than a Si density of the lower layer LL. Therefore, the upper layer UL may be a porous layer, and the middle layer ML may be a dense layer.

The lower layer LL, the middle layer ML, and the upper layer UL of the passivation layer 101d may have different dangling bonds (or densities), and thus, may have different etching speeds in a wet etching process of forming the trench pattern portion TPP. For example, with respect to the same wet etching time, an etching speed of the upper layer UL may be fastest, an etching speed of the middle layer ML may be slowest, and an etching speed of the lower layer LL may be slower than that of the upper layer UL and may be faster than that of the middle layer ML.

The trench pattern portion TPP according to an embodiment may include an inner trench pattern portion TPPa disposed inward from the dam pattern 105 in a first margin area MA1.

The inner trench pattern portion (or a first trench pattern portion) TPPa may be disposed to be adjacent to an inner portion of the dam pattern 105 and may be disposed to be surrounded by the dam pattern 105. That is, the inner trench pattern portion TPPa may be implemented between the dam pattern 105 and an emission area EA of an outermost pixel area PAo to have a closed loop shape (or a closed loop line shape) surrounded by the dam pattern 105. For example, the inner trench pattern portion TPPa may be implemented in a closed loop shape (or a closed loop line shape) along an edge portion of the first substrate 100, and thus, may be implemented to be surrounded by the dam pattern 105 having a closed loop shape (or a closed loop line shape). The inner trench pattern portion TPPa may be implemented at the passivation layer 101d by a wet etching process performed at the passivation layer 101d of a circuit layer 101 disposed in the first margin area MA1, and thus, may isolate (or disconnect) the light emitting device ED of the light emitting device layer 103 or may isolate (or disconnect) the common electrode CE and the light emitting device ED of the light emitting device layer 103.

A width W1 of the inner trench pattern portion TPPa according to an embodiment may be wider than a width of the dam pattern 105. For example, the width W1 of the inner trench pattern portion TPPa may be 20 μm to 60 μm, but is not limited thereto and may be changed based on a width of the first margin area MA1 or may be changed based on a total width of the first margin MA1 and a second margin area MA2.

The inner trench pattern portion TPPa according to an embodiment may include at least two first trench patterns TP1 and at least one first trench structure TS1.

The at least two first trench patterns TP1 may be implemented at the passivation layer 101d of the circuit layer 101 adjacent to the inner portion of the dam pattern 105. For example, the at least two first trench patterns TP1 may be formed or disposed at the passivation layer 101d by the wet etching process performed at the passivation layer 101d of the circuit layer 101.

Each of the at least two first trench patterns TP1 according to an embodiment may include a first hole pattern TPa, a second hole pattern TPb, and a groove pattern TPc.

The first hole pattern TPa may be implemented at the upper layer UL of the passivation layer 101d. The first hole pattern TPa according to an embodiment may be formed to pass through the upper layer UL of the passivation layer 101d through a wet etching process. For example, a cross-sectional surface of the first hole pattern TPa taken along a first direction X may have a ladder shape or a reverse ladder shape, where a top side thereof is wider than a bottom side thereof.

The second hole pattern TPb may be implemented at the middle layer ML of the passivation layer 101d to communicate with the first hole pattern TPa in a thickness direction Z of the first substrate 100. The second hole pattern TPb according to an embodiment may be formed to pass through the middle layer ML of the passivation layer 101d through a wet etching process. For example, a cross-sectional surface of the second hole pattern TPb taken along the first direction X may have a tetragonal shape or a rectangular shape.

A size of the second hole pattern TPb may be less than a bottom surface of the first hole pattern TPa. For example, with respect to the first direction X, a width of the second hole pattern TPb may be narrower than that of a bottom surface of the first hole pattern TPa.

The groove pattern TPc may be implemented at the lower layer LL of the passivation layer 101d to communicate with the second hole pattern TPb in a thickness direction Z of the first substrate 100. The groove pattern TPc may be formed on an interlayer insulation layer 101c to pass through the lower layer LL of the passivation layer 101d through a wet etching process. For example, a cross-sectional surface of the groove pattern TPc taken along the first direction X may have a ladder shape or a reverse ladder shape, where a top side thereof is wider than a bottom side thereof.

A top surface of the groove pattern TPc may have a size which is wider than that of the second hole pattern TPb, and a center portion of the top surface of the groove pattern TPc may be disposed at a center portion of the second hole pattern TPb. Therefore, the second hole pattern TPb may protrude to a center portion of the first trench pattern TP1 with respect to each of the first hole pattern TPa and the groove pattern TPc, and thus, may implement a protrusion tip (or an isolation tip) disposed at an internal middle height of the first trench pattern TP1. Accordingly, the first trench pattern TP1 may isolate (or disconnect) the light emitting device ED of the light emitting device layer 103 through the protrusion tip based on the second hole pattern TPb, or may isolate (or disconnect) all of the light emitting device ED of the light emitting device layer 103 and the common electrode CE.

The at least one first trench structure (or a first trench structure) TS1 may be implemented at the passivation layer 101d of the circuit layer 101 disposed between at least two first trench patterns TP1. That is, the at least one first trench structure TS1 may be formed or disposed at the passivation layer 101d by two first trench patterns TP1.

The at least one first trench structure TS1 according to an embodiment may include a lower trench structure TSa, a middle trench structure TSb, and an upper trench structure TSc.

The lower trench structure TSa may be implemented at the lower layer LL of the passivation layer 101d. The lower trench structure TSa may be implemented by the groove pattern TPc of the first trench pattern TP1. For example, the lower trench structure TSa may be formed or disposed by the lower layer LL of the passivation layer 101d which remains without being removed in a wet etching process of forming the groove pattern TPc of the first trench pattern TP1 at the lower layer LL of the passivation layer 101d disposed in the first margin area MA1.

A lateral surface of the lower trench structure TSa according to an embodiment may be implemented in an inclined structure or a tapered structure. For example, a cross-sectional surface of the lower trench structure TSa taken along the first direction X may have a ladder shape where a top side thereof is narrower than a bottom side thereof.

The middle trench structure TSb may be implemented at the middle layer ML of the passivation layer 101d. The middle trench structure TSb may be implemented by the second hole pattern TPb of the first trench pattern TP1. For example, the middle trench structure TSb may be formed or disposed by the middle layer ML of the passivation layer 101d which remains without being removed in a wet etching process of forming the second hole pattern TPb of the first trench pattern TP1 at the middle layer ML of the passivation layer 101d disposed in the first margin area MA1.

The middle trench structure TSb according to an embodiment may have a plate shape. The middle trench structure TSb may have a width which is wider than that of the lower trench structure TSa, and thus, may cover a bottom surface of the lower trench structure TSa. The middle trench structure TSb may protrude to an inner portion of the first trench pattern TP1 in parallel with the first direction X, and thus, may implement a protrusion tip (or an isolation tip) disposed at an internal middle height of the first trench pattern TP1. For example, with respect to the first direction X, the middle trench structure TSb may have a width which is relatively wider than that of the lower trench structure TSa, and thus, may protrude from a lateral surface of the lower trench structure TSa to the inner portion of the first trench pattern TP1. The protrusion tip of the middle trench structure TSb may be apart from the interlayer insulation layer 101c with the lower trench structure TSa therebetween, with respect to a thickness direction Z of the first substrate 100. The protrusion tip of the middle trench structure TSb may be implemented to isolate (or disconnect) the light emitting device ED of the light emitting device layer 103.

A lateral surface of the lower trench structure TSa may have an undercut structure (or an undercut area) with respect to the middle trench structure TSb. For example, a boundary portion between the lower trench structure TSa and the middle trench structure TSb or an upper lateral surface of the lower trench structure TSa may be under-cut with respect to the middle trench structure TSb. The middle trench structure TSb may protrude toward a center portion of the first trench pattern TP1 with respect to the lateral surface of the lower trench structure TSa on the basis of an undercut structure of the lower trench structure TSa, and thus, may cover a bottom surface of the lower trench structure TSa. Accordingly, the middle trench structure TSb may have an eaves structure with respect to the lower trench structure TSa, or have an undercut area with respect to the lower trench structure TSa.

The lateral surface of the lower trench structure TSa may be covered by the middle trench structure TSb, and thus, may be defined as an undercut area with respect to the middle trench structure TSb. An undercut area (or an undercut structure) disposed between the lateral surface of the lower trench structure TSa and a rear surface of the middle trench structure TSb may be implemented to isolate (or disconnect) the light emitting device ED of the light emitting device layer 103 and the common electrode CE.

The upper trench structure TSc may be implemented at the upper layer UL of the passivation layer 101d. The upper trench structure TSc may be implemented by the first hole pattern TPa of the first trench pattern TP1. For example, the upper trench structure TSc may be formed or disposed by the upper layer UL of the passivation layer 101d which remains without being removed in a wet etching process of forming the first hole pattern TPa of the first trench pattern TP1 at the upper layer UL of the passivation layer 101d disposed in the first margin area MA1.

A lateral surface of the upper trench structure TSc according to an embodiment may be implemented in an inclined structure or a tapered structure. For example, a cross-sectional surface of the upper trench structure TSc taken along the first direction X may have a ladder shape where a top side thereof is narrower than a bottom side thereof.

The inner trench pattern portion TPPa according to an embodiment may further include at least one first bank structure BS1.

The at least one first bank structure BS1 may be implemented on the at least one first trench structure TS1. The at least one first bank structure BS1 may be formed or disposed on the upper trench structure TSc of the at least one first trench structure TS1. The at least one first bank structure BS1 may be formed of the same material along with the bank 104. Also, the at least one first bank structure BS1 may be implemented to have the same height (or thickness) as that of the bank 104.

In the at least one first trench structure TS1, a lateral surface of the upper trench structure TSc may have an undercut structure with respect to the first bank structure BS1. For example, a boundary portion between the first bank structure BS1 and the upper trench structure TSc or an upper lateral surface of the upper trench structure TSc may be under-cut with respect to the first bank structure BS1. The first bank structure BS1 may protrude toward the center portion of the first trench pattern TP1 with respect to the lateral surface of the upper trench structure TSc on the basis of an undercut structure of the upper trench structure TSc, and thus, may cover a bottom surface of the upper trench structure TSc. Accordingly, the first bank structure BS1 may have an eaves structure with respect to the upper trench structure TSc. For example, the first bank structure BS1 may be defined as a first eaves structure.

In the at least one first trench structure TS1, the lateral surface of the upper trench structure TSc may be covered by the first bank structure BS1, and thus, may be defined as an undercut area with respect to the first bank structure BS1. An undercut area (or an undercut structure) disposed between the lateral surface of the upper trench structure TSc and a rear surface of the first bank structure BS1 may be implemented to isolate (or disconnect) the light emitting device ED of the light emitting device layer 103 and the common electrode CE.

The inner trench pattern portion TPPa according to an embodiment may include a plurality of first trench structures TS1.

In each of the plurality of first trench structures TS1, a width (or an interval) W2 between adjacent middle trench structures TSb may be greater than a total thickness of the light emitting device ED of the light emitting device layer 103 and the common electrode CE, for isolating (or disconnecting) the light emitting device ED of the light emitting device layer 103 and the common electrode CE. That is, when the width (or the interval) W2 between adjacent middle trench structures TSb is less than the total thickness of the light emitting device ED and the common electrode CE, common electrodes CE disposed at protrusion tips of the adjacent middle trench structures TSb may be electrically connected to each other, and due to this, the common electrode CE may not be isolated (or disconnected) by the middle trench structure TSb or the first trench pattern TP1. On the other hand, when the width (or the interval) W2 between adjacent middle trench structures TSb is greater than the total thickness of the light emitting device ED and the common electrode CE, the common electrode CE disposed at the protrusion tip of each of the adjacent middle trench structures TSb may be isolated (or disconnected) by the middle trench structure TSb or the first trench pattern TP1.

In each of the plurality of first trench structures TS1, a height of the lower trench structure TSa may be greater than the total thickness of the light emitting device ED and the common electrode CE. That is, when the height of the lower trench structure TSa is less than the total thickness of the light emitting device ED and the common electrode CE, the common electrode CE disposed at the protrusion tip of each of the adjacent middle trench structures TSb may be electrically connected to the common electrode CE disposed on a bottom surface of the first trench pattern TP1, and thus, the common electrode CE may not be isolated (or disconnected) by the middle trench structure TSb or the first trench pattern TP1. On the other hand, when the height of the lower trench structure TSa is greater than the total thickness of the light emitting device ED and the common electrode CE, the common electrode CE disposed at the protrusion tip of each of the adjacent middle trench structures TSb and the common electrode CE disposed on the bottom surface of the first trench pattern TP1 may be isolated (or disconnected) by the middle trench structure TSb or the first trench pattern TP1.

Moreover, in each of the plurality of first trench structures TS1, like the lower trench structure TSa, a height of the upper trench structure TSc is greater than the total thickness of the light emitting device ED and the common electrode CE, for isolating (or disconnecting) the light emitting device ED and the common electrode CE.

The inner trench pattern portion TPPa may include a protrusion tip which is implemented at the at least one first trench structure TS1, and thus, may isolate (or disconnect) the light emitting device ED of the light emitting device layer 103. Also, the inner trench pattern portion TPPa may include an eaves structure or an undercut area (or an undercut structure) implemented at the at least one first trench structure TS1, and thus, may isolate (or disconnect) the light emitting device ED of the light emitting device layer 103 and the common electrode CE. Also, the inner trench pattern portion TPPa may further include an eaves structure which is implemented at the first bank structure BS1, and thus, may additionally isolate (or disconnect) the light emitting device ED of the light emitting device layer 103 and the common electrode CE.

The trench pattern portion TPP according to an embodiment may further include an outer trench pattern portion TPPb disposed outward from the dam pattern 105 in the second margin area MA2.

The outer trench pattern portion (or a second trench pattern portion) TPPb may be disposed to be adjacent to an outer portion of the dam pattern 105 and may be disposed to surround the dam pattern 105. That is, the outer trench pattern portion TPPb may be implemented between the dam pattern 105 and an outer surface OS of the first substrate 100 to have a closed loop shape (or a closed loop line shape) surrounding the dam pattern 105. For example, the outer trench pattern portion TPPb may be implemented in a closed loop shape (or a closed loop line shape) along an edge portion of the first substrate 100, and thus, may be implemented to surround the dam pattern 105 having a closed loop shape (or a closed loop line shape). The outer trench pattern portion TPPb may be implemented at the passivation layer 101d by a wet etching process performed at the passivation layer 101d of the circuit layer 101 disposed in the second margin area MA2, and thus, may isolate (or disconnect) the light emitting device ED of the light emitting device layer 103 or may isolate (or disconnect) the common electrode CE and the light emitting device ED of the light emitting device layer 103.

The outer trench pattern portion TPPb according to an embodiment may include at least two second trench patterns TP2 and at least one second trench structure TS2.

Except for that the at least two second trench patterns TP2 are disposed adjacent to the outer portion of the dam pattern 105, the at least two second trench patterns TP2 may include a first hole pattern TPa, a second hole pattern TPb, and a groove pattern TPc which are implemented to be substantially identical to the at least two first trench patterns TP1 of the inner trench pattern portion TPPa, and thus, their repetitive descriptions are omitted.

Except for that the at least one second trench structure TS2 is implemented by the at least two second trench patterns TP2, the at least one second trench structure TS2 may include a lower trench structure TSa, a middle trench structure TSb, and an upper trench structure TSc which are implemented to be substantially identical to the at least one first trench structure TS1 of the inner trench pattern portion TPPa, and thus, its repetitive description is omitted. The at least one second trench structure TS2 may include a protrusion tip implemented at the middle trench structure TSb, an undercut area (or an undercut structure) implemented between a lateral surface of the lower trench structure TSa and a rear surface of the middle trench structure TSb, and an eaves structure of the middle trench structure TSb.

The outer trench pattern portion TPPb according to an embodiment may further include at least one second bank structure BS2.

Except for that the at least one second bank structure BS2 is implemented on the at least one second trench structure TS2, the at least one second bank structure BS2 may be implemented to be substantially identical to the at least one first bank structure BS1 of the inner trench pattern portion TPPa, and thus, its repetitive description is omitted. The at least one second bank structure BS2 may include an eaves structure implemented based on the second trench structure TS2. For example, the second bank structure BS2 may be defined as a second eaves structure.

The outer trench pattern portion TPPb may include a protrusion tip which is implemented at the at least one second trench structure TS2, and thus, may isolate (or disconnect) the light emitting device ED of the light emitting device layer 103. Also, the outer trench pattern portion TPPb may include an eaves structure or an undercut area (or an undercut structure) implemented at the at least one second trench structure TS2, and thus, may isolate (or disconnect) the light emitting device ED of the light emitting device layer 103 and the common electrode CE. Also, the outer trench pattern portion TPPb may further include an eaves structure which is implemented at the second bank structure BS2, and thus, may additionally isolate (or disconnect) the light emitting device ED of the light emitting device layer 103 and the common electrode CE.

The trench pattern portion TPP according to the present embodiment may be implemented by a patterning process performed on the bank 104.

The trench pattern portion TPP according to an embodiment may be implemented by a wet etching process using a mask pattern disposed on a bank material covering the passivation layer 101d where each of the at least one first trench structure TS1 of the inner trench pattern portion TPPa and the at least one second trench structure TS2 of the outer trench pattern portion TPPb is to be implemented.

Each of the at least one first bank structure BS1 of the inner trench pattern portion TPPa and the at least one second bank structure BS2 of the outer trench pattern portion TPPb may be implemented by a bank material removed by a wet etching process.

Also, each of the at least one first trench structure TS1 of the inner trench pattern portion TPPa and the at least one second trench structure TS2 of the outer trench pattern portion TPPb may be implemented by the passivation layer 101d selectively removed by a wet etching process.

The lower layer LL, the middle layer ML, and the upper layer UL of the passivation layer 101d may have different dangling bonds (or densities), and thus, may have different etching speeds with respect to the same wet etching time. When a wet etching process is performed on the passivation layer 101d, the upper layer UL may be patterned to have an undercut structure with respect to the bank structures BS1 and BS2 on the basis of a fastest etching speed, the lower layer LL may have a faster etching speed than that of the middle layer ML and thus may be patterned to have an undercut structure with respect to the middle layer ML, and the middle layer ML may have a slower etching speed than that of each of the upper layer UL and the lower layer LL and thus may protrude based on the undercut structure of the lower layer LL.

For example, when a wet etching process is performed on the passivation layer 101d and the bank material stacked on the first and second margin areas MA1 and MA2 of the first substrate 100, the bank structures BS1 and BS2 may be implemented by the bank material which is not etched, and the trench structures TS1 and TS2, including the lower trench structure TSa, the middle trench structure TSb, and the upper trench structure TSc may be implemented by the lower layer LL, the middle layer ML, and the upper layer UL of the passivation layer 101d which are not etched, may be implemented. In this case, an undercut structure (or an undercut area) may be implemented in each of the upper trench structure TSc and the lower trench structure TSa of the trench structures TS1 and TS2 on the basis of different etching speeds, and a protrusion tip may be implemented at the middle trench structure TSb of the trench structures TS1 and TS2.

Optionally, in the trench pattern portion TPP according to an embodiment, each of the inner trench pattern portion TPPa and the outer trench pattern portion TPPb may further include a dummy pixel electrode pattern disposed between the trench structures TS1 and TS2 and the bank structures BS1 and BS2. The dummy pixel electrode pattern may be formed of the same material along with the pixel electrode PE disposed in the emission area EA of the pixel P. That is, the dummy pixel electrode pattern may not be removed in a process of patterning a pixel electrode material and may remain in an island shape on the passivation layer 101d where the trench structures TS1 and TS2 are to be implemented, and thus, may be disposed between the trench structures TS1 and TS2 and the bank structures BS1 and BS2.

Additionally, in the trench pattern portion TPP according to an embodiment, each of the inner trench pattern portion TPPa and the outer trench pattern portion TPPb may further include an island-shaped planarization layer 102 disposed between the trench structures TS1 and TS2 and the bank structures BS1 and BS2 or disposed between the dummy pixel electrode pattern and the trench structures TS1 and TS2. The planarization layer 102 may be formed of the same material along with the dam pattern 105 and may have the same height (or thickness) as that of the dam pattern 105 or may have the same height (or thickness) as that of the planarization layer 102 overlapping the emission area EA of the pixel P.

In the display apparatus 10 according to the present embodiment, the light emitting device ED of the light emitting device layer 103 formed (or deposited) on the trench pattern portion TPP may be isolated (or disconnected) by the trench pattern portion TPP once or more. For example, the trench pattern portion TPP may include at least one light emitting device isolation portion where the light emitting device ED is isolated (or disconnected).

According to an embodiment, a depositing material EDm of the light emitting device ED may have linearity, and thus, may be deposited on only a top surface and a lateral surface of each of the bank structures BS1 and BS2 disposed in the trench pattern portion TPP, a top surface of the protrusion tip of the middle trench structure TSb uncovered by the bank structures BS1 and BS2, and a bottom surface of each of the trench patterns TP1 and TP2 and may not be deposited on a lateral surface of each of the lower trench structure TSa, the middle trench structure TSb, and the upper trench structure TSc covered by the bank structures BS1 and BS2. Therefore, the light emitting device ED formed (or deposited) on the trench pattern portion TPP may be isolated (or disconnected) between the bank structures BS1 and BS2 and the upper trench structure TSc, and moreover, may be isolated (or disconnected) between the lower trench structure TSa and the middle trench structure TSb. Accordingly, the light emitting device ED disposed in the first and second margin areas MA1 and MA2 may be automatically isolated (or disconnected) by the trench pattern portion TPP in a deposition process. Accordingly, in the display apparatus 10 according to the present embodiment, the light emitting device ED may be isolated (or disconnected) by only a deposition process performed on the light emitting device, even without a separate patterning process of isolating (or disconnecting) the light emitting device ED disposed in the first and second margin areas MA1 and MA2.

In the display apparatus 10 according to the present embodiment, the common electrode CE of the light emitting device layer 103 formed (or deposited) on the trench pattern portion TPP may be isolated (or disconnected) by the trench pattern portion TPP once or more. For example, the trench pattern portion TPP may include at least one common electrode isolation portion where the common electrode CE is isolated (or disconnected).

According to an embodiment, a common electrode material CEm of the light emitting device ED may be deposited on only the top surface and the lateral surface of each of the bank structures BS1 and BS2, a portion of an undercut area of the upper trench structure TSc, the top surface and the lateral surface of the protrusion tip of the middle trench structure TSb, and the bottom surface of each of the trench patterns TP1 and TP2, and thus, may cover the light emitting device ED which has been disposed at the trench pattern portion TPP. In this case, the common electrode material CEm may not be deposited on the lateral surface of each of the lower trench structure TSa and the upper trench structure TSc covered by the bank structures BS1 and BS2. Therefore, like the light emitting device ED, the common electrode CE or the common electrode material CEm formed (or deposited) on the trench pattern portion TPP may be isolated (or disconnected) between the bank structures BS1 and BS2 and the upper trench structure TSc, and moreover, may be isolated (or disconnected) between the lower trench structure TSa and the middle trench structure TSb. Accordingly, the common electrode CE disposed in the first and second margin areas MA1 and MA2 may be automatically isolated (or disconnected) by the trench pattern portion TPP in a deposition process. Accordingly, in the display apparatus 10 according to the present embodiment, the common electrode CE may be isolated (or disconnected) by only a deposition process performed on the common electrode CE, even without a separate patterning process of isolating (or disconnecting) the common electrode CE disposed in the first and second margin areas MA1 and MA2. Also, the common electrode CE disposed in the first and second margin areas MA1 and MA2 may surround an isolation surface of the light emitting device ED in the trench pattern portion TPP, and thus, may prevent lateral water penetration through a boundary portion between the interlayer insulation layer 101c and the light emitting device ED, thereby preventing a reduction in reliability of the light emitting device ED caused by the lateral water penetration.

In the display apparatus 10 according to the present embodiment, a first encapsulation layer 106a of an encapsulation layer 106 disposed in the first and second margin areas MA1 and MA2 of the first substrate 100 may be implemented to surround the inner trench pattern portion TPPa and the outer trench pattern portion TPPb of the trench pattern portion TPP and the dam pattern 105. For example, the first encapsulation layer 106a may cover the trench pattern portion TPP, and thus, may not be isolated (or disconnected) by the trench pattern portion TPP. For example, the first encapsulation layer 106a may be filled into the trench patterns TP1 and TP2 of the trench pattern portion TPP, and moreover, may be implemented to surround the trench structures TS1 and TS2 and the bank structures BS1 and BS2.

In the first margin area MA1 of the first substrate 100, a second encapsulation layer 106b of the encapsulation layer 106 may be implemented to cover the first encapsulation layer 106a covering the inner trench pattern portion TPPa of the trench pattern portion TPP and an inner surface of the dam pattern 105.

In the first and second margin areas MA1 and MA2 of the first substrate 100, a third encapsulation layer 106c of the encapsulation layer 106 may be implemented to cover the first encapsulation layer 106a, covering the inner trench pattern portion TPPa of the trench pattern portion TPP and an outer surface of the dam pattern 105, and the second encapsulation layer 106b. The inner trench pattern portion TPPa may be disposed to overlap the first to third encapsulation layers 106a, 106b and 106c. The outer trench pattern portion TPPb may be disposed to overlap the first and second encapsulation layers 106a and 106b.

Because the display apparatus 10 according to some embodiments includes the trench pattern portion TPP, a total width of the first margin area MA1 and the second margin area MA2 disposed at an edge portion of the first surface 100a of the first substrate 100 may decrease to 350 μm or less, and in this case, the display apparatus 10 may realize a resolution which is higher than that of a display apparatus including no trench pattern portion TPP.

For example, when half of a first interval (or a pixel pitch) D1 between two adjacent pixel areas PA is 350 μm within the process error range, a total width (or a shortest distance between an outer surface of the first substrate and an end of an emission area EA of an outermost pixel) of the first margin area MA1 and the second margin area MA2 may be implemented to be 320 μm or less, based on a shadow margin based on a shadow area of the light emitting device ED and an encapsulation margin based on securing the reliability of the light emitting device ED against water. In this case, a second interval D2 between an outermost outer surface VL of the first substrate 100 and a center portion of an outermost pixel including a first pad part 110 may be implemented to be 350 μm within the process error range. Here, the outermost outer surface VL of the first substrate 100 may be an outermost outer surface of an edge coating layer 403 covering a routing portion 400.

The first margin area MA1 and the second margin area MA2 may have the same width or different widths. For example, with respect to the first direction X, the first margin area MA1 may be implemented to have a width of 200 μm or less, and the second margin area MA2 may be implemented to have a width of 120 μm or less. Also, a pad margin area (or a lateral routing area) included in the second margin area MA2 may be implemented to have a width of 100 μm or less with respect to the first direction X.

Optionally, the trench pattern portion TPP according to the present embodiment may implement the common power contact portion and the secondary power contact portion illustrated in FIG. 20 or 21. That is, the trench pattern portion TPP according to the present embodiment may be disposed on each of a contact line CPLc and a secondary contact line SPLc illustrated in FIG. 20 or 21, and thus, may electrically connect each of a pixel common power line CPL and a secondary power line SPL to the common electrode CE. For example, the trench patterns TP1 and TP2 of the trench pattern portion TPP may be implemented so that each of the contact line CPLc and the secondary contact line SPLc illustrated in FIG. 20 or 21 is exposed, and the common electrode CE may be electrically connected to each of the contact line CPLc and the secondary contact line SPLc exposed by the trench patterns TP1 and TP2 in a deposition process. That is, in a deposition process performed on the common electrode CE, the common electrode material CEm deposited on the trench pattern portion TPP may be isolated (or disconnected) by the trench structures TS1 and TS2 but may be deposited on a top surface of each of the contact line CPLc and the secondary contact line SPLc through the trench patterns TP1 and TP2 disposed at both edge portions of the trench pattern portion TPP, and thus, the common electrode CE may be electrically connected to each of the contact line CPLc and the secondary contact line SPLc through the trench patterns TP1 and TP2 disposed at the both edge portions of the trench pattern portion TPP. Accordingly, each of the common power contact portion and the secondary power contact portion illustrated in FIG. 20 or 21 may be changed to the trench pattern portion TPP.

Figure 28:
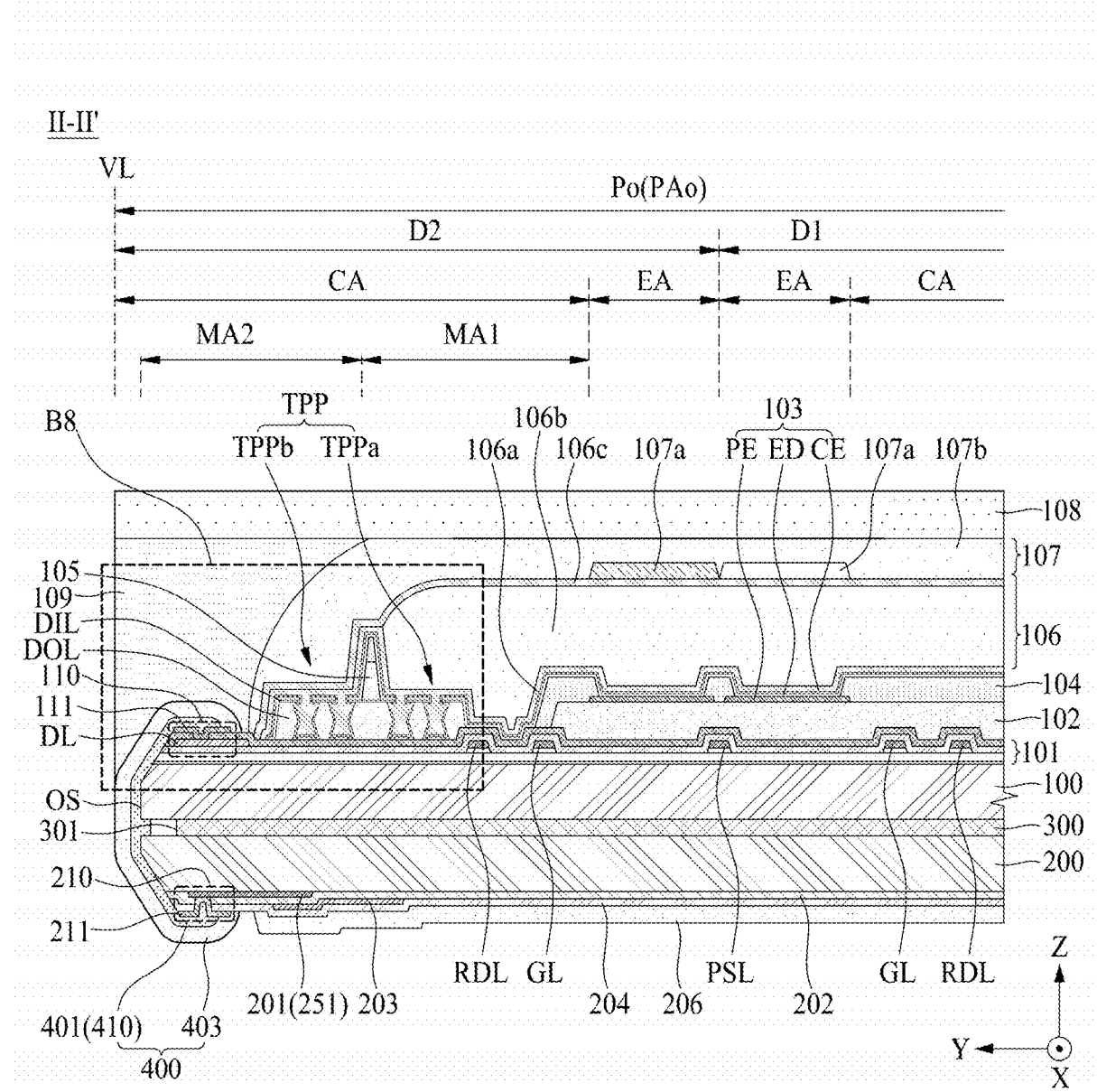
FIG. 28 is another cross-sectional view taken along line II-II' illustrated in FIG. 4.
Figure 29:
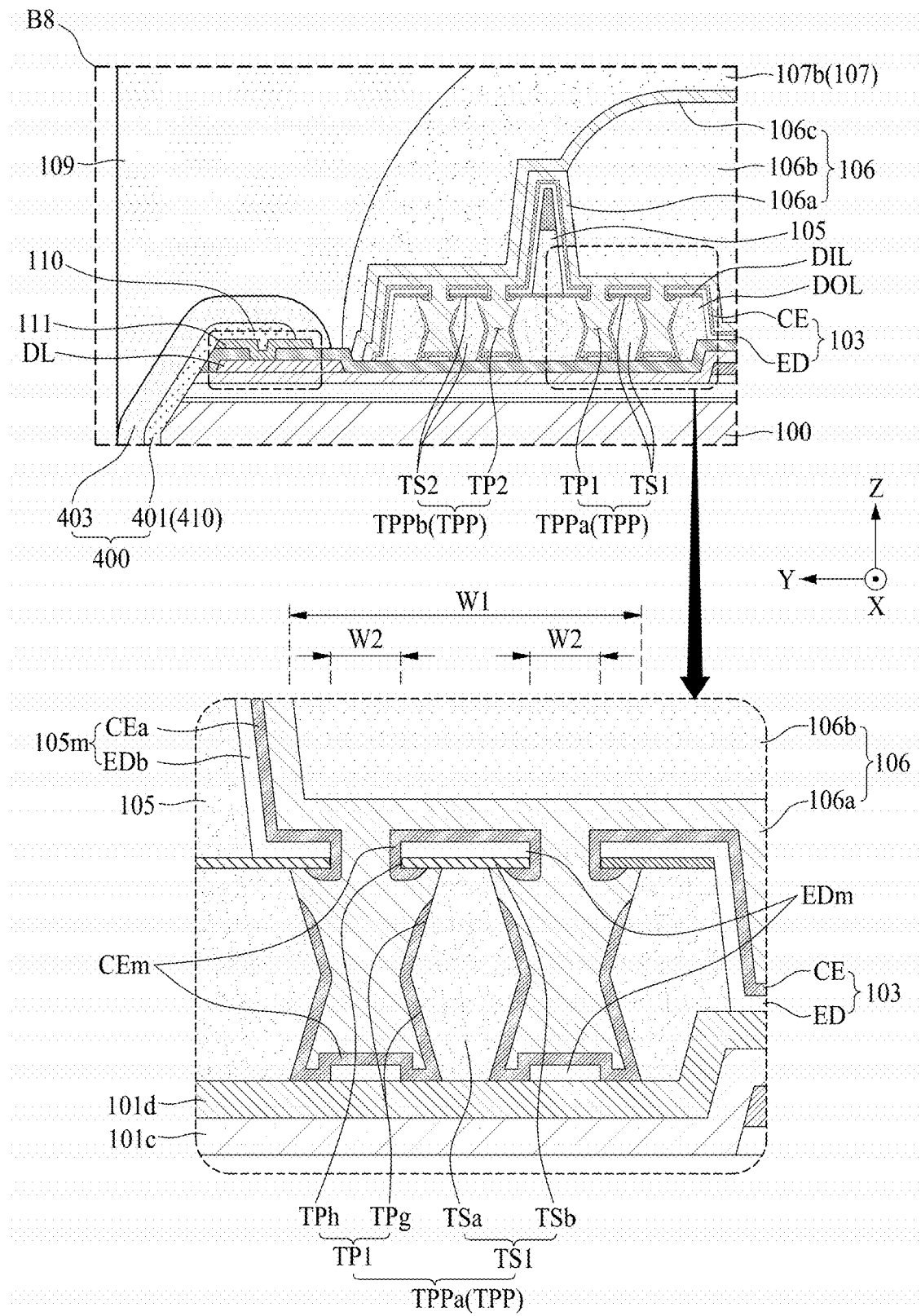
FIG. 29 is an enlarged view of a region 'B8' illustrated in FIG. 28.

FIG. 28 is another cross-sectional view taken along line II-II' illustrated in FIG. 4, and FIG. 29 is an enlarged view of a region 'B8' illustrated in FIG. 28. FIGS. 28 and 29 illustrate an embodiment where a trench pattern portion is further provided near a dam pattern in the display apparatus illustrated in FIGS. 1 to 21. In describing FIGS. 28 and 29, elements which are the same or correspond to the elements of FIGS. 1 to 21 are referred to by like reference numerals, and their repetitive descriptions are omitted or will be briefly described below.

Referring to FIGS. 4, 28, and 29, a display apparatus 10 according to the present disclosure may include a trench pattern portion TPP disposed near a dam pattern 105 of a first substrate 100.

The trench pattern portion TPP may be implemented to prevent the penetration of water through a lateral surface of the first substrate 100 to prevent the degradation in a light emitting device ED of a light emitting device layer 103 caused by lateral water penetration. For example, the trench pattern portion TPP may isolate (or disconnect) the light emitting device ED at a periphery of the dam pattern 105. Accordingly, the trench pattern portion TPP may be defined as an isolation area or a disconnection line of the light emitting device ED.

The light emitting device ED of the light emitting device layer 103 may be disposed at a bank 104 and a pixel electrode PE exposed at an emission area EA of each of a plurality of subpixels SP, and moreover, may be disposed on a passivation layer 101d exposed at an edge portion of a first surface 100a of the first substrate 100. Therefore, the light emitting device ED may be degraded or may be reduced in reliability due to the penetration of water through the lateral surface of the first substrate 100. In order to solve such a problem, the trench pattern portion TPP may isolate (or disconnect) the light emitting device ED of the light emitting device layer 103 disposed near the dam pattern 105, thereby preventing or minimizing a reduction in reliability of the light emitting device ED caused by lateral water penetration.

The trench pattern portion (or an isolation pattern portion) TPP may be implemented near the dam pattern 105 to include an isolation structure (or a disconnection structure or a cutting structure) for isolating (or disconnecting) the light emitting device ED disposed near the dam pattern 105 or for isolating (or disconnecting) all of the light emitting device ED and the common electrode CE. The isolation structure according to an embodiment may include at least one of an eaves structure (or a cliff structure) and an undercut structure. Therefore, the common electrode CE and the light emitting device ED disposed near the dam pattern 105 may be isolated (or disconnected) by an isolation structure of the trench pattern portion TPP in the middle of performing a deposition process, without a separate process. The trench pattern portion TPP may be covered by an encapsulation layer 106. The encapsulation layer 106 may directly contact an uppermost surface of a circuit layer 101 in the trench pattern portion TPP, and thus, may surround a lateral surface (or an isolation surface) of each of the isolated light emitting device ED and common electrode CE. For example, the encapsulation layer 106 may be filled into an isolation space formed by the isolation structure of the trench pattern portion TPP and may seal or completely surround the trench pattern portion TPP, and thus, may completely surround or cover the lateral surface (or the isolation surface) of each of the isolated light emitting device ED and common electrode CE, thereby fundamentally (or completely) preventing lateral water penetration.

The trench pattern portion TPP may be implemented in a trench pattern layer along an edge portion of the first surface 100a of the first substrate 100. The trench pattern layer may be disposed on a passivation layer 101d disposed at the edge portion of the first surface 100a of the first substrate 100. The trench pattern portion TPP may include an isolation structure which is implemented by patterning the trench pattern layer disposed near the dam pattern 105. For example, the trench pattern portion TPP may include a lower structure (or an undercut structure) having an undercut structure and an upper structure (or an eaves structure) which is disposed on the lower structure and has an eaves structure with respect to the lower structure.

The display apparatus 10 according to the present embodiment may further include a trench pattern layer for implementing the trench pattern portion TPP. The trench pattern layer may include a first dummy material layer (or a lower material layer) and a second dummy material layer (or an upper material layer). The first dummy material layer may be formed of the same material along with a planarization layer 102 disposed under the light emitting device layer 103. The second dummy material layer may include a material which differs from that of the first dummy material layer. The second dummy material layer may have a slower etching speed than the first dummy material layer in an etching process. For example, based on a material, the first dummy material layer may be a dummy organic material layer DOL including an organic material, and the second dummy material layer may be a dummy inorganic material layer DIL including an inorganic material.

The trench pattern layer according to an embodiment may further include a dummy organic material layer DOL and a dummy inorganic material layer DIL. The dummy organic material layer DOL and the dummy inorganic material layer DIL may be disposed in first and second margin areas MA1 and MA2 (or the trench pattern portion TPP) defined at an edge portion of the first surface 100a of the first substrate 100. For example, the dummy organic material layer DOL may be defined as a first dummy material layer or a lower material layer, and the dummy inorganic material layer DIL may be defined as a second dummy material layer or an upper material layer.

The dummy organic material layer DOL may be implemented in the first and second margin areas MA1 and MA2 defined at the edge portion of the first surface 100a of the first substrate 100 and may be formed of the same material along with the planarization layer 102 which is disposed under the light emitting device layer 103 to cover a circuit layer 101. For example, the dummy organic material layer DOL may be implemented as a portion which remains in an island shape in the first and second margin areas MA1 and MA2 without being removed in a patterning process of forming a contact hole for electrically connecting the pixel electrode PE to a driving TFT in the planarization layer 102 covering all of the circuit layer 101 disposed on the first substrate 100.

The dummy inorganic material layer DIL may be implemented on the dummy organic material layer DOL to have a relatively thin thickness. The dummy inorganic material layer DIL according to an embodiment may include SiOx, SiNx, or SiON. For example, the dummy inorganic material layer DIL may be formed or disposed on the planarization layer 102 including a contact hole after the patterning process of forming the contact hole for electrically connecting the pixel electrode PE to the driving TFT. Also, a portion other than the dummy inorganic material layer DIL disposed in the first and second margin areas MA1 and MA2 may be removed by the patterning process, and in the patterning process, the dummy inorganic material layer DIL disposed in the first and second margin areas MA1 and MA2 may be partially removed for implementing the trench pattern portion TPP.

The trench pattern portion TPP according to an embodiment may include an inner trench pattern portion TPPa disposed inward from the dam pattern 105 in the first margin area MA1.

The inner trench pattern portion (or a first trench pattern portion) TPPa may be disposed to be adjacent to an inner portion of the dam pattern 105 and may be disposed to be surrounded by the dam pattern 105. That is, the inner trench pattern portion TPPa may be implemented between the dam pattern 105 and an emission area EA of an outermost pixel area PAo to have a closed loop shape (or a closed loop shape) surrounded by the dam pattern 105. For example, the inner trench pattern portion TPPa may be implemented in a closed loop shape (or a closed loop shape) along an edge portion of the first substrate 100, and thus, may be implemented to be surrounded by the dam pattern 105 having a closed loop shape (or a closed loop shape). The inner trench pattern portion TPPa may isolate (or disconnect) the light emitting device ED of the light emitting device layer 103 or may isolate (or disconnect) all of the common electrode CE and the light emitting device ED of the light emitting device layer 103, at a portion inward from the dam pattern 105.

A width W1 of the inner trench pattern portion TPPa according to an embodiment may be wider than a width of the dam pattern 105. For example, the width W1 of the inner trench pattern portion TPPa may be 20 μm to 60 μm, but is not limited thereto and may be changed based on a width of the first margin area MA1 or may be changed based on a total width of the first margin MA1 and a second margin area MA2.

The inner trench pattern portion TPPa according to an embodiment may include at least two first trench patterns TP1 and at least one first trench structure TS1.

The at least two first trench patterns TP1 may be implemented at the dummy inorganic material layer DIL and the dummy organic material layer DOL adjacent to an inner portion of the dam pattern 105. For example, the at least two first trench patterns TP1 may be implemented by a dry etching process performed on the dummy inorganic material layer DIL and the dummy organic material layer DOL.

Each of the at least two first trench patterns TP1 according to an embodiment may include a hole pattern TPh and a groove pattern TPg.

The hole pattern TPh may be implemented at the dummy inorganic material layer DIL. The hole pattern TPh according to an embodiment may be formed to pass through the dummy inorganic material layer DIL through a patterning process performed at the dummy inorganic material layer DIL. For example, a cross-sectional surface of the hole pattern TPh taken along the first direction X may have a tetragonal shape or a rectangular shape.

A width (or a size) W2 of the hole pattern TPh may be greater than a total thickness of the light emitting device ED of the light emitting device layer 103 and the common electrode CE, for isolating (or disconnecting) the light emitting device ED of the light emitting device layer 103 and the common electrode CE. That is, when the width W2 of the hole pattern TPh is less than the total thickness of the light emitting device ED and the common electrode CE, common electrodes CE disposed on a top surface and a lateral surface of the hole pattern TPh may be electrically connected to each other, and due to this, the common electrode CE may not be isolated (or disconnected) by the hole pattern TPh. On the other hand, when the width W2 of the hole pattern TPh is greater than the total thickness of the light emitting device ED and the common electrode CE, the common electrode CE disposed on each of the top surface and the lateral surface of the hole pattern TPh may be isolated (or disconnected) by the hole pattern TPh.

The groove pattern TPg may be implemented at the dummy organic material layer DOL to communicate with the hole pattern TPh in a thickness direction Z of the first substrate 100. The groove pattern TPg may be formed to pass through the dummy organic material layer DOL through a dry etching process performed at least twice.

The groove pattern TPg according to an embodiment may include an upper portion directly communicating with the dummy inorganic material layer DIL, a lower portion directly exposing the passivation layer 101d, and a center portion between the upper portion and the lower portion. The center portion of the groove pattern TPg may have a width which is wider or narrower than the upper portion and the lower portion. Therefore, a cross-sectional surface of the groove pattern TPg taken along the first direction X may have a structure where the center portion protrudes or is recessed with respect to the upper portion and the lower portion. For example, the cross-sectional surface of the groove pattern TPg taken along the first direction X may have a cross-sectional structure having a ")"-shape, a "⟨"-shape, a "("-shape, or a "⟩"-shape.

An upper portion of the groove pattern TPg may have a size which is wider than that of the hole pattern TPh, and a center portion of the upper portion of the groove pattern TPg may be disposed at a center portion of the hole pattern TPh. Therefore, the hole pattern TPh may protrude to a center portion of the first trench pattern TP1 with respect to the groove pattern TPg, and thus, may implement a protrusion tip (or an isolation tip) disposed at an uppermost height of the first trench pattern TP1. Accordingly, the first trench pattern TP1 may isolate (or disconnect) the light emitting device ED of the light emitting device layer 103 through the protrusion tip based on the hole pattern TPh, or may isolate (or disconnect) all of the light emitting device ED of the light emitting device layer 103 and the common electrode CE.

The at least one first trench structure (or a first trench structure) TS1 may be implemented at the dummy organic material layer DOL disposed between at least two first trench patterns TP1. That is, the at least one first trench structure TS1 may be formed or disposed at the dummy organic material layer DOL by two first trench patterns TP1.

The at least one first trench structure TS1 according to an embodiment may include a lower trench structure TSa and an upper trench structure TSb.

The lower trench structure TSa may be implemented at the dummy organic material layer DOL. The lower trench structure TSa may be implemented by the groove pattern TPg of the first trench pattern TP1. For example, the lower trench structure TSa may be formed or disposed by the dummy organic material layer DOL which remains without being removed in at least two-time dry etching process of forming the groove pattern TPg of the first trench pattern TP1 at the dummy organic material layer DOL disposed in the first margin area MA1.

The lower trench structure TSa according to an embodiment may include a top surface directly contacting the dummy inorganic material layer DIL, a bottom surface directly contacting the passivation layer 101d, and a center portion between the top surface and the bottom surface.

In the lower trench structure TSa, an upper surface between the top surface and the center portion may be implemented in an inclined structure or a tapered structure. For example, the upper surface of the lower trench structure TSa taken along the first direction X may have a cross-sectional structure having a ladder shape where a top side thereof is narrower than a bottom side thereof.

In the lower trench structure TSa, a lower surface between the bottom surface and the center portion may be implemented in an inclined structure or a tapered structure. For example, the lower surface of the lower trench structure TSa taken along the first direction X may have a cross-sectional structure having a ladder shape where a top side thereof is wider than a bottom side thereof.

The center portion of the lower trench structure TSa may have a width (or a size) which is wider or narrower than that of each of the top surface and the bottom surface thereof.

The upper trench structure TSb may be implemented at the dummy inorganic material layer DIL. The upper trench structure TSb may be implemented by the hole pattern TPh of the first trench pattern TP1. For example, the upper trench structure TSb may be formed or disposed by the dummy inorganic material layer DIL which remains without being removed in a patterning process performed on the dummy inorganic material layer DIL disposed in the first margin area MA1 or a dry etching process of forming the hole pattern TPh of the first trench pattern TP1 at the dummy inorganic material layer DIL disposed in the first margin area MA1.

The upper trench structure TSb according to an embodiment may have a plate shape. The upper trench structure TSb may have a width which is wider than that of the lower trench structure TSa, and thus, may cover a bottom surface of the lower trench structure TSa. The upper trench structure TSb may protrude to an inner portion of the first trench pattern TP1 in parallel with the first direction X, and thus, may implement a protrusion tip (or an isolation tip) disposed at an uppermost height of the first trench pattern TP1. For example, with respect to the first direction X, the upper trench structure TSb may have a width which is relatively wider than that of the lower trench structure TSa, and thus, may protrude to the inner portion of the first trench pattern TP1. The protrusion tip of the upper trench structure TSb may be apart from the passivation layer 101d with the lower trench structure TSa therebetween, with respect to a thickness direction Z of the first substrate 100. The protrusion tip of the upper trench structure TSb may be implemented to isolate (or disconnect) the light emitting device ED of the light emitting device layer 103.

The upper trench structure TSb according to an embodiment may be implemented by a patterning process performed on the dummy inorganic material layer DIL formed on the planarization layer 102 including a contact hole after a patterning process of forming a contact hole, which electrically connects the pixel electrode PE to a driving TFT, in the planarization layer 102. For example, the upper trench structure TSb may be implemented by a dry etching process performed on the dummy inorganic material layer DIL.

Figure 30:
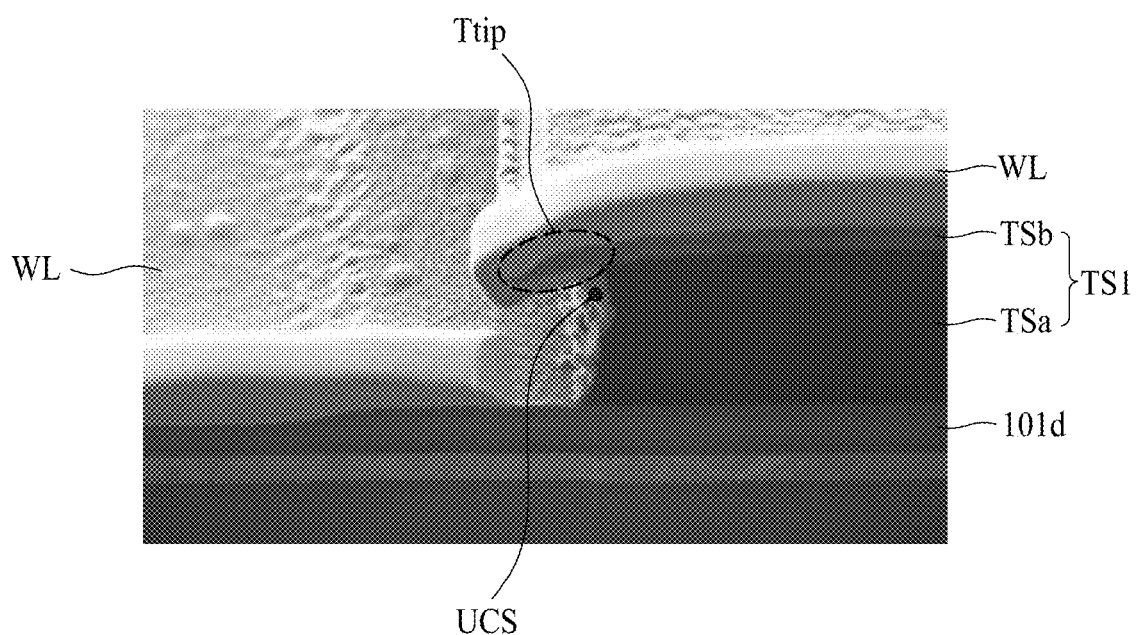
FIG. 30 is a microscope photograph showing a cross-sectional surface of a lower trench structure illustrated in FIG. 29.

A lateral surface of the lower trench structure TSa, as illustrated in FIG. 30, may have an undercut structure UCS with respect to the upper trench structure TSb. For example, a boundary portion between the lower trench structure TSa and the upper trench structure TSb or an upper lateral surface of the lower trench structure TSa may be under-cut with respect to the upper trench structure TSb. The upper trench structure TSb may protrude toward a center portion of the first trench pattern TP1 with respect to the lateral surface of the lower trench structure TSa on the basis of an undercut structure UCS of the lower trench structure TSa, and thus, may cover the lateral surface of the lower trench structure TSa. Accordingly, the upper trench structure TSb may include a protrusion tip Ttip protruding with respect to the lateral surface of the lower trench structure TSa, or may have an eaves structure with respect to the lower trench structure TSa. In FIG. 30, a white layer WL may be a coating layer which is experimentally coated to identify a cross-sectional structure of the first trench structure TS1, and thus, may not correspond to an element of the display apparatus according to the present disclosure.

The lateral surface of the lower trench structure TSa may be covered by the upper trench structure TSb, and thus, may be defined as an undercut area with respect to the upper trench structure TSb. An undercut area (or an undercut structure) disposed between the lateral surface of the lower trench structure TSa and a rear surface of the upper trench structure TSb may be implemented to isolate (or disconnect) the light emitting device ED of the light emitting device layer 103 and the common electrode CE.

The lower trench structure TSa according to an embodiment may be implemented by a dry etching process performed after a dam patterning process of forming a lower dam pattern of the dam pattern 105. For example, the lower trench structure TSa may be implemented at the dummy organic material layer DOL by a primary dry etching process which uses a photomask, disposed on the upper trench structure TSb, as a mask and may be implemented to include an undercut area (or an undercut structure) by using a secondary dry etching process performed after the primary dry etching process. That is, the lower trench structure TSa may be implemented by the secondary dry etching process performed after the primary dry etching process.

The inner trench pattern portion TPPa may include a protrusion tip which is implemented at the at least one first trench structure TS1, and thus, may isolate (or disconnect) the light emitting device ED of the light emitting device layer 103. Also, the inner trench pattern portion TPPa may include an eaves structure or an undercut area (or an undercut structure) implemented at the at least one first trench structure TS1, and thus, may isolate (or disconnect) the light emitting device ED of the light emitting device layer 103 and the common electrode CE.

The trench pattern portion TPP according to an embodiment may further include an outer trench pattern portion TPPb disposed outward from the dam pattern 105 in the second margin area MA2.

The outer trench pattern portion (or a second trench pattern portion) TPPb may be disposed to be adjacent to an outer portion of the dam pattern 105 and may be disposed to surround the dam pattern 105. That is, the outer trench pattern portion TPPb may be implemented between the dam pattern 105 and an outer surface OS of the first substrate 100 to have a closed loop shape (or a closed loop shape) surrounding the dam pattern 105. For example, the outer trench pattern portion TPPb may be implemented in a closed loop shape (or a closed loop shape) along an edge portion of the first substrate 100, and thus, may be implemented to surround the dam pattern 105 having a closed loop shape (or a closed loop shape). The outer trench pattern portion TPPb may isolate (or disconnect) the light emitting device ED of the light emitting device layer 103 or may isolate (or disconnect) the common electrode CE and the light emitting device ED of the light emitting device layer 103, at an outer portion of the dam pattern 105.

The outer trench pattern portion TPPb according to an embodiment may include at least two second trench patterns TP2 and at least one second trench structure TS2.

Except for that the at least two second trench patterns TP2 are disposed adjacent to the outer portion of the dam pattern 105, the at least two second trench patterns TP2 may include a hole pattern TPh and a groove pattern TPg which are implemented to be substantially identical to the at least two first trench patterns TP1 of the inner trench pattern portion TPPa, and thus, their repetitive descriptions are omitted.

Except for that the at least one second trench structure TS2 is implemented by the at least two second trench patterns TP2, the at least one second trench structure TS2 may include a lower trench structure TSa and an upper trench structure TSb which are implemented to be substantially identical to the at least one first trench structure TS1 of the inner trench pattern portion TPPa, and thus, its repetitive description is omitted. The at least one second trench structure TS2 may include a protrusion tip implemented at the upper trench structure TSb, an undercut area (or an undercut structure) implemented between a lateral surface of the lower trench structure TSa and a rear surface of the upper trench structure TSb, and an eaves structure of the upper trench structure TSb.

The outer trench pattern portion TPPb may include a protrusion tip which is implemented at the at least one second trench structure TS2, and thus, may isolate (or disconnect) the light emitting device ED of the light emitting device layer 103. Also, the outer trench pattern portion TPPb may include an eaves structure or an undercut area (or an undercut structure) implemented at the at least one second trench structure TS2, and thus, may isolate (or disconnect) the light emitting device ED of the light emitting device layer 103 and the common electrode CE.

In the display apparatus 10 according to an embodiment, the dam pattern 105 may be implemented on the dummy inorganic material layer DIL disposed between the inner trench pattern portion TPPa and the outer trench pattern portion TPPb of the trench pattern portion TPP. The dam pattern 105 according to an embodiment may include a lower dam pattern including the same material as that of the planarization layer 102 and an upper dam pattern which includes the same material as that of the bank 104 and is stacked on the lower dam pattern. The lower dam pattern may be disposed on the dummy inorganic material layer DIL between the inner trench pattern portion TPPa and the outer trench pattern portion TPPb to have the same height (or thickness) as that of the planarization layer 102 or to have a height which is higher than that of the planarization layer 102.

Optionally, in the trench pattern portion TPP according to an embodiment, each of the inner trench pattern portion TPPa and the outer trench pattern portion TPPb may further include a dummy pixel electrode pattern disposed on the upper trench structure TSb of the trench structures TS1 and TS2. The dummy pixel electrode pattern may be formed of the same material along with the pixel electrode PE disposed in the emission area EA of the pixel P. That is, the dummy pixel electrode pattern may not be removed in a process of patterning a pixel electrode material and may be additionally formed or disposed on the dummy inorganic material layer DIL.

In the display apparatus 10 according to the present embodiment, the light emitting device ED of the light emitting device layer 103 formed (or deposited) on the trench pattern portion TPP may be isolated (or disconnected) by the trench pattern portion TPP once or more. For example, the trench pattern portion TPP may include at least one light emitting device isolation portion where the light emitting device ED is isolated (or disconnected).

According to an embodiment, a depositing material EDm of the light emitting device ED may have linearity, and thus, may be deposited on only a top surface of the upper trench structure TSb of the trench structures TS1 and TS2 and bottom surfaces of the trench patterns TP1 and TP2 uncovered by the upper trench structure TSb and may not be deposited on a lateral surface of the lower trench structure TSa covered by an eaves structure of the upper trench structure TSb. Therefore, the light emitting device ED formed (or deposited) on the trench pattern portion TPP may be isolated (or disconnected) by a protrusion tip disposed at the upper trench structure TSb of the trench structures TS1 and TS2 or an undercut structure of the lower trench structure TSa. Accordingly, the light emitting device ED disposed in the first and second margin areas MA1 and MA2 may be automatically isolated (or disconnected) by the trench pattern portion TPP in a deposition process. Accordingly, in the display apparatus 10 according to the present embodiment, the light emitting device ED may be isolated (or disconnected) by only a deposition process performed on the light emitting device, even without a separate patterning process of isolating (or disconnecting) the light emitting device ED disposed in the first and second margin areas MA1 and MA2.

In the display apparatus 10 according to the present embodiment, the common electrode CE of the light emitting device layer 103 formed (or deposited) on the trench pattern portion TPP may be isolated (or disconnected) by the trench pattern portion TPP once or more. For example, the trench pattern portion TPP may include at least one common electrode isolation portion where the common electrode CE is isolated (or disconnected).

According to an embodiment, a common electrode material CEm of the common electrode CE may not be deposited on the undercut area disposed in the lower trench structure TSa of the trench pattern portion TPP. Therefore, like the light emitting device ED, the common electrode CE or the common electrode material CEm formed (or deposited) on the trench pattern portion TPP may be isolated (or disconnected) in the undercut area disposed in the lower trench structure TSa. Accordingly, the common electrode CE disposed in the first and second margin areas MA1 and MA2 may be automatically isolated (or disconnected) by the trench pattern portion TPP in a deposition process. Accordingly, in the display apparatus 10 according to the present embodiment, the common electrode CE may be isolated (or disconnected) by only a deposition process performed on the common electrode CE, even without a separate patterning process of isolating (or disconnecting) the common electrode CE disposed in the first and second margin areas MA1 and MA2. Also, the common electrode CE disposed in the first and second margin areas MA1 and MA2 may surround an isolation surface of the light emitting device ED in the trench pattern portion TPP, and thus, may prevent lateral water penetration through the isolation surface of the light emitting device ED, thereby preventing a reduction in reliability of the light emitting device ED caused by the lateral water penetration.

In the display apparatus 10 according to the present embodiment, in the first and second margin areas MA1 and MA2 of the first substrate 100, a first encapsulation layer 106a of the encapsulation layer 106 may be implemented to surround the inner trench pattern portion TPPa and the outer trench pattern portion TPPb of the trench pattern portion TPP and the dam pattern 105. For example, the first encapsulation layer 106a may cover the trench pattern portion TPP, and thus, may not be isolated (or disconnected) by the trench pattern portion TPP. For example, the first encapsulation layer 106a may be filled into the trench patterns TP1 and TP2 of the trench pattern portion TPP, and moreover, may be implemented to surround the trench structures TS1 and TS2.

In the first margin area MA1 of the first substrate 100, a second encapsulation layer 106b of the encapsulation layer 106 may be implemented to cover the first encapsulation layer 106a covering the inner trench pattern portion TPPa of the trench pattern portion TPP and an inner surface of the dam pattern 105. The second encapsulation layer 106b may spread to an edge portion of the first surface 100a of the first substrate 100 due to a relatively thick thickness, but the spread of the second encapsulation layer 106b may be blocked by the dam pattern 105. For example, an end of the second encapsulation layer 106b may directly contact the first encapsulation layer 106a on the dam pattern 105. Accordingly, the second encapsulation layer 106b may be disposed on only the first encapsulation layer 106a in an internal region (or an inner region) surrounded by the dam pattern 105.

In the first and second margin areas MA1 and MA2 of the first substrate 100, a third encapsulation layer 106c of the encapsulation layer 106 may be implemented to cover the first encapsulation layer 106a, covering the inner trench pattern portion TPPa of the trench pattern portion TPP and an outer surface of the dam pattern 105, and the second encapsulation layer 106b.

Because the display apparatus 10 according to some embodiments includes the trench pattern portion TPP, a total width of the first margin area MA1 and the second margin area MA2 disposed at an edge portion of the first surface 100a of the first substrate 100 may decrease to 350 μm or less, and in this case, the display apparatus 10 may realize a resolution which is higher than that of a display apparatus including no trench pattern portion TPP.

For example, when half of a first interval (or a pixel pitch) D1 between two adjacent pixel areas PA is 350 μm within the process error range, a total width (or a shortest distance between an outer surface of the first substrate and an end of an emission area EA of an outermost pixel) of the first margin area MA1 and the second margin area MA2 may be implemented to be 320 μm or less, based on a shadow margin based on a shadow area of the light emitting device ED and an encapsulation margin based on securing the reliability of the light emitting device ED against water. In this case, a second interval D2 between an outermost outer surface VL of the first substrate 100 and a center portion of an outermost pixel including a first pad part 110 may be implemented to be 350 μm within the process error range. Here, the outermost outer surface VL of the first substrate 100 may be an outermost outer surface of an edge coating layer 403 covering a routing portion 400.

The first margin area MA1 and the second margin area MA2 may have the same width or different widths. For example, with respect to the first direction X, the first margin area MA1 may be implemented to have a width of 200 μm or less, and the second margin area MA2 may be implemented to have a width of 120 μm or less. Also, a pad margin area (or a lateral routing area) included in the second margin area MA2 may be implemented to have a width of 100 μm or less with respect to the first direction X.

Figure 31:
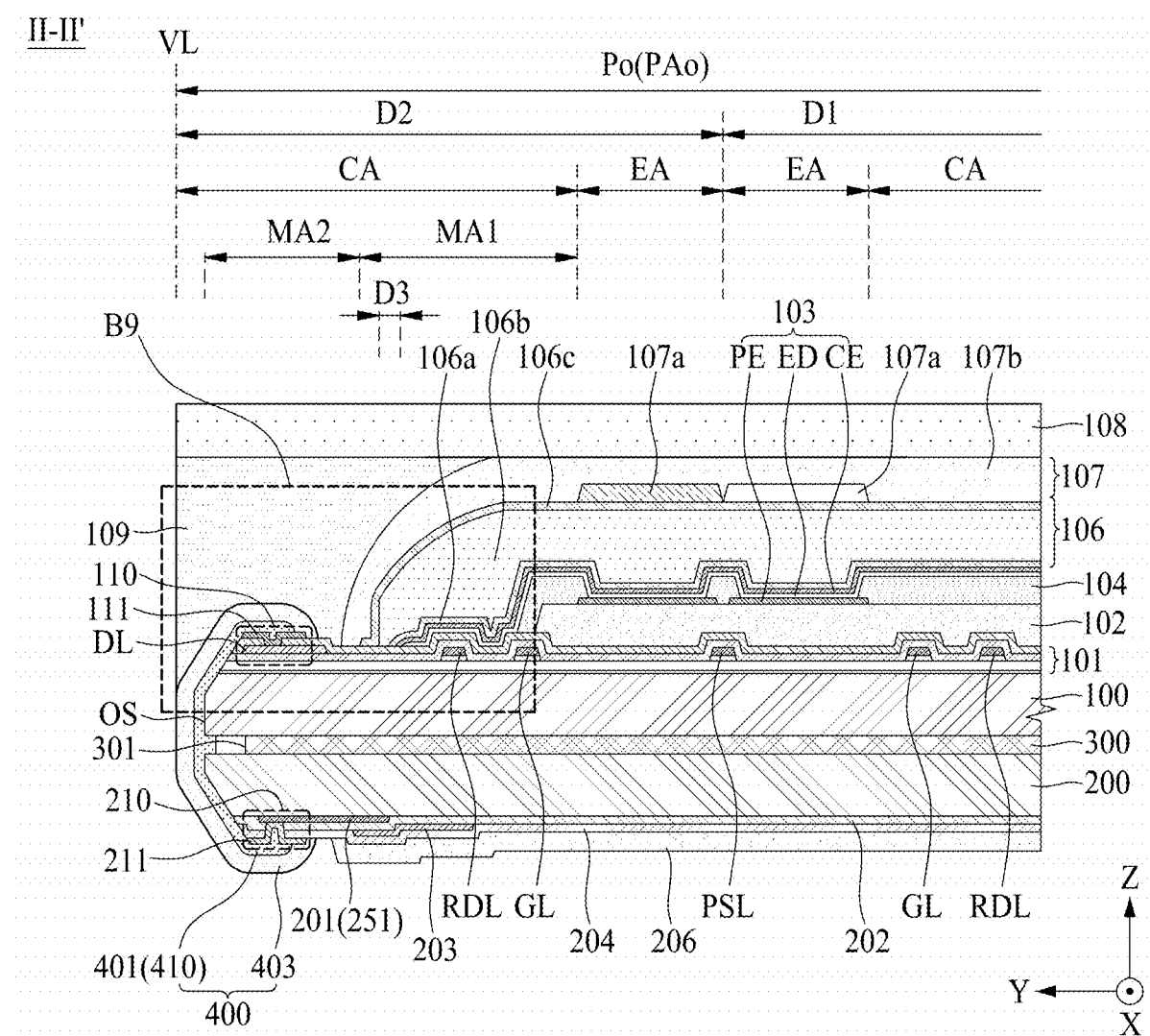
FIG. 31 is another cross-sectional view taken along line II-II' illustrated in FIG. 4.
Figure 32:
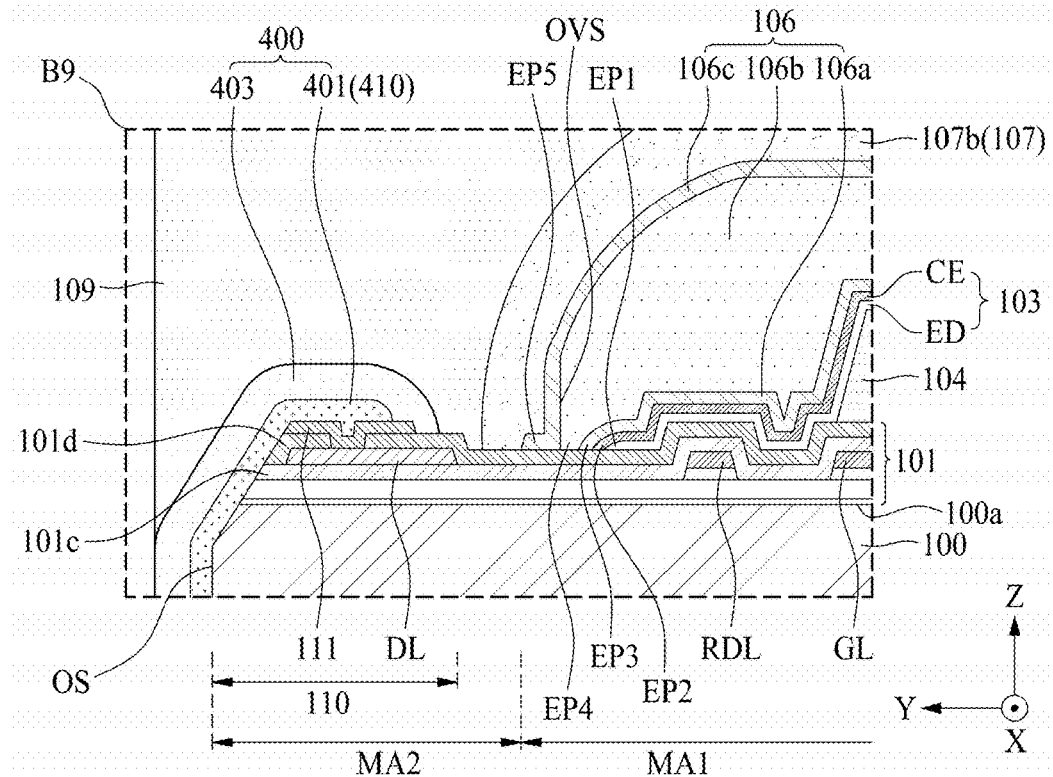
FIG. 32 is an enlarged view of a region 'B9' illustrated in FIG. 31.

FIG. 31 is another cross-sectional view taken along line II-II' illustrated in FIG. 4, and FIG. 32 is an enlarged view of a region 'B9' illustrated in FIG. 30. FIGS. 31 and 32 illustrate an embodiment which is configured by removing (or omitting) a dam pattern and modifying a structure of an encapsulation layer in the display apparatus illustrated in FIGS. 1 to 21. In describing FIGS. 31 and 32, elements other than a light emitting device, a common electrode, and an encapsulation layer are substantially the same as the elements of FIGS. 1 to 21, and thus, like reference numerals refer to like elements and their repetitive descriptions are omitted or will be briefly described below.

Referring to FIGS. 4, 31, and 32, in a display apparatus 10 according to the present disclosure, a light emitting device ED of a light emitting device layer 103 may be disposed at a bank 104 and a pixel electrode PE exposed at an emission area EA of each of a plurality of pixels SP, and moreover, may be disposed in a first margin area MA1 of a first surface 100a of a first substrate 100. An end portion (or a first tail portion) EP1 of the light emitting device ED may directly contact a passivation layer 101d disposed in the first margin area MA1. An outermost end of the light emitting device ED may be disposed to be most adjacent to a boundary portion between the first margin area MA1 and the second margin area MA2. For example, the end portion EP1 of the light emitting device ED may be apart from an outer surface OS of the first substrate 100 within a range of 120 μm to 320 μm.

The common electrode CE of the light emitting device layer 103 may directly contact the light emitting device ED and may surround the light emitting device ED. For example, the common electrode CE may be implemented in a conformal shape based on a surface shape of the light emitting device ED. An end portion (or a second tail portion) EP2 of the common electrode CE may be disposed in the first margin area MA1 to directly contact the passivation layer 101d disposed in the first margin area MA1, and thus, may surround the end portion EP1 of the light emitting device ED. An outermost end of the light emitting device ED may be directly surrounded by the common electrode CE, and thus, may not be exposed at the outside. Accordingly, the end portion EP2 of the common electrode CE may cover a boundary portion (or an interface) between the end portion EP1 of the light emitting device ED and the passivation layer 101d, thereby preventing or minimizing lateral water penetration.

A first encapsulation layer 106a of an encapsulation layer 106 may be implemented to directly contact the common electrode CE and to surround the common electrode CE. For example, the first encapsulation layer 106a may be implemented in a conformal shape based on a surface shape of the common electrode CE. An end portion (or a third tail portion) EP3 of the first encapsulation layer 106a may be disposed in the first margin area MA1 to directly contact the passivation layer 101d disposed in the first margin area MA1, and thus, may surround the end portion EP2 of the common electrode CE. Accordingly, the end portion EP3 of the first encapsulation layer 106a may cover a boundary portion (or an interface) between the end portion EP2 of the common electrode CE and the passivation layer 101d, thereby preventing or minimizing lateral water penetration.

A second encapsulation layer 106b of the encapsulation layer 106 may be implemented to directly contact the first encapsulation layer 106a and to surround the encapsulation layer 106a. An end portion EP4 of the second encapsulation layer 106b may be disposed in the first margin area MA1 to directly contact the passivation layer 101d disposed in the first margin area MA1, and thus, may surround the end portion EP3 of the first encapsulation layer 106a. Accordingly, the end portion EP4 of the second encapsulation layer 106b may cover a boundary portion (or an interface) between the end portion EP3 of the first encapsulation layer 106a and the passivation layer 101d, thereby additionally preventing or minimizing lateral water penetration.

The end portion EP4 of the second encapsulation layer 106b according to an embodiment may not be sharp unlike the end portion EP3 of the first encapsulation layer 106a and may have a thickness of which is relatively thicker than that of the first encapsulation layer 106a. A lower portion of an outer surface of the second encapsulation layer 106b, which faces the outer surface OS of the first substrate 100 or is adjacent to the outer surface OS of the first substrate 100, may be implemented to be vertical from the passivation layer 101d in a thickness direction Z of the first substrate 100. For example, the lower portion of the outer surface of the second encapsulation layer 106b directly contacting the passivation layer 101d may include an outermost vertical sidewall OVS perpendicular to a top surface of the passivation layer 101d.

The outermost vertical sidewall OVS of the second encapsulation layer 106b may be apart from the end portion EP1 of the light emitting device ED by a range of 10 μm to 20 μm. That is, an interval D3 between the outermost vertical sidewall OVS of the second encapsulation layer 106b and the end portion EP1 of the light emitting device ED may be 10 μm to 20 μm.

The third encapsulation layer 106c of the encapsulation layer 106 may be implemented to directly contact the second encapsulation layer 106b and to surround the second encapsulation layer 106b. An end portion EP5 of the third encapsulation layer 106c may be disposed in the first margin area MA1 to directly contact the passivation layer 101d disposed in the first margin area MA1, and thus, may surround the end portion EP4 of the second encapsulation layer 106b. Accordingly, the end portion EP5 of the third encapsulation layer 106c may cover a boundary portion (or an interface) between the end portion EP4 of the second encapsulation layer 106b and the passivation layer 101d, thereby additionally preventing or minimizing lateral water penetration.

The encapsulation layer 106 may be surrounded by a protection layer 107b of a wavelength conversion layer 107.

The protection layer 107b may be implemented to directly contact the third encapsulation layer 106c and to surround the third encapsulation layer 106c. For example, an edge portion of the protection layer 107b may be disposed in the second margin area MA2 adjacent to the first margin area MA1 to directly contact the passivation layer 101d disposed in the second margin area MA2, and thus, may surround the end portion EP5 of the third encapsulation layer 106c.

In the display apparatus 10 according to some embodiments, the end portion EP1 of the light emitting device ED may be surrounded or sealed by a triplex sealing structure which is based on the common electrode CE, the first encapsulation layer 106a, and the second encapsulation layer 106b, and thus, the reduction in reliability of the light emitting device ED caused by lateral water penetration may be prevented and a width of the first margin area MA1 may be greatly reduced, whereby a second interval D2 between a center portion of an outermost pixel area PAo and each of outer surfaces OS of the first substrate 100 may be implemented to be half or less of a first interval D1 between adjacent pixel areas PA. Here, the first interval D1 may be referred to as a pixel pitch or a reference pixel pitch.

Figure 33A:
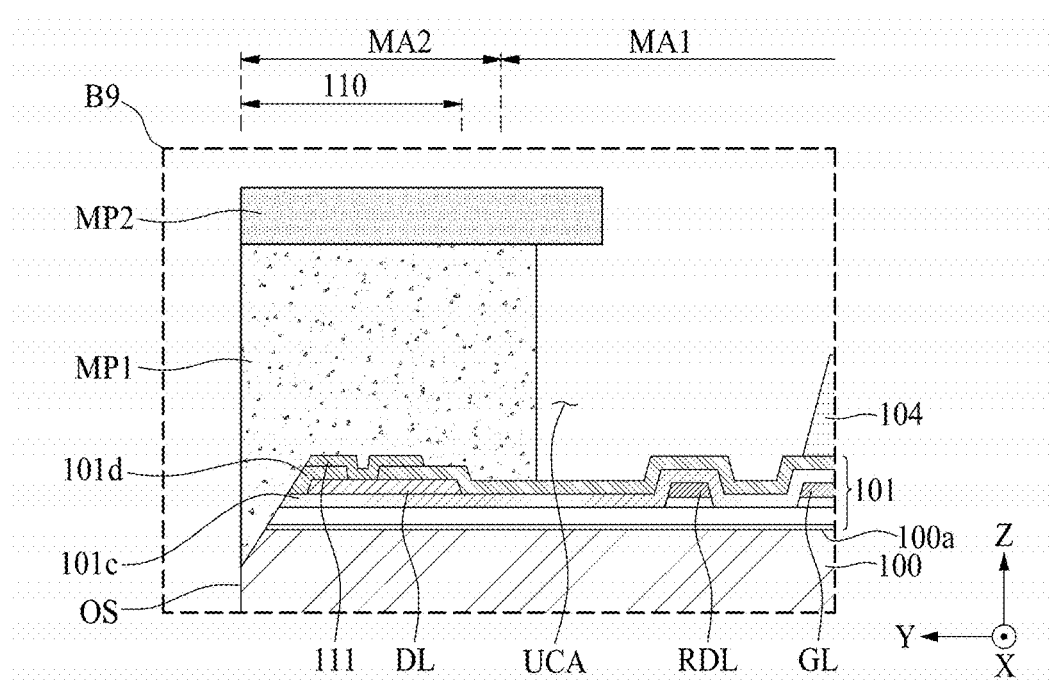
FIGS. 33A to 33E are diagrams illustrating a method of manufacturing a light emitting device, a common electrode, and an encapsulation layer each illustrated in FIG. 31.
Figure 33B:
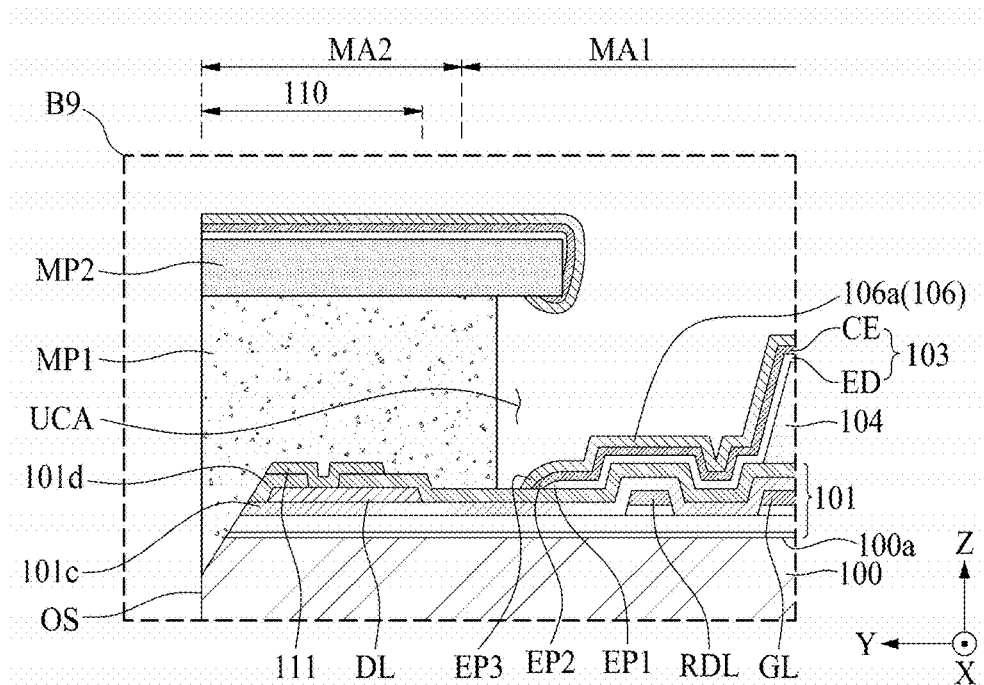
Figure 33C:
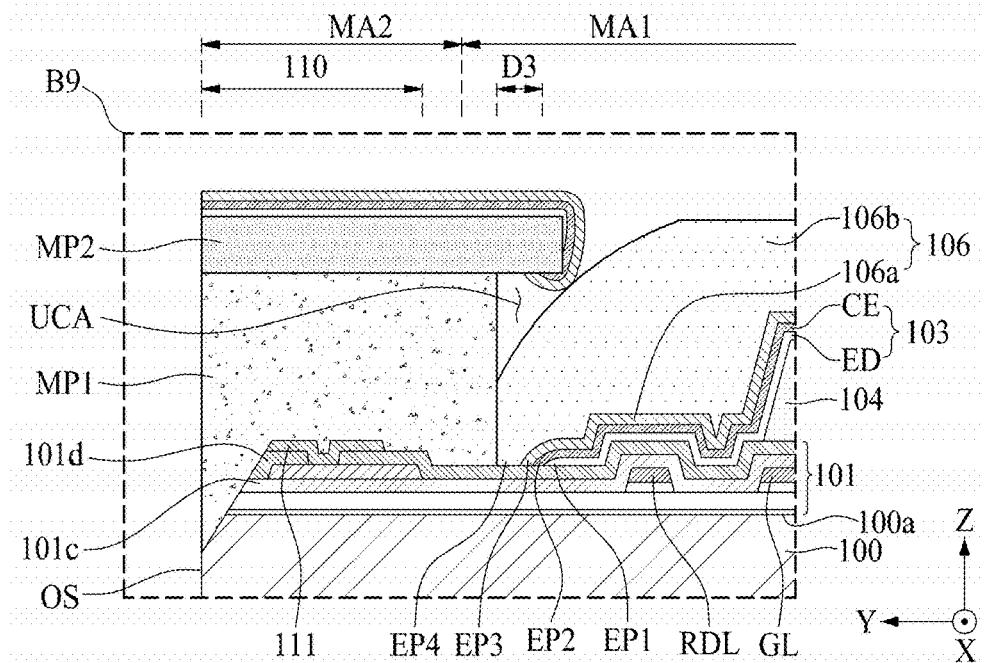
Figure 33D:
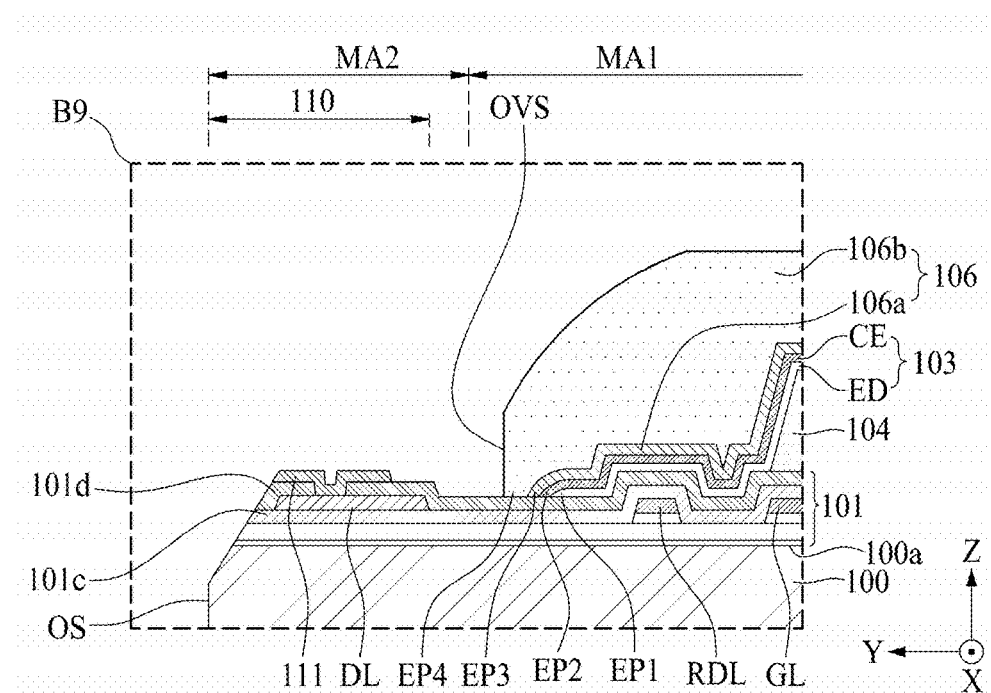
Figure 33E:
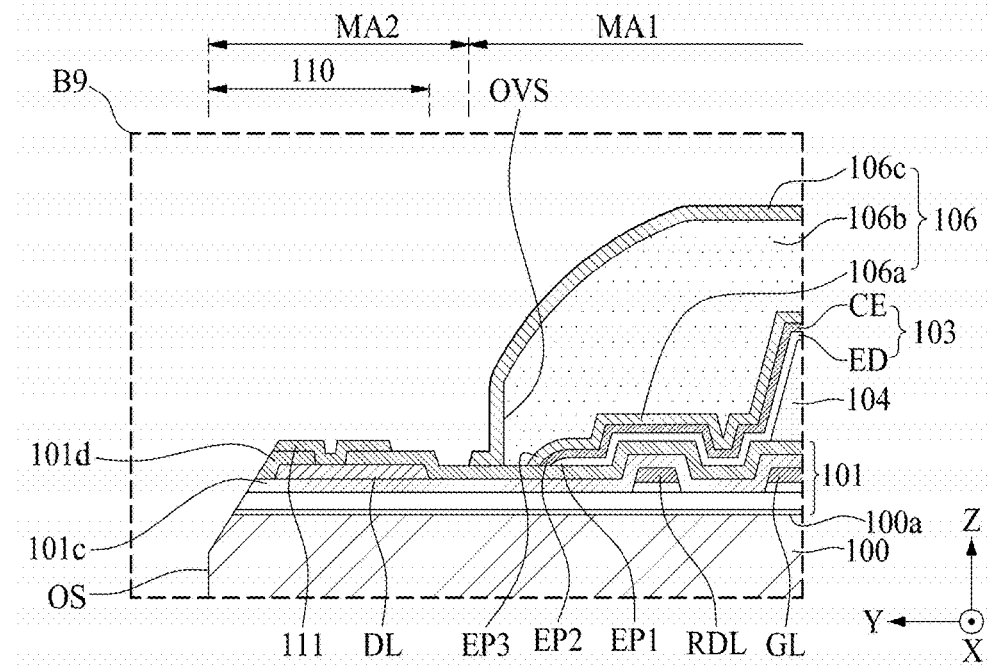
Figure 34:
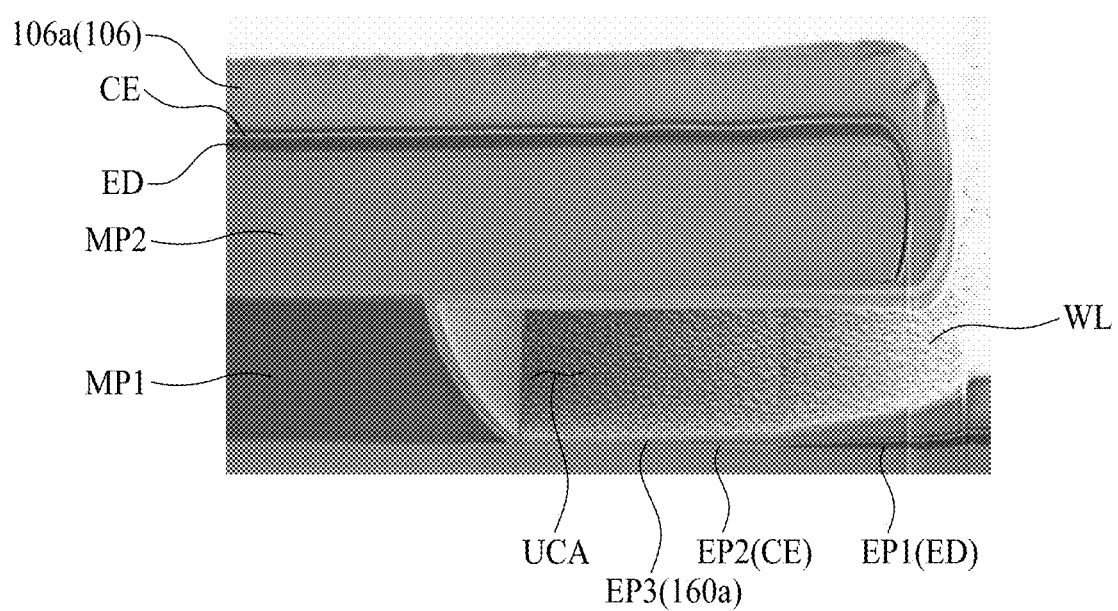
FIG. 34 is a microscope photograph of FIG. 33B.

FIGS. 33A to 33E are diagrams illustrating a method of manufacturing a light emitting device, a common electrode, and an encapsulation layer each illustrated in FIG. 31, and FIG. 34 is a microscope photograph of FIG. 33B. In FIG. 34, a white layer WL may be a coating layer which is experimentally coated to identify a cross-sectional structure of a mask pattern and a depositing material, and thus, may not correspond to an element of the display apparatus according to the present disclosure.

Referring to FIGS. 33A to 33E and 34, a method of manufacturing a light emitting device, a common electrode, and an encapsulation layer according to the present disclosure will be described below.

As illustrated in FIGS. 33A and 34, a first mask pattern MP1 may be formed (or disposed) on a first surface 100a of a first substrate 100, and a second mask pattern MP2 having an eaves structure with respect to the first mask pattern MP1 may be formed (or disposed) on the first mask pattern MP1. For example, the first mask pattern MP1 and the second mask pattern MP2 may be implemented by a process of sequentially forming (or coating) a first mask pattern material and a second mask pattern material on the first surface 100a of the first substrate 100, a process of performing exposure on the second mask pattern material, a process of sequentially patterning (or removing) the second mask pattern material and the first mask pattern material, and a process of baking a patterned first mask pattern material and a patterned second mask pattern material.

The second mask pattern material according to an embodiment may include a photosensitive resist. For example, the second mask pattern material may include a positive photoresist or a negative photoresist.

The first mask pattern material and the second mask pattern material according to an embodiment may include a material which is not deformed by the exposure process. For example, the first mask pattern material may include polydimethylglutarimide (PMGI) or polymethylmethacrylate (PMMA). The first mask pattern material may be referred to as an etch leading layer, a sacrificial layer, a liftoff resist layer, or a non-photosensitive layer.

A develop rate of the first mask pattern material to a developer may be higher than a develop rate of the second mask pattern material to the developer. For example, the second mask pattern material may include an exposure portion exposed by the exposure process and a non-exposure portion, and the second mask pattern may be implemented as the non-exposure portion of the second mask pattern material. In this case, a patterning portion of the first mask pattern material overlapping the exposure portion of the second mask pattern material may be exposed by the developer as the exposure portion of the second mask pattern material is removed by the developer, and a patterning portion of the first mask pattern material exposed by the developer may be more quickly removed than the exposure portion of the second mask pattern material. Accordingly, the first mask pattern material may have a develop rate which is relatively higher than that of the second mask pattern material, and thus, the first mask pattern material may have an undercut structure with respect to the second mask pattern material.

A lateral surface of the first mask pattern MP1 according to an embodiment may have an undercut area (or a tapered structure) UCA with respect to the second mask pattern MP2. For example, a boundary portion between the first mask pattern MP1 and the second mask pattern MP2 or an upper lateral surface of the first mask pattern MP1 may be under-cut with respect to the second mask pattern MP2. The second mask pattern MP2 may protrude with respect to the lateral surface of the first mask pattern MP1 due to the undercut area UCA of the first mask pattern MP1, and thus, may cover the lateral surface of the first mask pattern MP1. Accordingly, the second mask pattern MP2 may have an eaves structure with respect to the first mask pattern MP1.

The first mask pattern MP1 may cover all of the second margin area MA2 which is defined on the first surface 100a of the first substrate 100 and may cover a portion of the first margin area MA1 adjacent to the second margin MA2. For example, an inner surface of the first mask pattern MP1 may be disposed in the first margin area MA1 adjacent to a boundary portion between the first margin area MA1 and the second margin area MA2. An inner surface of the second mask pattern MP2 may be disposed in the first margin area MA1 so as to be apart from the inner surface of the first mask pattern MP1. That is, the inner surface of the first mask pattern MP1 may be disposed between the inner surface of the second mask pattern MP2 and the boundary portion between the first margin area MA1 and the second margin area MA2.

Subsequently, as illustrated in FIGS. 33B and 34, the light emitting device ED and the common electrode CE of the light emitting device layer 103 and the first encapsulation layer 106a of the encapsulation layer 106 may be sequentially formed (or deposited) on the first margin area MA1, the second mask pattern MP2, and the first surface 100a of the first substrate 100.

The light emitting device ED may be disposed at a bank 104 and a pixel electrode PE exposed at an emission area EA of each of a plurality of pixels SP, and moreover, may be disposed on the second mask pattern MP2 and in the first margin area MA1 on the first surface 100a of the first substrate 100. In this case, an end portion (or a first tail portion) EP1 of the light emitting device ED may penetrate into a partial region of the undercut area UCA of the first mask pattern MP1 and may directly contact a passivation layer 101d exposed at the undercut area UCA of the first mask pattern MP1.

In a deposition process performed on the light emitting device ED, a position of an end portion EP1 of the light emitting device ED should be set based on a shadow area of the light emitting device ED which inevitably occurs based on a distance between a deposition mask of the light emitting device ED and the first substrate 100. However, the shadow area of the light emitting device ED according to some embodiments may overlap the second mask pattern MP2 and may be controlled or set based on a protrusion length of the second mask pattern MP2. Accordingly, in the display apparatus according to some embodiments, because the shadow area of the light emitting device ED is not reflected in the deposition process performed on the light emitting device ED, a width of the first margin area MA1 based on the shadow area of the light emitting device ED may be considerably reduced.

The common electrode CE may be formed to cover the light emitting device ED. Particularly, an end portion (or a second tail portion) EP2 of the common electrode CE may penetrate into the undercut area UCA of the first mask pattern MP1 and may directly contact the passivation layer 101d exposed at the undercut area UCA of the first mask pattern MP1, and thus, may surround the end portion EP1 of the light emitting device ED.

The first encapsulation layer 106a may be formed to cover the common electrode CE. Particularly, an end portion EP3 of the first encapsulation layer 106a may penetrate into the undercut area UCA of the first mask pattern MP1 and may directly contact the passivation layer 101d exposed at the undercut area UCA of the first mask pattern MP1, and thus, may surround the end portion EP2 of the common electrode CE.

Subsequently, as illustrated in FIG. 33C, a second encapsulation layer 106b surrounding the first encapsulation layer 106a may be formed (or coated) on the first surface 100a of the first substrate 100.

An end portion EP4 of the second encapsulation layer 106b may penetrate into the undercut area UCA of the first mask pattern MP1 and may directly contact the passivation layer 101d disposed in the first margin area MA1, and thus, may surround the end portion EP3 of the first encapsulation layer 106a. Also, the end portion EP4 of the second encapsulation layer 106b may directly contact an inner surface of the first mask pattern MP1, and thus, may include an outermost vertical sidewall OVS perpendicular to a top surface of the passivation layer 101d.

The outermost vertical sidewall OVS of the second encapsulation layer 106b may be apart from the end portion EP1 of the light emitting device ED by a range of 10 μm to 20 μm. That is, an interval D3 between the outermost vertical sidewall OVS of the second encapsulation layer 106b and the end portion EP1 of the light emitting device ED may be 10 μm to 20 μm.

Subsequently, as illustrated in FIG. 33D, all of the first mask pattern MP1 and the second mask pattern MP2 disposed on the first surface 100a of the first substrate 100 may be removed through a liftoff process.

Optionally, a heated solvent may be used to decrease a time for performing the liftoff process on the first mask pattern MP1 and the second mask pattern MP2, and an ultrasonic cleaning process may further be applied thereto.

Subsequently, as illustrated in FIG. 33E, a third encapsulation layer 106c surrounding the second encapsulation layer 106b of the encapsulation layer 106 may be formed (or coated) on the first surface 100a of the first substrate 100.

The third encapsulation layer 106c may be formed to surround a top surface, a lateral surface, and an end portion EP4 of the second encapsulation layer 106b. Also, the third encapsulation layer 106c formed on a pad part 110 on the first surface 100a of the first substrate 100 may be removed by a patterning process or a pad open process.

Figure 35:
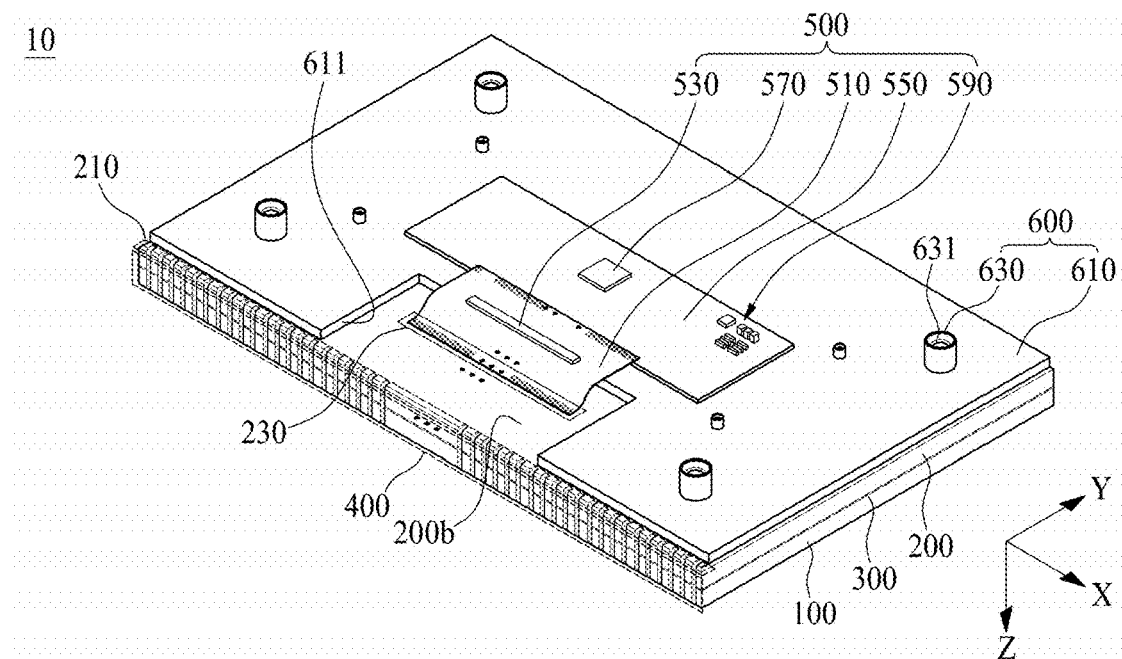
FIG. 35 is a diagram illustrating a rear surface of a second substrate illustrated in FIG. 4.

FIG. 35 is a diagram illustrating a rear surface of a second substrate illustrated in FIG. 4 and illustrates an embodiment where a panel supporting member is further provided on the second substrate of the display apparatus illustrated in FIGS. 1 to 32. In describing FIG. 35, elements which are the same or correspond to the elements of FIGS. 1 to 32 are referred to by like reference numerals, and their repetitive descriptions are omitted or will be briefly described below.

Referring to FIGS. 4 and 35, a display apparatus 10 according to an embodiment of the present disclosure may further include a panel supporting member 600 disposed on a rear surface 200b of a second substrate 200.

The panel supporting member 600 may be implemented to support a rear surface of a display panel including a first substrate 100 and a second substrate 200, which are bonded (or coupled) to each other by a coupling member 300. The panel supporting member 600 may be referred to as a rear cover, a back cover, or a rear member.

The panel supporting member 600 according to an embodiment may include a supporting plate 610 and a plurality of fastening members 630.

The supporting plate 610 may be connected to the rear surface 200b of the second substrate 200 to support a rear surface of the display panel. The supporting plate 610 may be disposed to cover a portion, other than a second pad part 210 and a third pad part 230, of the rear surface 200b of the second substrate 100 and may support a printed circuit board (PCB) 550 of a driving circuit unit 500. For example, the supporting plate 610 may be coupled to the rear surface 200b of the second substrate 200 by a plate coupling member such as a double-sided tape.

The supporting plate 610 may include a metal material. For example, the supporting plate 610 may include one material of Al, an Al alloy, a Mg alloy, a Fe—Ni alloy, and stainless steel, an alloy thereof, or a junction structure, but is not limited thereto.

The supporting plate 610 according to an embodiment may include a concave portion 611 where a portion of one side thereof is removed, for exposing the third pad part 230. For example, when seen downward from above, the supporting plate 610 may have a "凹" or "⊔"-shape. In this case, the third pad part 230 of the second substrate 200 may be exposed in a rearward direction of the second substrate 200 by the concave portion 611 of the supporting plate 610. Also, the other edge portion of a flexible circuit film 510 attached on the third pad part 230 of the second substrate 200 may cover a stepped portion between the concave portion 611 of the supporting plate 610 and the second substrate 200 and may be electrically connected to the PCB 550 supported by the supporting plate 610.

According to another embodiment, the supporting plate 610 may include an opening hole for exposing the third pad part 230. For example, the supporting plate 610 may include a tetragonal opening hole which has a tetragonal shape covering a portion, other than the second pad part 210, of the rear surface 200b of the second substrate 200 and has a size which is relatively greater than that of the third pad part 230. For example, when seen downward from above, the supporting plate 610 may have a "⊡"-shape. In this case, the third pad part 230 of the second substrate 200 may be exposed in the rearward direction of the second substrate by the opening hole of the supporting plate 610. Also, the other edge portion of a flexible circuit film 510 attached on the third pad part 230 of the second substrate 200 may pass through the opening hole of the supporting plate 610 and may be electrically connected to the PCB 550 supported by the supporting plate 610.

The plurality of fastening member 630 may be disposed on a rear surface of the supporting plate 610. For example, the plurality of fastening members 630 may be disposed to contact each of corner portions of the supporting plate 610 and may protrude from the rear surface of the supporting plate 610 by a certain length.

Each of the plurality of fastening members 630 according to an embodiment may include a fastening groove 631 which is implemented to be concave from a front surface thereof.

Each of the plurality of fastening members 630 may be fixed to the rear surface of the supporting plate 610 by a fixing member such as a screw or a bolt. For example, the fixing member may pass through the fastening groove 631 of the fastening member 630 and may be fastened to the rear surface of the supporting plate 610, and thus, may fix a rear portion of the fastening member 630 to the rear surface of the supporting plate 610.

Each of the plurality of fastening members 630 according to an embodiment may include a material which may be magnetized by a magnet. According to another embodiment, each of the plurality of fastening members 630 may be coupled to the rear surface of the supporting plate 610 with a magnet block therebetween. For example, the magnet block may be a neodymium magnet.

The plurality of fastening members 630 may be respectively fastened to a plurality of fastening pins disposed in a rear frame unit supporting the display apparatus. For example, the fastening member 630 may be coupled to the fastening pin disposed in the rear frame unit on the basis of a magnetic force. Therefore, the display apparatus 10 according to the present disclosure may be mounted on the rear frame unit. Also, a plurality of display apparatuses 10 mounted on the rear frame unit may be continuously tiled in at least one of a first direction X and a second direction Y, and thus, a multi display apparatus or an infinitely-extendable display apparatus may be implemented. Here, the rear frame unit may be referred to as a rear structure, a display supporting unit, a tiling unit, a tiling structure, a cabinet unit, a module cabinet unit, or a cabinet structure. Also, the multi display apparatus may be referred to as a multi-panel display apparatus, a multi-screen display apparatus, or a tiling display apparatus.

Additionally, the display apparatus 10 according to an embodiment of the present disclosure may further include a circuit cover. The circuit cover may be coupled to a rear surface of the panel supporting member 600 to cover the driving circuit unit 500 exposed at the rear surface of the panel supporting member 600, and thus, may protect the driving circuit unit 500 from an external impact and may protect the driving circuit unit 500 from static electricity. The circuit cover according to an embodiment may include a metal material having a shape for covering the driving circuit unit 500 exposed at the rear surface of the panel supporting member 600. For example, the circuit cover may be referred to as a cover shield.

Figure 36:
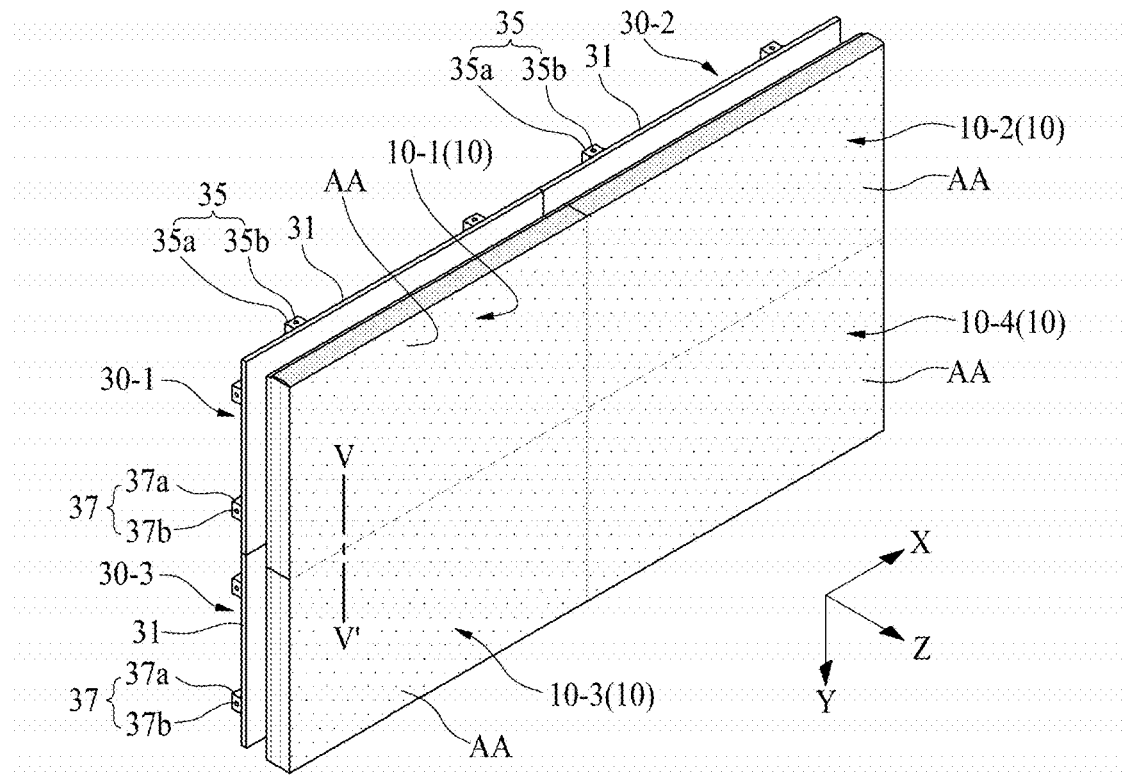
FIG. 36 is a diagram illustrating a multi-display apparatus according to an embodiment of the present disclosure.
Figure 37:
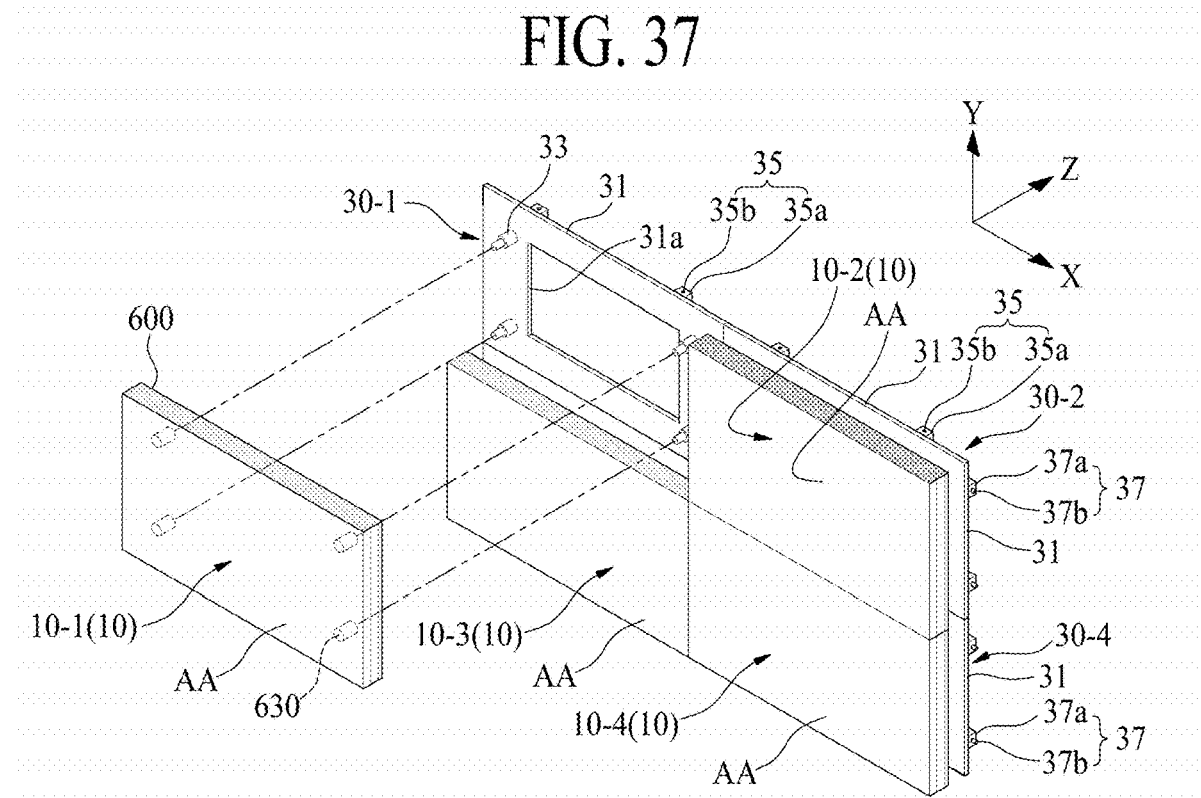
FIG. 37 is a diagram illustrating a tiling process of a display apparatus illustrated in FIG. 36.
Figure 38:
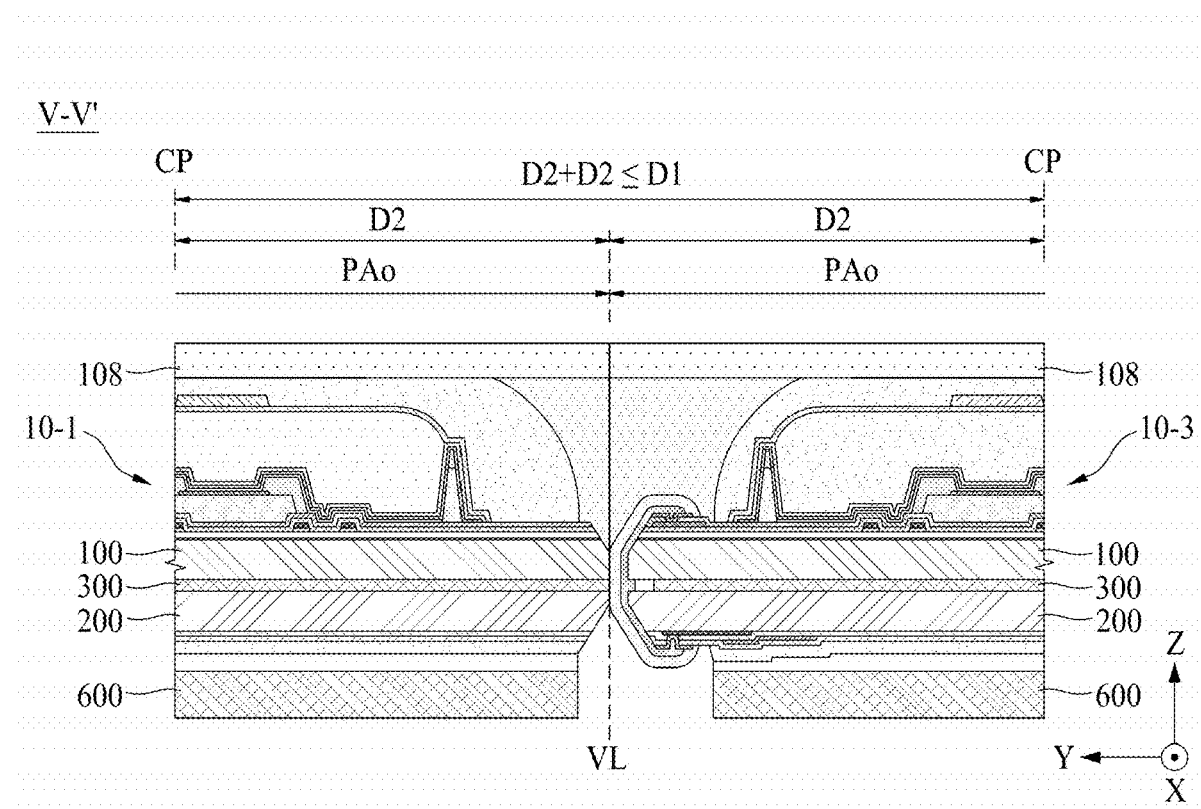
FIG. 38 is a cross-sectional view taken along line V-V' illustrated in FIG. 36.

FIG. 36 is a diagram illustrating a multi-display apparatus according to an embodiment of the present disclosure, FIG. 37 is a diagram illustrating a tiling process of a display apparatus illustrated in FIG. 36, and FIG. 38 is a cross-sectional view taken along line V-V' illustrated in FIG. 36.

Referring to FIGS. 36 to 38, the multi-display apparatus according to an embodiment of the present disclosure may include a plurality of display modules 10-1 to 10-4 and a plurality of rear frame units 30-1 to 30-4.

The plurality of display modules 10-1 to 10-4 may be arranged in an N×M form (where N is a positive integer of 2 or more and M is a positive integer of 2 or more), and thus, may each display an individual image or may divisionally display one image. Each of the plurality of display modules 10-1 to 10-4 may include the display apparatus 10 according to the present disclosure illustrated in FIGS. 1 to 35, and thus, its repetitive description is omitted.

The plurality of rear frame units 30-1 to 30-4 may be respectively coupled to the plurality of display modules 10-1 to 10-4 and may each support a corresponding display module of the plurality of display modules 10-1 to 10-4. The plurality of rear frame units 30-1 to 30-4 may be tiled in a first direction X and a second direction Y on the basis of a lateral coupling manner.

Each of the plurality of rear frame units 30-1 to 30-4 according to an embodiment may include a rear frame 31, a plurality of fastening pins 33, a plurality of first connection devices 35, and a plurality of second connection devices 37.

The rear frame 31 may be disposed on a rear surface of each of the display modules 10-1 to 10-4. The rear frame 31 according to an embodiment may include a plate shape having a size corresponding to the display modules 10-1 to 10-4. Also, the rear frame 31 may include a through hole 31a which enables a cable, connecting a driving system (or a main control board) of a multi display apparatus to a PCB of each of the display modules 10-1 to 10-4, to pass through. The through hole 31a may have a circular shape or a polygonal shape, which passes through a center portion of the rear frame 31.

Each of the plurality of fastening pins 33 may be disposed on a front surface of the rear frame 31. For example, the plurality of fastening pins 31 may be respectively disposed adjacent to corner portions of the rear frame 31 and may protrude from the front surface of the rear frame 31 by a certain length. That is, each of the plurality of fastening pins 33 may be fixed to the front surface of the rear frame 31 overlapping each of the plurality of fastening members 630 disposed in the panel supporting member 600 included in the display apparatus 10 of each of the display modules 10-1 to 10-4.

Each of the plurality of fastening pins 33 may be fixed to the front surface of the rear frame 31 by a fixing member such as a screw or a bolt. For example, the fixing member may pass through the rear frame 31 and may be fastened to a rear portion of the fastening pin 33, and thus, may fix the rear portion of the fastening pin 33 to the front surface of the rear frame 31.

One portion of each of the plurality of fastening pins 33 may have a size which enables each fastening pin 33 to be inserted into the fastening groove 631 of a corresponding fastening member 630. For example, the one portion of each of the plurality of fastening pins 33 may have a first diameter which enables each fastening pin 33 to be inserted into the fastening groove 631 of a corresponding fastening member 630. Also, the other portion of each of the plurality of fastening pins 33 may have a second diameter which is greater than the first diameter, so as to contact the front portion of the fastening member 630.

Each of the plurality of fastening pins 33 according to an embodiment may include a metal material. Therefore, each of the plurality of fastening pins 33 may be inserted into the fastening groove of a corresponding fastening member 630 of the plurality of fastening members 630 by a magnetic force of the corresponding fastening member 630, and thus, may be fastened to the corresponding fastening member 630.

Optionally, each of the plurality of fastening pins 33 according to an embodiment may be coupled to the front surface of the rear frame 31 with a magnet block therebetween. The magnet block may be a neodymium magnet. In this case, the magnet block of each of the plurality of fastening pins 33 may be implemented to have an attractive force based on a magnetic force of the fastening member 630.

The plurality of first connection devices 35 may be arranged at certain intervals at first and second rear edge portions, which are parallel to the first direction (or a horizontal direction or a widthwise direction) X, of the rear surface of the rea frame 31. Each of the plurality of first connection devices 35 may be implemented to be connected to a first connection device of a rear frame disposed at an upper portion and to be connected to a first connection device of a rear frame disposed at a lower portion, with respect to the second direction (or a vertical direction or a lengthwise direction) Y.

Each of the plurality of first connection devices 35 according to an embodiment may include a first connection body 35a and a first connection member 35b.

The first connection body 35a may be disposed at each of first and second rear edge portions of the rear frame 31.

The first connection member 35b may be disposed on an outer surface of the first connection body 35a exposed in the second direction Y. The first connection member 35b may be a protrusion pin or a pin hole. According to an embodiment, a first connection member 35b of a first connection device 35 disposed at a first rear edge portion of the rear frame 31 may be a pin hole, and a first connection member 35b of a first connection device 35 disposed at a second rear edge portion of the rear frame 31 may be a protrusion pin.

The first connection member 35b including a protrusion pin may move in the second direction Y on the basis of a rotation thereof based on a handwork of a worker to move the rear frame 31 in the second direction Y. Therefore, the rotation of the first connection member 35b including the protrusion pin may be used to align an adjacent rear frame 31 in the second direction Y.

Each of the plurality of first connection devices 35 according to an embodiment may further include a first fine adjustment member disposed in the first connection body 35a including the first connection member 35b including a pin hole.

The first fine adjustment member may be disposed in the first connection body 35a and may be implemented to move the protrusion pin inserted into the pin hole in the first direction X or a third direction (or a forward and rearward direction or a thickness direction) Z parallel to a thickness direction of the display apparatus 10. The first fine adjustment member according to an embodiment may include a first fine adjustment bolt and a second fine adjustment bolt, which are disposed in the first connection body 35a. For example, the first fine adjustment bolt and the second fine adjustment bolt may each be a non-head bolt.

The first fine adjustment bolt may be disposed on the other surface of the first connection body 35a facing the first direction X and may move the protrusion pin inserted into the pin hole in the first direction X. A rotation of the first fine adjustment bolt may be used to align an adjacent rear frame 31 in the first direction X.

The second fine adjustment bolt may be disposed on a rear surface of the first connection body 35a and may move the protrusion pin inserted into the pin hole in the third direction Z. A rotation of the second fine adjustment bolt may be used to align an adjacent rear frame 31 in the third direction Z.

The plurality of second connection devices 37 may be arranged at certain intervals at third and fourth rear edge portions, which are parallel to the second direction Y, of the rear surface of the rea frame 31. Each of the plurality of second connection devices 37 may be implemented to be connected to a second connection device of a rear frame disposed at a left portion and to be connected to a second connection device of a rear frame disposed at a right portion, with respect to the first direction X.

Each of the plurality of second connection devices 37 according to an embodiment may include a second connection body 37a and a second connection member 37b.

The second connection body 37a may be disposed at each of third and fourth rear edge portions of the rear frame 31.

The second connection member 37b may be disposed on an outer surface of the second connection body 37a exposed in the first direction X. The second connection member 37b may be a protrusion pin or a pin hole. According to an embodiment, a second connection member 37b of a second connection device 37 disposed at a third rear edge portion of the rear frame 31 may be a pin hole, and a second connection member 37b of a second connection device 37 disposed at a fourth rear edge portion of the rear frame 31 may be a protrusion pin.

The second connection member 37b including a protrusion pin may move in the first direction X on the basis of a rotation thereof based on a handwork of the worker to move the rear frame 31 in the first direction X. Therefore, the rotation of the second connection member 37b including the protrusion pin may be used to align an adjacent rear frame 31 in the first direction X.

Each of the plurality of second connection devices 37 according to an embodiment may further include a second fine adjustment member disposed in the second connection body 37a including the second connection member 37b including a pin hole.

The second fine adjustment member may be disposed in the second connection body 37a and may be implemented to move the protrusion pin inserted into the pin hole in the second direction Y or the third direction Z. The second fine adjustment member according to an embodiment may include a third fine adjustment bolt and a fourth fine adjustment bolt, which are disposed in the second connection body 37a. For example, the third fine adjustment bolt and the fourth fine adjustment bolt may each be a non-head bolt.

The third fine adjustment bolt may be disposed on the other surface of the second connection body 37a facing the second direction Y and may move the protrusion pin inserted into the pin hole in the second direction Y. A rotation of the third fine adjustment bolt may be used to align an adjacent rear frame 31 in the second direction Y.

The fourth fine adjustment bolt may be disposed on a rear surface of the second connection body 37a and may move the protrusion pin inserted into the pin hole in the third direction Z. A rotation of the fourth fine adjustment bolt may be used to align an adjacent rear frame 31 in the third direction Z.

Each of the plurality of rear frame units 30-1 to 30-4 may support a corresponding display module of the plurality of display modules 10-1 to 10-4 and may be tiled in a 2×2 form in the first direction X and the second direction Y, and based on the tiling, the plurality of display modules 10-1 to 10-4 may implement a large-screen display apparatus.

Each of the plurality of display modules 10-1 to 10-4 may not include a bezel area (or a non-display area) surrounding all of a display area AA and may have an air-bezel structure where the display area AA is surrounded by air. That is, in each of the plurality of display modules 10-1 to 10-4, all of a first surface of a first substrate 100 may be implemented as the display area AA. Therefore, an image displayed by a multi display apparatus where the plurality of display modules 10-1 to 10-4 are tiled in a 2×2 form may be continuously displayed without a sense of discontinuity (or discontinuity) at a boundary portion between the plurality of display modules 10-1 to 10-4, and thus, the immersion of a viewer watching an image displayed by the multi display apparatus may be enhanced.

According to some embodiments, in each of the plurality of display modules 10-1 to 10-4, a second interval D2 between a center portion CP of an outermost pixel Po and an outermost outer surface VL of the first substrate 100 may be implemented to be half or less of a first interval D1 between adjacent pixels. Accordingly, in two adjacent display modules connected to (or contacting) each other at side surfaces thereof in the first direction X and the second direction Y on the basis of a lateral coupling manner, an interval "D2+D2" between adjacent outermost pixels Po may be equal to or less than the first interval D1 between two adjacent pixels.

Referring to FIG. 38, in first and third display modules 10-1 and 10-3 connected to (or contacting) each other at side surfaces thereof in the second direction Y, the interval "D2+D2" between a center portion CP of an outermost pixel Po of the first display module 10-1 and a center portion CP of an outermost pixel Po of the third display module 10-3 may be equal to or less than the first interval D1 between two adjacent pixels disposed in each of the first and third display modules 10-1 and 10-3.

Therefore, the interval "D2+D2" between center portions CP of outermost pixels Po of two adjacent display modules connected to (or contacting) each other at side surfaces thereof in the first direction X and the second direction Y may be equal to or less than the first interval D1 between two adjacent pixels disposed in each of the display modules 10-1 to 10-4, and thus, there may be no seam or boundary portion between two adjacent display modules, whereby there may be no dark area caused by a boundary portion provided between the display modules 10-1 to 10-4.

As a result, in a case where the display area AA of each of the plurality of display modules 10-1 to 10-4 is one screen and displays one image, a multi display apparatus according to the present disclosure may display an image which is not disconnected and is continuous at a boundary portion between the plurality of display modules 10-1 to 10-4.

In FIGS. 36 and 37, it is illustrated that the plurality of display modules 10-1 to 10-4 are tiled in a 2×2 form, but the present disclosure is not limited thereto and the plurality of display modules 10-1 to 10-4 may be tiled in an x×1 form, a 1×y form, or an x×y form. Here, x may be a natural number which is 2 or more, and y may be a natural number which is 2 or more.

Figure 39A:
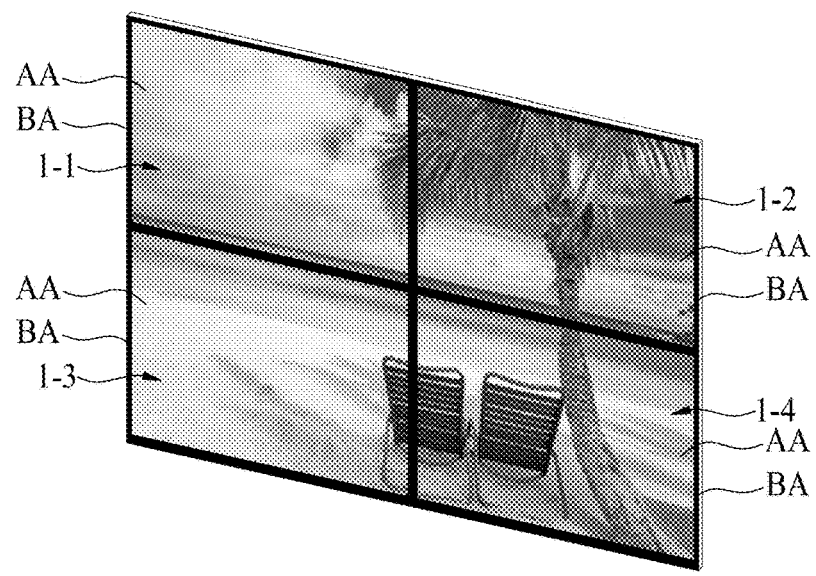
FIGS. 39A and 39B are diagrams illustrating images respectively displayed by a multi-display apparatus according to a comparative example and a multi-display apparatus according to the present disclosure.
Figure 39B:
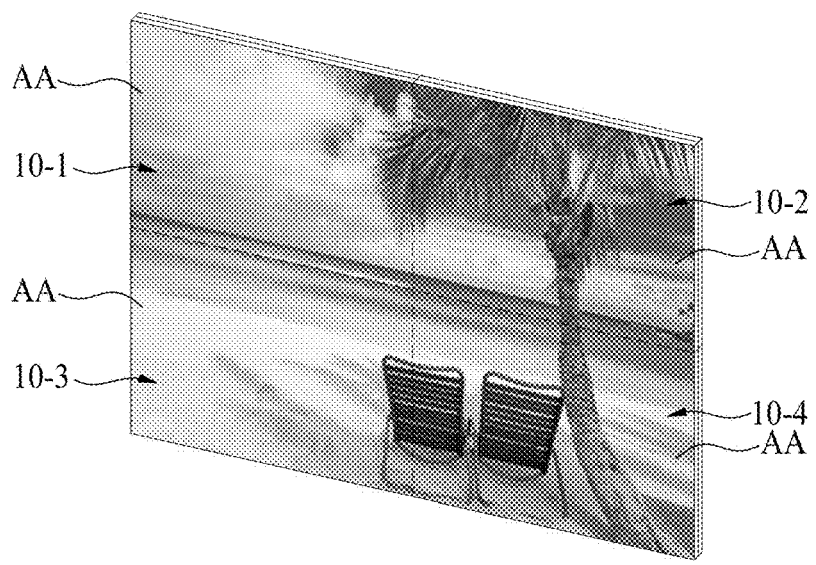

FIGS. 39A and 39B are diagrams illustrating images respectively displayed by a multi-display apparatus according to a comparative example and a multi-display apparatus according to the present disclosure. A dotted line illustrated in FIG. 39B represents a boundary portion between display modules and is irrelevant to an image displayed by a multi display apparatus.

Referring to FIG. 39A, the multi display apparatus according to the comparative example may be implemented by tiling a plurality of display modules 1-1 to 1-4 including a bezel area (or a non-display area) BA completely surrounding a display area AA, and thus, it may be seen that an image displayed by the multi display apparatus according to the comparative example is disconnected and displayed at a boundary portion between the plurality of display modules 1-1 to 1-4 due to the bezel area BA of each of the plurality of display modules 1-1 to 1-4. Therefore, in the multi display apparatus according to the comparative example, a sense of discontinuity (or discontinuity) of an image may occur in a boundary portion between the plurality of display modules 1-1 to 1-4 due to the bezel area BA of each of the plurality of display modules 1-1 to 1-4, and due to this, the immersion of a viewer watching an image may decrease.

Referring to FIG. 39B, the multi display apparatus according to the present disclosure may be implemented by tiling a plurality of display modules 10-1 to 10-4 including an air-bezel structure where a whole first surface of a first substrate 100 is a display area AA and is surrounded by air, and thus, it may be seen that an image displayed by the multi display apparatus according to the present disclosure is continuous at a boundary portion between the plurality of display modules 10-1 to 10-4 without a sense of discontinuity (or discontinuity) of the displayed image. Therefore, the multi display apparatus according to the present disclosure may display an image which is continuous at a boundary portion between the plurality of display modules 10-1 to 10-4 without a sense of discontinuity (or discontinuity) of the image.

As a result, even in a case where the plurality of display modules 10-1 to 10-4 are connected to one another at side surfaces thereof in a lattice form, the multi display apparatus according to the present disclosure may display an image which is continuous at the boundary portion between the plurality of display modules 10-1 to 10-4 without a sense of discontinuity (or discontinuity) of the image, thereby enhancing the immersion of a viewer watching an image.

A display apparatus and a multi-display apparatus including the same according to the present disclosure will be described below.

A display apparatus according to some embodiments of the present disclosure may include a first substrate including a plurality of pixel areas provided in a display portion, a second substrate coupled to the first substrate, and a routing portion disposed on an outer surface of the first substrate and an outer surface of the second substrate, wherein the first substrate may include a dam pattern disposed along an edge of the display portion, a light emitting device layer including a light emitting device disposed on the dam pattern and the plurality of pixel areas, and a trench pattern portion disposed near the dam pattern, and the light emitting device may be isolated by the trench pattern portion.

According to some embodiments of the present disclosure, the light emitting device layer may further include a common electrode disposed on the light emitting device, and each of the light emitting device and the common electrode may be isolated by the trench pattern portion disposed in at least one of an inner portion and an outer portion of the dam pattern.

According to some embodiments of the present disclosure, the common electrode may surround a laser isolation surface of the light emitting device at the trench pattern portion.

According to some embodiments of the present disclosure, the first substrate may further include an encapsulation layer disposed on the common electrode and the trench pattern portion, and the encapsulation layer may seal the trench pattern portion.

According to some embodiments of the present disclosure, the encapsulation layer may further include a first encapsulation layer disposed on the common electrode and the trench pattern portion, a second encapsulation layer disposed on the first encapsulation layer in an area surrounded by the dam pattern, and a third encapsulation layer disposed on the first encapsulation layer disposed on the second encapsulation layer and at an outer portion of the dam pattern, and the trench pattern portion may include an inner trench pattern portion disposed inward from the dam pattern to overlap the first to third encapsulation layers and an outer trench pattern portion disposed outward from the dam pattern to overlap the first and second encapsulation layers.

According to some embodiments of the present disclosure, the first substrate may further include a passivation layer disposed on the display portion, the dam pattern may directly contact a top surface of the passivation layer, and the trench pattern portion may be implemented by patterning the passivation layer disposed near the dam pattern.

According to some embodiments of the present disclosure, the trench pattern portion may include an isolation structure for isolating the light emitting device.

According to some embodiments of the present disclosure, the isolation structure may include at least one of an eaves structure, a tip structure, and an undercut structure.

According to some embodiments of the present disclosure, the trench pattern portion may include a trench structure implemented by patterning the passivation layer disposed near the dam pattern and an eaves structure disposed on the trench structure.

According to some embodiments of the present disclosure, the first substrate may further include a bank defining an emission area of each of the plurality of pixel areas, and the eaves structure may include the same material as a material of the bank.

According to some embodiments of the present disclosure, the passivation layer may include a lower layer having a first thickness, a middle layer disposed on the lower layer to have a second thickness which differs from the first thickness, and an upper layer disposed on the middle layer to have a third thickness which differs from the first thickness.

According to some embodiments of the present disclosure, the trench pattern portion may include a tip structure implemented at the middle layer, and an undercut structure implemented on a side surface of the upper layer.

According to some embodiments of the present disclosure, the trench pattern portion may further include an eaves structure disposed on the upper layer, and the eaves structure may include the same material as a material of a bank defining an emission area of each of the plurality of pixel areas.

According to some embodiments of the present disclosure, the first substrate may further include a trench pattern layer disposed along an edge portion thereof, the dam pattern may directly contact a top surface of the trench pattern layer, and the trench pattern portion may be implemented by patterning the trench pattern layer disposed near the dam pattern.

According to some embodiments of the present disclosure, the trench pattern portion may include an isolation structure for isolating the light emitting device, and the isolation structure may include at least one of an eaves structure and an undercut structure.

According to some embodiments of the present disclosure, the trench pattern portion may include a lower structure including an undercut structure, and an upper structure disposed on the lower structure to have an eaves structure with respect to the lower structure.

According to some embodiments of the present disclosure, the first substrate may further include a planarization layer disposed under the light emitting device layer, the trench pattern layer may include a first dummy material layer including the same material as a material of the planarization layer and a second dummy material layer disposed on the first dummy material layer, the second dummy material layer including a material which differs from a material of the first dummy material layer, and the trench pattern portion may include a lower structure implemented by patterning the first dummy material layer, and an upper structure implemented by patterning the second dummy material layer.

According to some embodiments of the present disclosure, the second dummy material layer may include an inorganic material.

According to some embodiments of the present disclosure, the dam pattern and the trench pattern portion may be disposed in outermost pixel areas among the plurality of pixel areas.

According to some embodiments of the present disclosure, the outermost pixel areas may further include a pad part disposed between the outer surface of the first substrate and the dam pattern, and an end of the display portion may be the outer surface of the first substrate.

According to some embodiments of the present disclosure, an interval between an outermost outer surface of the first substrate and a center portion of the outermost pixel areas including the pad part may be 350 µm or less.

A multi display apparatus according to some embodiments of the present disclosure may include a plurality of display modules arranged in at least one direction of a first direction and a second direction transverse to the first direction, wherein each of the plurality of display modules may include a first substrate including a plurality of pixel areas provided in a display portion, a second substrate coupled to the first substrate, and a routing portion disposed on an outer surface of the first substrate and an outer surface of the second substrate, wherein the first substrate may include a dam pattern disposed along an edge of the display portion, a light emitting device layer including a light emitting device disposed on the dam pattern and in the plurality of pixel areas, and a trench pattern portion disposed near the dam pattern, and the light emitting device may be isolated by the trench pattern portion.

According to some embodiments of the present disclosure, the dam pattern and the trench pattern portion may be disposed in outermost pixel areas among the plurality of pixel areas, and in two adjacent display modules respectively including side surfaces contacting each other among the plurality of display modules, a second interval between center portions of adjacent outermost pixel areas may be equal to or less than a first interval between center portions of two adjacent pixel areas.

According to some embodiments of the present disclosure, in two adjacent display modules respectively including side surfaces contacting each other among the plurality of display modules, a second interval between adjacent outermost pixels may be equal to or less than a first interval between two adjacent pixels.

According to some embodiments of the present disclosure, each of the plurality of display modules may further include a panel supporting member, and the panel supporting member includes a supporting plate connected to a rear surface of the second substrate and a plurality of fastening members disposed on a rear surface of the supporting plate, the plurality of fastening members being magnetized by a magnet.

The display apparatus according to the present disclosure may be applied to all electronic devices including a display panel. For example, the display apparatus according to the present disclosure may be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation devices, automotive navigation devices, automotive display devices, TVs, wall paper display devices, signage devices, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a first substrate including a plurality of pixel areas provided in a display portion;
a second substrate coupled to the first substrate; and
a routing assembly disposed adjacent to an outermost side surface of the first substrate and a corresponding outermost side surface of the second substrate,
wherein the first substrate includes:
a dam pattern disposed along an edge of the display portion, the edge of the display portion being adjacent to the outermost side surface of the first substrate;
a light emitting device layer including a pixel electrode, a common electrode, and a light emitting device disposed between the pixel electrode and the common electrode, the light emitting device extending from the light emitting device layer and disposed over the dam pattern; and
a trench pattern portion disposed adjacent to the dam pattern,
wherein the light emitting device extending from the light emitting device layer is disconnected at the trench pattern portion.

2. The display apparatus of claim 1, wherein the common electrode is disposed on the light emitting device,
wherein the common electrode extends from the light emitting device layer and disposed over the dam pattern, and
wherein the common electrode extending from the light emitting device layer is disconnected at the trench pattern portion.

3. The display apparatus of claim 2, wherein the common electrode at least partially surrounds an isolation surface of the light emitting device at the trench pattern portion.

4. The display apparatus of claim 2, wherein
the first substrate further includes an encapsulation layer disposed on the common electrode and the trench pattern portion, and
the encapsulation layer at least partially seals the trench pattern portion.

5. The display apparatus of claim 2, wherein the encapsulation layer further includes:
a first encapsulation layer disposed on the common electrode and the trench pattern portion;
a second encapsulation layer disposed on the first encapsulation layer in an area at least partially surrounded by the dam pattern; and
a third encapsulation layer disposed on the first encapsulation layer disposed on the second encapsulation layer and at an outer portion of the dam pattern, and
wherein the trench pattern portion includes:
an inner trench pattern portion disposed inward from the dam pattern to overlap the first to third encapsulation layers; and
an outer trench pattern portion disposed outward from the dam pattern to overlap the first and second encapsulation layers.

6. The display apparatus of claim 1, wherein:
the first substrate further includes a passivation layer disposed on the display portion;
the dam pattern directly contacts a top surface of the passivation layer; and
the trench pattern portion is implemented by patterning the passivation layer disposed adjacent to the dam pattern.

7. The display apparatus of claim 6, wherein the trench pattern portion includes an isolation structure for isolating the light emitting device.

8. The display apparatus of claim 7, wherein the isolation structure includes at least one of an eaves structure, a tip structure, and an undercut structure.

9. The display apparatus of claim 6, wherein the trench pattern portion includes:
a trench structure implemented by patterning the passivation layer disposed adjacent to the dam pattern; and
an eaves structure disposed on the trench structure.

10. The display apparatus of claim 9, wherein the first substrate further includes a bank defining an emission area of each of the plurality of pixel areas, and wherein the eaves structure includes the same material as a material of the bank.

11. The display apparatus of claim 6, wherein the passivation layer includes:
a lower layer having a first thickness;
a middle layer disposed on the lower layer to have a second thickness which differs from the first thickness; and
an upper layer disposed on the middle layer to have a third thickness which differs from the first thickness.

12. The display apparatus of claim 11, wherein the trench pattern portion includes:
a tip structure implemented at the middle layer, and
an undercut structure implemented on a side surface of the upper layer.

13. The display apparatus of claim 12, wherein the trench pattern portion further includes an eaves structure disposed on the upper layer, and
wherein the eaves structure includes the same material as a material of a bank defining an emission area of each of the plurality of pixel areas.

14. The display apparatus of claim 1, wherein:
the first substrate further includes a trench pattern layer disposed along an edge portion thereof;
the dam pattern directly contacts a top surface of the trench pattern layer; and
the trench pattern portion is implemented by patterning the trench pattern layer disposed adjacent to the dam pattern.

15. The display apparatus of claim 14, wherein the trench pattern portion includes an isolation structure for isolating the light emitting device, and
wherein the isolation structure includes at least one of an eaves structure and an undercut structure.

16. The display apparatus of claim 15, wherein the trench pattern portion includes:
a lower structure including an undercut structure; and
an upper structure disposed on the lower structure to have an eaves structure with respect to the lower structure.

17. The display apparatus of claim 14, wherein the first substrate further includes a planarization layer disposed under the light emitting device layer, wherein the trench pattern layer includes:
a first dummy material layer including the same material as a material of the planarization layer; and
a second dummy material layer disposed on the first dummy material layer, the second dummy material layer including a material which differs from a material of the first dummy material layer, and
wherein the trench pattern portion includes:
a lower structure implemented by patterning the first dummy material layer; and
an upper structure implemented by patterning the second dummy material layer.

18. The display apparatus of claim 17, wherein the second dummy material layer includes an inorganic material.

19. The display apparatus of claim 1, wherein the dam pattern and the trench pattern portion are disposed in outermost pixel areas among the plurality of pixel areas.

20. The display apparatus of claim 19, wherein the outermost pixel areas further include a pad part disposed between the outermost side surface of the first substrate and the dam pattern, and
wherein an end of the display portion extends adjacent to the outermost side surface of the first substrate.

21. The display apparatus of claim 20, wherein an interval between an outermost outer surface of the first substrate and a center portion of the outermost pixel areas including the pad part is 350 μm or less.

22. A multi display apparatus, comprising:
a plurality of display modules arranged in at least one direction of a first direction and a second direction transverse to the first direction,
wherein each of the plurality of display modules includes the display apparatus of claim 1.

23. The multi display apparatus of claim 22, wherein the dam pattern and the trench pattern portion are disposed in outermost pixel areas among the plurality of pixel areas, and
wherein in two adjacent display modules respectively including side surfaces contacting each other among the plurality of display modules, a second interval between center portions of adjacent outermost pixel areas is equal to or less than a first interval between center portions of two adjacent pixel areas.

24. The multi display apparatus of claim 22, wherein each of the plurality of display modules further includes a panel supporting member, and
wherein the panel supporting member includes:
a supporting plate connected to a rear surface of the second substrate; and
a plurality of fastening members disposed on a rear surface of the supporting plate, the plurality of fastening members being magnetized by a magnet.

* * * * *